United States Patent
Suzaki

(10) Patent No.: US 11,856,848 B2
(45) Date of Patent: Dec. 26, 2023

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventor: Yuji Suzaki, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 396 days.

(21) Appl. No.: 17/186,737

(22) Filed: Feb. 26, 2021

(65) Prior Publication Data

US 2021/0376250 A1     Dec. 2, 2021

(30) Foreign Application Priority Data

May 28, 2020 (KR) .................. 10-2020-0064093

(51) Int. Cl.
*H10K 85/60* (2023.01)
*H10K 50/12* (2023.01)
(Continued)

(52) U.S. Cl.
CPC ....... *H10K 85/656* (2023.02); *H10K 85/6572* (2023.02); *H10K 85/6574* (2023.02);
(Continued)

(58) Field of Classification Search
None
See application file for complete search history.

(56) References Cited

U.S. PATENT DOCUMENTS

| | | |
|---|---|---|
| 2019/0207112 A1 | 7/2019 | Hatakeyama et al. |
| 2020/0058885 A1 | 2/2020 | Hong et al. |
| 2020/0144515 A1 | 5/2020 | Hatakeyama et al. |

FOREIGN PATENT DOCUMENTS

| | | | | |
|---|---|---|---|---|
| CA | 3 017 010 A1 | 3/2019 | | |
| CN | 110407858 | * 11/2019 | ............. | H01L 51/50 |

(Continued)

OTHER PUBLICATIONS

Masaki Numata, et al., "High efficiency pure blue thermally activated delayed fluorescence molecules having 10H-phenoxaborin and acridan units", Chem. Commun. 2015, 51, pp. 9443-9446.

(Continued)

*Primary Examiner* — Gregory D Clark
(74) *Attorney, Agent, or Firm* — Lewis Roca Rothgerber Christie LLP

(57) ABSTRACT

An organic electroluminescence device of one or more embodiments includes a first electrode, a hole transport region disposed on the first electrode, an emission layer disposed on the hole transport region, an electron transport region disposed on the emission layer and a second electrode disposed on the electron transport region, wherein the emis- (Continued)

sion layer includes a polycyclic compound represented by Formula 1, thereby showing high emission efficiency:

Formula 1

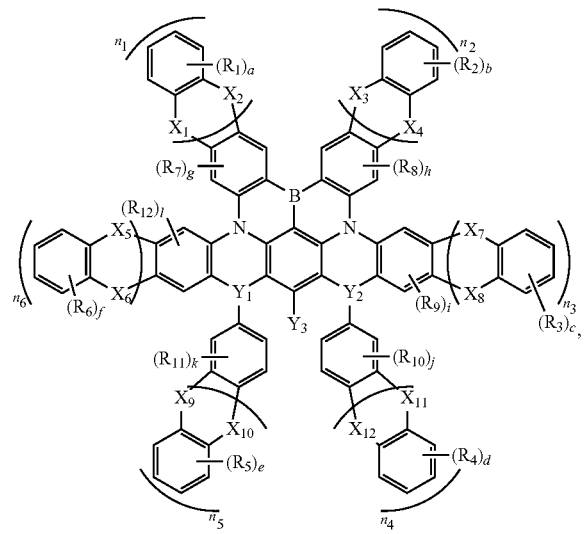

wherein at least one of n1 to n6 is 1.

20 Claims, 2 Drawing Sheets

(51) Int. Cl.
H10K 50/15 (2023.01)
H10K 50/16 (2023.01)
H10K 50/805 (2023.01)

(52) U.S. Cl.
CPC ......... *H10K 85/6576* (2023.02); *H10K 50/12* (2023.02); *H10K 50/15* (2023.02); *H10K 50/16* (2023.02); *H10K 50/805* (2023.02)

(56) References Cited

FOREIGN PATENT DOCUMENTS

| | | |
|---|---|---|
| CN | 110407858 A | 11/2019 |
| JP | 5935199 B2 | 6/2016 |
| KR | 10-2053324 B1 | 12/2019 |
| KR | 10-2058028 B1 | 12/2019 |
| WO | WO 2017/188111 A1 | 11/2017 |
| WO | WO 2018/203666 A1 | 11/2018 |

OTHER PUBLICATIONS

Kohei Matsui, et al., "One-Shot Multiple Borylation toward BN-Doped Nanographenes", Journal of the American Chemical Society, ACS Publications, published Nov. 9, 2017, 140, pp. 1195-1198.
In Seob Park et al., "High-Performance Dibenzoheteraborin-Based Thermally Activated Delayed Fluorescence Emitters: Molecular Architectonics for Concurrently Achieving Narrowband Emission and Efficient Triplet-Singlet Spin Conversion", Adv. Funct. Mater. 2018, 28, 1802031, 12pp.

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATIONS

This application claims priority to and the benefit of Korean Patent Application No. 10-2020-0064093, filed on May 28, 2020, the entire content of which is hereby incorporated by reference.

BACKGROUND

One or more aspects of embodiments of the present disclosure herein relate to an organic electroluminescence device and a polycyclic compound for an organic electroluminescence device.

Recently, the development of an organic electroluminescence display as an image display is being actively conducted. Different from a liquid crystal display, the organic electroluminescence display is a self-luminescent display, in which holes and electrons injected from a first electrode and a second electrode recombine in an emission layer, and a light-emitting material including an organic compound in the emission layer emits light to attain display of images.

In the application of an organic electroluminescence device to a display, the decrease of the driving voltage, and the increase of the emission efficiency and/or the life of the organic electroluminescence device are required (or desired), and developments of materials for an organic electroluminescence device capable of stably attaining the requirements are being continuously required (or desired).

Particularly, recently, in order to accomplish an organic electroluminescence device with high efficiency, techniques on phosphorescence emission, which uses energy in a triplet state, and/or delayed fluorescence emission, which uses the generating phenomenon of singlet excitons by the collision of triplet excitons (triplet-triplet annihilation, TTA), are being developed, and development of a material for thermally activated delayed fluorescence (TADF) using delayed fluorescence phenomenon is being conducted.

SUMMARY

One or more aspects of embodiments of the present disclosure are directed toward an organic electroluminescence device having long life and high efficiency, and a polycyclic compound used therein.

One or more aspects of embodiments of the present disclosure are also directed toward an organic electroluminescence device including a thermally activated delayed fluorescence emitting material and a polycyclic compound used as a thermally activated delayed fluorescence material.

In one or more embodiments, there is provided a polycyclic compound represented by the following Formula 1:

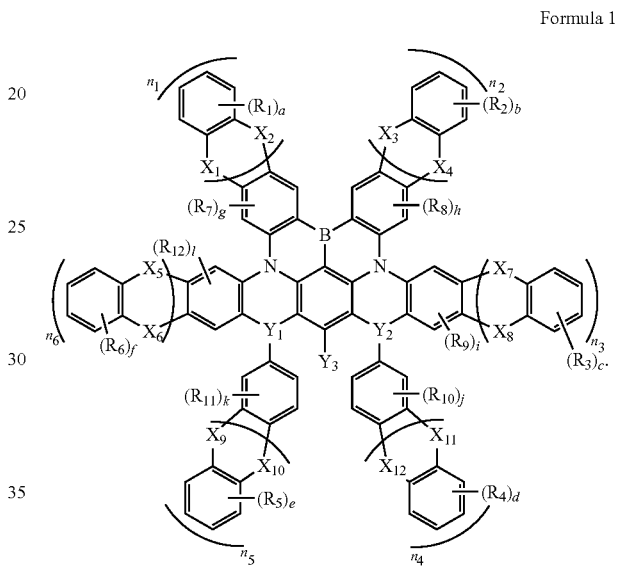

Formula 1 in Formula 1, $Y_1$ and $Y_2$ may each independently be B, N, P=O or P=S; $X_1$ to $X_{12}$ may each independently be $BAr_1$, O, S, $NAr_2$ or a direct linkage; $Ar_1$ and $Ar_2$ may each independently be a substituted or unsubstituted aryl group of 6 to 30 carbon atoms for forming a ring, or a substituted or unsubstituted heteroaryl group of 2 to 30 carbon atoms for forming a ring; $Y_3$ and $R_1$ to $R_{12}$ may each independently be a hydrogen atom, a deuterium atom, a halogen atom, a substituted or unsubstituted amino group, a substituted or unsubstituted oxy group, a substituted or unsubstituted thio group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or may be bonded to one or more adjacent groups to form one or more rings; "a" to "f" may each independently be an integer of 0 to 4, "j" and "k" may each independently be an integer of 0 to 3; "g" to "i" and "l" may each independently be an integer of 0 to 2; and n1 to n6 may each independently be 0 or 1, where at least one of n1 to n6 is 1.

In one or more embodiments, $Y_1$, and $Y_2$ may be the same.

In one or more embodiments, Formula 1 may be represented by the following Formula 2:

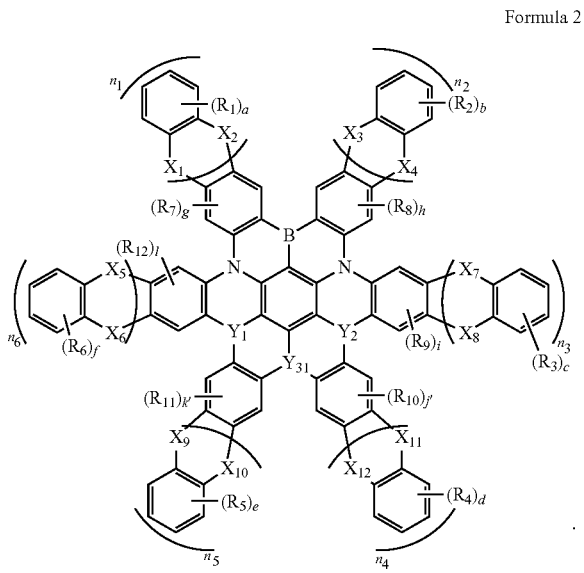

Formula 2 in Formula 2, $Y_{31}$ may be CA, or N; A may be a hydrogen atom, a deuterium atom, a halogen atom, a substituted or unsubstituted amino group, a substituted or unsubstituted oxy group, a substituted or unsubstituted thio group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring; "j'" and "k'" may each independently be an integer of 0 to 2; and $Y_1$, $Y_2$, $X_1$ to $X_{12}$, $R_1$ to $R_{12}$, "a" to "i", "l" and n1 to n6 are the same as defined in Formula 1.

In one or more embodiments, Formula 1 may be represented by the following Formula 3:

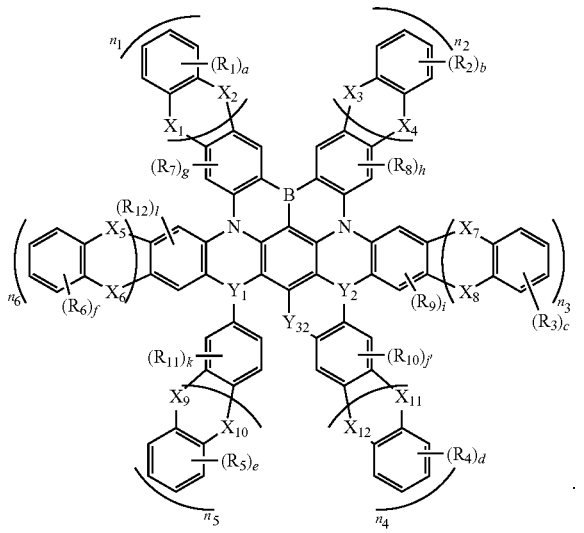

Formula 3 in Formula 3, $Y_{32}$ may be $CA_1A_2$ or $NA_3$; $A_1$ to $A_3$ may each independently be a hydrogen atom, a deuterium atom, a halogen atom, a substituted or unsubstituted amino group, a substituted or unsubstituted oxy group, a substituted or unsubstituted thio group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring; "j'" may be an integer of 0 to 2; and $Y_1$, $Y_2$, $X_1$ to $X_{12}$, $R_1$ to $R_{12}$, "a" to "i", "k", "l" and n1 to n6 are the same as defined in Formula 1.

In one or more embodiments, Formula 1 may be represented by the following Formula 4:

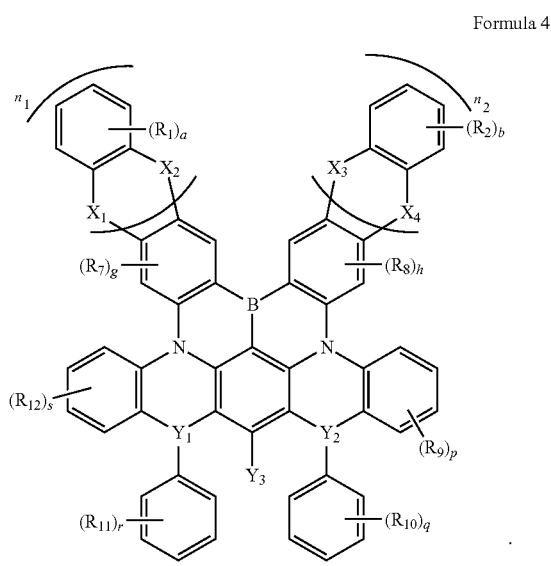

Formula 4 in Formula 4, "q" and "r" may each independently be an integer of 0 to 5; "p" and "s" may each independently be an integer of 0 to 4; and $Y_1$ to $Y_3$, $X_1$ to $X_4$, $R_1$, $R_2$, $R_7$ to $R_{12}$, "a", "b", "g", "h", n1 and n2 are the same as defined in Formula 1.

In one or more embodiments, Formula 2 may be represented by the following Formula 5:

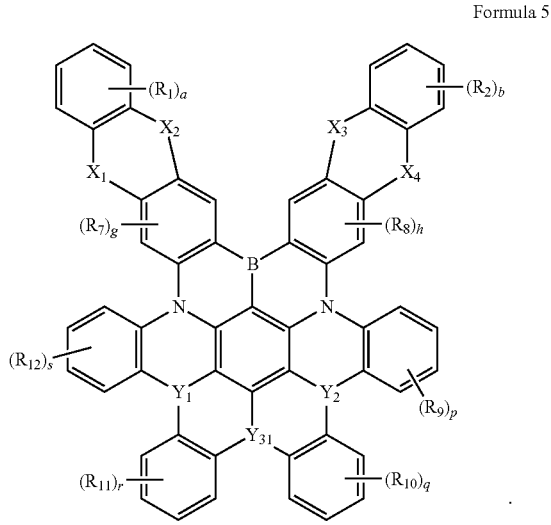

Formula 5 in Formula 5, "p" to "s" may each independently be an integer of 0 to 4; and $Y_1$, $Y_2$, $Y_{31}$, $X_1$ to $X_4$, $R_1$, $R_2$, $R_7$ to $R_{12}$, "a", "b", "g", and "h" are the same as defined in Formula 2.

In one or more embodiments, Formula 2 may be represented by the following Formula 6:

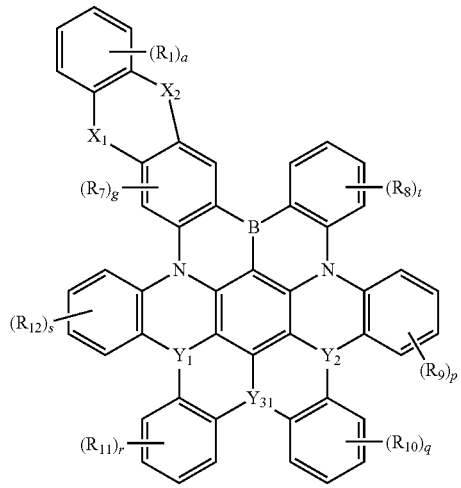

Formula 6 in Formula 6, "p" to "s" may each independently be an integer of 0 to 4; and $Y_1$, $Y_2$, $Y_{31}$, $X_1$, $X_2$, $R_1$, $R_7$ to $R_{12}$, "a", "g", and "h" are the same as defined in Formula 2.

In one or more embodiments, the compound represented by Formula 1 may be at least one among compounds represented in Compound Group 1.

In one or more embodiments of the present disclosure, there is provided an organic electroluminescence device including a first electrode; a hole transport region disposed (e.g., provided) on the first electrode; an emission layer disposed on the hole transport region; an electron transport region disposed on the emission layer; and a second electrode disposed on the electron transport region, wherein the first electrode and the second electrode each independently include Ag, Mg, Cu, Al, Pt, Pd, Au, Ni, Nd, Ir, Cr, Li, Ca, LiF/Ca, LiF/Al, Mo, Ti, In, Zn, Sn, a compound thereof, a mixture thereof, or an oxide thereof, and the emission layer includes the polycyclic compound of one or more embodiments.

In one or more embodiments, the emission layer may emit delayed fluorescence.

In one or more embodiments, the emission layer may be a delayed fluorescence emission layer including a first compound and a second compound, and the first compound may include the polycyclic compound.

In one or more embodiments, the emission layer may be a thermally activated delayed fluorescence emission layer to emit blue light.

BRIEF DESCRIPTION OF THE FIGURES

The accompanying drawings are included to provide a further understanding of the present disclosure and are incorporated in and constitute a part of this specification. The drawings illustrate example embodiments of the present disclosure and, together with the description, serve to explain principles of the present disclosure. In the drawings.

DETAILED DESCRIPTION

Figure 1:
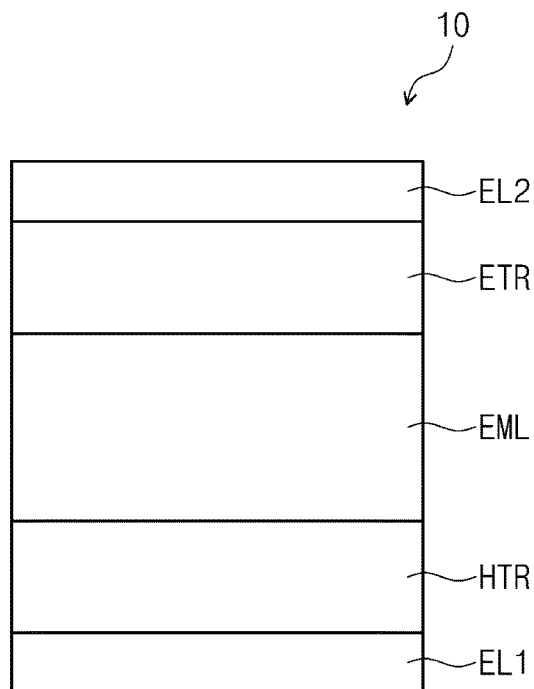
FIG. 1 is a cross-sectional view schematically illustrating an organic electroluminescence device according to one or more embodiments of the present disclosure.

The present disclosure may have various modifications and may be embodied in different forms, and example embodiments will be explained in more detail with reference to the accompany drawings. The present disclosure may, however, be embodied in different forms and should not be construed as limited to the embodiments set forth herein. Rather, all modifications, equivalents, and substituents, which are included in the spirit and technical scope of the present disclosure, should be included in the present disclosure.

It will be understood that when an element (or region, layer, part, etc.) is referred to as being "on", "connected to" or "coupled to" another element, it can be directly on, connected or coupled to the other element (without any intervening elements therebetween), or one or more third intervening elements may be present.

Like reference numerals refer to like elements throughout. In addition, in the drawings, the thickness, the ratio, and the dimensions of constituent elements are exaggerated for effective explanation of technical contents.

The term "and/or" includes one or more combinations which may be defined by relevant elements. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

It will be understood that, although the terms first, second, etc. may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

In addition, the terms "below", "beneath", "on" and "above" are used for explaining the relation of elements shown in the drawings. The terms are relative concept and are explained based on the direction shown in the drawing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, the organic electroluminescence device according to one or more embodiments of the present disclosure will be explained with reference to attached drawings.

FIGS. 1 to 4 are cross-sectional views schematically showing organic electroluminescence devices according to exemplary embodiments of the present disclosure. Referring to FIGS. 1 to 4, in an organic electroluminescence device 10 according to one or more embodiments, a first electrode EL1 and a second electrode EL2 are oppositely disposed, and between the first electrode EL1 and the second electrode EL2, an emission layer EML may be disposed.

In one or more embodiments, the organic electroluminescence device 10 of one or more embodiments further includes a plurality of functional layers between the first electrode EL1 and the second electrode EL2, in addition to the emission layer EML. The plurality of the functional layers may include a hole transport region HTR and an electron transport region ETR. For example, the organic electroluminescence device 10 of one or more embodiments may include a first electrode EL1, a hole transport region HTR, an emission layer EML, an electron transport region ETR, and a second electrode, stacked one by one. In one or more embodiments, the organic electroluminescence device 10 of one or more embodiments may include a capping layer CPL disposed on the second electrode EL2.

The organic electroluminescence device 10 of one or more embodiments includes a polycyclic compound of one or more embodiments, which will be explained hereinbelow, in the emission layer EML disposed between the first electrode EL1 and the second electrode EL2. However, the embodiments of the present disclosure are not limited thereto, and the organic electroluminescence device 10 of one or more embodiments may include the polycyclic compound of one or more embodiments in the hole transport region HTR and/or the electron transport region ETR, which are included in a plurality of the functional layers disposed between the first electrode EL1 and the second electrode EL2, or may include the polycyclic compound of one or more embodiments in a capping layer CPL disposed on the second electrode EL2, in addition to the emission layer EML.

Figure 2:
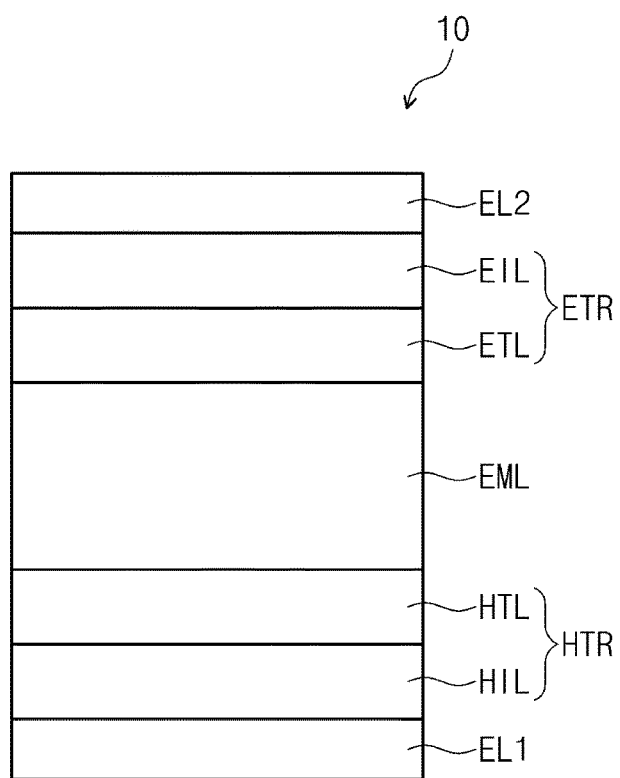
FIG. 2 is a cross-sectional view schematically illustrating an organic electroluminescence device according to one or more embodiments of the present disclosure.
Figure 3:
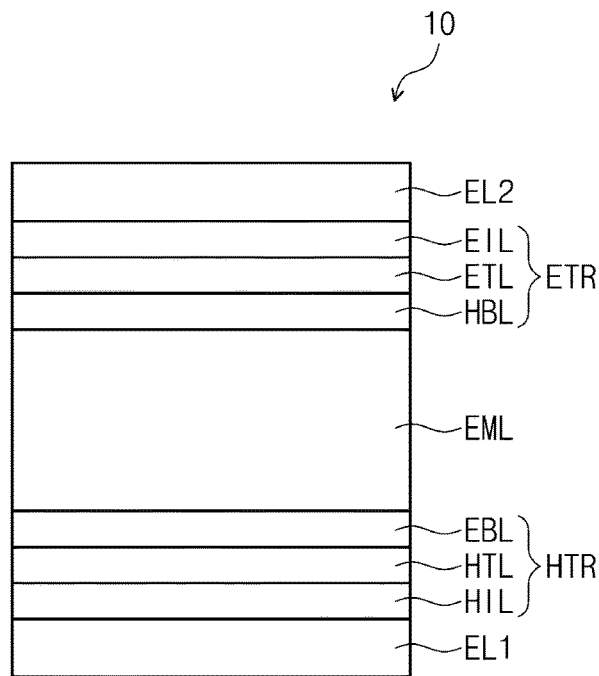
FIG. 3 is a cross-sectional view schematically illustrating an organic electroluminescence device according to one or more embodiments of the present disclosure.

Meanwhile, when compared with FIG. 1, FIG. 2 shows the cross-sectional view of an organic electroluminescence device 10 of one or more embodiments, wherein a hole transport region HTR includes a hole injection layer HIL and a hole transport layer HTL, and an electron transport region ETR includes an electron injection layer EIL and an electron transport layer ETL. In one or more embodiments, when compared with FIG. 1, FIG. 3 shows the cross-sectional view of an organic electroluminescence device 10 of one or more embodiments, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL.

Figure 4:
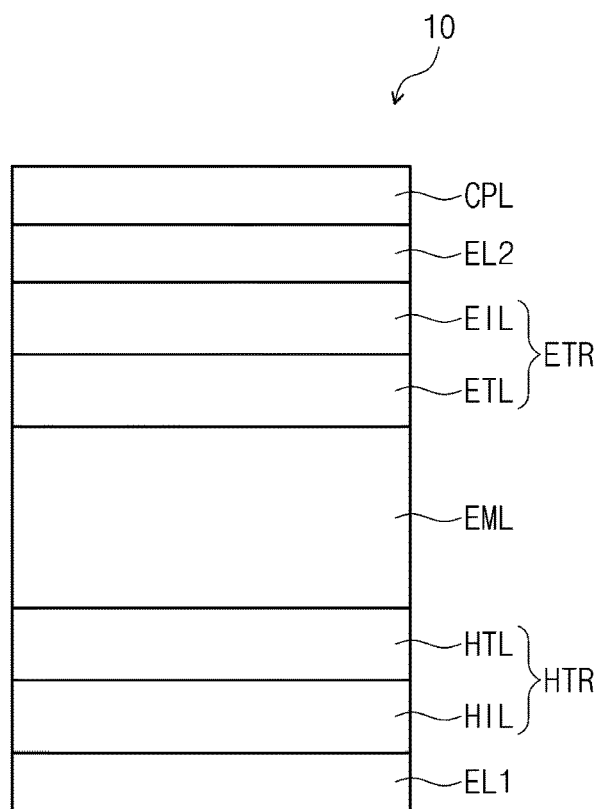
FIG. 4 is a cross-sectional view schematically illustrating an organic electroluminescence device according to one or more embodiments of the present disclosure.

When compared with FIG. 2, FIG. 4 shows the cross-sectional view of an organic electroluminescence device 10 of one or more embodiments, including a capping layer CPL disposed on the second electrode EL2.

The first electrode EL1 has conductivity. The first electrode EL1 may be formed using a metal alloy or any suitable conductive compound. The first electrode EL1 may be a pixel electrode or an anode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or a transflective layer formed using any of the above materials, and a transmissive conductive layer formed using ITO, IZO, ZnO, and/or ITZO. For example, the first electrode EL1 may include a three-layer structure of ITO/Ag/ITO. However, the embodiments of the present disclosure are not limited thereto. The thickness of the first electrode EL1 may be from about 1,000 Å to about 10,000 Å, for example, from about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL.

The hole transport region HTR may have a single layer (e.g., a single layer structure) formed using (e.g., consisting of) a single material, a single layer formed using a plurality of different materials, or a multilayer structure including a plurality of layers formed using a plurality of different materials.

For example, the hole transport region HTR may have the structure of a single layer of a hole injection layer HIL, or a hole transport layer HTL, and may have a structure of a single layer formed using a hole injection material and a hole transport material. In one or more embodiments, the hole transport region HTR may have a structure of a single layer formed using a plurality of different materials, or a structure stacked from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using one or more suitable methods selected from a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino] triphenylamine (m-MTDATA), 4,4',4"-tris(N,N-diphenylamino)triphenylamine (TDATA), 4,4',4"-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate)

(PANI/PSS), N,N'-di(naphthalene-1-yl)-N,N'-diphenyl-benzidine (NPD), triphenylamine-containing polyetherketone (TPAPEK), 4-isopropyl-4'-methyldiphenyliodonium [tetrakis(pentafluorophenyl)borate], and/or dipyrazino[2,3-f:2',3'-h]quinoxaline-2,3,6,7,10,11-hexacarbonitrile (HAT-CN).

The hole transport layer HTL may include suitable materials, for example, carbazole derivatives (such as N-phenyl carbazole and/or polyvinyl carbazole), fluorine-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di(naphthalene-1-yl)-N,N'-diphenyl-benzidine (NPD), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc.

The electron blocking layer EBL may include, for example, carbazole derivatives (such as N-phenyl carbazole and/or polyvinyl carbazole), fluorene-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di(1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino-3,3'-dimethylbiphenyl] (HMTPD), mCP, etc.

The thickness of the hole transport region HTR may be from about 50 Å to about 15,000 Å, for example, from about 100 Å to about 5,000 Å. The thickness of the hole injection region HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. When the thicknesses of the hole transport region HTR, the hole injection layer HIL, the hole transport layer HTL and the electron blocking layer EBL each independently satisfy their respective above-described ranges, satisfactory (or suitable) hole transport properties may be achieved without substantial increase of a driving voltage.

The hole transport region HTR may further include a charge generating material, in addition to the above-described materials to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. For example, non-limiting examples of the p-dopant may include quinone derivatives (such as tetracyanoquinodimethane (TCNQ) and/or 2,3,5,6-tetrafluoro-7,7',8,8'-tetracyanoquinodimethane (F4-TCNQ)), and metal oxides (such as tungsten oxide and/or molybdenum oxide).

As described above, the hole transport region HTR may further include at least one of a hole butter layer or an electron blocking layer EBL, in addition to the hole injection layer HIL and the hole transport layer HTL. The hole buffer layer may compensate an optical resonance distance according to the wavelength of light emitted from an emission layer EML and may increase light emission efficiency. Any of the materials which may be included in a hole transport region HTR may be used as materials included in a hole buffer layer. The electron blocking layer EBL is a layer playing the role of preventing or reducing the electron injection from the electron transport region ETR to the hole transport region HTR.

The emission layer EML is provided on the hole transport region HTR. The emission layer EML may have a thickness of, for example, about 100 Å to about 1,000 Å, or about 100 Å to about 300 Å. The emission layer EML may have a single layer formed using a single material, a single layer formed using a plurality of different materials, or a multi-layer structure having a plurality of layers formed using a plurality of different materials.

The emission layer EML may emit one among red light, green light, blue light, white light, yellow light and cyan light. The emission layer EML may include a fluorescence emitting material or a phosphorescence emitting material.

In one or more embodiments, the emission layer EML may be a fluorescence emission layer. For example, a part of light emitted from the emission layer EML may be by thermally activated delayed fluorescence (TADF). In one or more embodiments, the emission layer EML may include a light emitting component emitting (e.g. to emit) thermally activated delayed fluorescence, and in one or more embodiments, the emission layer EML may be a thermally activated delayed fluorescence emission layer emitting (e.g. to emit) blue light.

The emission layer EML of the organic electroluminescence device 10 of one or more embodiments includes the polycyclic compound according to one or more embodiments of the present disclosure.

Meanwhile, in the description, the term "substituted or unsubstituted" corresponds to a group that is unsubstituted or that is substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In one or more embodiments, each of the exemplified substituents may be substituted or unsubstituted. For example, a biphenyl group may be interpreted as an aryl group or a phenyl group substituted with a phenyl group.

In the description, the term "forming a ring via the combination with an adjacent group" may mean forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The ring formed by the combination with an adjacent group may be a monocyclic ring or a polycyclic ring. In one or more embodiments, the ring formed via the combination with an adjacent group may be bonded to another ring to form a spiro structure.

In the description, the term "adjacent group" may refer to a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, examples of the halogen atom may include a fluorine atom, a chlorine atom, a bromine atom, and an iodine atom.

In the description, the alkyl may be a chain alkyl group or a cyclic alkyl group, unless otherwise classified. The carbon number of the alkyl may be 1 to 50, 1 to 30, 1 to 20, 1 to 10, or 1 to 6. Examples of the chain alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, 1-methylpentyl, 3-methylpentyl, 2-ethylpentyl, 4-methyl-2-pentyl, n-hexyl, 1-methylhexyl, 2-ethylhexyl, 2-butylhexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation. Examples of the cyclic alkyl may include cyclopentyl, cyclohexyl, 4-methylcyclohexyl, 4-t-butylcyclohexyl, cyclooctyl, etc., without limitation.

In the description, the alkenyl group may refer to a hydrocarbon group including one or more carbon double bonds in the middle of and/or at either terminal of an alkyl group of 2 or more carbon atoms. The alkenyl group may be a linear chain or a branched chain group. The carbon number is not specifically limited, but may be 2 to 30, 2 to 20, or 2 to 10. Examples of the alkenyl group include a vinyl group, a 1-butenyl group, a 1-pentenyl group, a 1,3-butadienyl aryl group, a styrenyl group, a styrylvinyl group, etc., without limitation.

In the description, the alkynyl group refer to a hydrocarbon group including one or more carbon triple bonds in the middle of and/or at either terminal of an alkyl group of 2 or more carbon atoms. The alkynyl group may be a linear chain or a branched chain group. The carbon number is not specifically limited, but may be 2 to 30, 2 to 20, or 2 to 10. Examples of the alkynyl group include an ethynyl group, a propynyl group, etc., without limitation.

In the description, the hydrocarbon ring group may be an optional functional group or substituent derived from an aliphatic hydrocarbon ring, or an optional functional group or substituent derived from an aromatic hydrocarbon ring. The carbon number of the hydrocarbon ring group for forming a ring may be 5 to 60, 5 to 30, or 5 to 20.

In the description, the aryl group may refer to an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sextphenyl, triphenylenyl, pyrenyl, benzofluoranthenyl, chrysenyl, etc., without limitation.

In the description, the heterocyclic group may refer to an optional functional group or substituent derived from a ring including one or more among B, O, N, P, Si and S as heteroatoms. The heterocyclic group includes an aliphatic heterocyclic group and an aromatic heterocyclic group. The aromatic heterocyclic group may be a heteroaryl group. The aliphatic heterocycle and aromatic heterocycle may each independently be a monocycle or a polycycle.

In the description, the heterocyclic group may include one or more among B, O, N, P, Si and S as heteroatoms. If the heterocyclic group includes two or more heteroatoms, the two or more heteroatoms may be the same or different. The heterocyclic group may be a monocyclic heterocyclic group or a polycyclic heterocyclic group and has the concept including a heteroaryl group. The carbon number for forming a ring of the heterocyclic group may be 2 to 30, 2 to 20, or 2 to 10.

In the description, the aliphatic heterocyclic group may include one or more among B, O, N, P, Si and S as heteroatoms. The carbon number for forming a ring of the aliphatic heterocyclic group may be 2 to 30, 2 to 20, or 2 to 10. Examples of the aliphatic heterocyclic group may be an oxirane group, a thiirane group, a pyrrolidine group, a piperidine group, a tetrahydrofuran group, a tetrahydrothiophene group, a thiane group, a tetrahydropyrane group, a 1,4-dioxane group, etc., without limitation.

In the description, the heteroaryl group may include one or more among B, O, N, P, Si and S as heteroatoms. If the heteroaryl group includes two or more heteroatoms, two or more heteroatoms may be the same or different. The heteroaryl group may be a monocyclic heteroaryl group or polycyclic heteroaryl group. The carbon number for forming a ring of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridine, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, etc., without limitation.

In the description, the carbon number of the amine group is not specifically limited, but may be 1 to 30. The amine group may include an alkyl amine group, an aryl amine group or a heteroaryl amine group. Examples of the amine group include a methylamine group, a dimethylamine group, a phenylamine group, a diphenylamine group, a naphthylamine group, a 9-methyl-anthracenylamine group, a triphenylamine group, etc., without limitation.

In the description, the thiol group may include an alkyl thio group and an aryl thio group.

Meanwhile, in the description, "-•" means a position to be connected (e.g., a bonding site to a neighboring atom).

In the description, "atoms for forming a ring" may refer to ring-forming atoms.

In the description, "direct linkage" may refer to a chemical bond, for example, a single bond.

The polycyclic compound according to one or more embodiments of the present disclosure is represented by the following Formula 1:

Formula 1

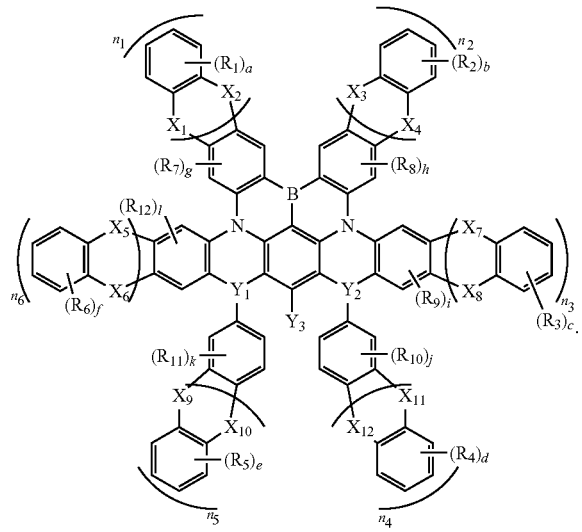

In one or more embodiments, Formula 1 may be represented by the following Formula 2:

Formula 2

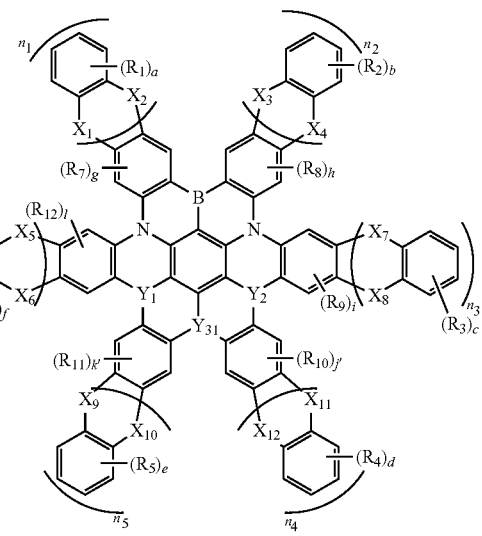

in Formula 1, $Y_1$, and $Y_2$ are each independently B, N, P=O or P=S.

In Formula 1, $X_1$ to $X_{12}$ are each independently $BAr_1$, O, S, $NAr_2$ or a direct linkage; and $Ar_1$ and $Ar_2$ are each independently a substituted or unsubstituted aryl group of 6 to 30 carbon atoms for forming a ring, or a substituted or unsubstituted heteroaryl group of 2 to 30 carbon atoms for forming a ring.

In Formula 1, $Y_3$ and $R_1$ to $R_{12}$ are each independently hydrogen atoms, deuterium atoms, halogen atoms, substituted or unsubstituted amino groups, substituted or unsubstituted oxy groups, substituted or unsubstituted thio groups, substituted or unsubstituted alkyl groups of 1 to 20 carbon atoms, substituted or unsubstituted aryl groups of 6 to 30 carbon atoms for forming a ring, or substituted or unsubstituted heteroaryl groups of 2 to 30 carbon atoms for forming a ring, and/or bonded to respective adjacent groups to form rings.

In Formula 1, "a" to "f" are each independently an integer of 0 to 4. Meanwhile, if "a" is 2 or more, a plurality of $R_1$ groups are the same or different, if "b" is 2 or more, a plurality of $R_2$ groups are the same or different, if "c" is 2 or more, a plurality of $R_3$ groups are the same or different, if "d" is 2 or more, a plurality of $R_4$ groups are the same or different, if "e" is 2 or more, a plurality of $R_5$ groups are the same or different, and if "f" is 2 or more, a plurality of $R_6$ groups are the same or different.

In Formula 1, "j" and "k" are each independently an integer of 0 to 3. Meanwhile, if "j" is 2 or more, a plurality of $R_{10}$ groups are the same or different, and if "k" is 2 or more, a plurality of $R_{11}$ groups are the same or different.

In Formula 1, "g" to "i" and "l" are each independently an integer of 0 to 2. Meanwhile, if "g" is 2 or more, a plurality of $R_7$ groups are the same or different, if "h" is 2 or more, a plurality of Ra groups are the same or different, if "i" is 2 or more, a plurality of $R_9$ groups are the same or different, and if "l" is 2 or more, a plurality of $R_{12}$ groups are the same or different.

In Formula 1, n1 to n6 are each independently 0 or 1, where at least one thereof is 1.

in Formula 2, $Y_{31}$ is CA, or N, and A may be a hydrogen atom, a deuterium atom, a halogen atom, a substituted or unsubstituted amino group, a substituted or unsubstituted oxy group, a substituted or unsubstituted thio group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

In Formula 2, "j'" and "k'" are each independently an integer of 0 to 2. Meanwhile, if "j'" is 2 or more, a plurality of $R_{10}$ groups are the same or different, and if "k'" is 2 or more, a plurality of $R_{11}$ groups are the same or different.

In Formula 2, $Y_1$, $Y_2$, $X_1$ to $X_{12}$, $R_1$ to $R_{12}$, "a" to "i", "l" and n1 to n6 are the same as defined in Formula 1.

In one or more embodiments, Formula 2 may be represented by the following Formula 5:

Formula 5

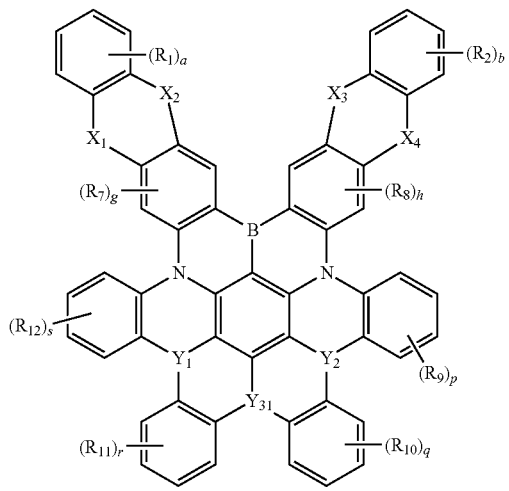

in Formula 5, "p" to "s" are each independently an integer of 0 to 4. Meanwhile, if "p" is 2 or more, a plurality of $R_9$ groups are the same or different, if "q" is 2 or more, a plurality of $R_{10}$ groups are the same or different, if "r" is 2 or more, a plurality of $R_{11}$ groups are the same or different, and if "s" is 2 or more, a plurality of $R_{12}$ groups are the same or different.

In Formula 5, $Y_1$, $Y_2$, $Y_{31}$, $X_1$ to $X_4$, $R_1$, $R_2$, $R_7$ to $R_{12}$, "a", "b", "g", and "h" are the same as defined in Formula 2.

In one or more embodiments, Formula 2 may be represented by the following Formula 6:

Formula 6

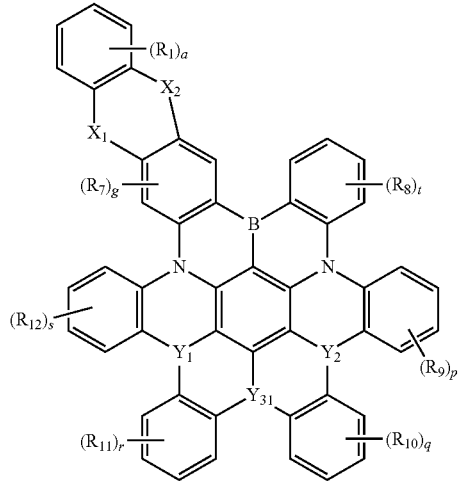

in Formula 6, "p" to "s" are each independently an integer of 0 to 4. Meanwhile, if "p" is 2 or more, a plurality of $R_9$ groups are the same or different, if "q" is 2 or more, a plurality of $R_{10}$ groups are the same or different, if "r" is 2 or more, a plurality of $R_{11}$ groups are the same or different, and if "s" is 2 or more, a plurality of $R_{12}$ groups are the same or different.

In Formula 6, $Y_1$, $Y_2$, $Y_{31}$, $X_1$, $X_2$, $R_1$, $R_7$ to $R_{12}$, "a", "g", and "h" are the same as defined in Formula 2.

In one or more embodiments, Formula 1 may be represented by the following Formula 3:

Formula 3

In Formula 3, $Y_{32}$ is $CA_1A_2$ or $NA_3$, and $A_1$ to $A_3$ may be each independently a hydrogen atom, a deuterium atom, a halogen atom, a substituted or unsubstituted amino group, a substituted or unsubstituted oxy group, a substituted or unsubstituted thio group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring.

In Formula 3, "j'" is an integer of 0 to 2. Meanwhile, if "j'" is 2 or more, a plurality of $R_{10}$ groups are the same or different.

In Formula 3, $Y_1$, $Y_2$, $X_1$ to $X_{12}$, $R_1$ to $R_{12}$, "a" to "i", "k", "l" and n1 to n6 are the same as defined in Formula 1.

In one or more embodiments, Formula 1 may be represented by the following Formula 4:

Formula 4 in Formula 4, "q" and "r" are each independently an integer of 0 to 5. Meanwhile, if "q" is 2 or more, a plurality of $R_{10}$ groups are the same or different, and if "r" is 2 or more, a plurality of $R_{11}$ groups are the same or different.

In Formula 4, "p" and "s" are each independently an integer of 0 to 4. Meanwhile, if "p" is 2 or more, a plurality of $R_9$ groups are the same or different, and if "s" is 2 or more, a plurality of $R_{12}$ groups are the same or different.

In Formula 4, $Y_1$ to $Y_3$, $X_1$ to $X_4$, $R_1$, $R_2$, $R_7$ to $R_{12}$, "a", "b", "g", "h", n1 and n2 are the same as defined in Formula 1.

In one or more embodiments, $Y_1$ and $Y_2$ may be the same.

In one or more embodiments, $Y_1$ and $Y_2$ may each independently be B.

In one or more embodiments, $Y_3$ may be a substituted or unsubstituted amine group, and/or bonded to at least one among $R_{10}$ and $R_{11}$ to form a ring.

In one or more embodiments, $X_1$ to $X_4$ may not be direct linkages at the same time, and at least one among n1 and n2 may be 1.

In one or more embodiments, the polycyclic compound represented by Formula 1 may be at least one among the compounds represented in the following Compound Group 1, but one or more embodiments of the present disclosure is not limited thereto:

Compound Group 1
1
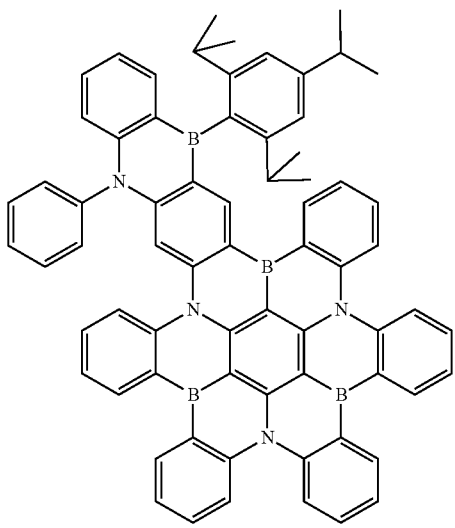
2
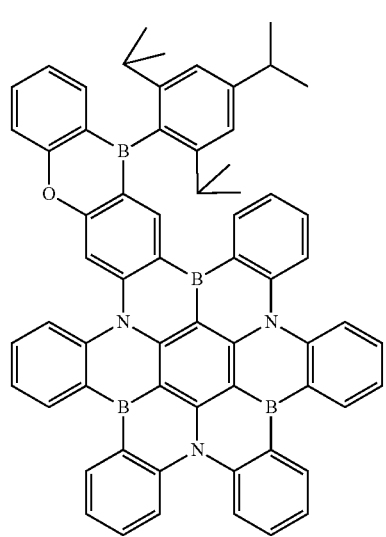
3
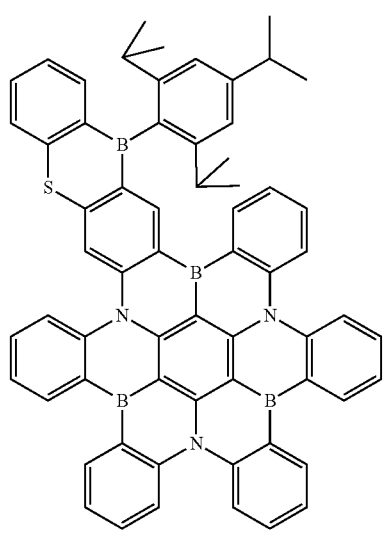
1-D
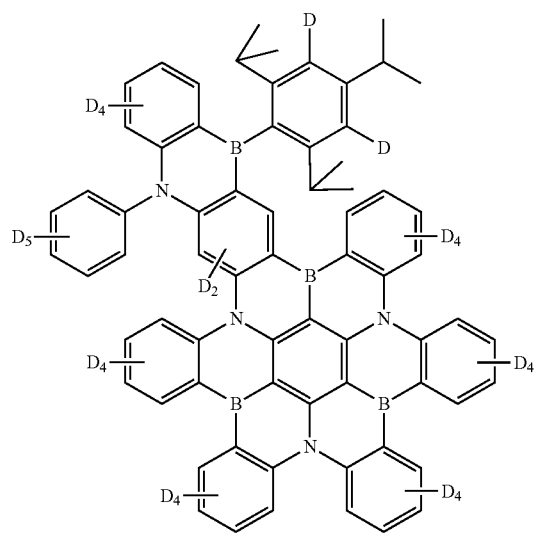
2-D
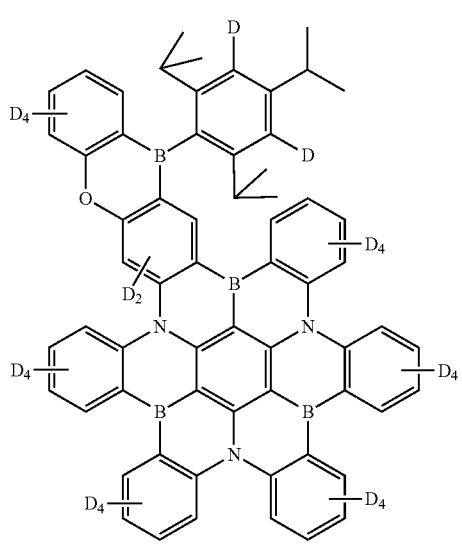
3-D
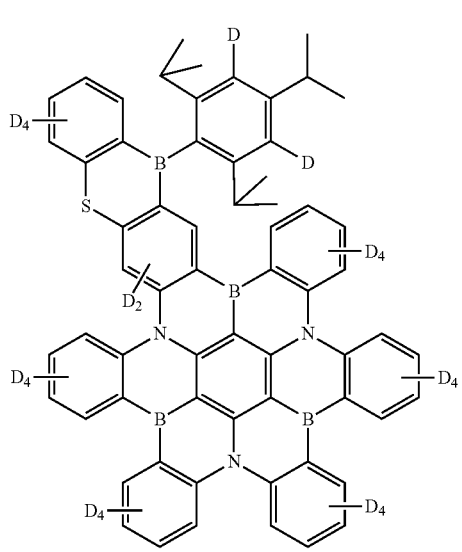

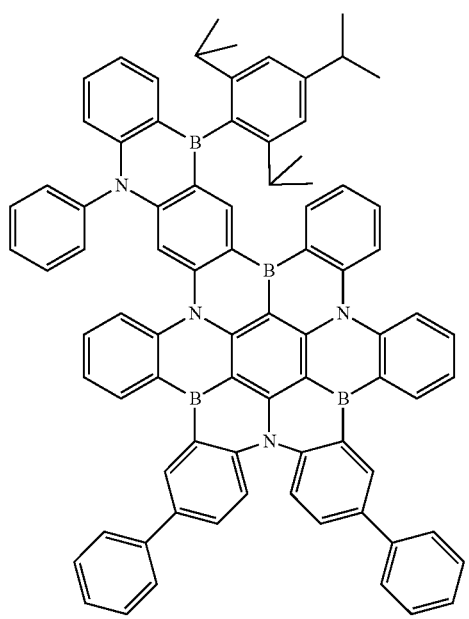
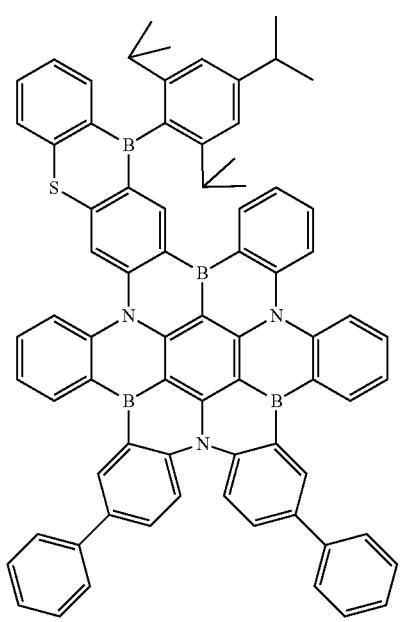
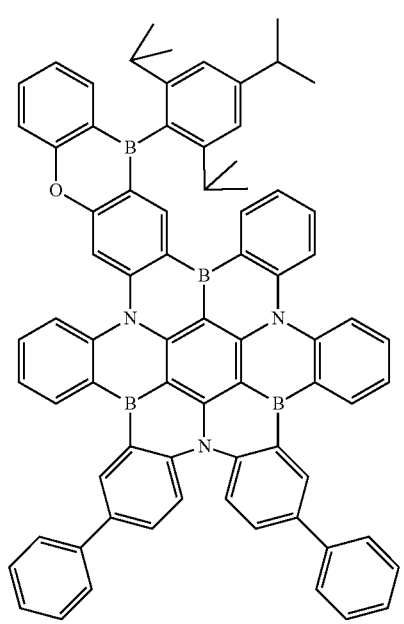
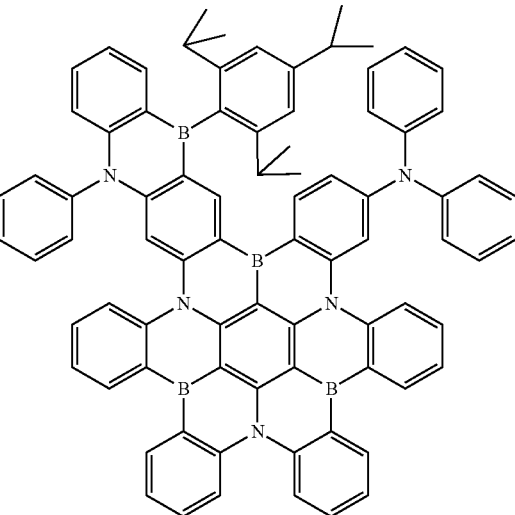

8
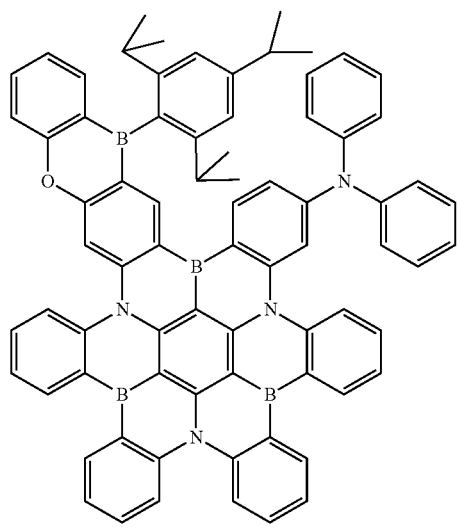
9
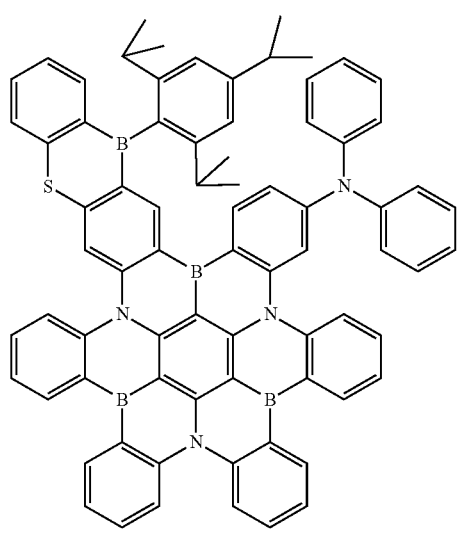
10
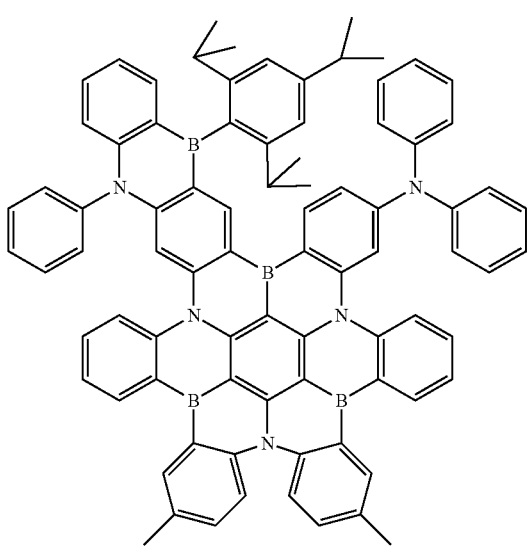
11
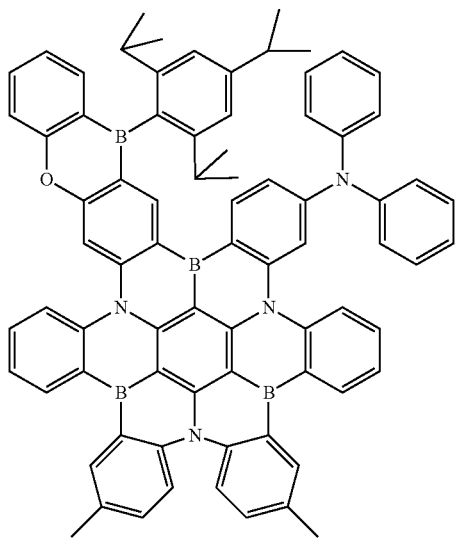
12
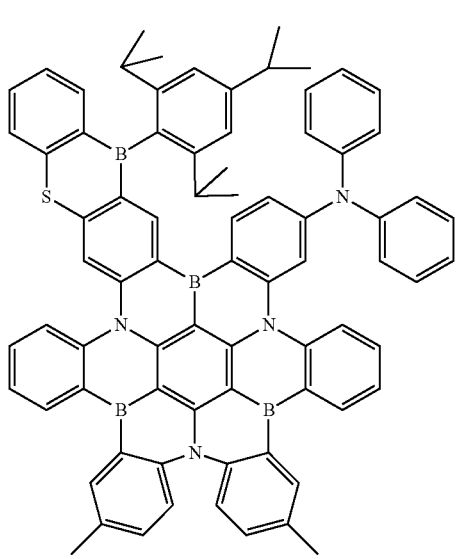
13
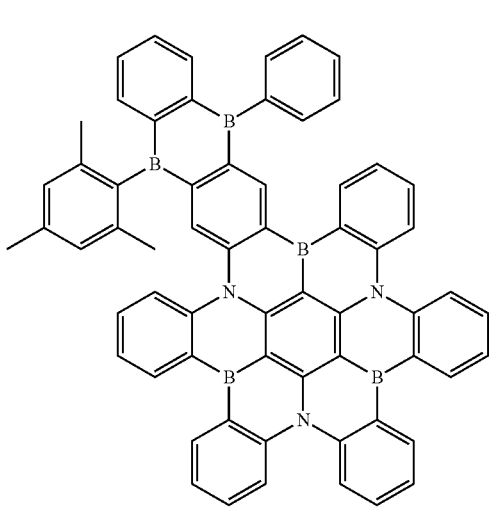

14
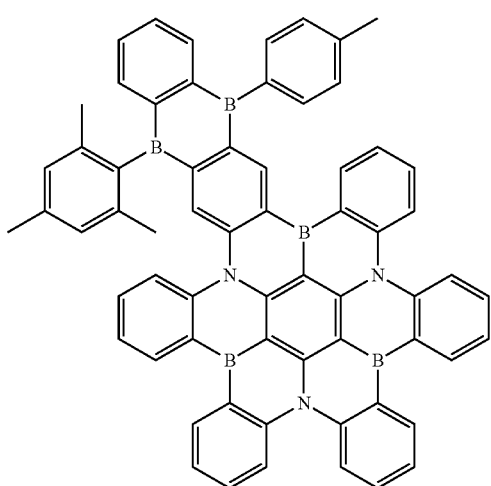
15
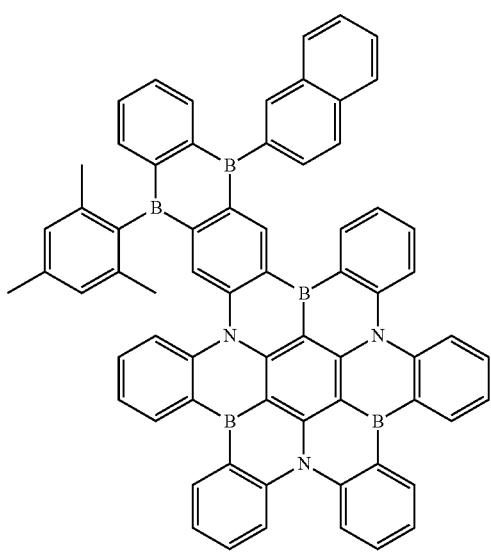
16
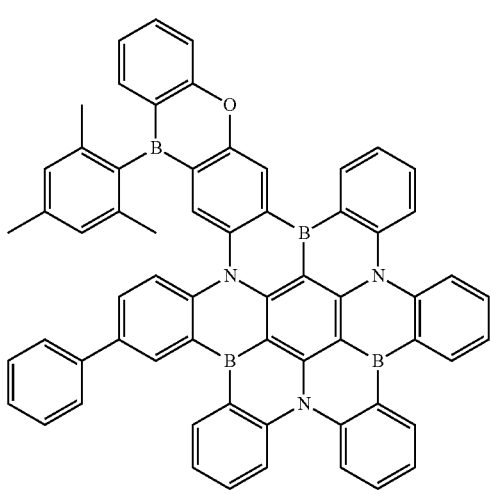
17
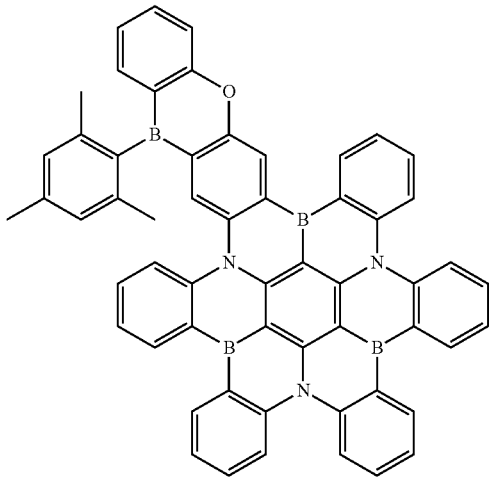
18
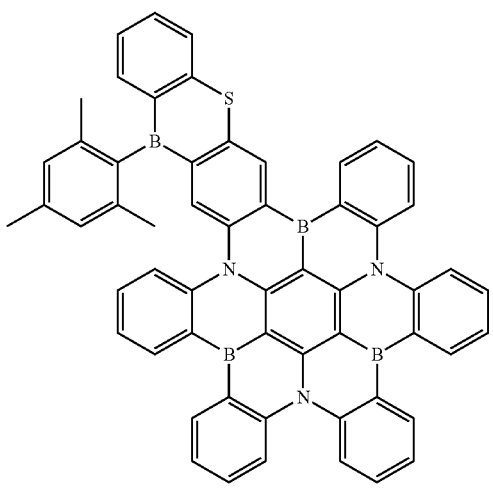
19
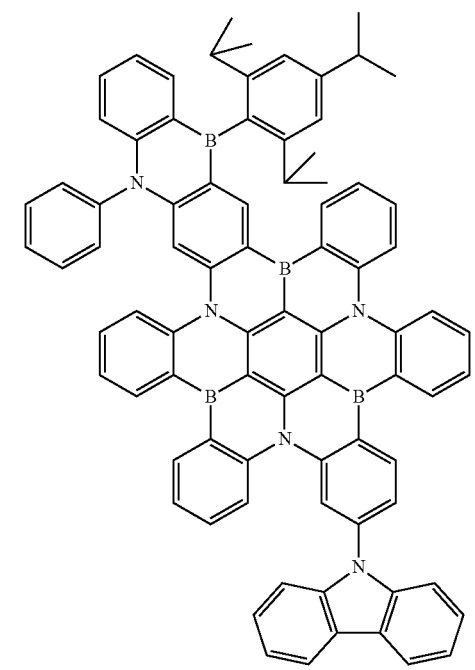

20
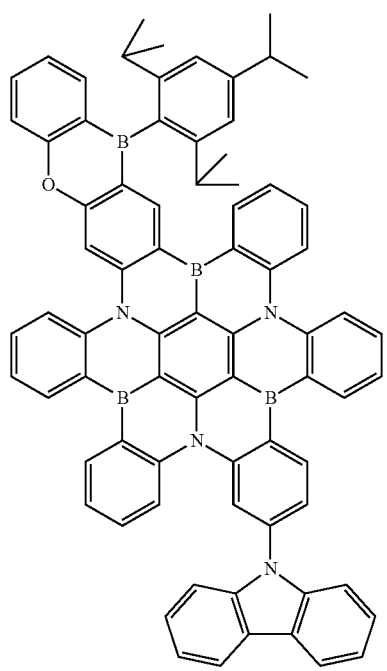
21
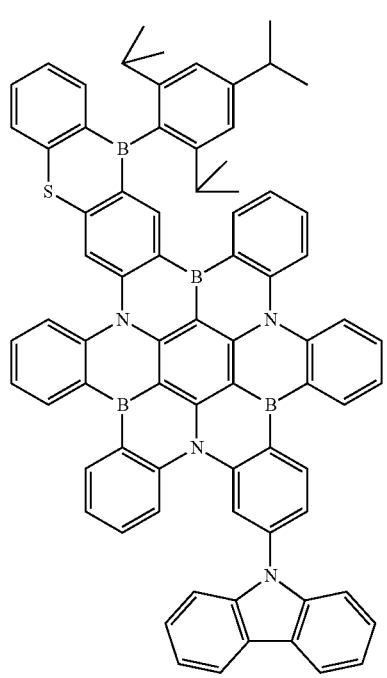
22
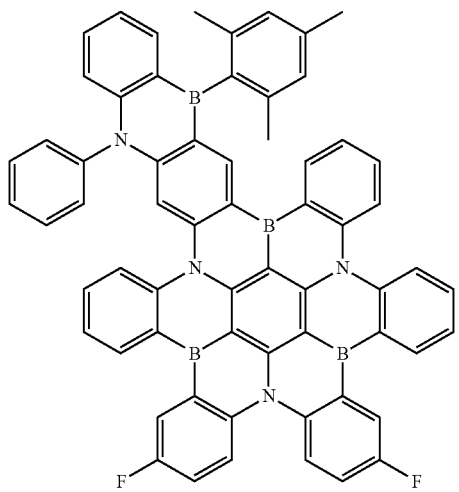
23
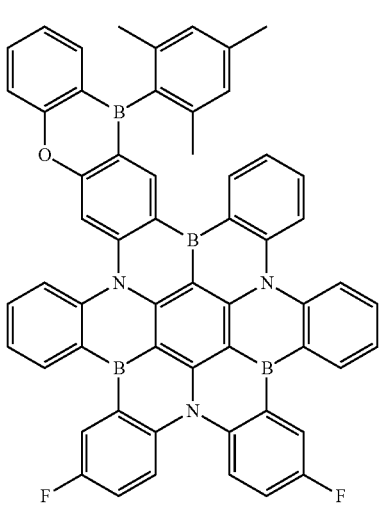
24
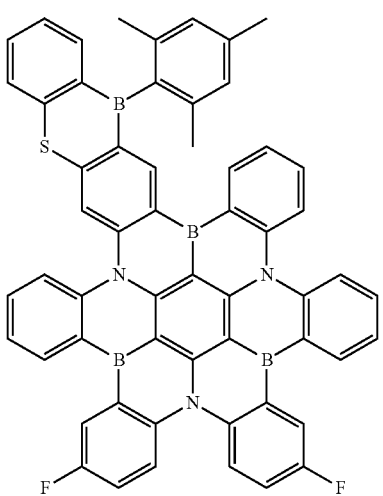

25
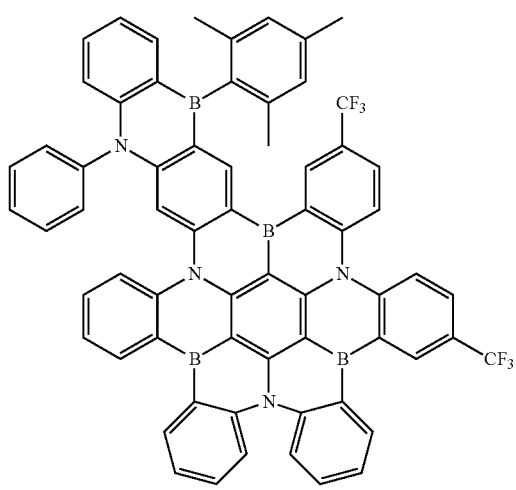
26
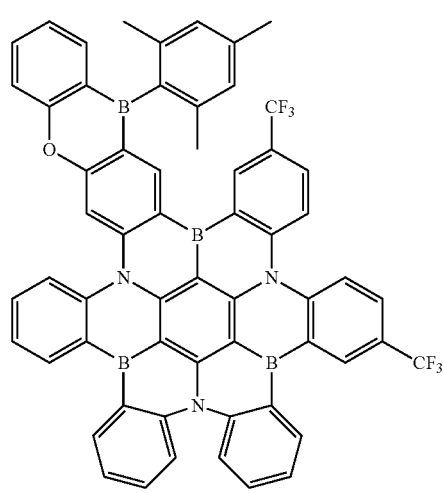
27
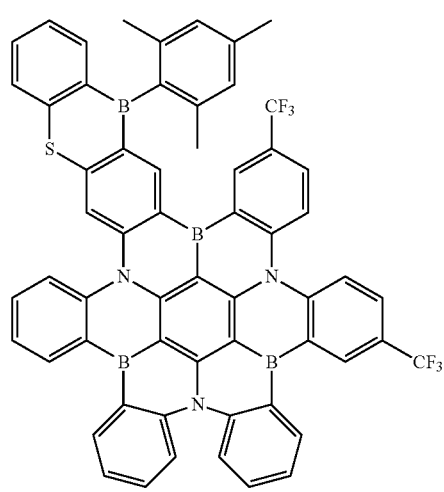
28
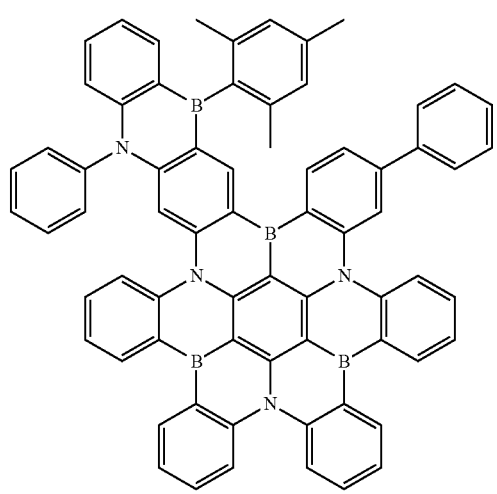
29
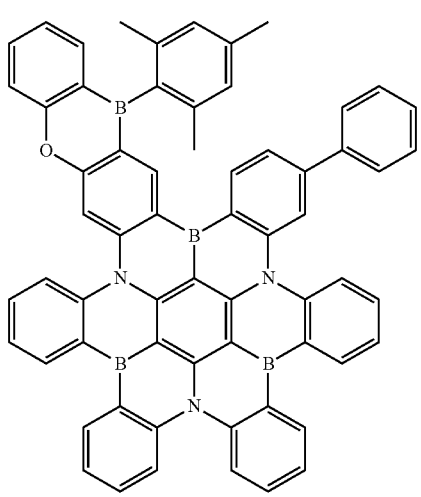
30
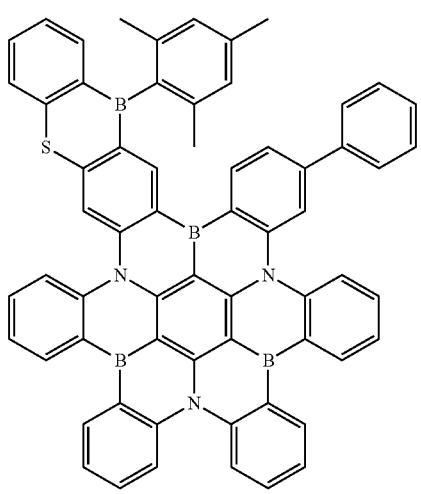

29
-continued
31
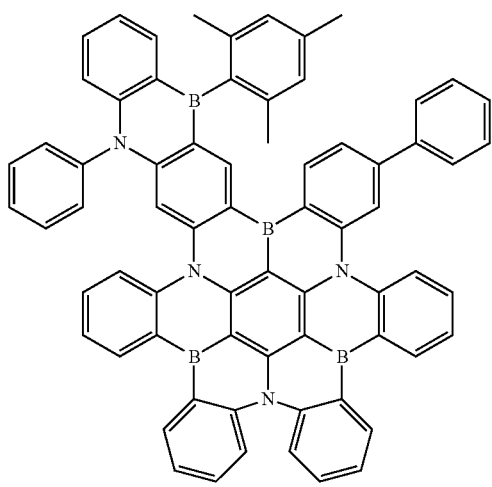
32
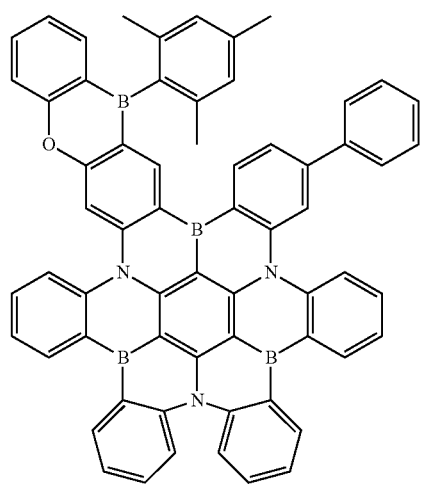
33
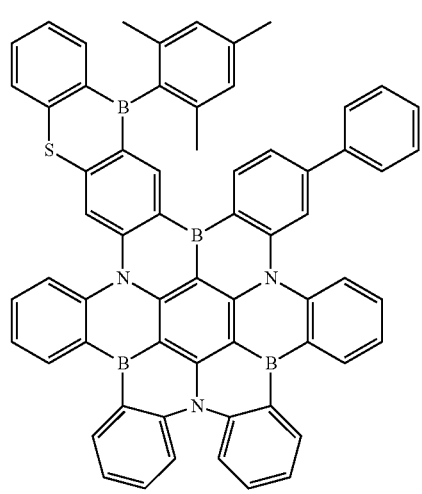
30
-continued
34
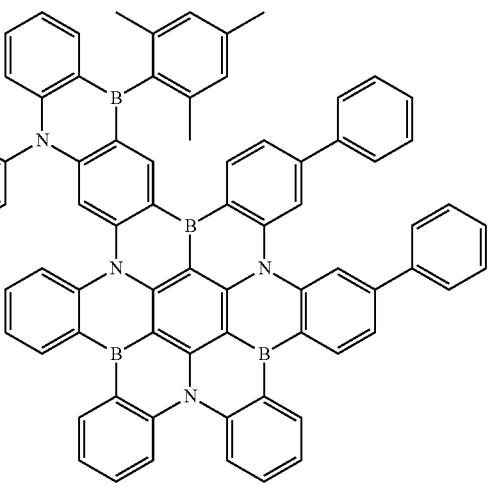
35
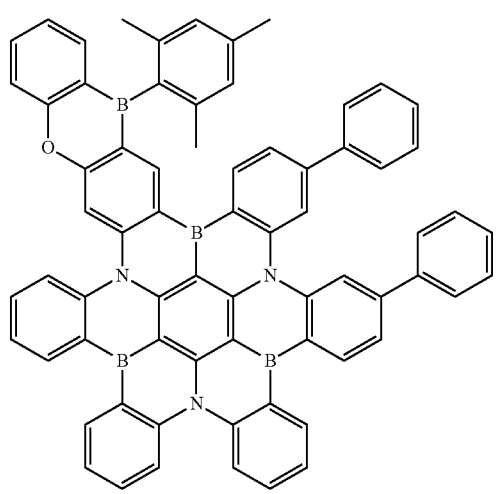
36
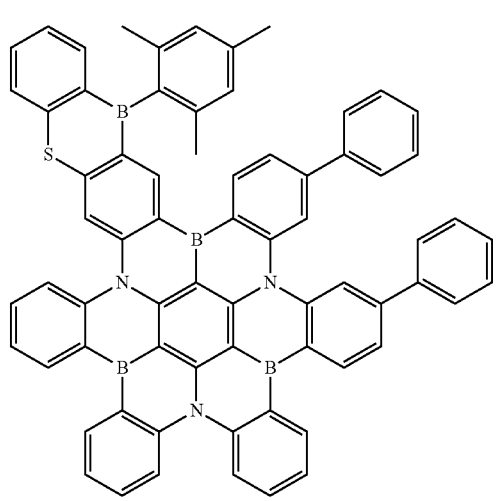

37
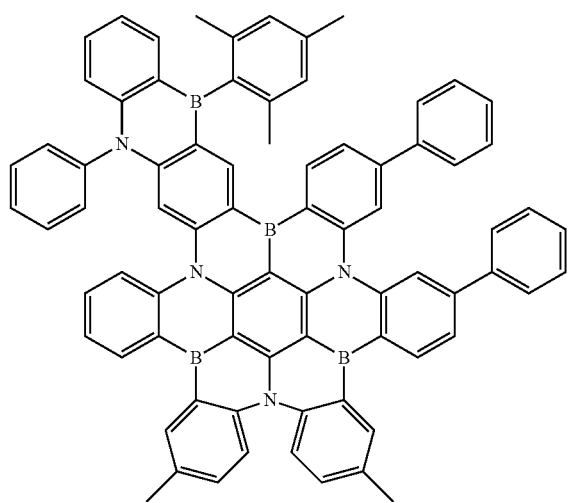
38
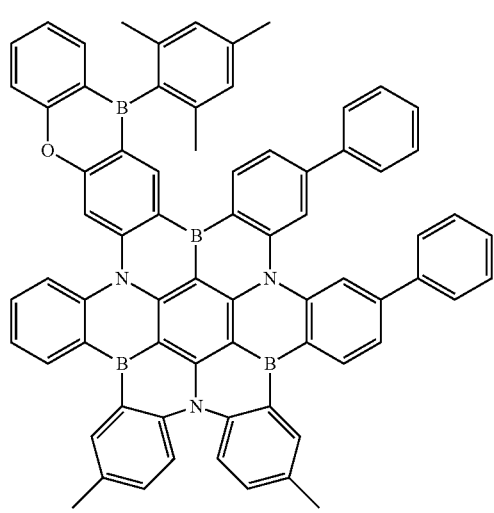
39
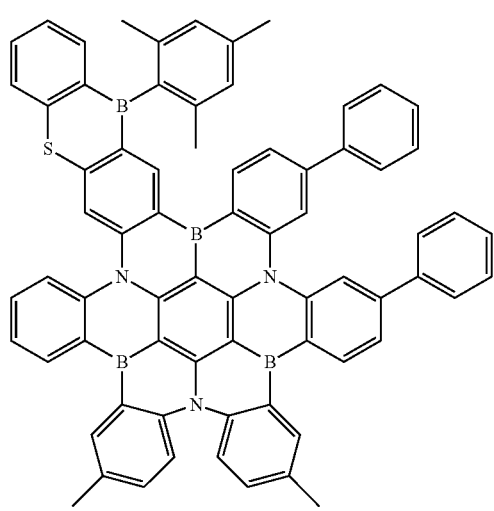
40
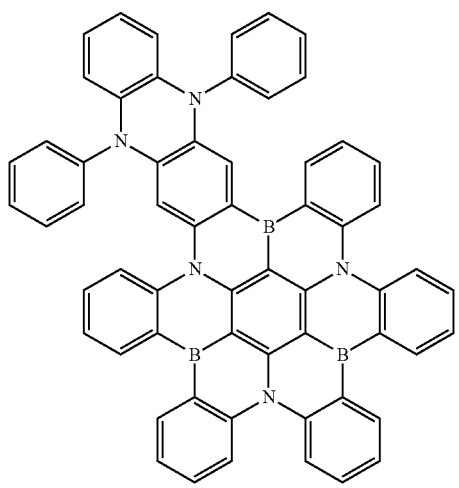
41
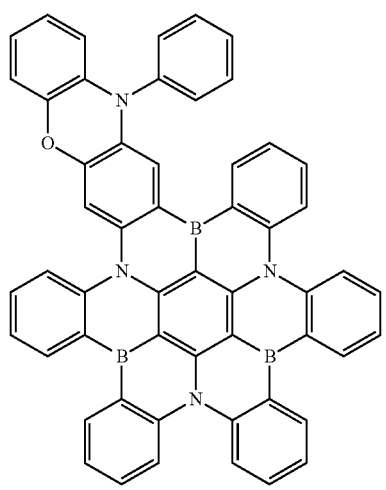
41-D
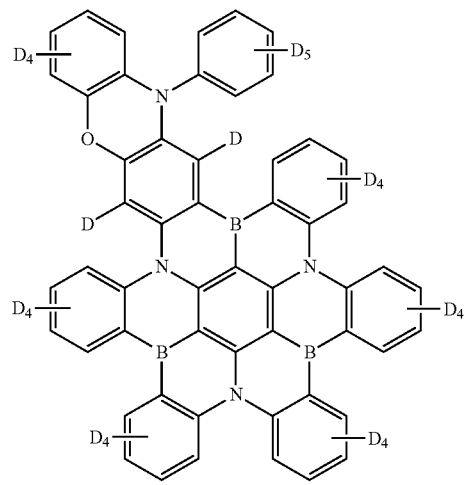

42
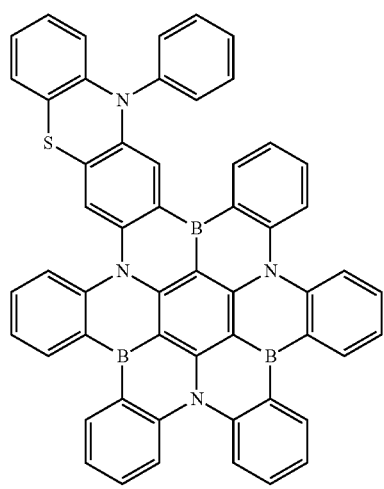
43
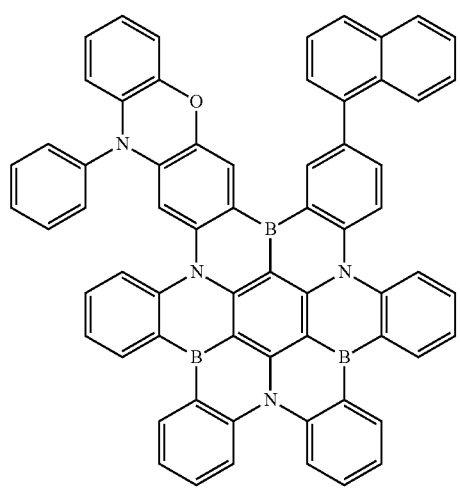
44
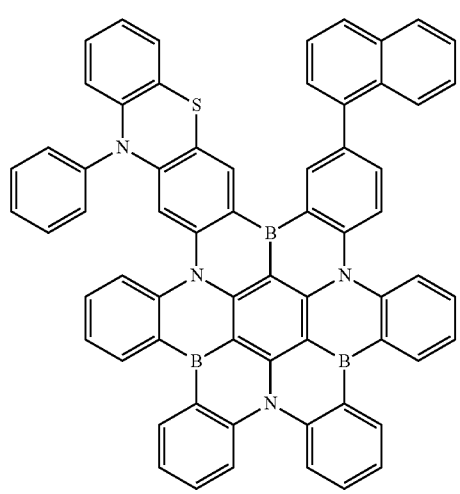
45
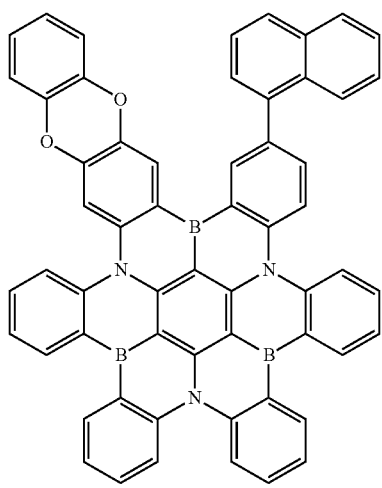
46
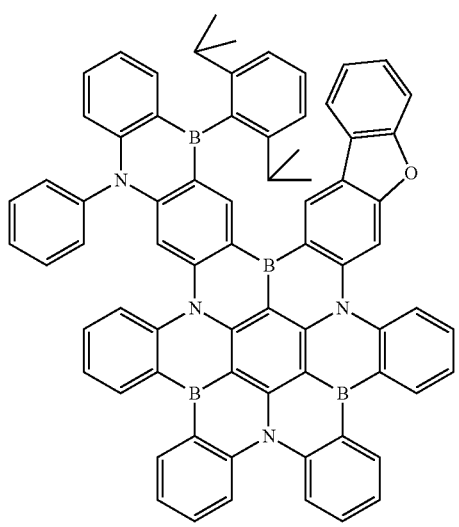
47
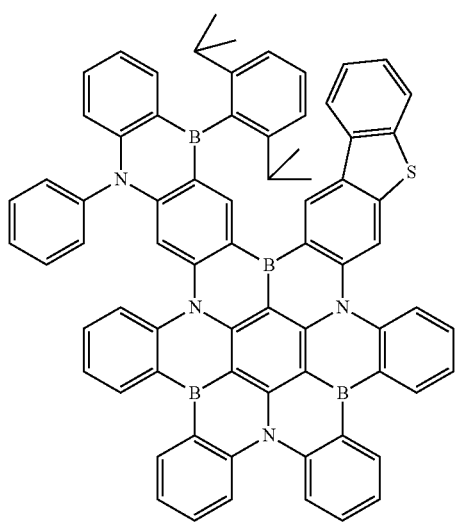

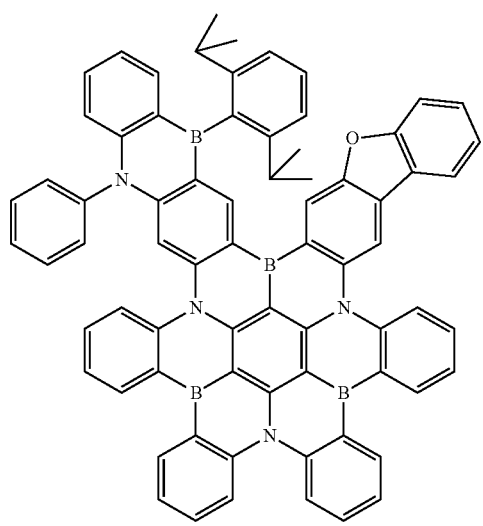
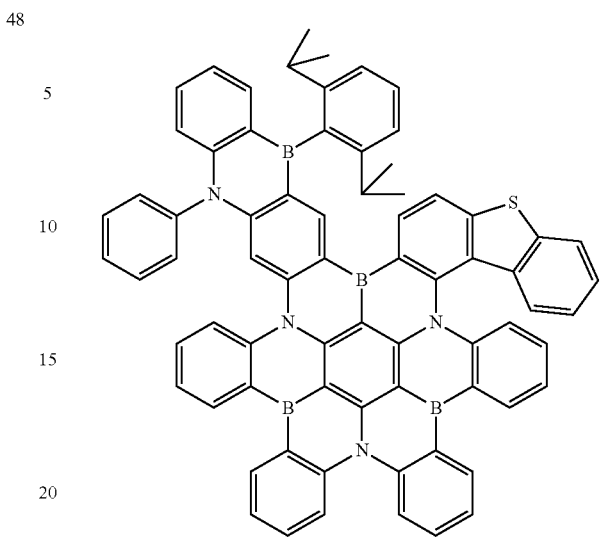

53
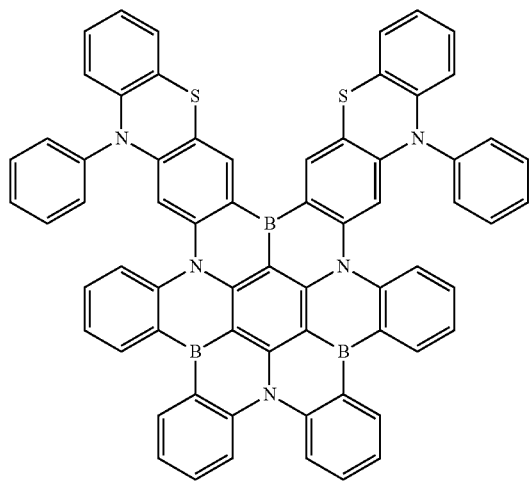
54
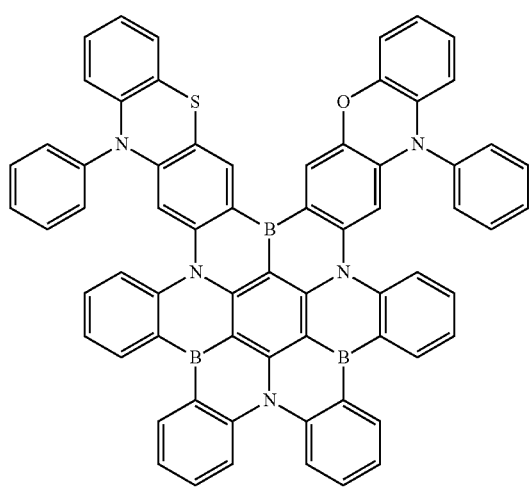
55
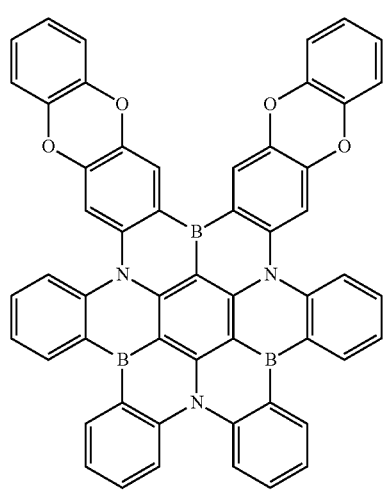
56
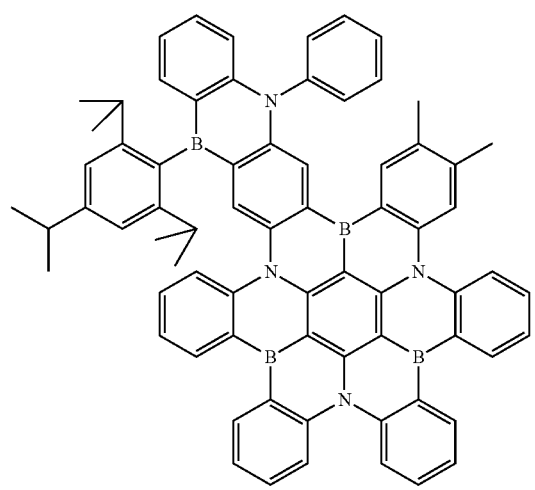
57
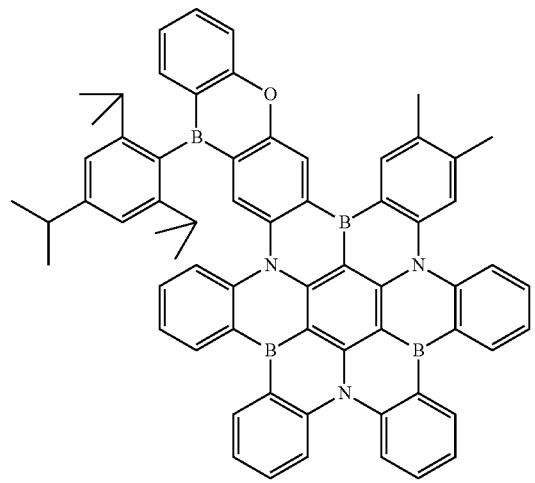
58
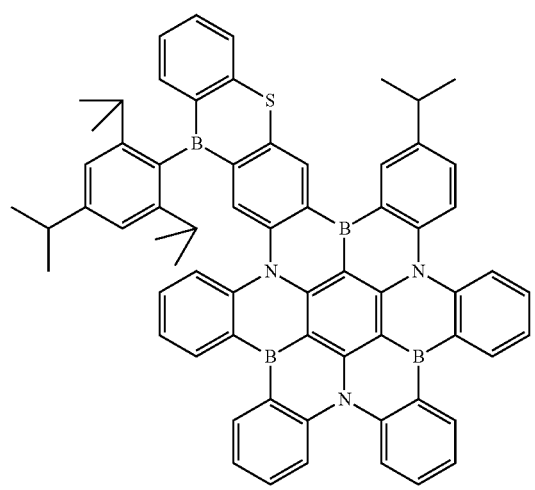

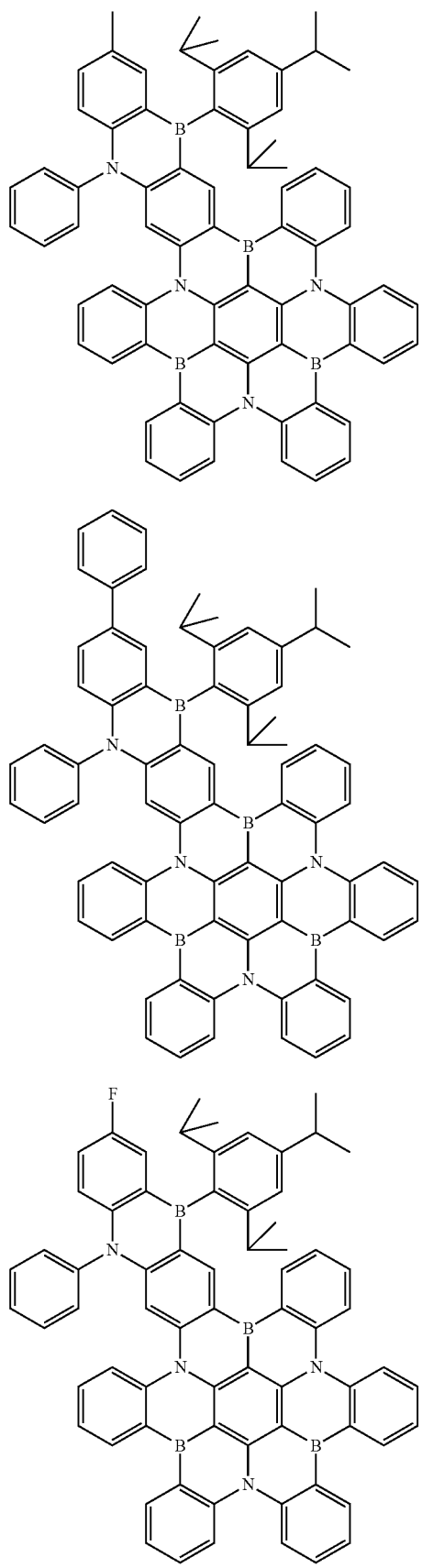
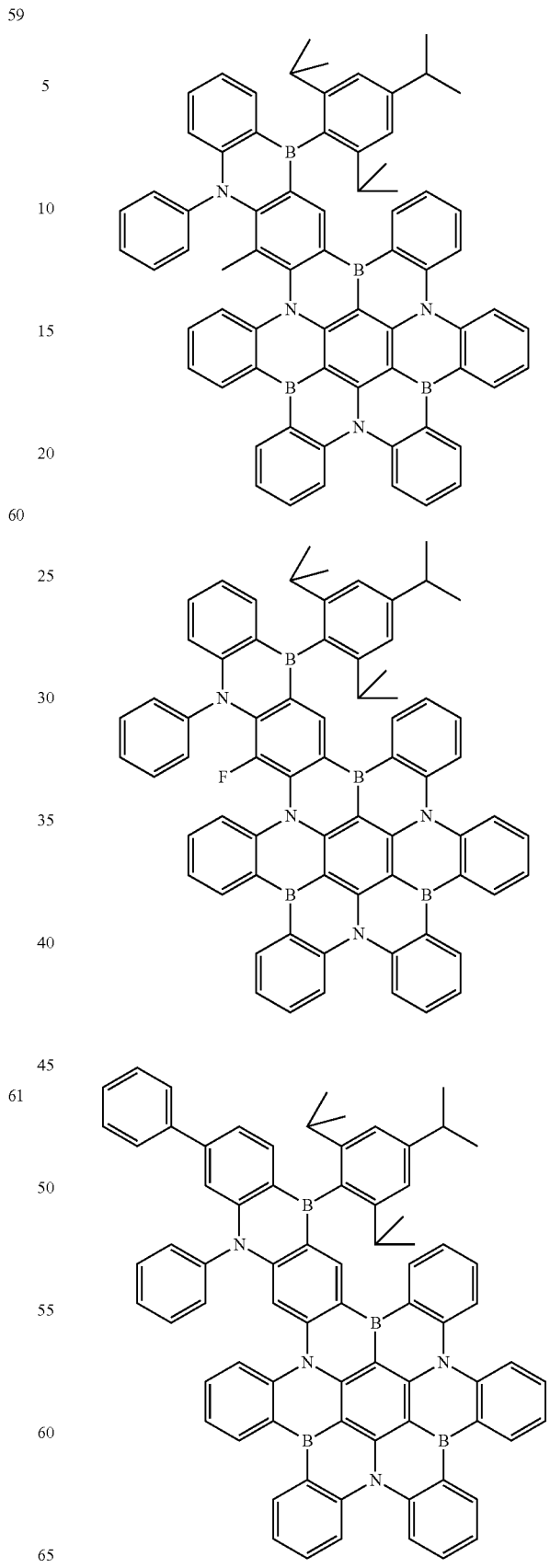

65
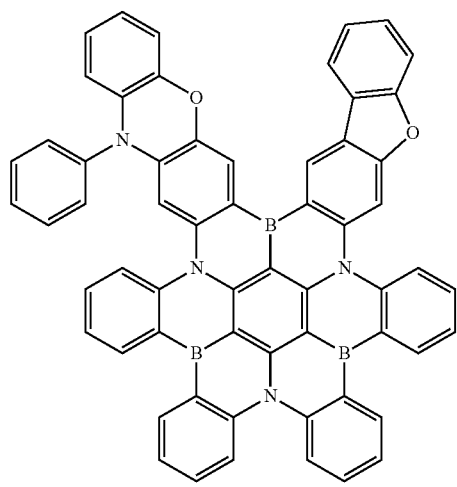
66
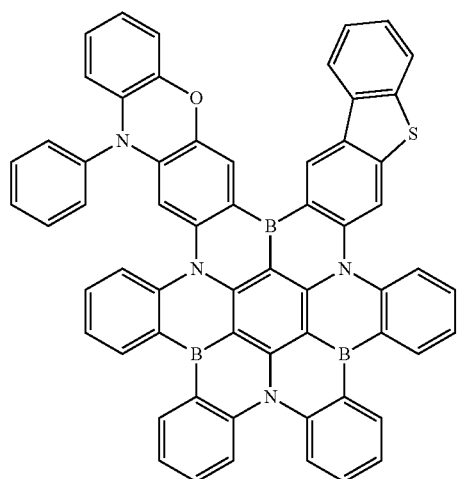
67
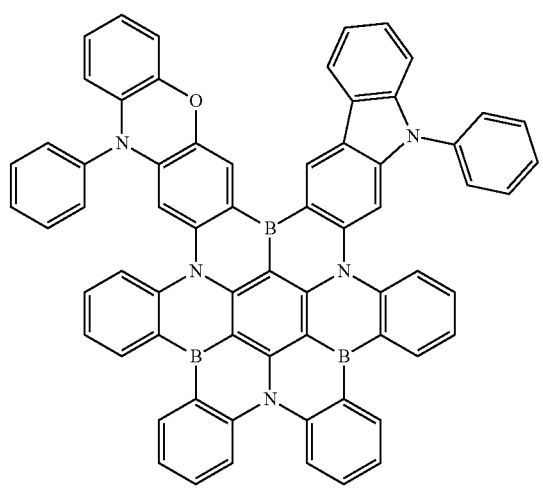
68
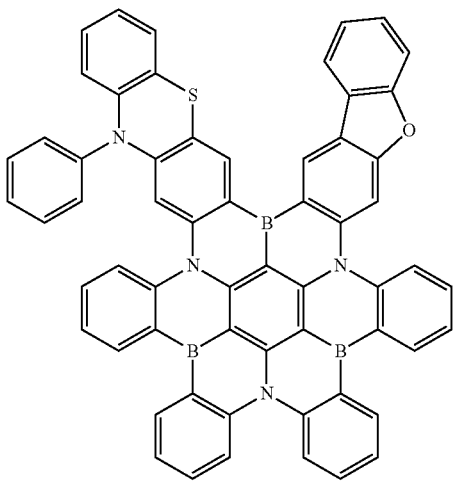
69
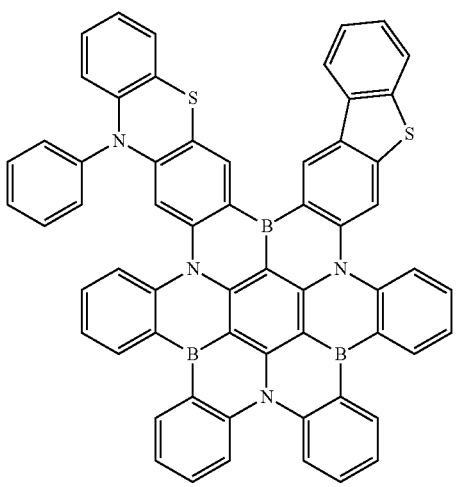
70
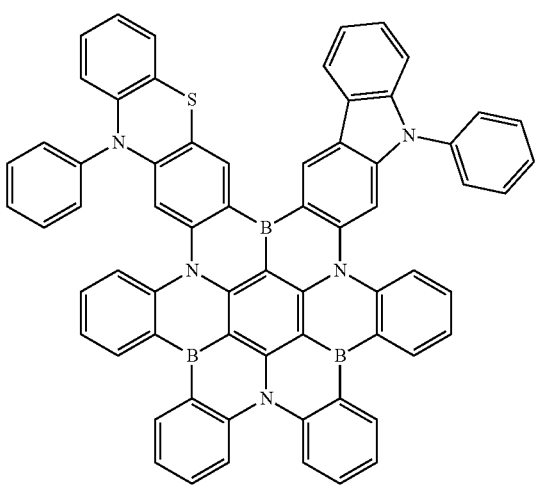

71
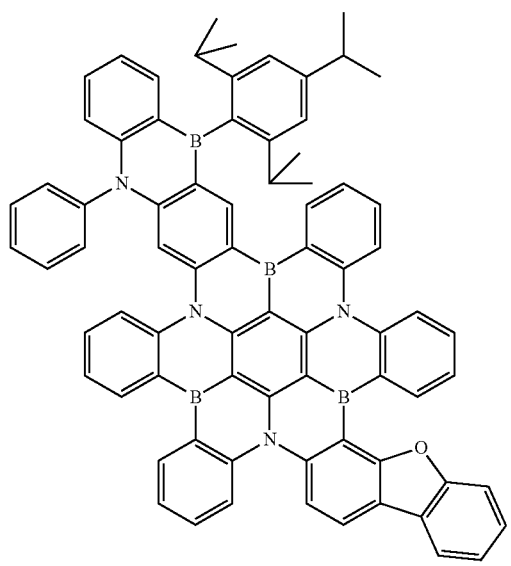
72
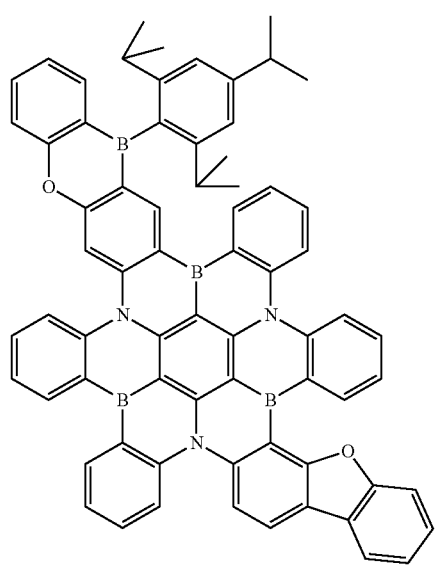
73
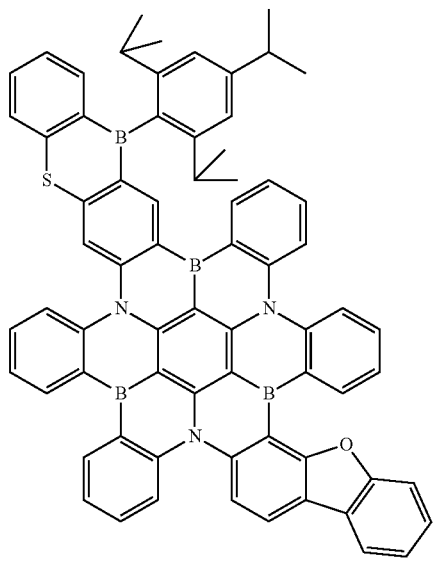
74
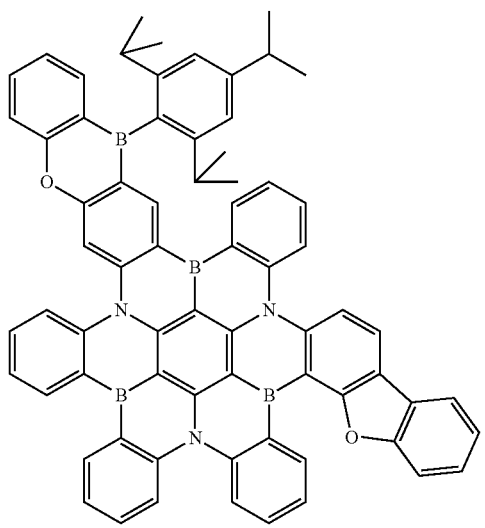
75

76
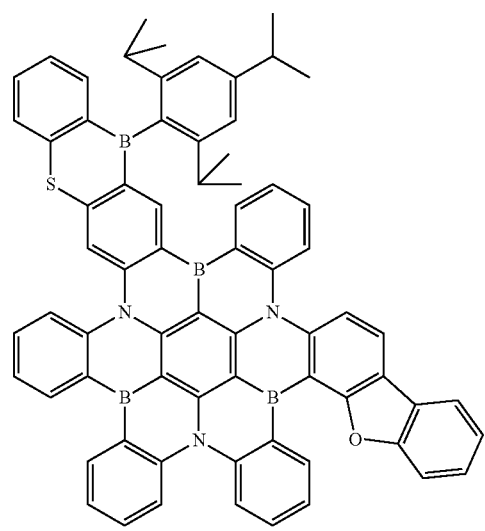
77
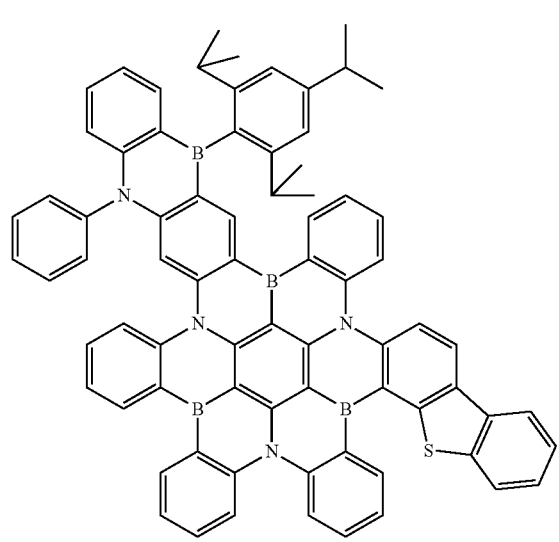
78
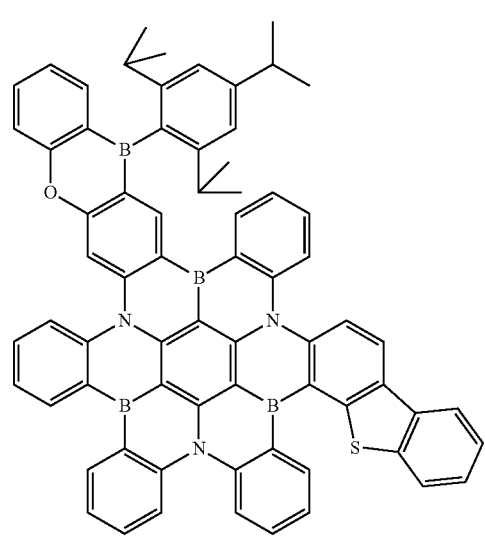
79
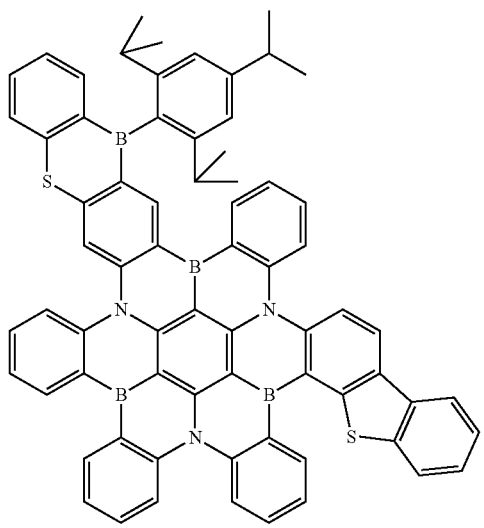
80
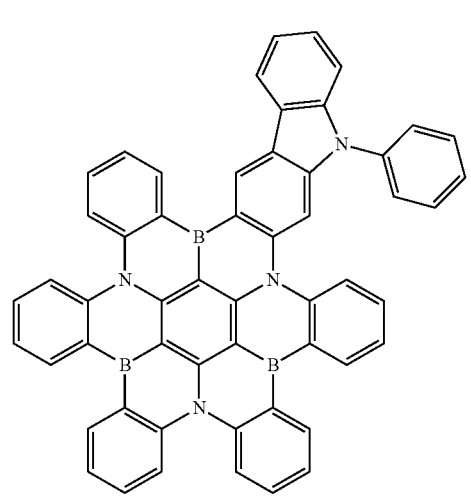
81
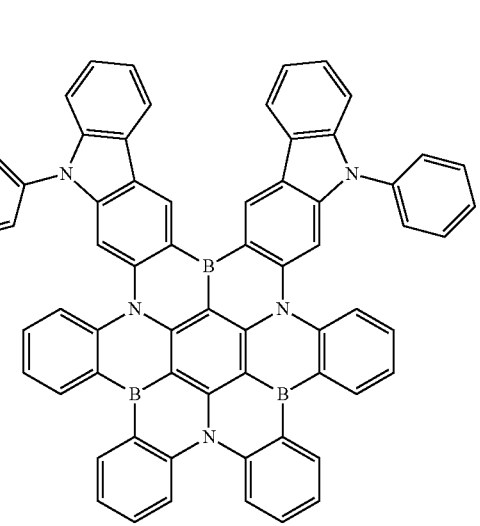

82
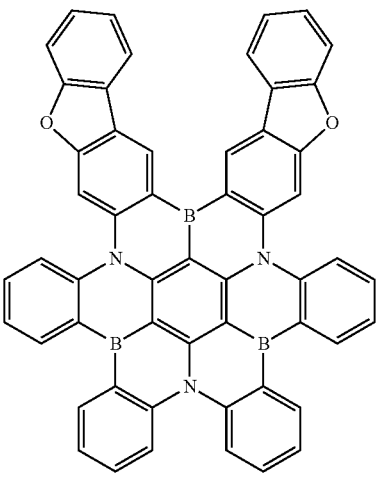
83
85
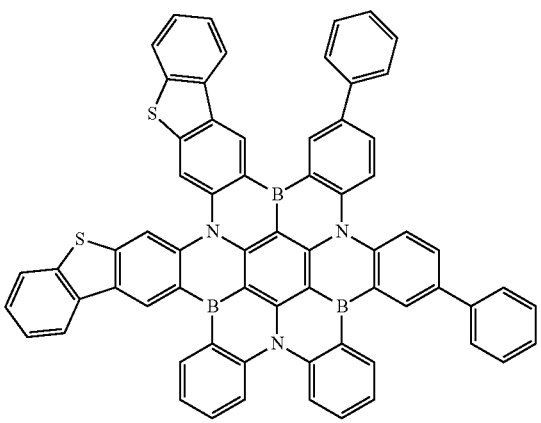
86
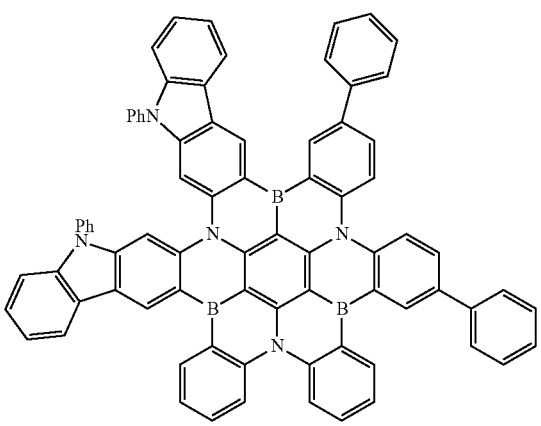
84
87
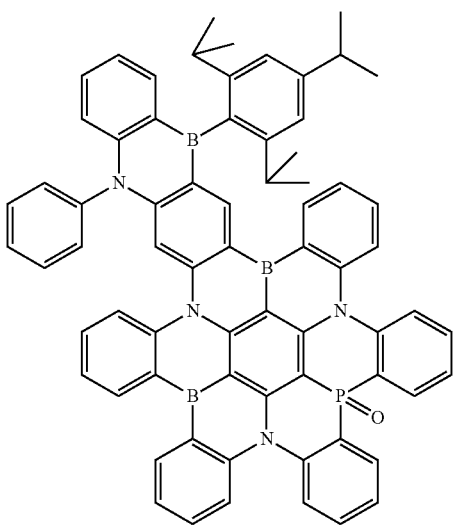

88
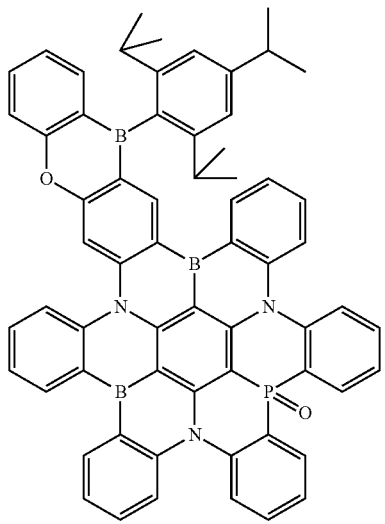
89
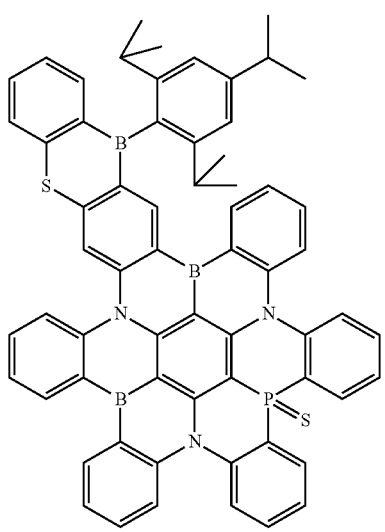
90
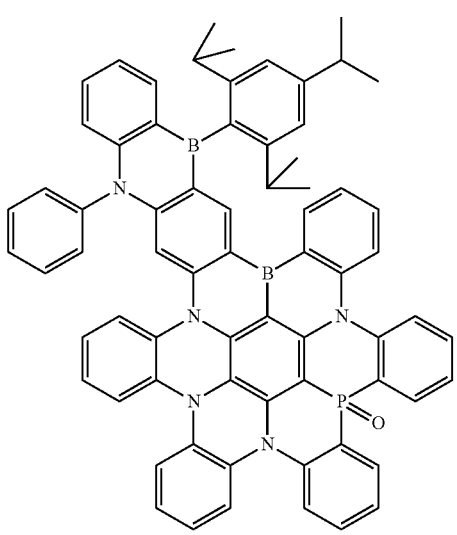
91
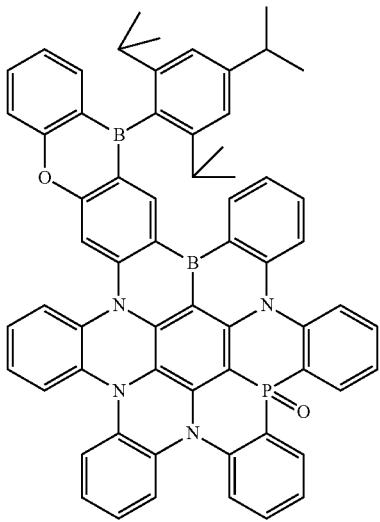
92
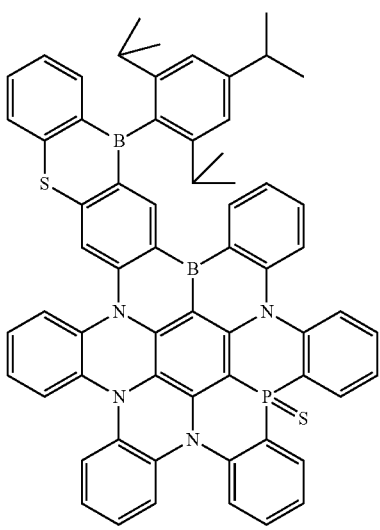
93
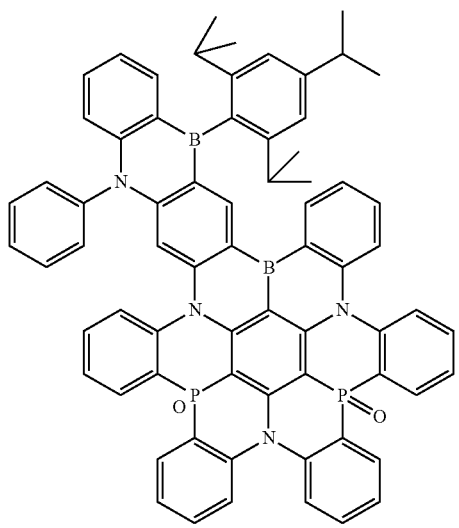

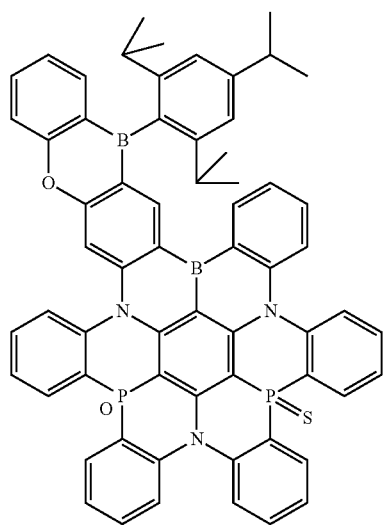
94
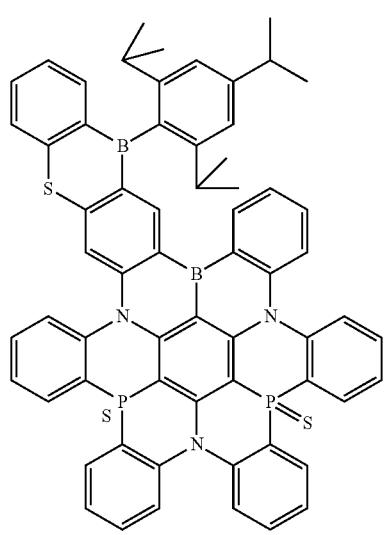
95
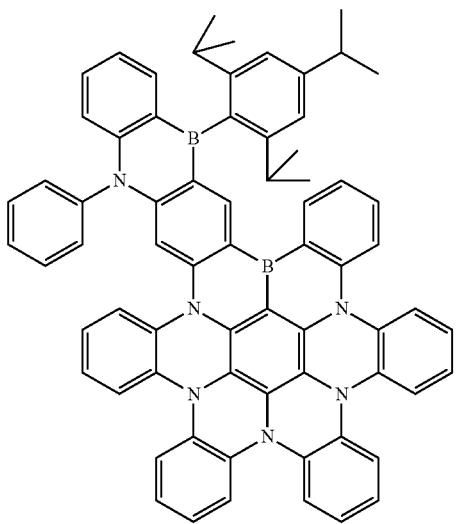
96
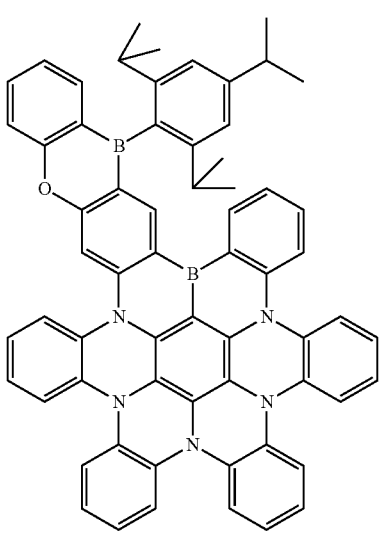
97
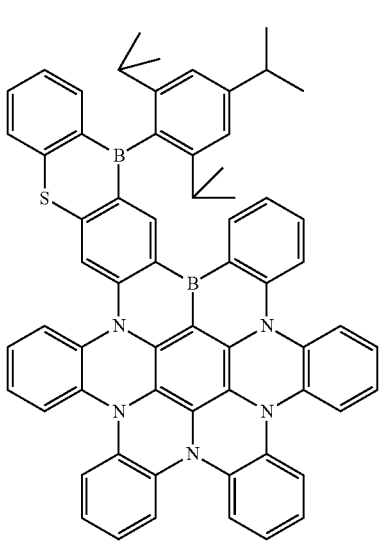
98
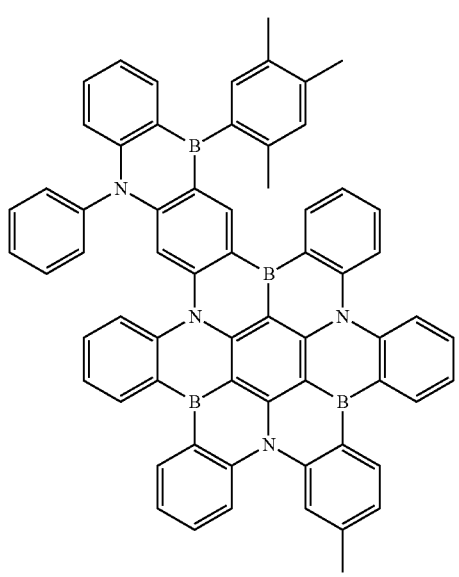
99

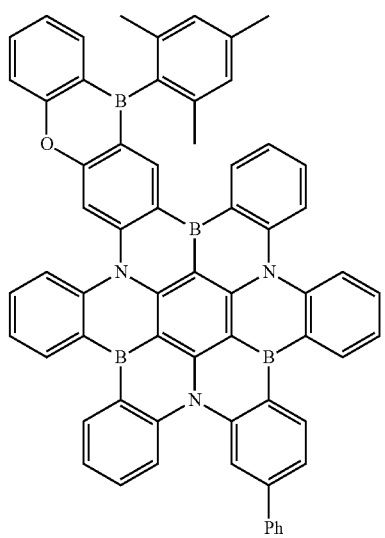
100
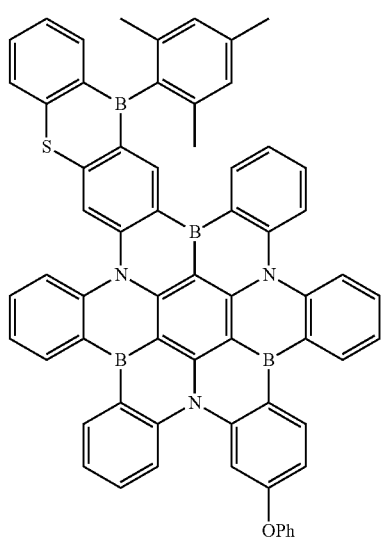
101
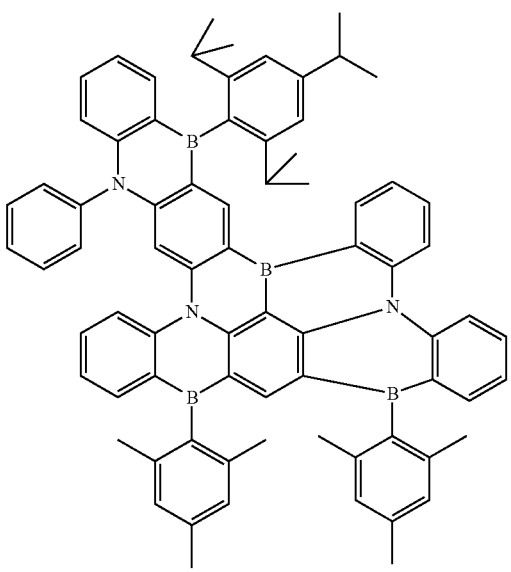
102
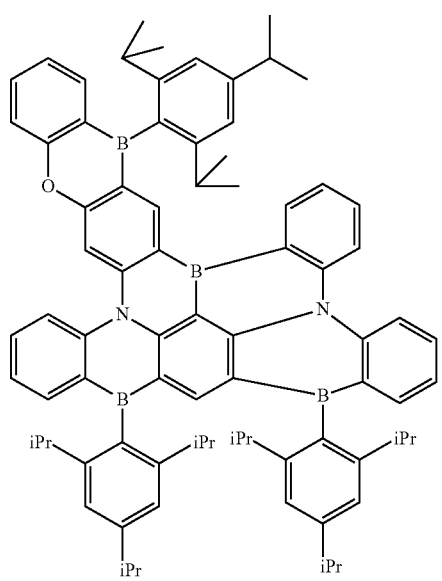
103
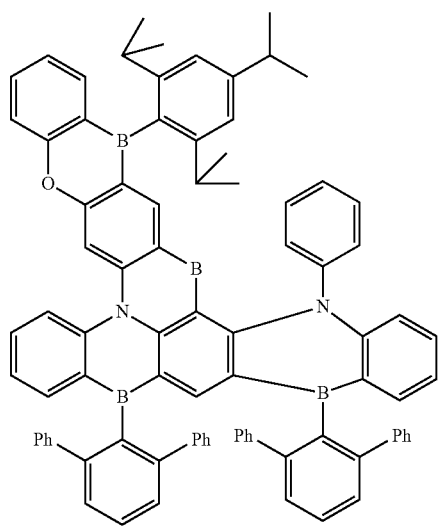
104

55
-continued
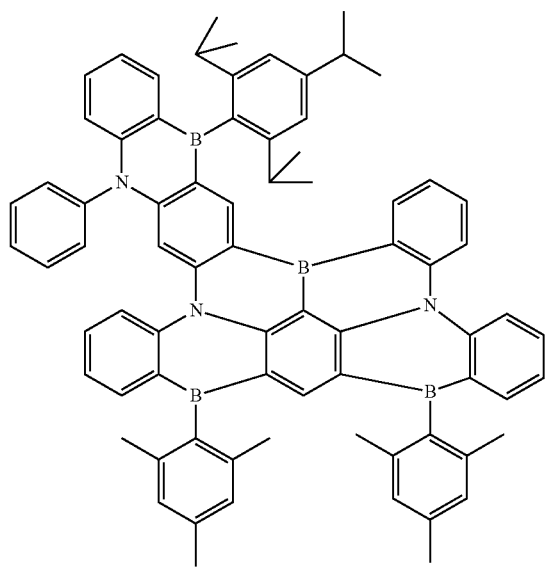
105
56
-continued
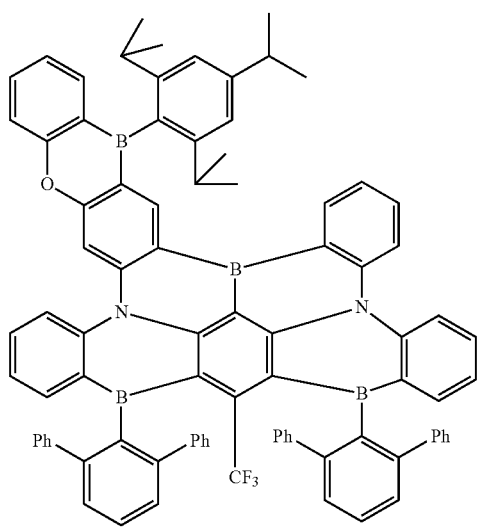
107
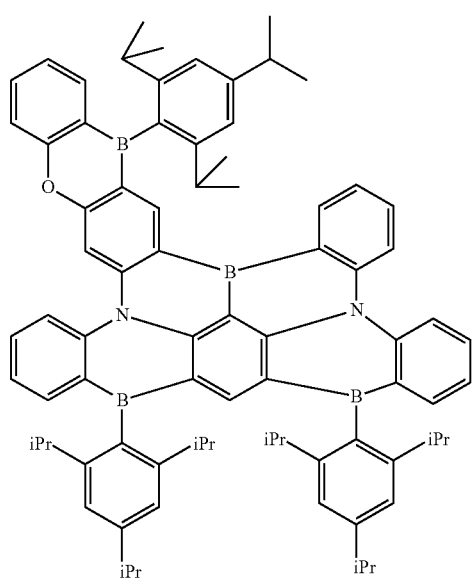
106
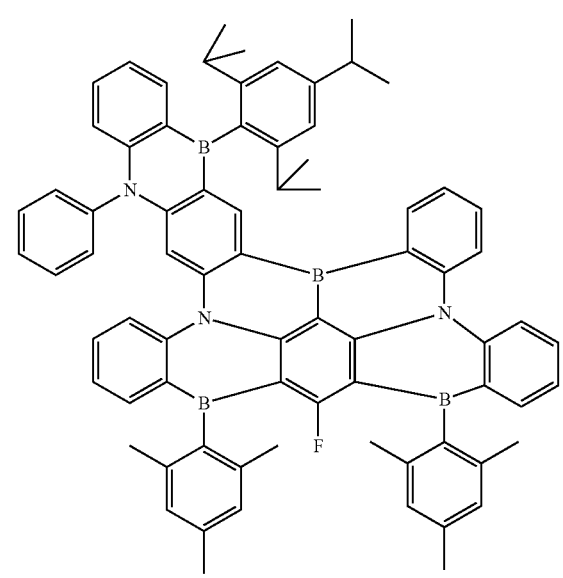
108

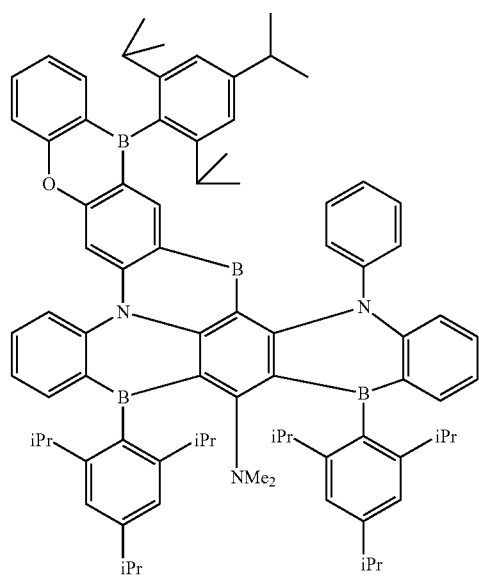
109
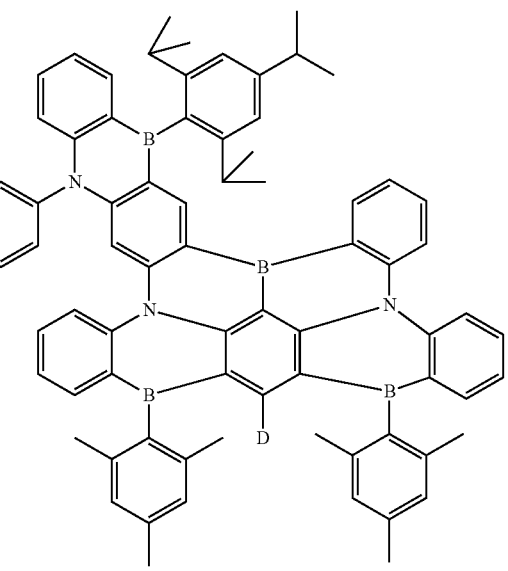
111
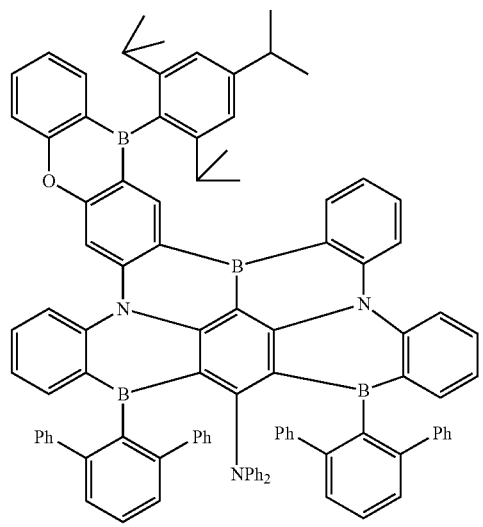
110
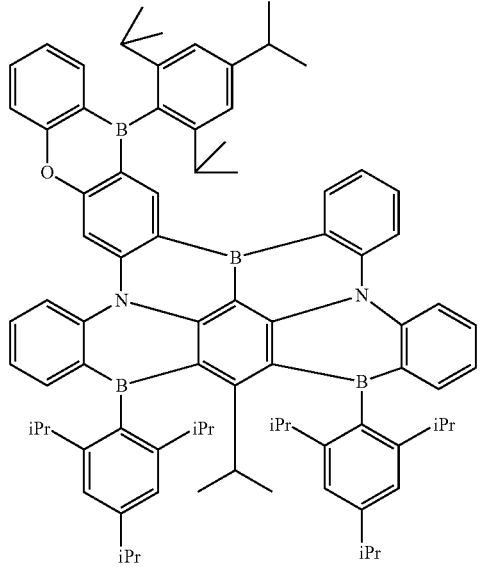
112

113
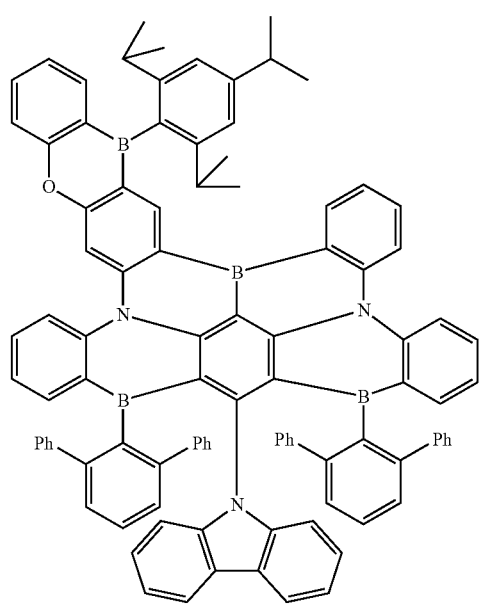
115
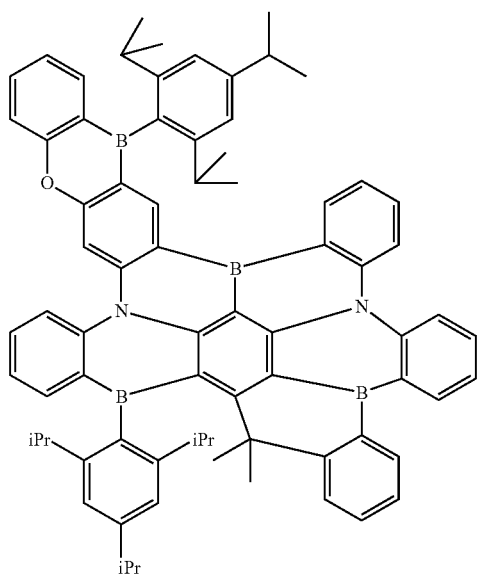
114
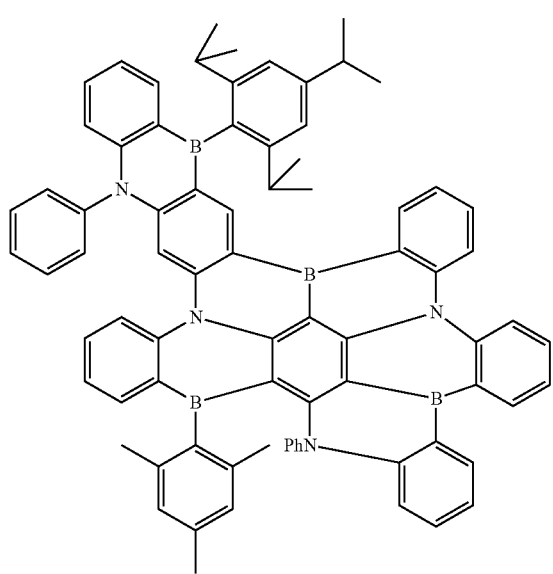
116
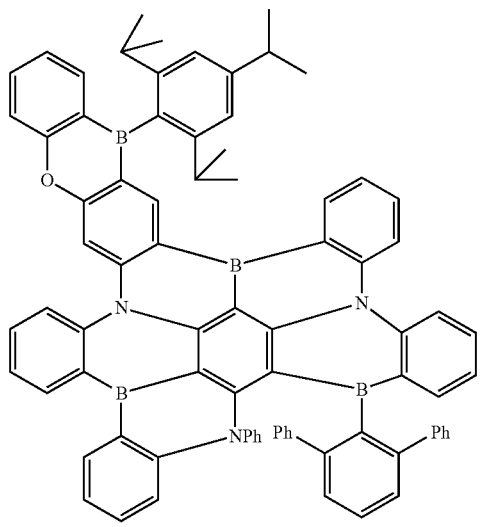

117
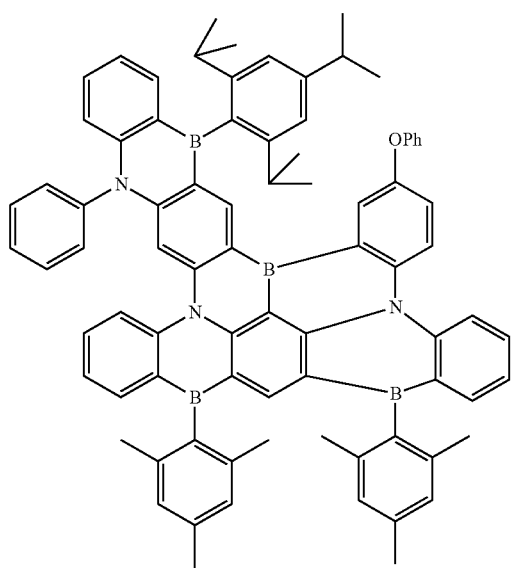
118
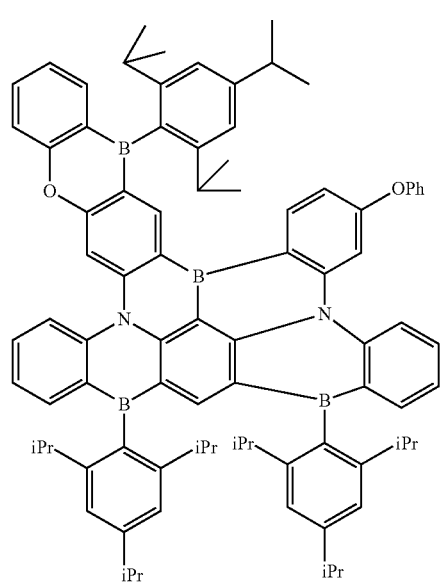
119
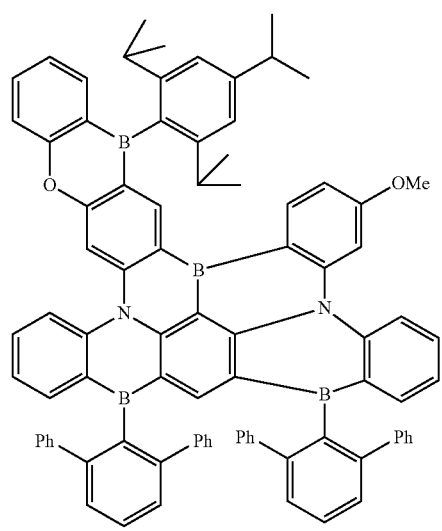
120
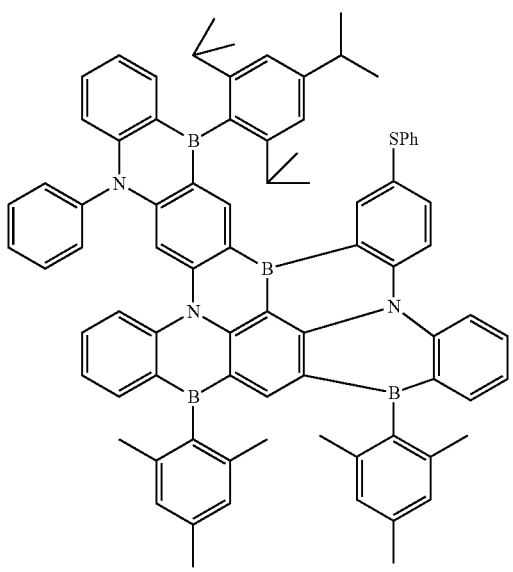
121
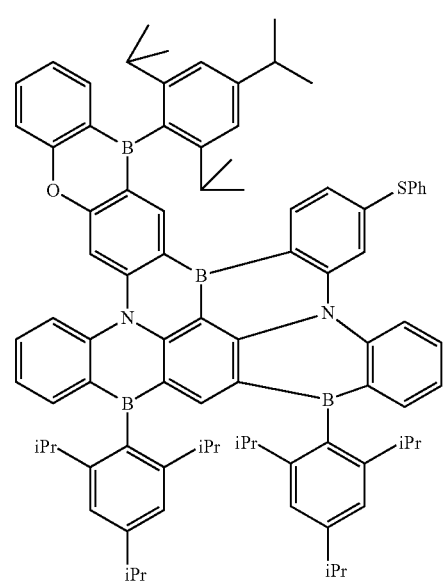
122
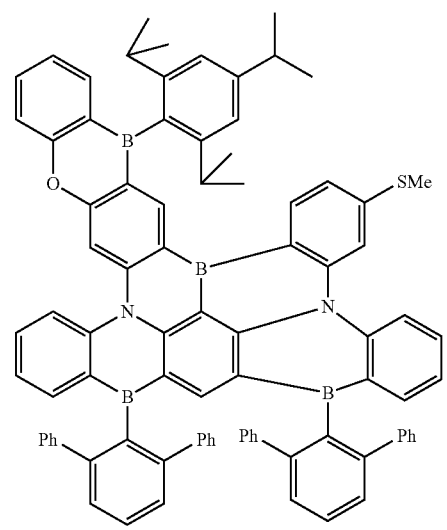

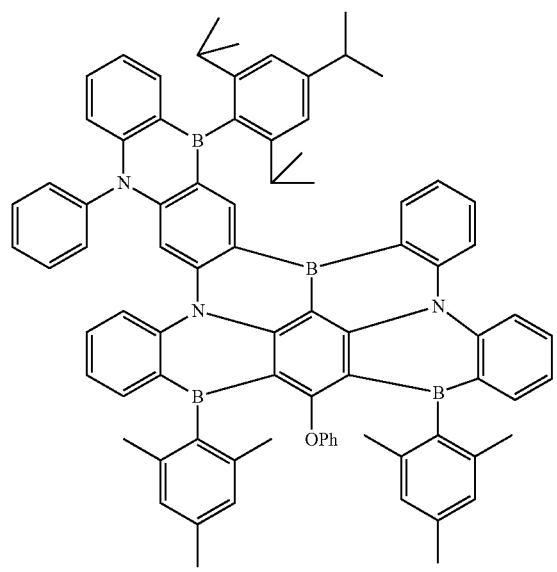
123
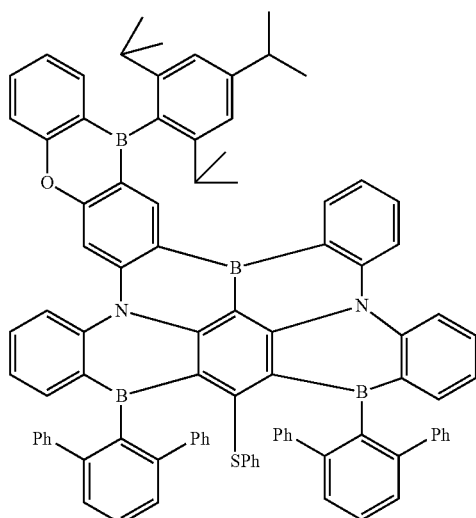
125
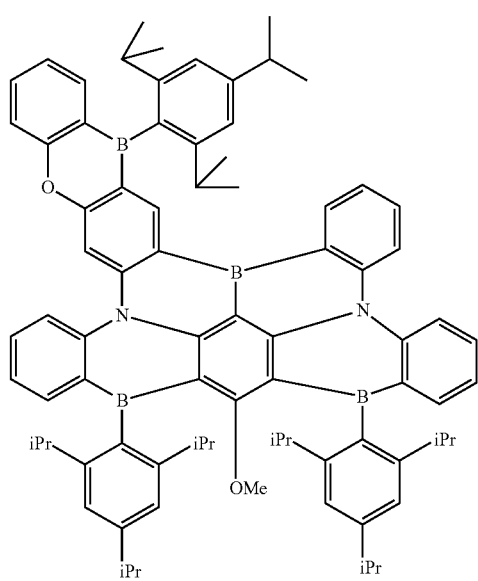
124
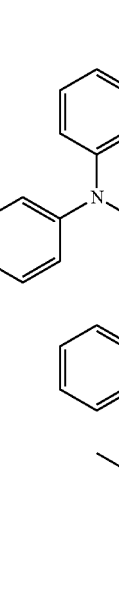
126

-continued

127

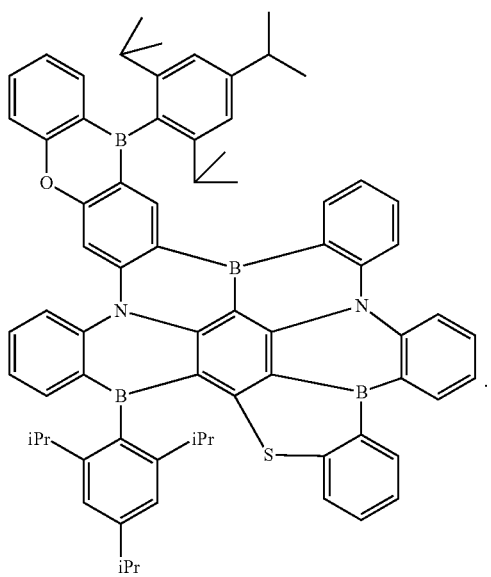

In one or more embodiments, in the compounds represented in Compound Group 1, at least one hydrogen atom may each independently be substituted with a deuterium atom.

The polycyclic compound may be used in the organic electroluminescence device 10 of one or more embodiments to improve the efficiency and life of the organic electroluminescence device. For example, the polycyclic compound may be used in the emission layer EML of the organic electroluminescence device 10 of one or more embodiments to improve the emission efficiency and life of the organic electroluminescence device.

In one or more embodiments, the emission layer EML may be a delayed fluorescence emission layer including a first compound and a second compound, and the polycyclic compound of one or more embodiments represented by Formula 1 may be included in the first compound of the emission layer EML. For example, the first compound may be a dopant, and the second compound may be a host.

In one or more embodiments, the host may be a host for emitting delayed fluorescence, and the dopant may be a dopant for emitting delayed fluorescence. In one or more embodiments, the polycyclic compound of one or more embodiments represented by Formula 1 may be included as the dopant material of the emission layer EML. For example, the polycyclic compound of one or more embodiments represented by Formula 1 may be used as a TADF dopant.

In one or more embodiments, the organic electroluminescence device 10 of one or more embodiments may include a plurality of emission layers. The plurality of emission layers may be stacked one by one. For example, the organic electroluminescence device 10 including a plurality of emission layers may emit white light. The organic electroluminescence device including the plurality of emission layers may be an organic electroluminescence device having a tandem structure. If the organic electroluminescence device 10 includes a plurality of emission layers, at least one emission layer EML may include the polycyclic compound according to the present disclosure as described above.

The emission layer EML may further include a dopant material, and the dopant may be any suitable material. For example, at least one among styryl derivatives (for example, 1,4-bis[2-(3-N-ethylcarbazoryl)vinyl]benzene (BCzVB), 4-(di-p-tolylamino)-4''-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and/or the derivatives thereof (for example, 2,5,8,11-tetra-t-butylperylene (TBP)), pyrene and/or the derivatives thereof (for example, 1,1-dipyrene, 1,4-dipyrenylbenzene, 1,4-bis(N,N-diphenylamino)pyrene, 1,6-bis(N,N-diphenylamino)pyrene, 2,5,8,11-tetra-t-butylperylene (TBP), and/or 1,3,5-tris(1-phenyl-1H-benzo[d]imidazole-2-yl)benzene (TPBi)), etc. may be used as the dopant, without limitation.

The emission layer EML may further include other suitable host materials.

For example, the emission layer EML may include, as a host material, at least one among tris(8-hydroxyquinolino) aluminum ($Alq_3$), bis[2-(diphenylphosphino)phenyl]ether oxide (DPEPO), 4,4'-bis(N-carbazol-9-yl)biphenyl (CBP), 1,3-bis(carbazol-9-yl)benzene (mCP), 2,8-bis(diphenylphosphoryl)dibenzo[b,d]furan (PPF), 4,4',4''-tris(carbazol-9-yl)-triphenylamine (TCTA), poly(N-vinylcarbazole) (PVK), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH-2), hexaphenylcyclotrisiloxane ($DPSiO_3$), octaphenylcyclotetrasiloxane ($DPSiO_4$), 2,8-bis(diphenylphosphoryl)dibenzofuran (PPF), and 1,3,5-tris(1-phenyl-1H-benzo[d]imidazol-2-yl)benzene (TPBi), without limitation.

In case where the emission layer EML is to emit red light, the emission layer EML may further include, for example, a fluorescence material including tris(dibenzoylmethanato) phenanthroline europium ($PBD:Eu(DBM)_3(Phen)$) and/or perylene. In case where the emission layer EML is to emit red light, the dopant included in the emission layer EML may be selected from, for example, a metal complex or an organometallic complex (such as bis(1-phenylisoquinoline) acetylacetonate iridium (PIQIr(acac)), bis(1-phenylquinoline)acetylacetonate iridium (PQIr(acac)), tris(1-phenylquinoline)iridium (PQIr) and/or octaethylporphyrin platinum (PtOEP), rubrene and the derivatives thereof, and 4-dicyanomethylene-2-(p-dimethylaminostyryl)-6-methyl-4H-pyrane (DCM) and the derivatives thereof.

In case where the emission layer EML is to emit green light, the emission layer EML may further include, for example, a fluorescence material including tris(8-hydroxyquinolino)aluminum ($Alq_3$). In case where the emission layer EML is to emit green light, the dopant included in the emission layer EML may be selected from, for example, a metal complex or an organometallic complex (such as fac-tris(2-phenylpyridine)iridium ($Ir(ppy)_3$), and coumarin and the derivatives thereof.

In case where the emission layer EML is to emit blue light, the emission layer EML may further include a fluorescence material including at least one selected from the group consisting of spiro-DPVBi, spiro-6P, distyryl-benzene (DSB), distyryl-arylene (DSA), a polyfluorene (PFO)-based polymer and a poly(p-phenylene vinylene (PPV)-based polymer. In case where the emission layer EML is to emit blue light, the dopant included in the emission layer EML may be selected from, for example, a metal complex or an organometallic complex (such as (4,6-F2ppy)2Irpic), and perylene and the derivatives thereof.

In the organic electroluminescence device 10 of one or more embodiments, as shown in FIGS. 1 to 4, the electron transport region ETR is provided on the emission layer EML. The electron transport region ETR may include at least one of an electron blocking layer HBL, an electron transport layer ETL or an electron injection layer EIL. However, the embodiments of the present disclosure are not limited thereto.

The electron transport region ETR may have a single layer (e.g., a single layer structure) formed using (e.g., consisting of) a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In some embodiments, the electron transport region ETR may have a single layer structure having a plurality of different materials, or a structure stacked from the emission layer EML of electron transport layer ETL/ electron injection layer EIL, or hole blocking layer HBL/ electron transport layer ETL/electron injection layer EIL, without limitation. The thickness of the electron transport region ETR may be, for example, from about 1,000 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include an anthracene-based compound. The electron transport region may include an anthracene compound. The electron transport region may include, for example, tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, bis[2-(diphenylphosphino)phenyl]ether oxide (DPEPO), 2-(4-(N-phenylbenzoimidazole-1-yl phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate (Bebq$_2$), 9,10-di(naphthalene-2-yl)anthracene (ADN), or a mixture thereof, without limitation. The thickness of the electron transport layer ETL may be from about 100 Å to about 1,000 Å and may be, for example, from about 150 Å to about 500 Å. If the thickness of the electron transport layer ETL satisfies the above-described range, satisfactory (or suitable) electron transport properties may be obtained without substantial increase of a driving voltage.

If the electron transport region ETR includes the electron injection layer EIL, the electron transport region ETR may include a metal halide (such as LiF, NaCl, CsF, RbCl and/or RbI), a metal in lanthanoides (such as Yb), a metal oxide (such as Li$_2$O and/or BaO), and/or lithium quinolate (LiQ). However, the embodiments of the present disclosure are not limited thereto. The electron injection layer EIL also may be formed using a mixture material of an electron transport material and an insulating organo metal salt. The organo metal salt may be a material having an energy band gap of about 4 eV or more. For example, the organo metal salt may be selected from metal acetates, metal benzoates, metal acetoacetates, metal acetylacetonates, and metal stearates. The thickness of the electron injection layer EIL may be from about 1 Å to about 100 Å, for example, from about 3 Å to about 90 Å. If the thickness of the electron injection layer EIL satisfies the above described range, satisfactory (or suitable) electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), bis[2-(diphenylphosphino)phenyl]ether oxide (DPEPO), or 4,7-diphenyl-1,10-phenanthroline (Bphen). However, the embodiments of the present disclosure are not limited thereto.

The second electrode EL2 is provided on the electron transport region ETR. The second electrode EL2 may be a common electrode and/or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound including thereof, or a mixture thereof (for example, a mixture of Ag and Mg). In one or more embodiments, the second electrode EL2 may have a multilayered structure including a reflective layer or a transflective layer formed using any of the above-described materials and a transparent conductive layer formed using ITO, IZO, ZnO, ITZO, etc.

In some embodiments, the second electrode EL2 may be connected with an auxiliary electrode. When the second electrode EL2 is connected with the auxiliary electrode, the resistance of the second electrode EL2 may decrease.

Referring to FIG. 4, the organic electroluminescence device 10 of one or more embodiments may further include a capping layer CPL on the second electrode EL2. The capping layer CPL may include, for example, α-NPD, NPB, TPD, m-MTDATA, Alq$_3$, CuPc, N4,N4,N4',N4'-tetra(biphenyl-4-yl) biphenyl-4,4'-diamine (TPD15), 4,4',4"-tris(carbazol sol-9-yl) triphenylamine (TCTA), N,N'-bis(naphthalen-1-yl), etc.

The organic electroluminescence device 10 according to one or more embodiments of the present disclosure is characterized in including the polycyclic compound represented by Formula 1, and showing high efficiency and long life. In one or more embodiments, the organic electroluminescence device 10 of one or more embodiments may show high efficiency and long life characteristics in a deep blue wavelength region.

Hereinafter, the present disclosure will be particularly explained referring to embodiments and comparative embodiments. The following embodiments are only illustrations to assist the understanding of the present disclosure, and the scope of the present disclosure is not limited thereto.

EXAMPLES

Synthesis of Polycyclic Compounds

The synthetic methods of the polycyclic compounds explained below are only embodiments (e.g., examples), and the synthetic method of the polycyclic compound according to one or more embodiments of the present disclosure is not limited thereto.

1. Synthesis of Compound 1

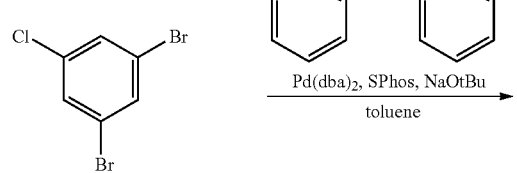

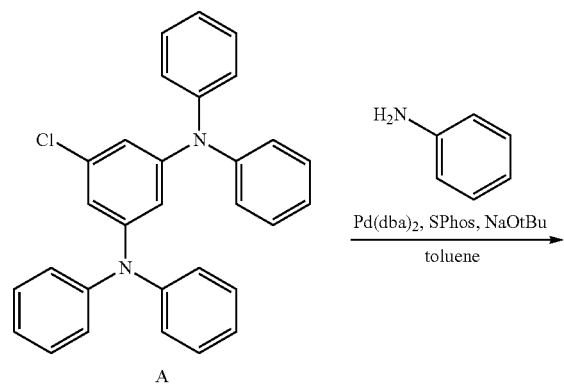

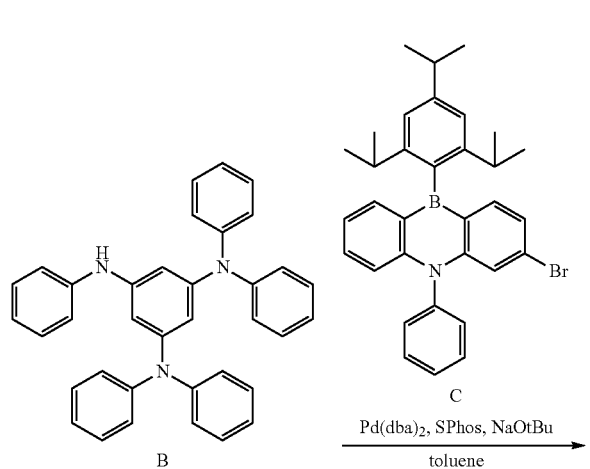

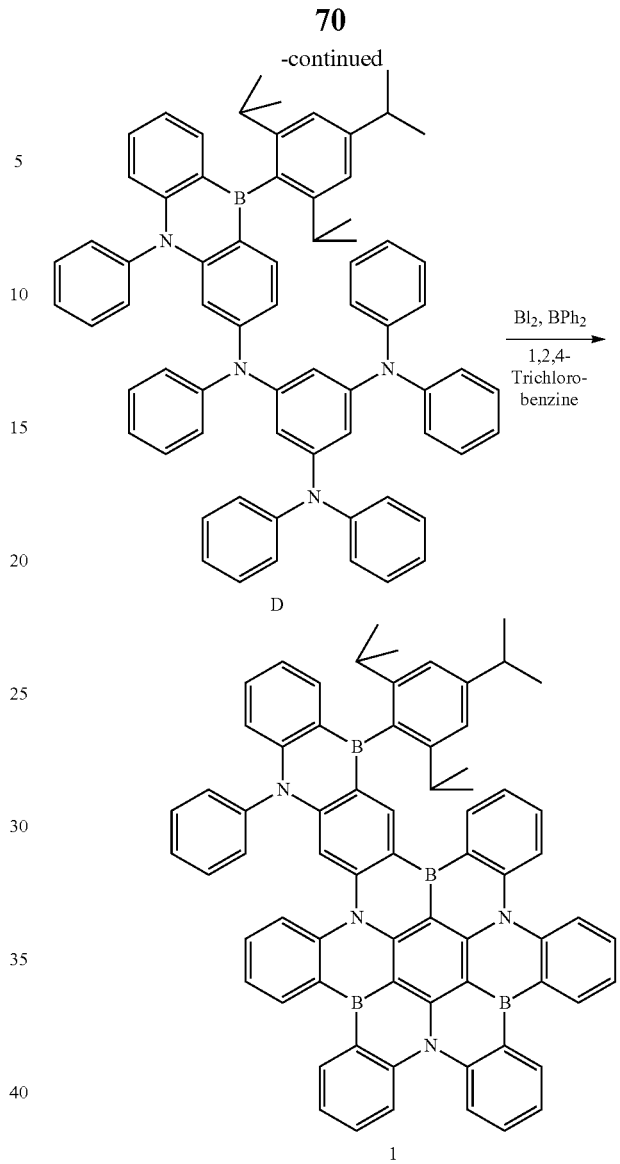

(1) Under an Ar atmosphere, to a 1,000 ml, three-neck flask, 1,3-dibromo-5-chlorobenzene (100.0 g), diphenylamine (125.2 g), bis(dibenzylideneacetone)palladium(O) (Pd(dba)$_2$, 4.2 g), 2-dicyclohexylphosphino-2',6'-dimethoxybiphenyl (SPhos, 3.1 g), and sodium tert-butoxide (NaOtBu, 72.0 g) were added and dissolved in toluene (1000 ml), followed by heating and refluxing the resulting mixture for about 2 hours. After putting back the temperature to room temperature, water was added thereto, and the reaction product was extracted therefrom with CH$_2$Cl$_2$. Organic layers were collected and dried with MgSO$_4$, and solvents were removed by distillation under a reduced pressure. The crude product thus obtained was separated by silica gel column chromatography to obtain 148 g (yield 90%) of Intermediate A. The mass number of Intermediate A measured by Fast Atom Bombardment-Mass Spectroscopy (FAB-MS) was 446.

(2) Under an Ar atmosphere, to a 1,000 ml, three-neck flask, Intermediate A (70.0 g), aniline (21.8 g), Pd(dba)$_2$ (0.9 g), SPhos (0.64 g), and NaOtBu (22.6 g) were placed and dissolved in toluene (500 mL), followed by heating and refluxing the resulting mixture for about 1 hour. After putting back the temperature to room temperature, water was added thereto, and the reaction product was extracted therefrom with $CH_2Cl_2$. Organic layers were collected and dried with $MgSO_4$, and solvents were removed by distillation under a reduced pressure. Ethanol was added to the crude product thus obtained, and washing was performed to obtain 74.2 g (yield 94%) of Intermediate B. The mass number of Intermediate B measured by FAB-MS was 503.

(3) Azaborinine derivative C was synthesized referring to a non-patent document (Adv. Funct. Mater. 2018, 28, 1802031), the entire content of which is hereby incorporated by reference.

(4) Under an Ar atmosphere, to a 1,000 ml, three-neck flask, Intermediate B (20.0 g), C (21.4 g), Pd(dba)$_2$ (0.22 g), SPhos (0.16 g), and NaOtBu (3.8 g) were put and dissolved in toluene (300 ml), followed by heating and refluxing the resulting mixture for about 3 hours. Water was added thereto, and the reaction product was extracted therefrom with $CH_2Cl_2$. Organic layers were collected and dried with $MgSO_4$, and solvents were removed by distillation under a reduced pressure. The crude product thus obtained was separated by silica gel column chromatography to obtain 33.8 g (yield 89%) of Intermediate D. The mass number of Intermediate D measured by FAB-MS was 956.

(5) Under an Ar atmosphere, to a 500 ml, three-neck flask, Intermediate D (32.0 g) was placed, dissolved in 1,2,4-trichlorobenzene (200 ml) and cooled to about 0° C. in an ice bath. Boron triiodide (BI$_3$, 40 g) and triphenylborane (BPh$_3$, 9.7 g) were added thereto and heated and stirred at about 200° C. for about 12 hours. The resultant product was cooled to about 0° C. in an ice bath, and N,N-diisopropylethylamine (50 ml) was added thereto. After putting back the temperature to room temperature, the reaction solution was filtered using silica gel, and the solvents of the filtrate were removed by distillation under a reduced pressure. The crude product thus obtained was recrystallized in toluene to obtain 1.98 g (yield 6%) of Compound 1. The mass number of Compound 1 measured by FAB-MS was 982.

2. Synthesis of Compound 2

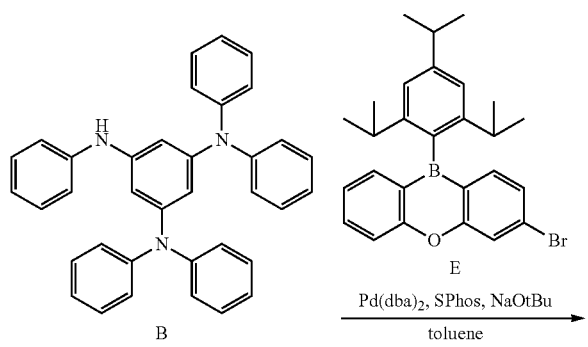

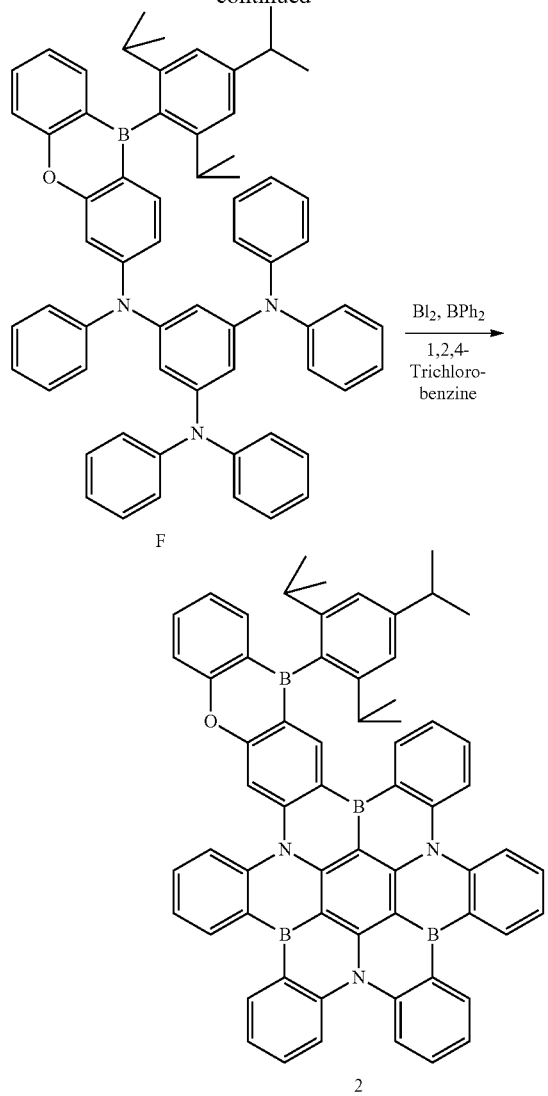

(1) Oxaborinine derivative E was synthesized referring to a non-patent document (Chem. Commun. 2015, 51, 9443-9446), the entire content of which is hereby incorporated by reference.

(2) Under an Ar atmosphere, to a 1,000 ml, three-neck flask, Intermediate B (20.0 g), E (18.3 g), Pd(dba)$_2$ (0.22 g), SPhos (0.16 g), and NaOtBu (3.8 g) were placed and dissolved in toluene (250 mL), followed by heating and refluxing the resulting mixture for about 3 hours. After putting back the temperature to room temperature, water was added thereto, and the reaction product was extracted therefrom with $CH_2Cl_2$. Organic layers were collected and dried with $MgSO_4$, and solvents were removed by distillation under a reduced pressure. The crude product thus obtained was separated by silica gel column chromatography to obtain 32.2 g (yield 92%) of Intermediate F. The mass number of Intermediate F measured by FAB-MS was 883.

(3) Under an Ar atmosphere, to a 1,000 ml, three-neck flask, Intermediate F (32.0 g) was put, dissolved in 1,2,4-trichlorobenzene (200 ml) and cooled to about 0° C. Boron triiodide (BI$_3$, 40 g) and triphenylborane (BPh$_3$, 9.7 g) were added thereto, and heated and stirred at about 195° C. for about 17 hours. The resultant product was cooled to about 0°

C., and N,N-diisopropylethylamine (50 ml) was added thereto. After putting back the temperature to room temperature, the reaction solution was filtered using silica gel, and the solvents of the filtrate were removed by distillation under a reduced pressure. The crude product thus obtained was recrystallized in toluene to obtain 1.51 g (yield 5%) of Compound 2. The mass number of Compound 2 measured by FAB-MS was 899.

3. Synthesis of Compound 3

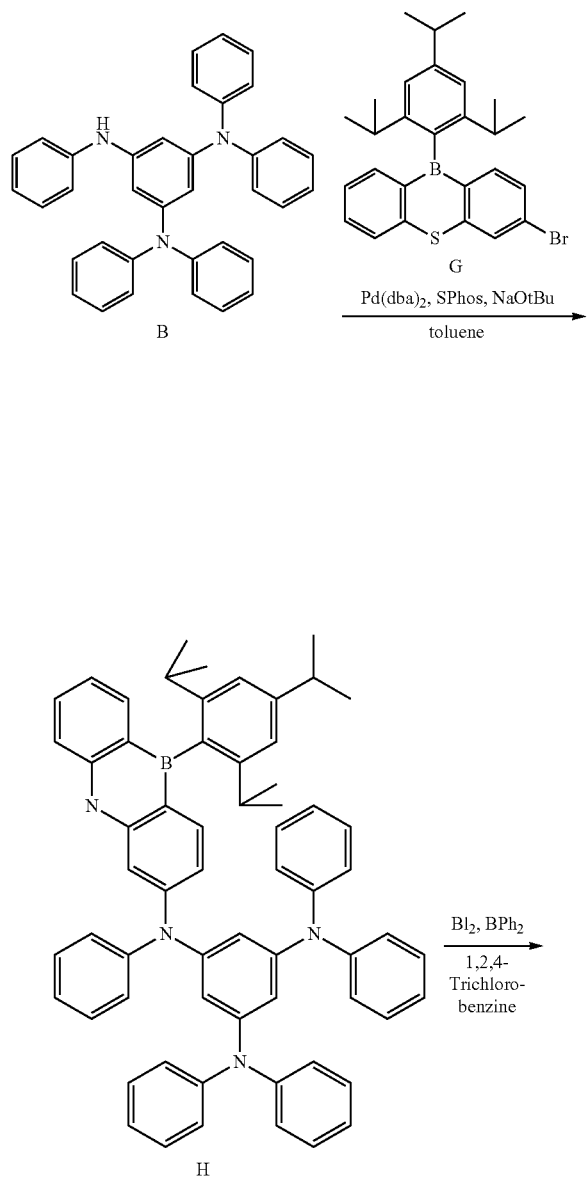

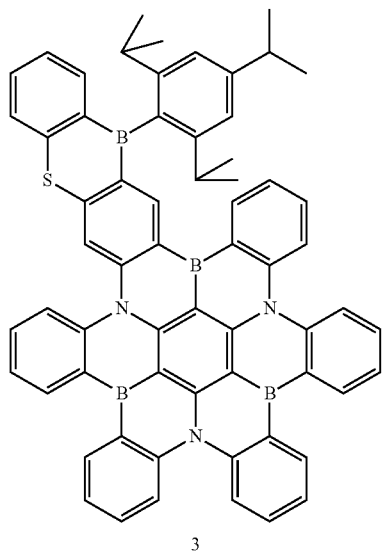

(1) Thiaborinine derivative G was synthesized referring to a non-patent document (Adv. Funct. Mater. 2018, 28, 1802031).

(2) Under an Ar atmosphere, to a 1,000 ml, three-neck flask, Intermediate B (20.0 g), Intermediate G (19.0 g), Pd(dba)$_2$ (0.22 g), SPhos (0.16 g), and NaOtBu (3.8 g) were placed and dissolved in toluene (250 mL), followed by heating and refluxing the resulting mixture for about 3 hours. Water was added thereto, and the reaction product was extracted therefrom with CH$_2$Cl$_2$. Organic layers were collected and dried with MgSO$_4$, and solvents were removed by distillation under a reduced pressure. The crude product thus obtained was separated by silica gel column chromatography to obtain 30.6 g (yield 86%) of Intermediate H. The mass number of Intermediate H measured by FAB-MS was 899.

Under an Ar atmosphere, to a 1,000 ml, three-neck flask, H (30.0 g) was placed, dissolved in 1,2,4-trichlorobenzene (200 ml) and cooled to about 0° C. in an ice bath. Boron triiodide (BI$_3$, 40 g) and triphenylborane (BPhs, 9.7 g) were added thereto, and heated and stirred at about 200° C. for about 10 hours. The resultant product was cooled to about 0° C. in an ice bath, and N,N-diisopropylethylamine (50 ml) was added thereto. After putting back the temperature to room temperature, the reaction solution was filtered using silica gel, and the solvents of the filtrate were removed by distillation under a reduced pressure. The crude product thus obtained was separated through recrystallization in toluene and recrystallization in 1,2-dichlorobenzene (ODCB) to obtain 1.07 g (yield 3%) of Compound 3. The mass number of Compound 3 measured by FAB-MS was 923.

4. Synthesis of Compound 41

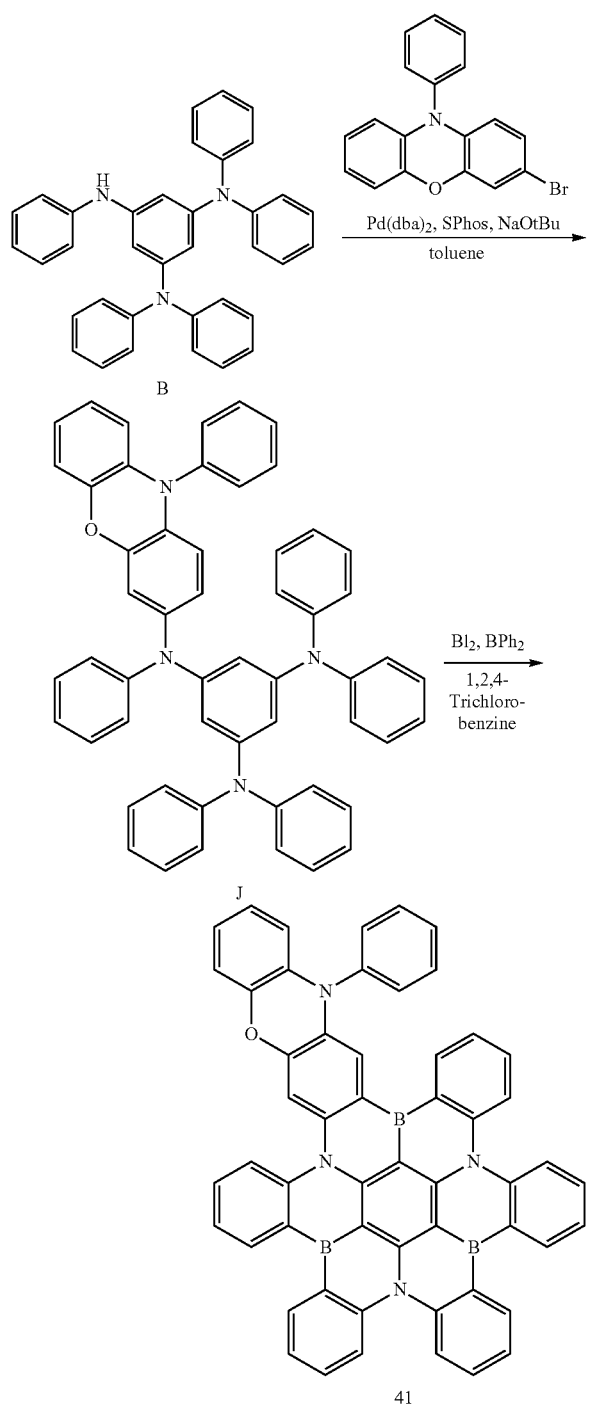

(1) Under an Ar atmosphere, to a 1,000 ml, three-neck flask, Intermediate B (30.0 g), 3-bromo-10-phenylphenoxazine (20.2 g), Pd(dba)$_2$ (0.34 g), SPhos (0.24 g), and NaOtBu (5.72 g) were placed and dissolved in toluene (250 mL), followed by heating and refluxing the resulting mixture for about 3 hours. Water was added thereto, and the reaction product was extracted therefrom with CH$_2$Cl$_2$. Organic layers were collected and dried with MgSO$_4$, and solvents were removed by distillation under a reduced pressure. The crude product thus obtained was separated by silica gel column chromatography to obtain 34.8 g (yield 77%) of Intermediate J. The mass number of Intermediate J measured by FAB-MS was 760.

(2) Under an Ar atmosphere, to a 1,000 ml, three-neck flask, Intermediate J (30.0 g) was placed, dissolved in 1,2,4-trichlorobenzene (200 ml) and cooled to about 0° C. in an ice bath. Boron triiodide (BI$_3$, 40 g) and triphenylborane (BPh$_3$, 9.7 g) were added thereto, and heated and stirred at about 200° C. for about 18 hours. The resultant product was cooled to about 0° C. in an ice bath, and N,N-diisopropylethylamine (50 ml) was added thereto. After putting back the temperature to room temperature, the reaction solution was filtered using silica gel, and the solvents of the filtrate were removed by distillation under a reduced pressure. The crude product thus obtained was separated through recrystallization in toluene and recrystallization in ODCB to obtain 1.99 g (yield 12%) of Compound 41. The mass number of Compound 41 measured by FAB-MS was 776.

5. Synthesis of Compound 52

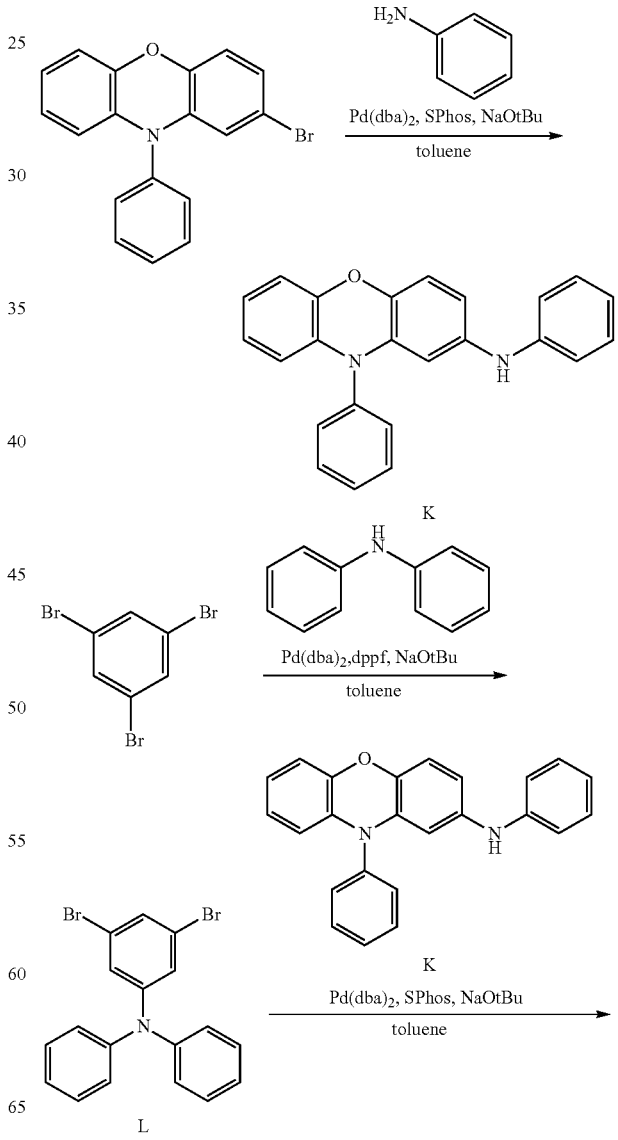

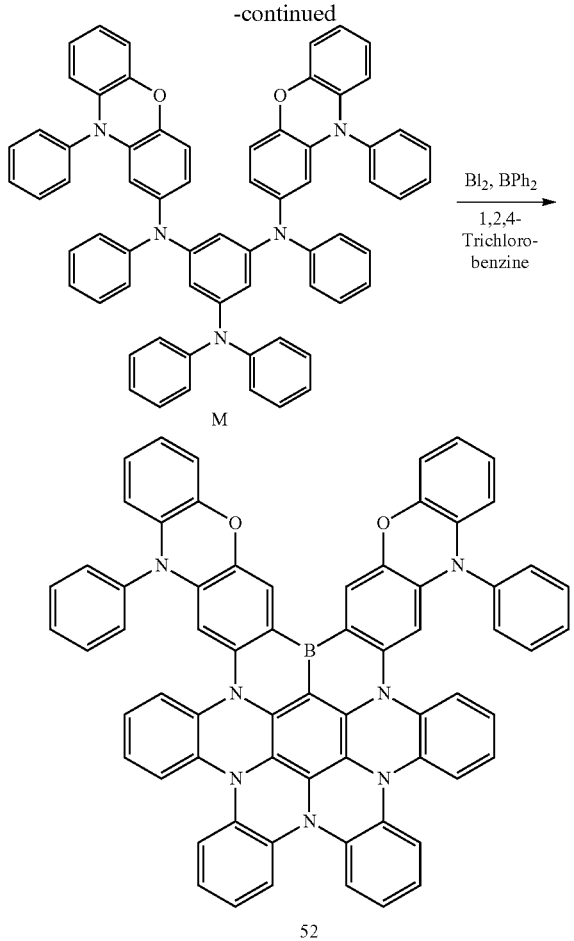

M

52

(1) Under an Ar atmosphere, to a 2,000 ml, three-neck flask, 2-bromo-10-phenylphenoxazine (60.0 g), aniline (16.5 g), Pd(dba)$_2$ (1.0 g), SPhos (0.72 g), and NaOtBu (17.0 g) were placed and dissolved in toluene (600 mL), followed by heating and refluxing the resulting mixture for about 2 hours. Water was added thereto, and the reaction product was extracted therefrom with CH$_2$Cl$_2$. Organic layers were collected and dried with MgSO$_4$, and solvents were removed by distillation under a reduced pressure. The crude product thus obtained was separated by silica gel column chromatography to obtain 46.6 g (yield 75%) of Intermediate K. The mass number of Intermediate K measured by FAB-MS was 350.

(2) Under an Ar atmosphere, to a 2,000 ml, three-neck flask, 1,3,5-tribromobenzene (100.0 g), diphenylamine (52.6 g), Pd(dba)$_2$ (1.8 g), bis(diphenylphosphino)ferrocene (dppf, 3.5 g), and NaOtBu (30.6 g) were placed and dissolved in toluene (600 mL), followed by heating and refluxing the resulting mixture for about 3 hours. Water was added thereto, and the reaction product was extracted therefrom with CH$_2$Cl$_2$. Organic layers were collected and dried with MgSO$_4$, and solvents were removed by distillation under a reduced pressure. The crude product thus obtained was separated by silica gel column chromatography to obtain 51.2 g (yield 80%) of Intermediate L. The mass number of Intermediate L measured by FAB-MS was 403.

(3) Under an Ar atmosphere, to a 1,000 ml, three-neck flask, Intermediate L (20.0 g), K (34.8 g), Pd(dba)$_2$ (0.28 g), SPhos (0.20 g), and NaOtBu (9.60 g) were placed and dissolved in toluene (250 mL), followed by heating and refluxing the resulting mixture for about 3 hours. Water was added thereto, and the reaction product was extracted therefrom with CH$_2$Cl$_2$. Organic layers were collected and dried with MgSO$_4$, and solvents were removed by distillation under a reduced pressure. The crude product thus obtained was separated by silica gel column chromatography to obtain 31.8 g (yield 68%) of Intermediate M. The mass number of Intermediate M measured by FAB-MS was 942.

(4) Under an Ar atmosphere, to a 300 ml, three-neck flask, Intermediate M (30.0 g) was placed, dissolved in 1,2,4-trichlorobenzene (220 ml) and cooled to about 0° C. in an ice bath. Boron triiodide (BI$_3$, 40 g) and triphenylborane (BPh$_3$, 9.7 g) were added thereto, and heated to about 190° C. for about 12 hours. The resultant product was cooled to about 0° C. in an ice bath, and N,N-diisopropylethylamine (50 ml) was added thereto. After putting back the temperature to room temperature, the reaction solution was filtered using silica gel, and the solvents of the filtrate were removed by distillation under a reduced pressure. The crude product thus obtained was separated through recrystallization in toluene and recrystallization in ODCB to obtain 1.49 g (yield 5%) of Compound 52. The mass number of Compound 52 measured by FAB-MS was 965.

6. Synthesis of Compound 55

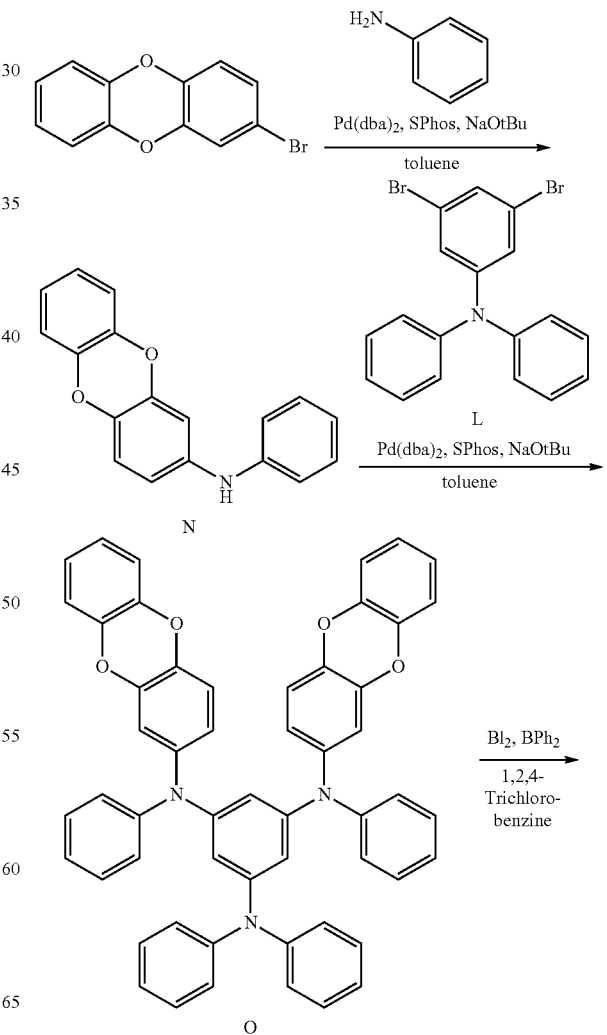

79

-continued

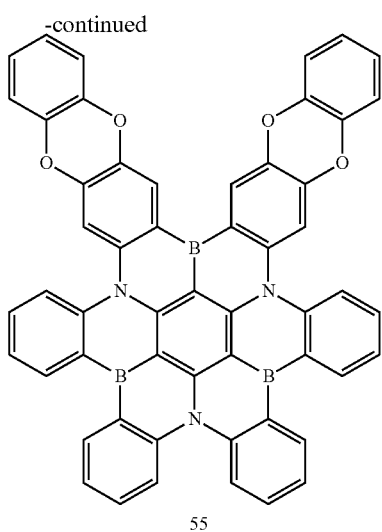

55

(1) Under an Ar atmosphere, to a 2,000 ml, three-neck flask, 2-bromodibenzodioxine (60.0 g), aniline (21.2 g), Pd(dba)$_2$ (1.3 g), SPhos (0.92 g), and NaOtBu (22.0 g) were placed and dissolved in toluene (1,000 mL), followed by heating and refluxing the resulting mixture for about 4 hours. Water was added thereto, and the reaction product was extracted therefrom with CH$_2$Cl$_2$. Organic layers were collected and dried with MgSO$_4$, and solvents were removed by distillation under a reduced pressure. The crude product thus obtained was separated by silica gel column chromatography to obtain 43.8 g (yield 70%) of Intermediate N. The mass number of Intermediate N measured by FAB-MS was 275.

80

(2) Under an Ar atmosphere, to a 2,000 ml, three-neck flask, Intermediate N (40.0 g), L (29.2 g), Pd(dba)$_2$ (0.82 g), SPhos (0.60 g), and NaOtBu (14.0 g) were placed and dissolved in toluene (550 mL), followed by heating and refluxing the resulting mixture for about 3 hours. Water was added thereto, and the reaction product was extracted therefrom with CH$_2$Cl$_2$. Organic layers were collected and dried with MgSO$_4$, and solvents were removed by distillation under a reduced pressure. The crude product thus obtained was separated by silica gel column chromatography to obtain 37.4 g (yield 65%) of Intermediate O. The mass number of Intermediate O measured by FAB-MS was 791.

(3) Under an Ar atmosphere, to a 1,000 ml, three-neck flask, Intermediate O (30.0 g) was placed, dissolved in 1,2,4-trichlorobenzene (250 ml) and cooled to about 0° C. in an ice bath. Boron triiodide (BI$_3$, 40 g) and triphenylborane (BPh$_3$, 9.7 g) were added thereto, and heated and stirred at about 200° C. for about 15 hours. The resultant product was cooled to about 0° C. in an ice bath, and N,N-diisopropylethylamine (50 ml) was added thereto. After putting back the temperature to room temperature, the reaction solution was filtered using silica gel, and the solvents of the filtrate were removed by distillation under a reduced pressure. The crude product thus obtained was separated through recrystallization in toluene and recrystallization in ODCB to obtain 2.73 g (yield 9%) of Compound 55. The mass number of Compound 55 measured by FAB-MS was 815.

7. Synthesis of Compound 67

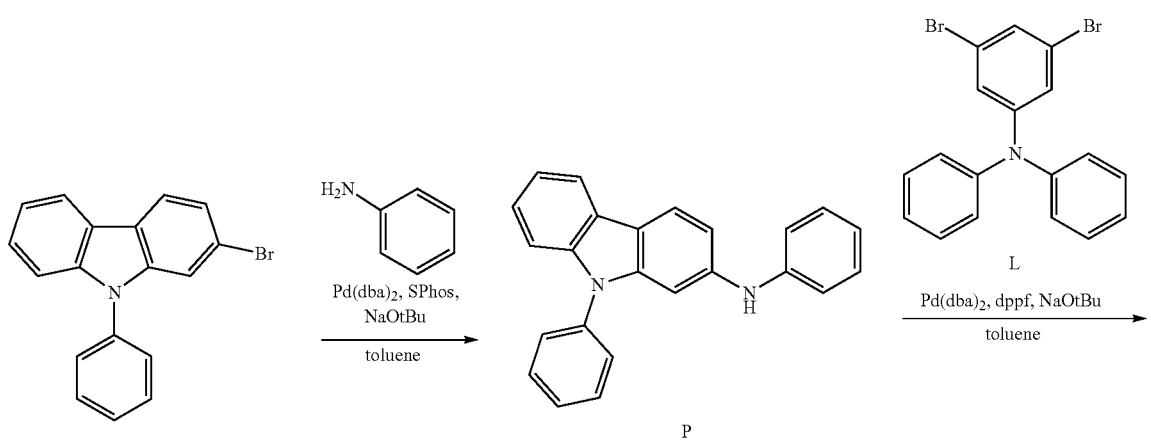

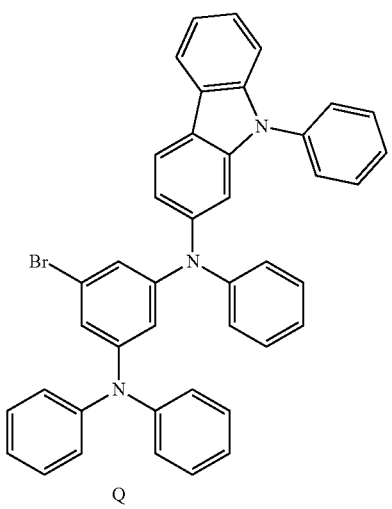

Q

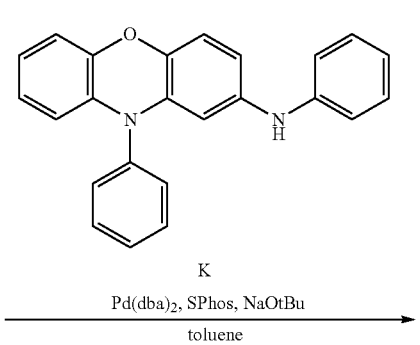

K

Pd(dba)₂, SPhos, NaOtBu
---------→
toluene

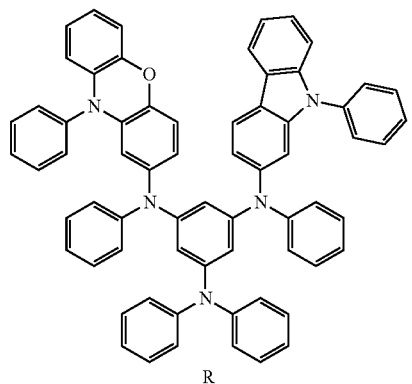

R

Bl₂, BPh₂
----------→
1,2,4-Trichloro-benzine

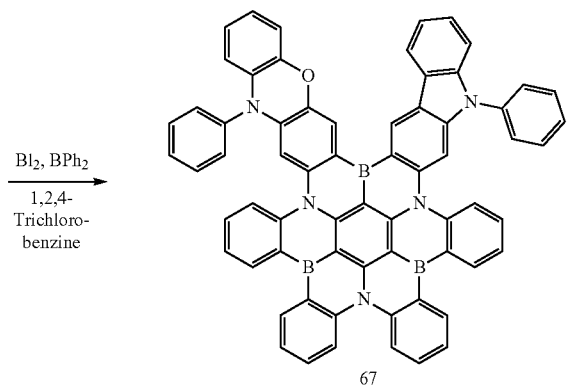

67

(1) Under an Ar atmosphere, to a 2,000 ml, three-neck flask 2-bromo-9-phenylcarbazole (100.0 g), aniline (29.0 g), Pd(dba)₂ (1.8 g), SPhos (1.28 g), and NaOtBu (29.9 g) were placed and dissolved in toluene (90 mL), followed by heating and refluxing the resulting mixture for about 4 hours. Water was added thereto, and the reaction product was extracted therefrom with CH₂Cl₂. Organic layers were collected and dried with MgSO₄, and solvents were removed by distillation under a reduced pressure. The crude product thus obtained was separated by silica gel column chromatography to obtain 70.6 g (yield 68%) of Intermediate P. The mass number of Intermediate P measured by FAB-MS was 334.

(2) Under an Ar atmosphere, to a 2,000 ml, three-neck flask, Intermediate P (40.0 g), L (24.2 g), Pd(dba)₂ (0.68 g), dppf (1.3 g), and NaOtBu (12.1 g) were placed and dissolved in toluene (450 mL), followed by heating and refluxing the resulting mixture for about 3 hours. Water was added thereto, and the reaction product was extracted therefrom with CH₂Cl₂. Organic layers were collected and dried with MgSO₄, and solvents were removed by distillation under a reduced pressure. The crude product thus obtained was separated by silica gel column chromatography to obtain 40.8 g (yield 52%) of Intermediate Q. The mass number of Intermediate Q measured by FAB-MS was 656.

(3) Under an Ar atmosphere, to a 1,000 ml, three-neck flask, Intermediate Q (38.0 g), Intermediate K (20.2 g), Pd(dba)₂ (0.32 g), SPhos (0.24 g), and NaOtBu (5.56 g) were placed and dissolved in toluene (300 mL), followed by heating and refluxing the resulting mixture for about 2 hours. Water was added thereto, and the reaction product was extracted therefrom with CH₂Cl₂. Organic layers were collected and dried with MgSO₄, and solvents were removed by distillation under a reduced pressure. The crude product thus obtained was separated by silica gel column chromatography to obtain 34.8 g (yield 65%) of Intermediate R. The mass number of Intermediate R measured by FAB-MS was 926.

(4) Under an Ar atmosphere, to a 1,000 ml, three-neck flask, Intermediate R (30.0 g) was placed, dissolved in 1,2,4-trichlorobenzene (300 ml) and cooled to about 0° C. in an ice bath. Boron triiodide (BI₃, 40 g) and triphenylborane (BPh₃, 9.7 g) were added thereto, and heated and stirred at about 200° C. for about 18 hours. The resultant product was cooled to about 0° C. in an ice bath, and N,N-diisopropyl-ethylamine (50 ml) was added thereto. After putting back the temperature to room temperature, the reaction solution was filtered using silica gel, and the solvents of the filtrate were removed by distillation under a reduced pressure. The crude product thus obtained was separated through recrystallization in toluene and recrystallization in ODCB to obtain 2.12 g (yield 7%) of Compound 67. The mass number of Compound 67 measured by FAB-MS was 949.

Manufacture of Organic Electroluminescence Device

Organic electroluminescence devices of Examples 1 to 7 were manufactured using the aforementioned compounds as materials for an emission layer.

Example Compounds
1
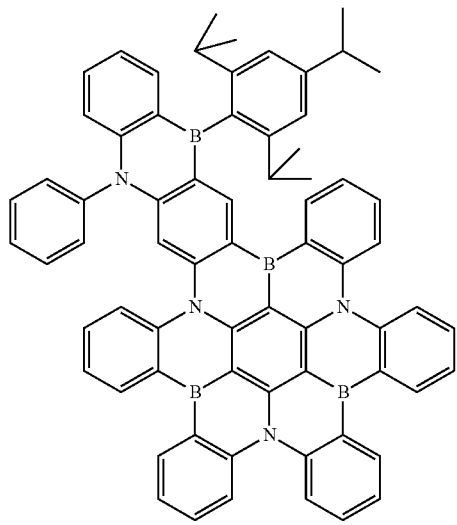
2
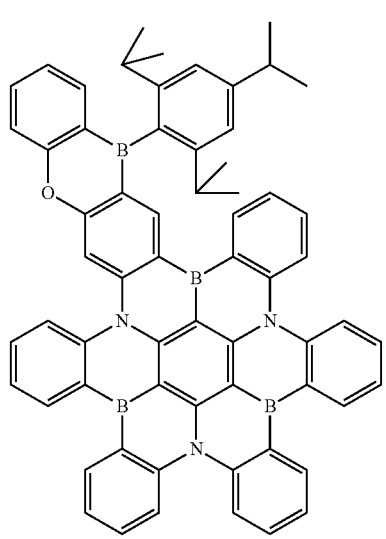
3
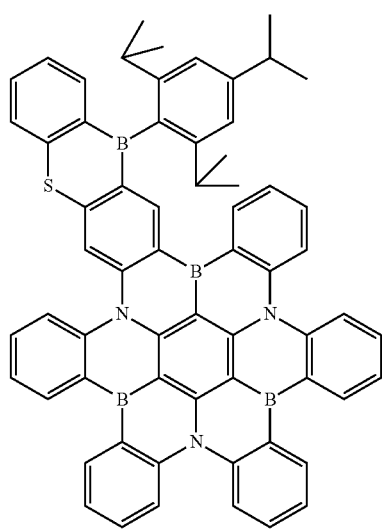
41
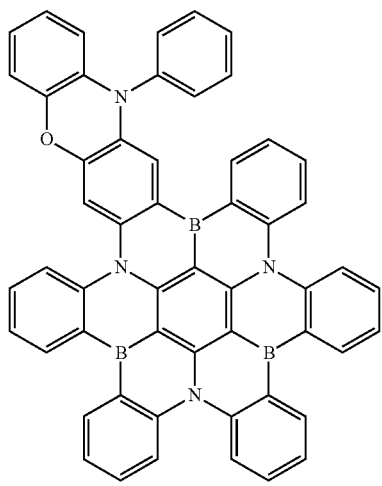
52
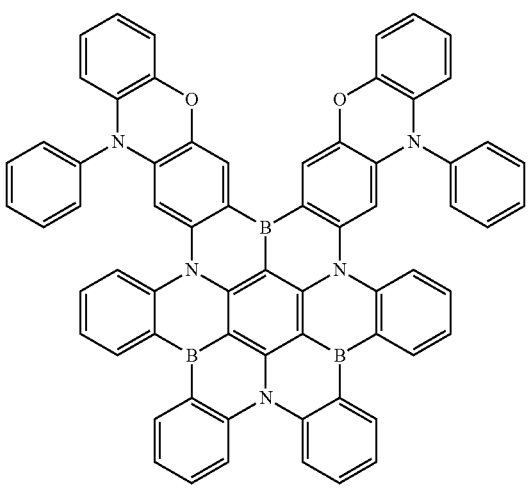
56
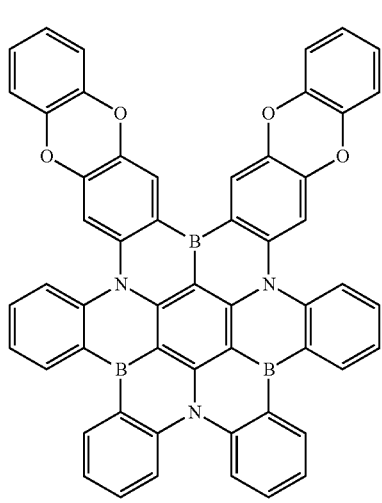

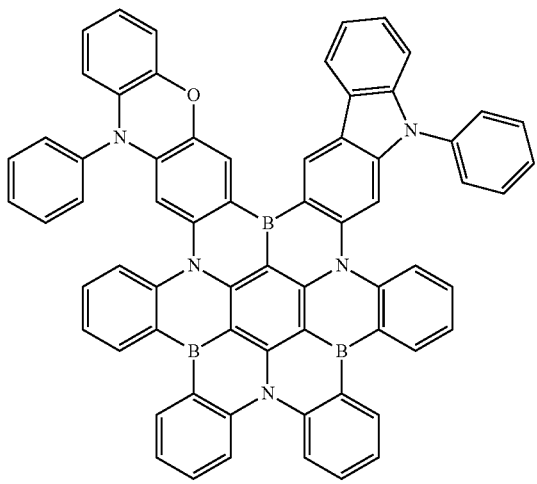
67
Organic electroluminescence devices of Comparative Examples 1 to 7 were manufactured using Comparative Compounds below as materials for an emission layer.
Comparative Compounds
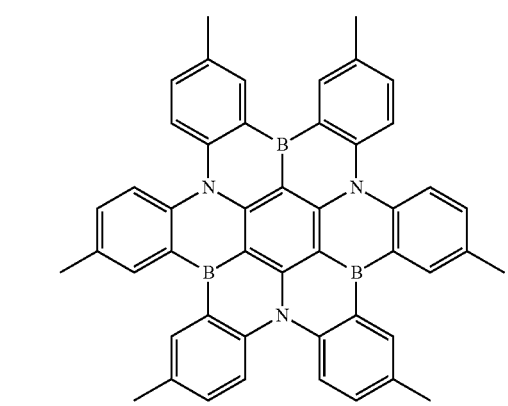
X-1
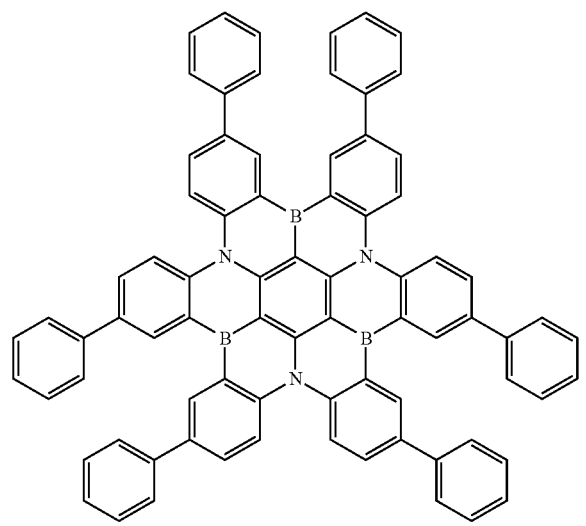
X-2
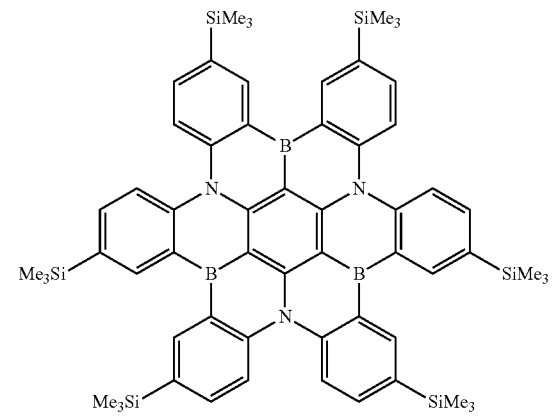
X-3
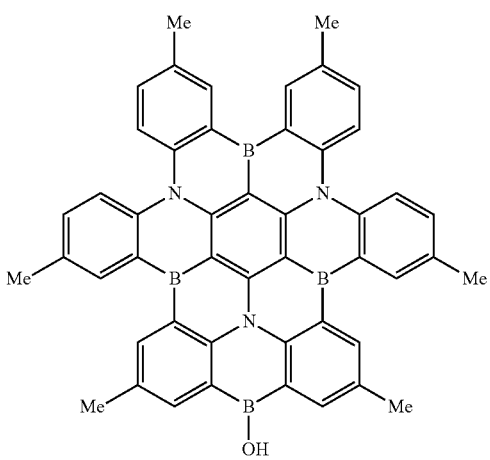
X-4
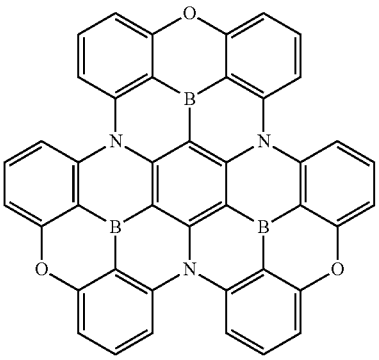
X-5
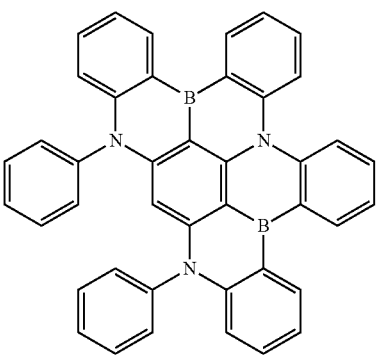
X-6

-continued

X-7

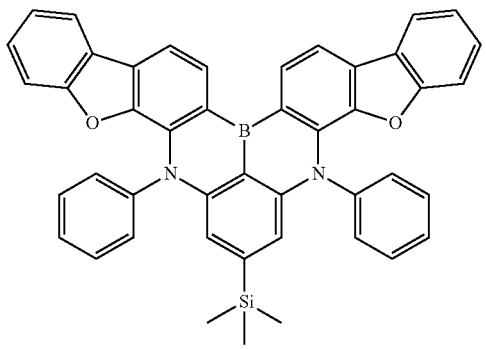

The organic electroluminescence devices of the Examples and Comparative Examples were manufactured by a method below.

On a glass substrate, ITO with a thickness of about 1,500 Å was patterned, washed with ultra-pure water, and treated with UV ozone for about 10 minutes. Then, HAT-CN was deposited to a thickness of about 100 Å, α-NPD was deposited to about 800 Å, and mCP was deposited to a thickness of about 50 Å to form a hole transport region.

Then, the Example polycyclic compound, or the Comparative Compound, and mCBP were co-deposited in a ratio of 1:99 to form a layer with a thickness of about 200 Å to form an emission layer.

On the emission layer, a layer with a thickness of about 300 Å was formed using TPBi, and a layer with a thickness of about 5 Å was formed using LiF to form an electron transport region. Then, a second electrode with a thickness of about 1,000 Å was formed using aluminum (Al).

In the Examples, the hole transport region, the emission layer, the electron transport region, and the second electrode were formed using a vacuum deposition apparatus.

Evaluation of Properties of Organic Electroluminescence Devices

In order to evaluate the properties of the organic electroluminescence devices according to the Examples and Comparative Examples, maximum emission wavelength (nm), external quantum yield maximum value (%) and external quantum efficiency (%) at a luminance of about 1,000 cd/m$^2$ were measured. A C9920-11 brightness light distribution characteristics measurement system of HAMAMATSU Photonics Co. was used for measurement.

TABLE 1

| | Emission layer dopant | Emission wavelength (nm) | External quantum yield maximum value (%) | External quantum efficiency (%) |
|---|---|---|---|---|
| Example 1 | Example Compound 1 | 457 | 22 | 14 |
| Example 2 | Example Compound 2 | 455 | 21 | 13 |
| Example 3 | Example Compound 3 | 461 | 20 | 12 |
| Example 4 | Example Compound 41 | 472 | 15 | 7 |
| Example 5 | Example Compound 52 | 471 | 16 | 7 |
| Example 6 | Example Compound 55 | 459 | 16 | 8 |
| Example 7 | Example Compound 67 | 462 | 18 | 8 |

TABLE 1-continued

| | Emission layer dopant | Emission wavelength (nm) | External quantum yield maximum value (%) | External quantum efficiency (%) |
|---|---|---|---|---|
| Comparative Example 1 | Comparative Compound X-1 | 450 | 10 | 4 |
| Comparative Example 2 | Comparative Compound X-2 | 453 | 13 | 7 |
| Comparative Example 3 | Comparative Compound X-3 | 454 | 11 | 7 |
| Comparative Example 4 | Comparative Compound X-4 | 448 | 9 | 3 |
| Comparative Example 5 | Comparative Compound X-5 | 443 | 7 | 2 |
| Comparative Example 6 | Comparative Compound X-6 | 460 | 14 | 11 |
| Comparative Example 7 | Comparative Compound X-7 | 470 | 8 | 3 |

Referring to the results of Table 1, it could be confirmed that if the polycyclic compound according to one or more embodiments is included in an emission layer, the external quantum efficiency is improved when compared with the Comparative Examples. The Example Compounds include a structure in which a heterocycle is further condensed with one of the phenyl rings of the core structure, when compared with the Comparative Compounds. Without being bound by any particular theory, it is thought that in the Example Compounds, the conjugation of a molecule is enlarged, emission intensity is increased, and accordingly, if applied to a device, the external quantum efficiency is improved.

It was confirmed that the efficiency of the device was improved for the Examples when compared with most of the Comparative Examples. Without being bound by any particular theory, it is thought that in the heterocycle of the Example compounds, nitrogen or oxygen was positioned at the para position with respect to boron, and the push-pull of electrons was efficiently (or suitably) generated, and accordingly, the structure became relatively easy to generate reverse intersystem crossing due to resonance effects.

Comparative Examples 4 and 5 (using Comparative Compounds X-4 and X-5) have structures in which oxygen is bonded to boron, and Comparative Example 7 (using Comparative Compound X-7) includes a structure in which a heterocycle is condensed, but these Comparative Examples showed lower device efficiency when compared with the Examples. Without being bound by any particular theory, it is believed that the effects of the Example Compounds could not be accomplished by simply introducing oxygen to an aromatic ring which is combined with boron or forming a condensed ring, but the selection and combination of positions is necessary for generating resonance effects in a molecule.

The organic electroluminescence device of one or more embodiments uses the polycyclic compound represented by Formula 1 and may accomplish high emission efficiency.

The organic electroluminescence device according to one or more embodiments of the present disclosure may attain high efficiency and long life.

The polycyclic compound according to one or more embodiments of the present disclosure may improve the life and efficiency of an organic electroluminescence device.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present disclosure have been described, it is understood that the present disclosure should not be limited to these example embodiments but various changes and modifications can be made by one ordinary skilled in the art within the spirit and scope of the present disclosure as hereinafter claimed by the following claims and their equivalents.

What is claimed is:

1. An organic electroluminescence device, comprising:
a first electrode;
a hole transport region on the first electrode;
an emission layer on the hole transport region;
an electron transport region on the emission layer; and
a second electrode on the electron transport region,
wherein the first electrode and the second electrode each independently comprise Ag, Mg, Cu, Al, Pt, Pd, Au, Ni, Nd, Ir, Cr, Li, Ca, LiF/Ca, LiF/Al, Mo, Ti, In, Zn, Sn, a compound thereof, a mixture thereof, or an oxide thereof, and
the emission layer comprises a polycyclic compound represented by Formula 1:

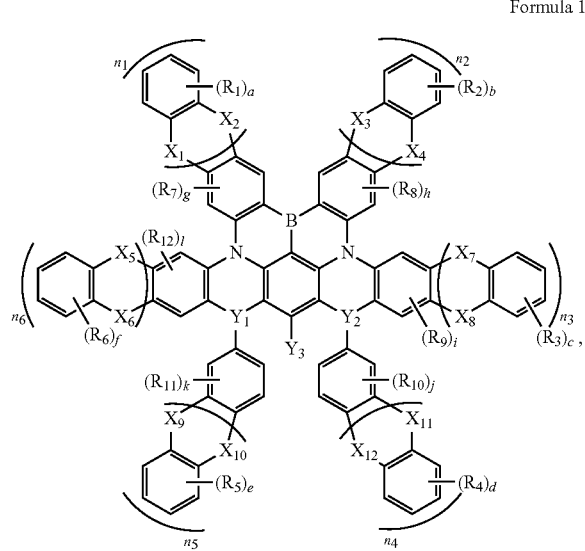

Formula 1 and wherein in Formula 1, $Y_1$ and $Y_2$ are each independently B, N, P=O or P=S, $X_1$ to $X_{12}$ are each independently $BAr_1$, O, S, $NAr_2$ or a direct linkage, $Ar_1$ and $Ar_2$ are each independently a substituted or unsubstituted aryl group of 6 to 30 carbon atoms for forming a ring, or a substituted or unsubstituted heteroaryl group of 2 to 30 carbon atoms for forming a ring, $Y_3$ and $R_1$ to $R_{12}$ are each independently selected from a hydrogen atom, a deuterium atom, a halogen atom, a substituted or unsubstituted amino group, a substituted or unsubstituted oxy group, a substituted or unsubstituted thio group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or are bonded to one or more adjacent groups to form one or more rings, "a" to "f" are each independently an integer of 0 to 4, "j" and "k" are each independently an integer of 0 to 3, "g" to "i" and "l" are each independently an integer of 0 to 2, and n1 to n6 are each independently 0 or 1, where at least one among n1 to n6 is 1.

2. The organic electroluminescence device of claim 1, wherein the emission layer is to emit delayed fluorescence.

3. The organic electroluminescence device of claim 1, wherein the emission layer is a delayed fluorescence emission layer comprising a first compound and a second compound, and
the first compound comprises the polycyclic compound.

4. The organic electroluminescence device of claim 1, wherein the emission layer is a thermally activated delayed fluorescence emission layer to emit blue light.

5. The organic electroluminescence device of claim 1, wherein $Y_1$ and $Y_2$ are the same.

6. The organic electroluminescence device of claim 1, wherein $Y_1$ and $Y_2$ are each independently boron (B), and
$Y_3$ is a substituted or unsubstituted amine group, and/or is bonded to at least one among $R_{10}$ and $R_{11}$ to form a ring.

7. The organic electroluminescence device of claim 1, wherein $X_1$ to $X_4$ are not all direct linkages at the same time, and
at least one among n1 and n2 is 1.

8. The organic electroluminescence device of claim 1, wherein Formula 1 is represented by the following Formula 2:

Formula 2

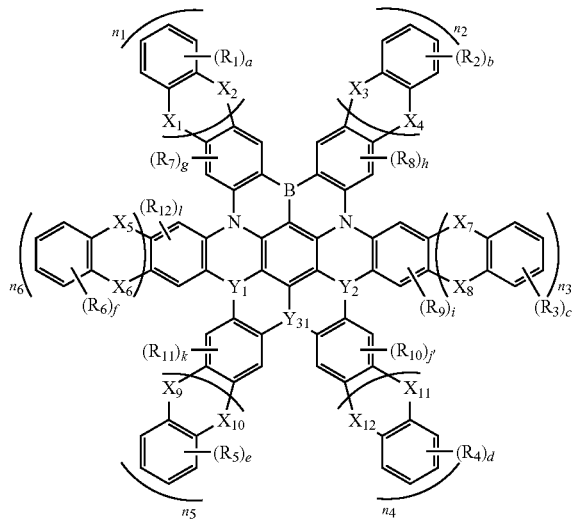

and
wherein in Formula 2,
Y$_{31}$ is CA or N,
A is a hydrogen atom, a deuterium atom, a halogen atom, a substituted or unsubstituted amino group, a substituted or unsubstituted oxy group, a substituted or unsubstituted thio group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring,
"j" and "k'" are each independently an integer of 0 to 2, and
Y$_1$, Y$_2$, X$_1$ to X$_{12}$, R$_1$ to R$_{12}$, "a" to "i", "l" and n1 to n6 are the same as defined in Formula 1.

9. The organic electroluminescence device of claim 1, wherein Formula 1 is represented by the following Formula 3:

Formula 3 and
wherein in Formula 3,
Y$_{32}$ is CA$_1$A$_2$ or NA$_3$,
A$_1$ to A$_3$ are each independently a hydrogen atom, a deuterium atom, a halogen atom, a substituted or unsubstituted amino group, a substituted or unsubstituted oxy group, a substituted or unsubstituted thio group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring,
"j'" is an integer of 0 to 2, and
Y$_1$, Y$_2$, X$_1$ to X$_{12}$, R$_1$ to R$_{12}$, "a" to "i", "k", "l" and n1 to n6 are the same as defined in Formula 1.

10. The organic electroluminescence device of claim 1, wherein Formula 1 is represented by the following Formula 4:

Formula 4 and
wherein in Formula 4,
"q" and "r" are each independently an integer of 0 to 5,
"p" and "s" are each independently an integer of 0 to 4, and
Y$_1$ to Y$_3$, X$_1$ to X$_4$, R$_1$, R$_2$, R$_7$ to R$_{12}$, "a", "b", "g", "h", n1 and n2 are the same as defined in Formula 1.

11. The organic electroluminescence device of claim 8, wherein Formula 2 is represented by the following Formula 5:

Formula 5

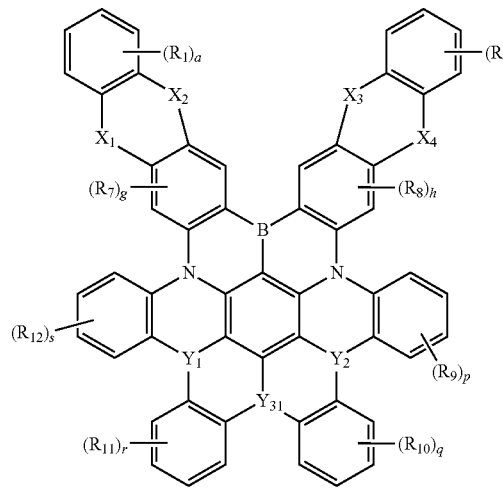

and
wherein in Formula 5,
"p" to "s" are each independently an integer of 0 to 4, and $Y_1$, $Y_2$, $Y_{31}$, $X_1$ to $X_4$, $R_1$, $R_2$, $R_7$ to $R_{12}$, "a", "b", "g", and "h" are the same as defined in Formula 2.

12. The organic electroluminescence device of claim 8, wherein Formula 2 is represented by the following Formula 6:

Formula 6

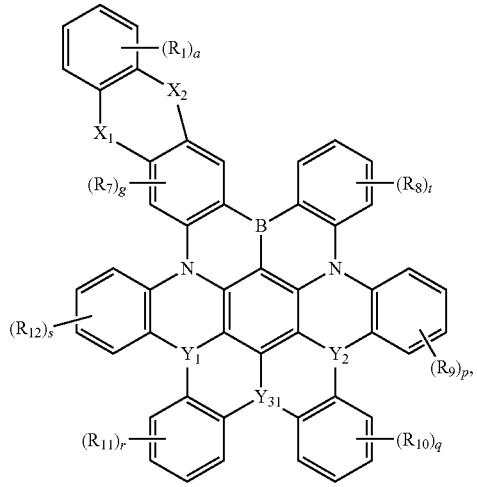

and
wherein in Formula 6,
"p" to "s" are each independently an integer of 0 to 4, and $Y_1$, $Y_2$, $Y_{31}$, $X_1$, $X_2$, $R_1$, $R_7$ to $R_{12}$, "a", "g", and "h" are the same as defined in Formula 2.

13. The organic electroluminescence device of claim 1, wherein the polycyclic compound represented by Formula 1 is at least one among compounds represented in the following Compound Group 1:

Compound Group 1

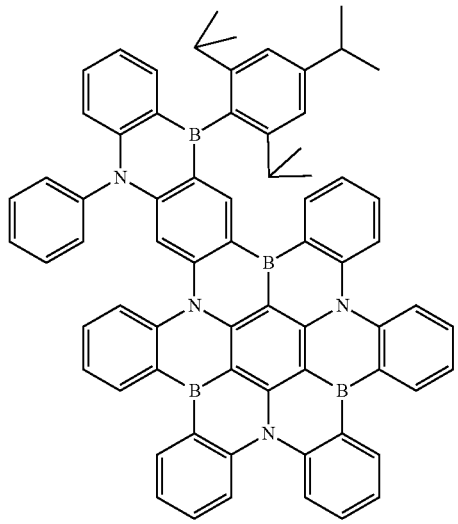

1

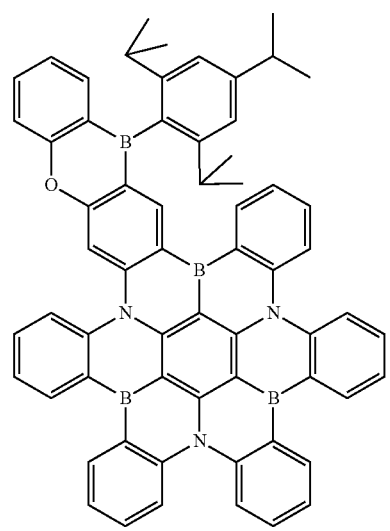

2

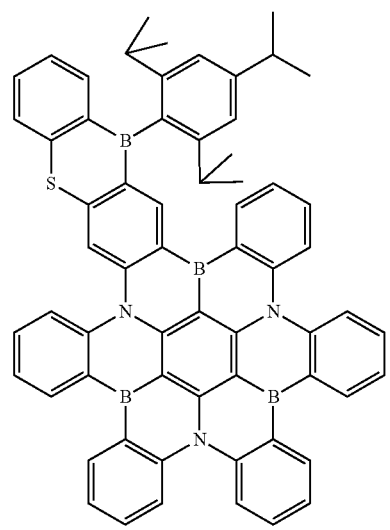

3

1-D
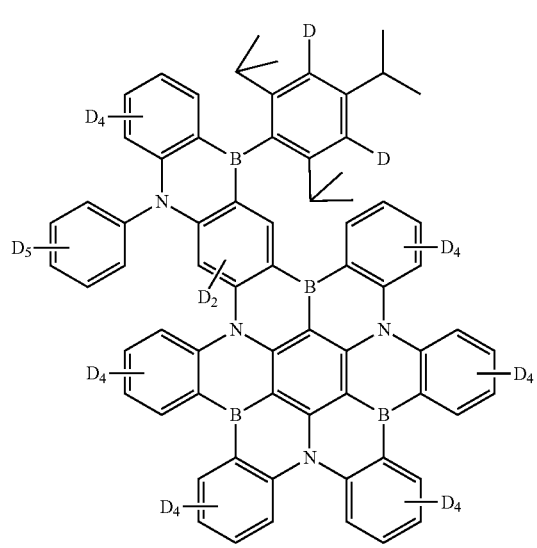
2-D
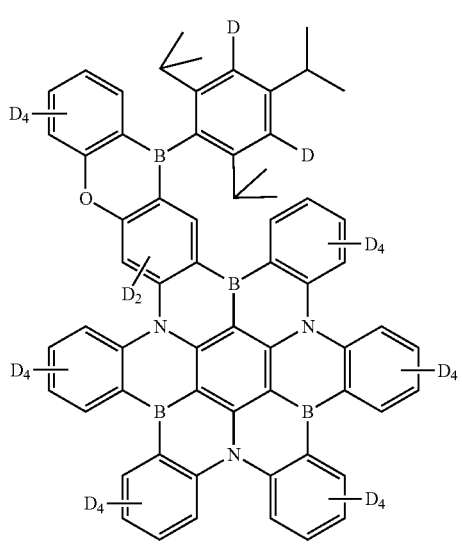
3-D
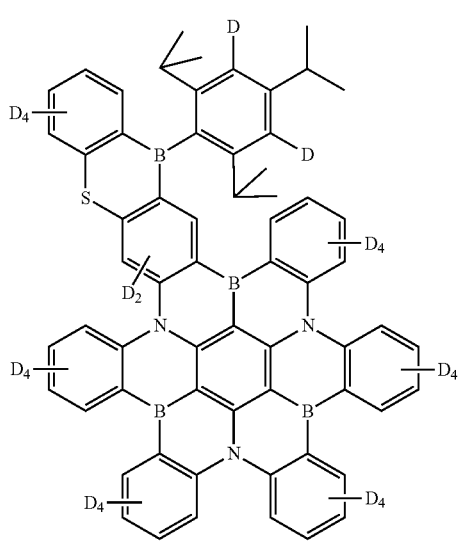
4
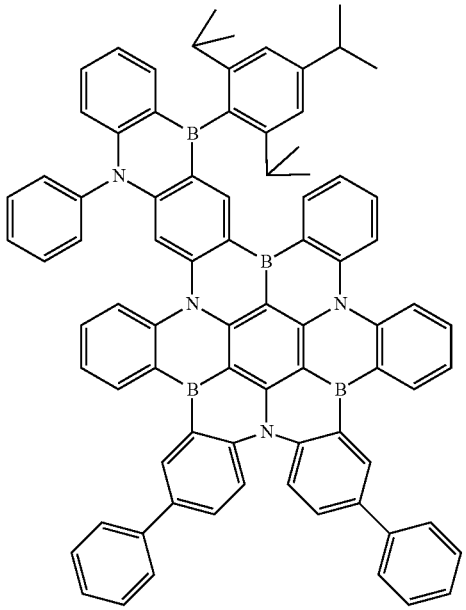
5
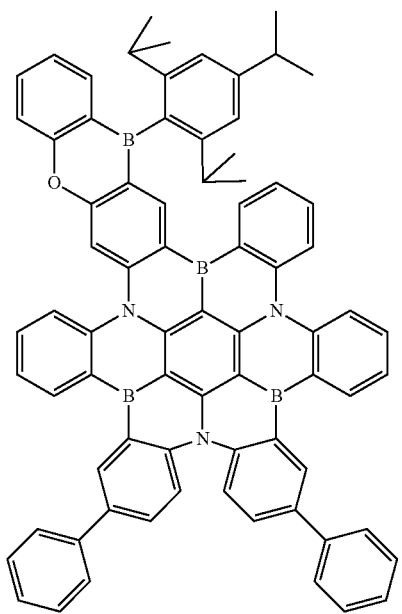

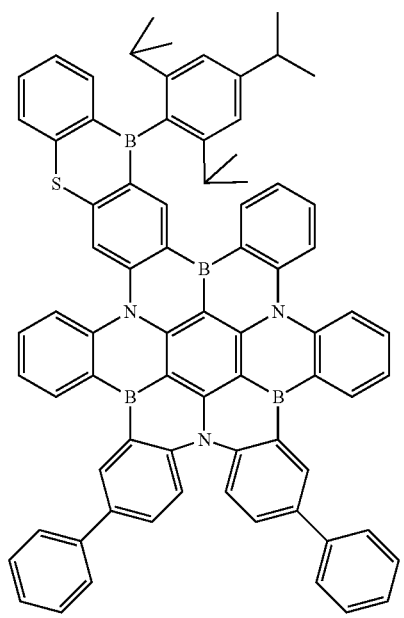
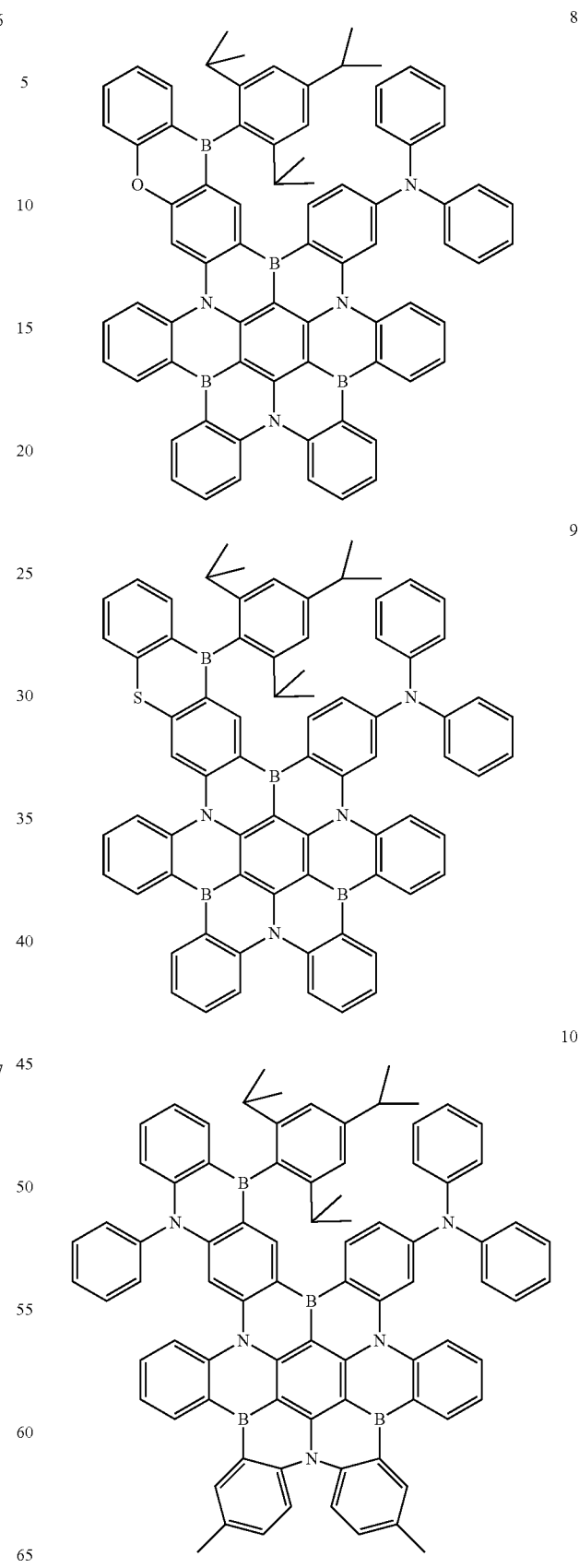

99
-continued
11
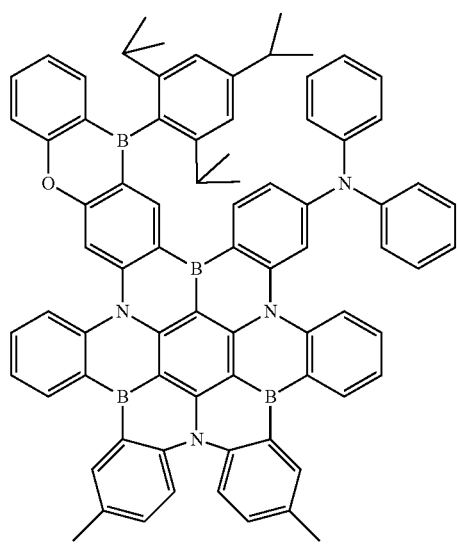
12
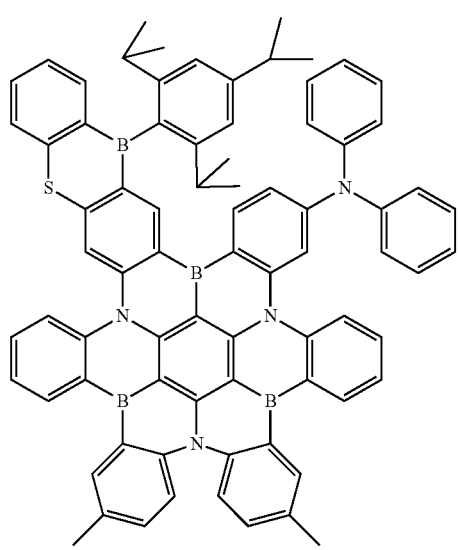
13
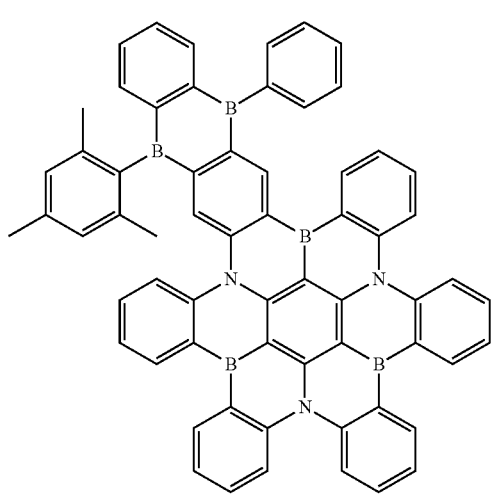
100
-continued
14
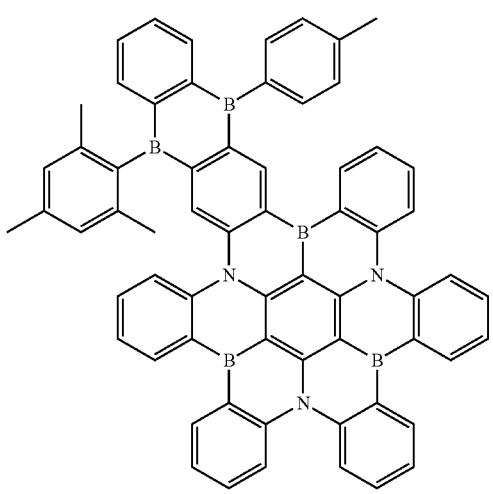
15
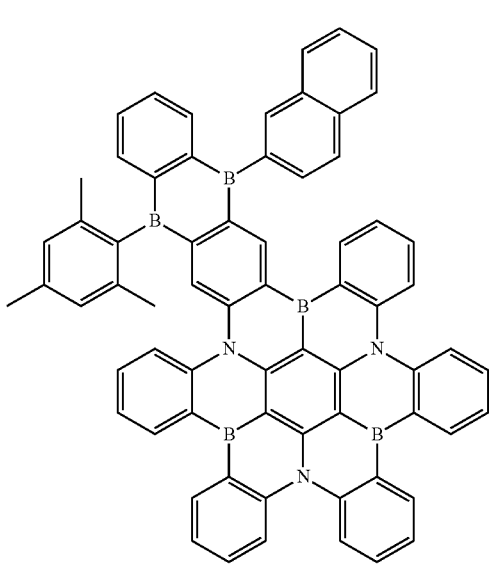
16
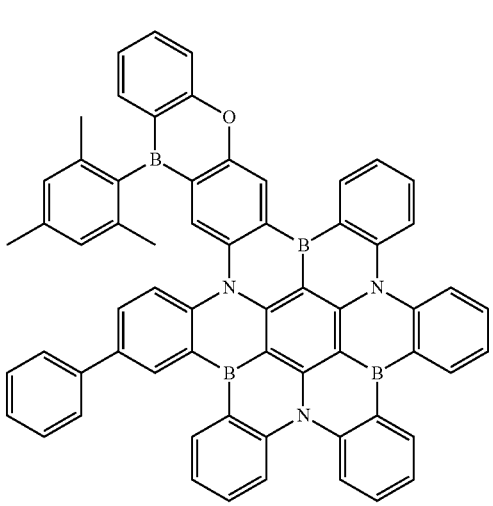

17
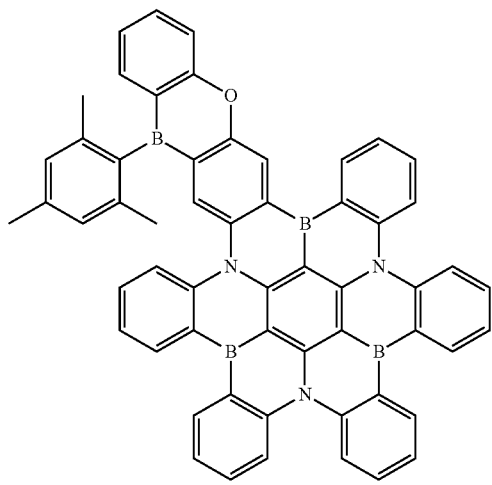
18
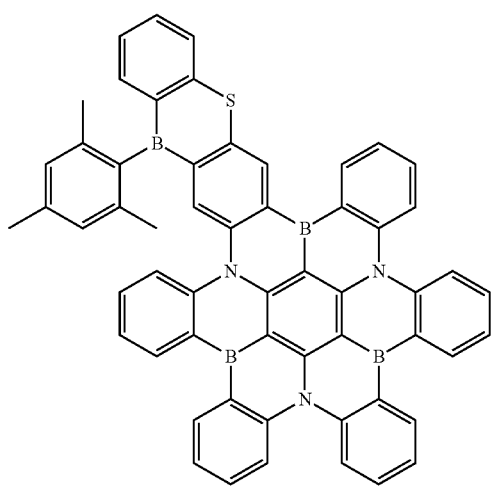
19
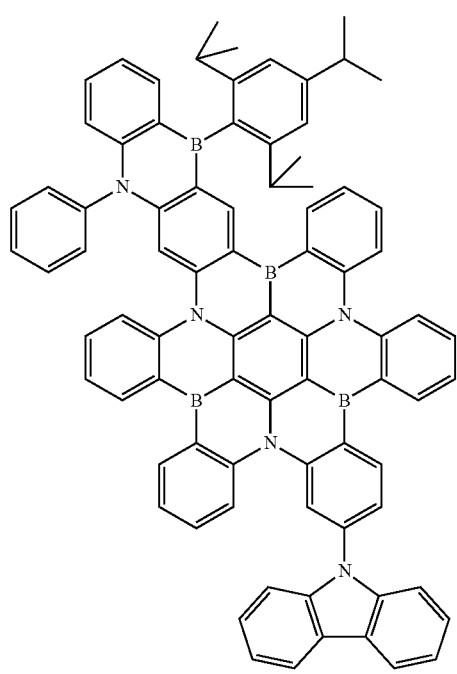
20
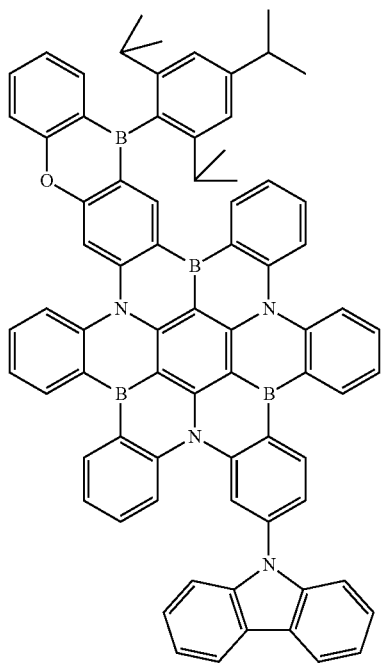
21
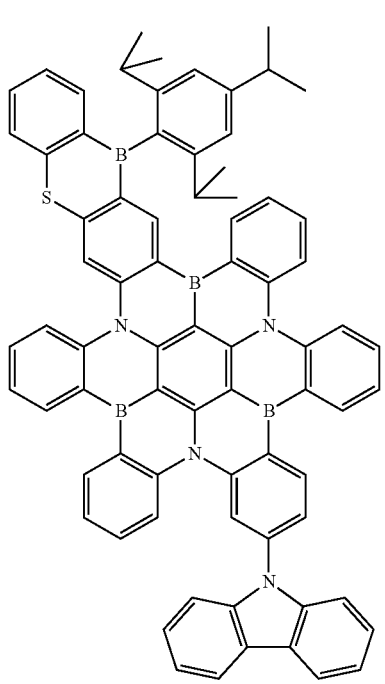

103
-continued
22
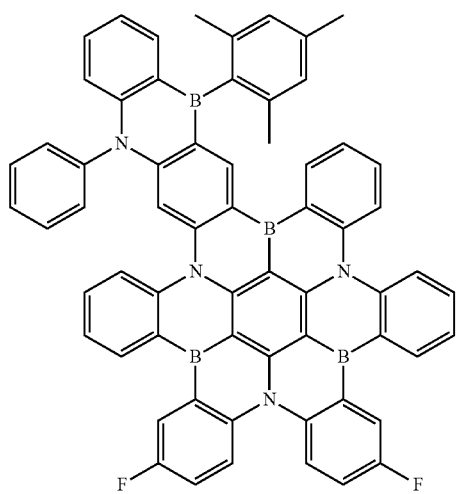
23
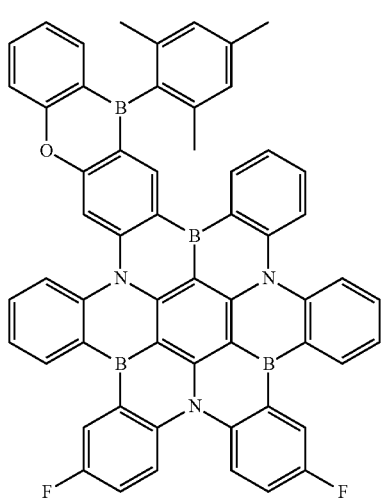
24
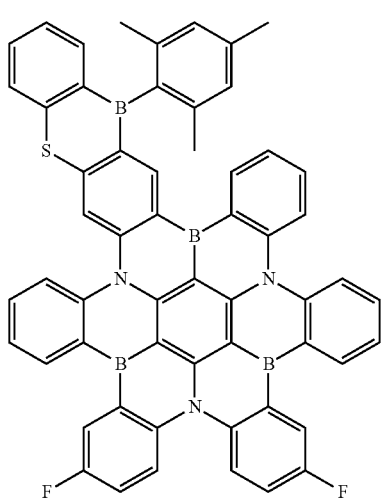
104
-continued
25
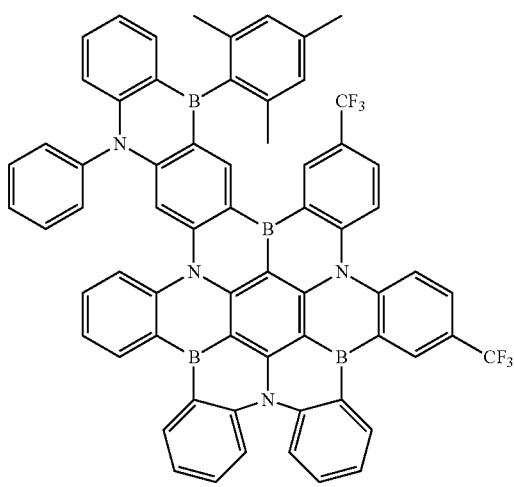
26
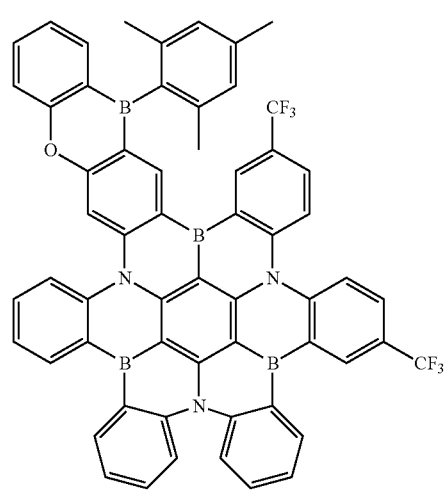
27
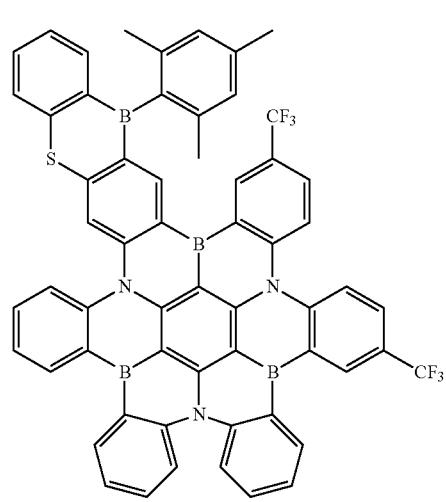

-continued
28
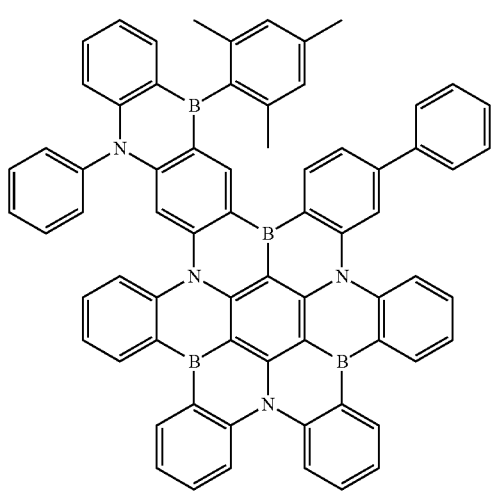
29
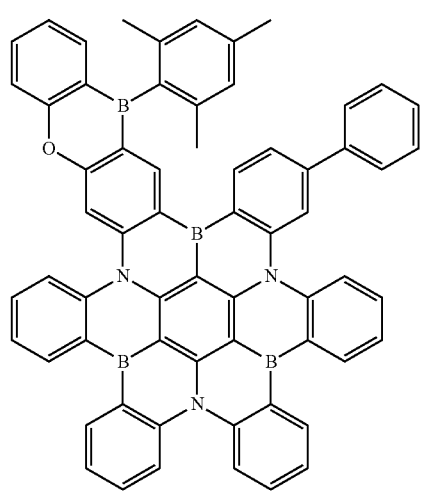
30
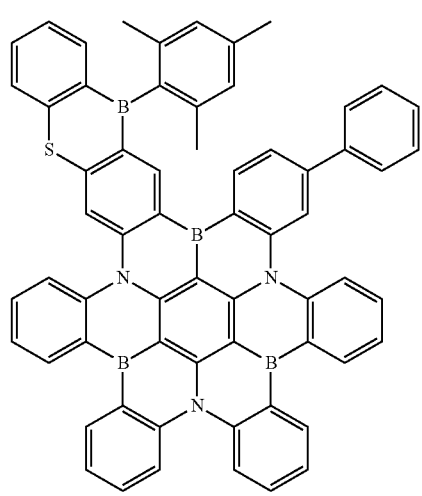
-continued
31
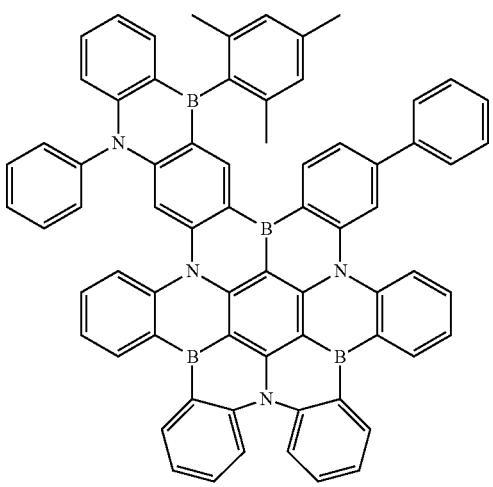
32
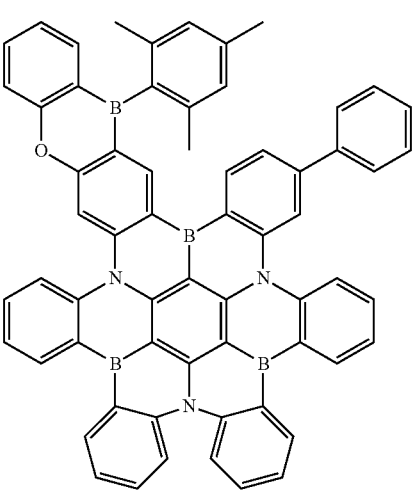
33
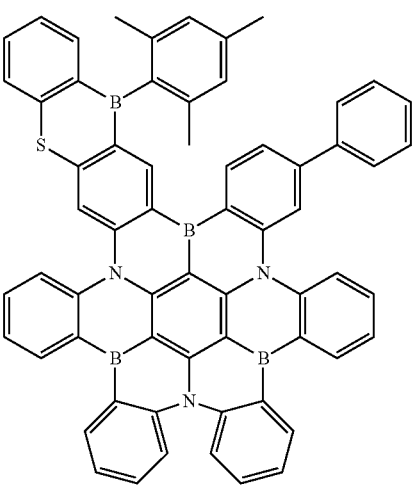

107
-continued
34
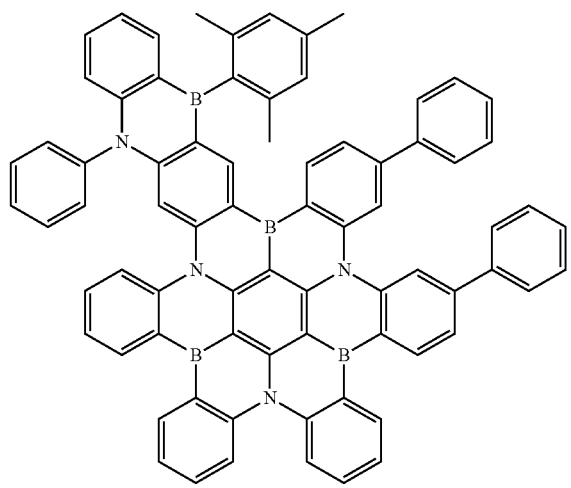
35
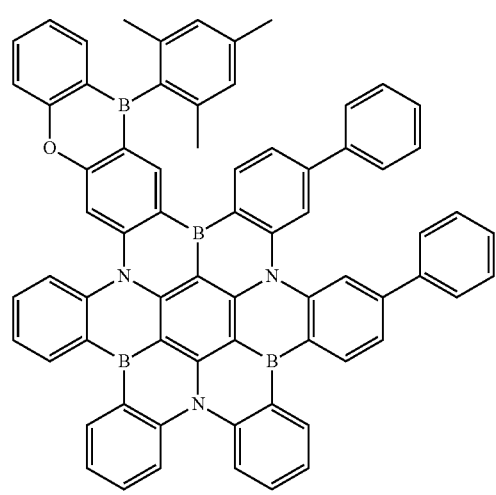
36
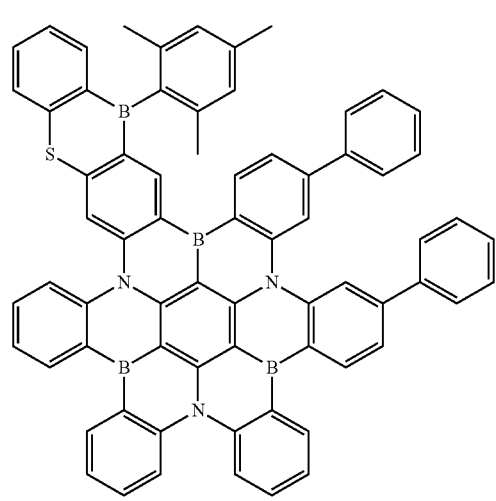
108
-continued
37
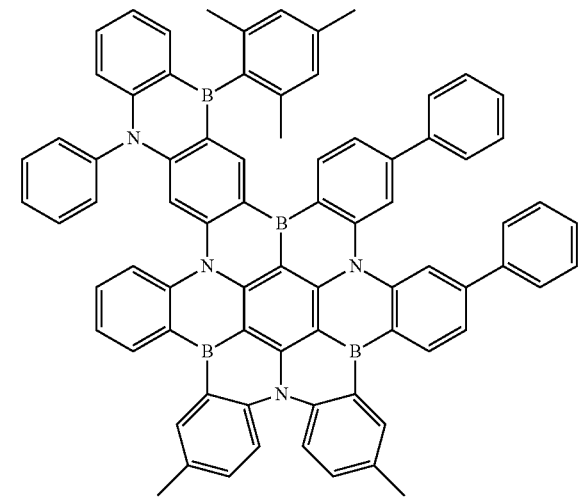
38
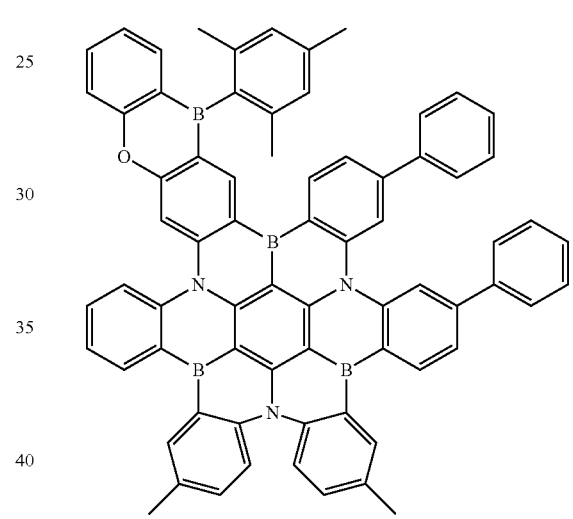
39
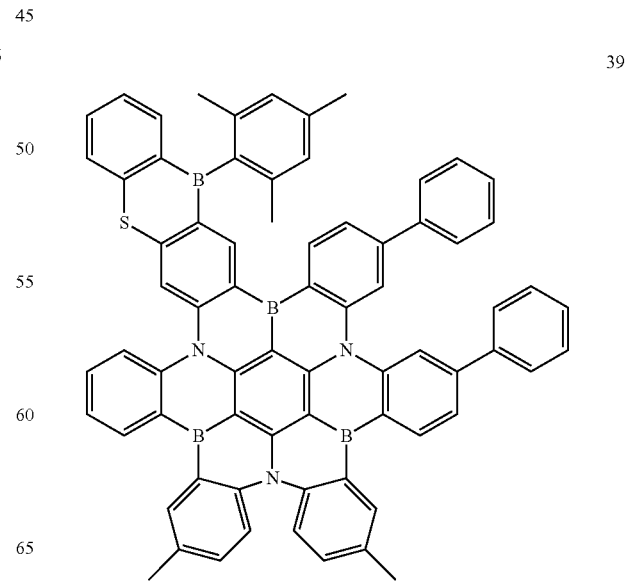

109
-continued
40
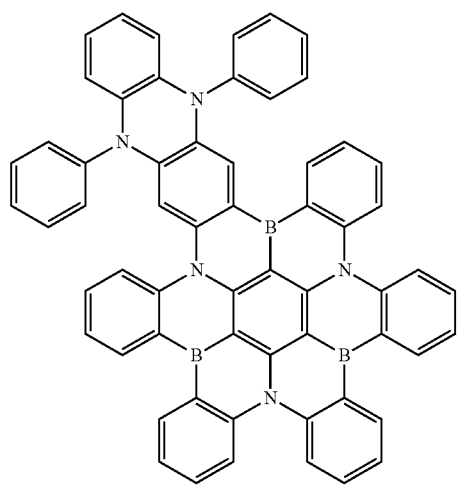
41
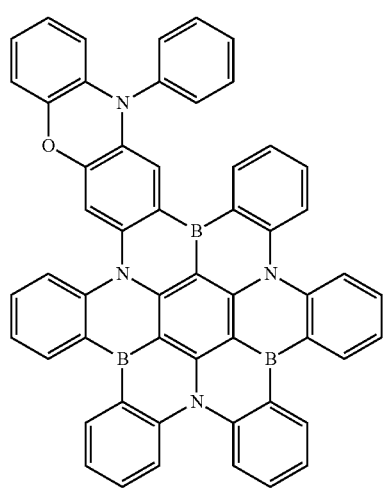
41-D
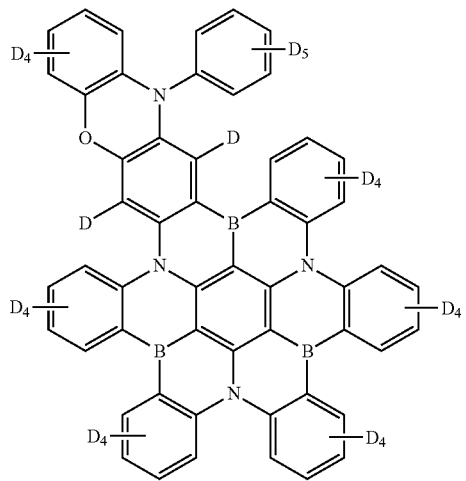
110
-continued
42
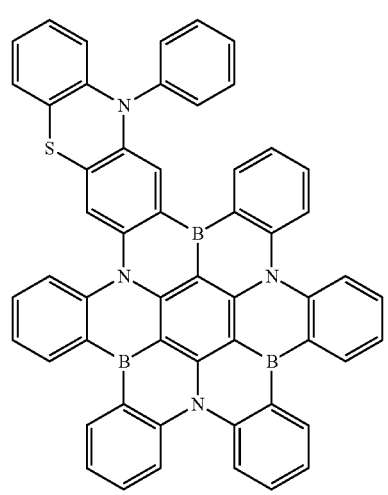
43
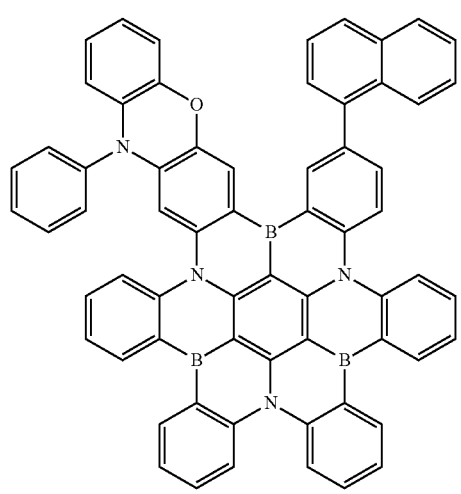
44
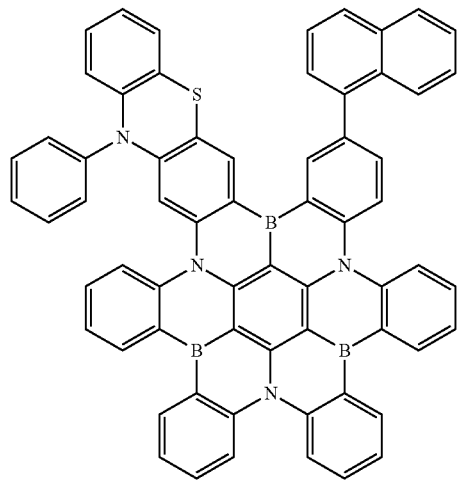

111
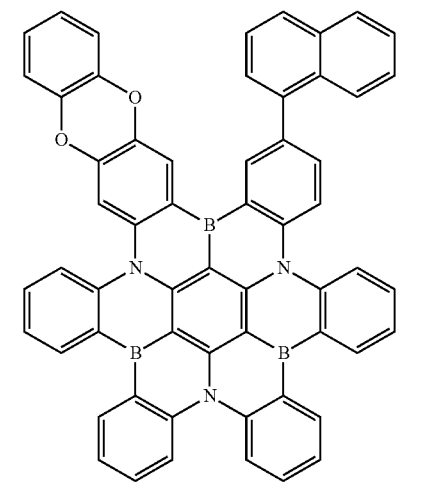
45
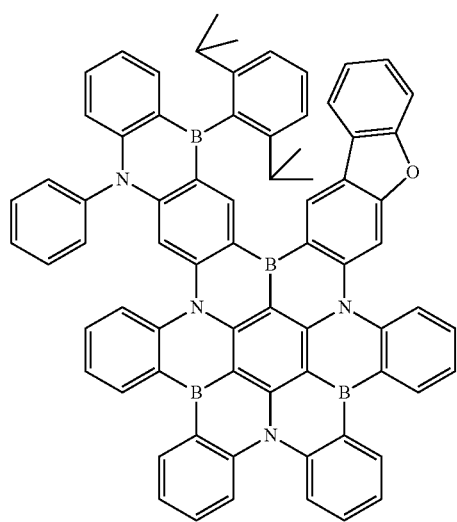
46
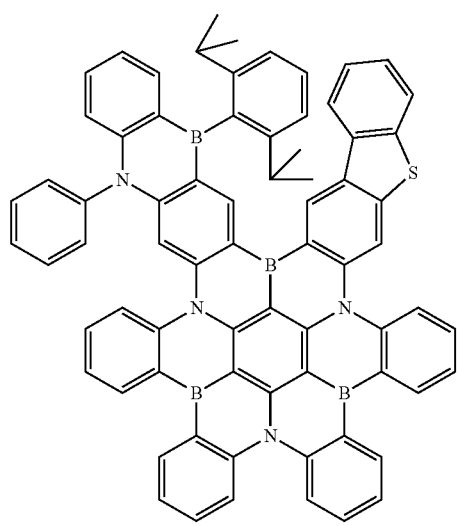
47
112
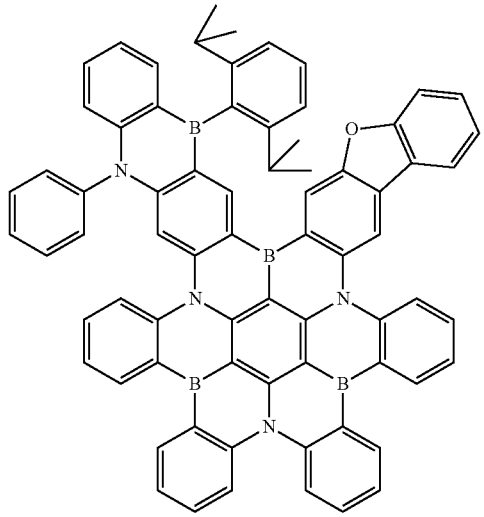
48
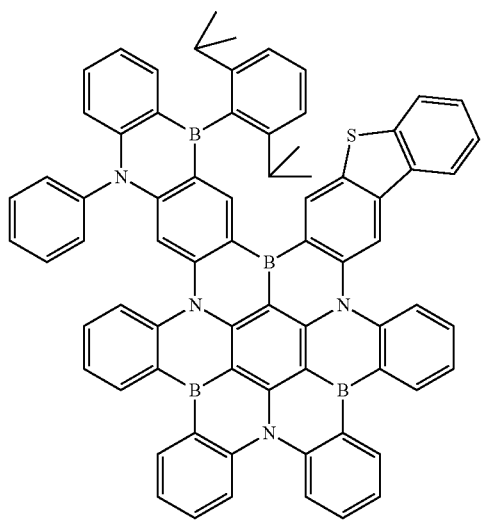
49
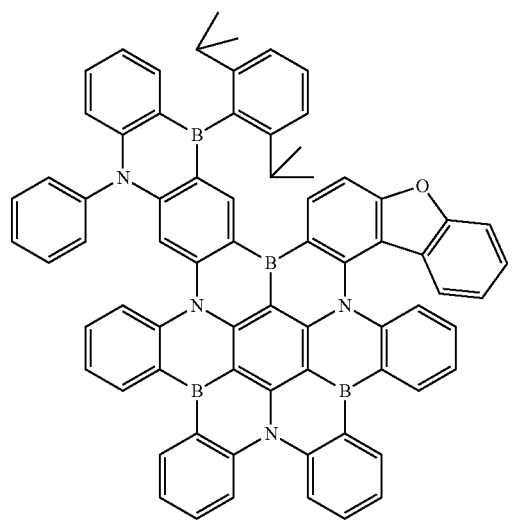
50

113
-continued
51
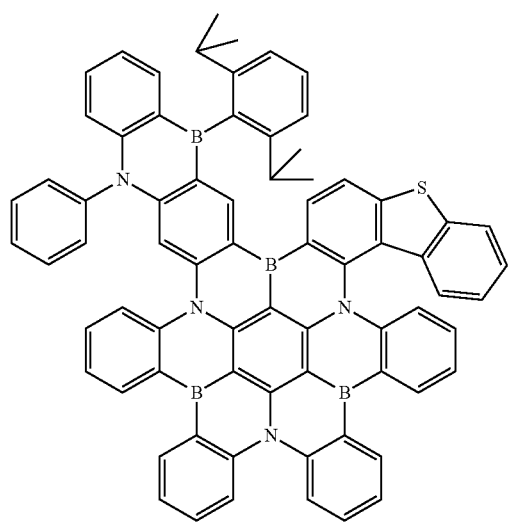
52
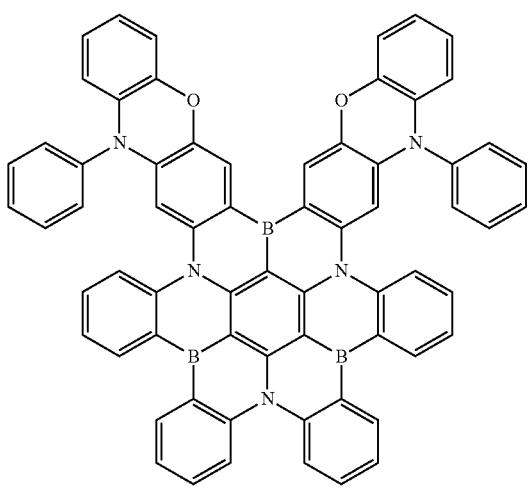
52-D
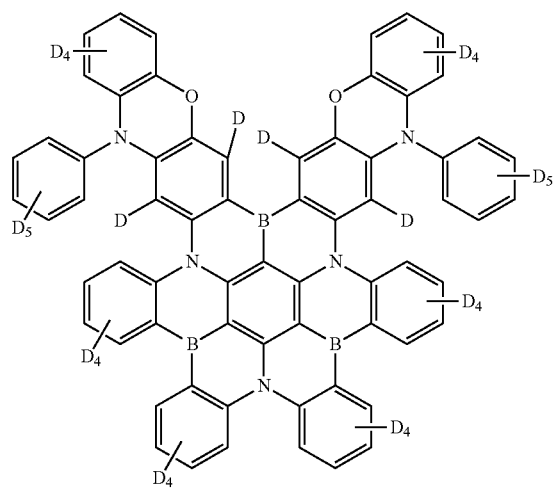
114
-continued
53
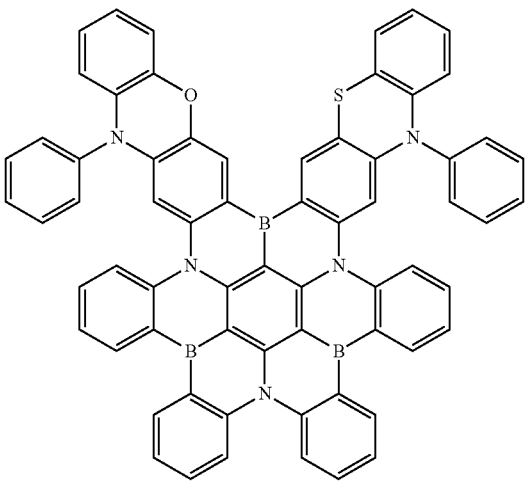
54
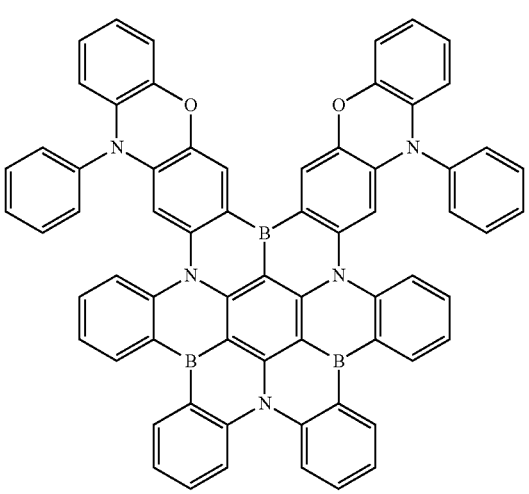
55
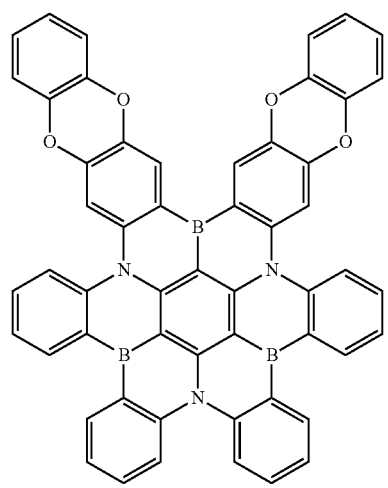

56
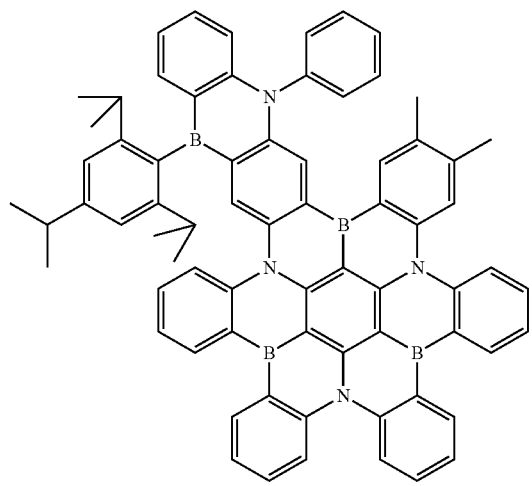
57
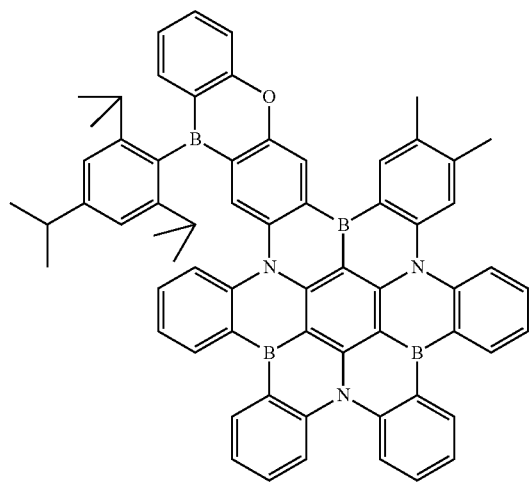
58
59
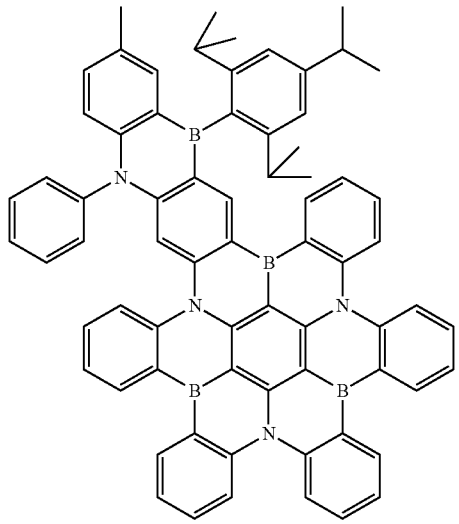
60
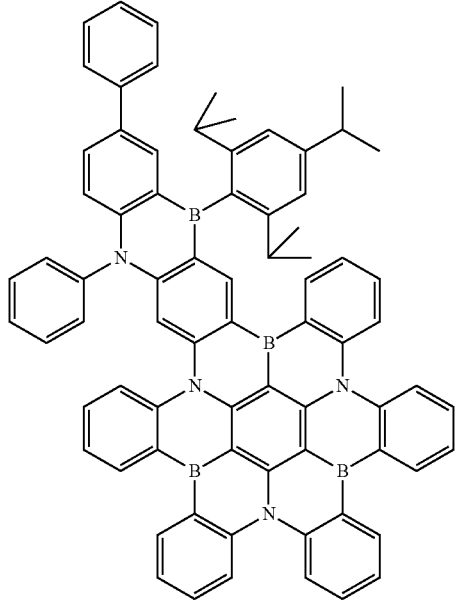
61
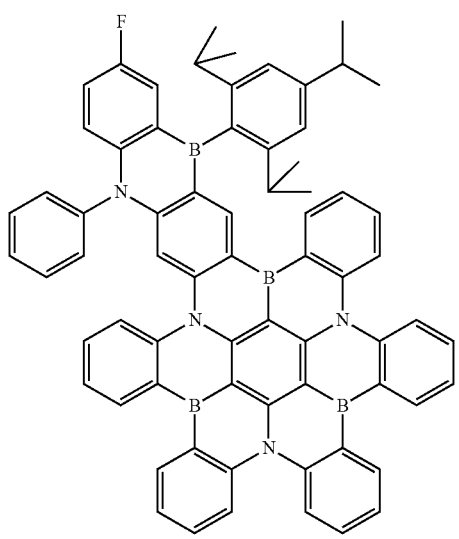

117
-continued
62
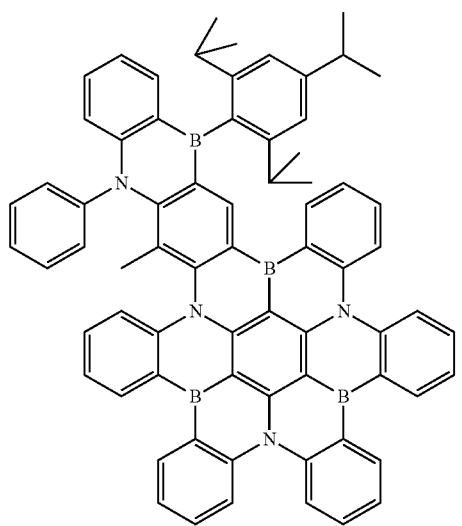
63
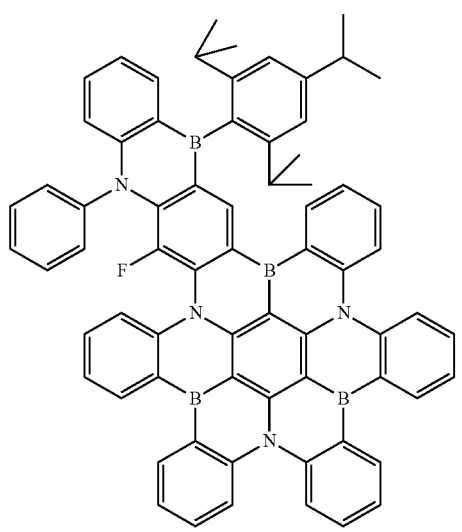
64
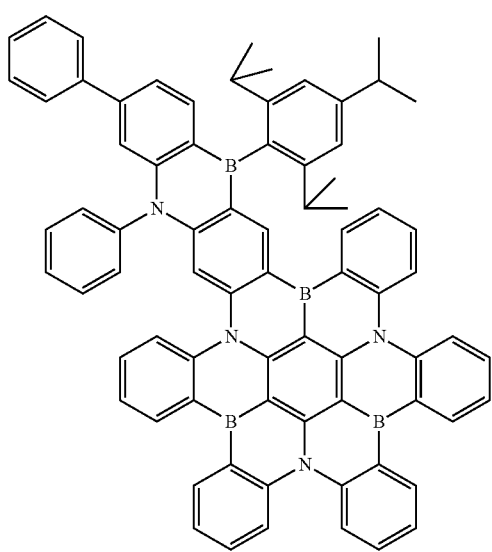
118
-continued
65
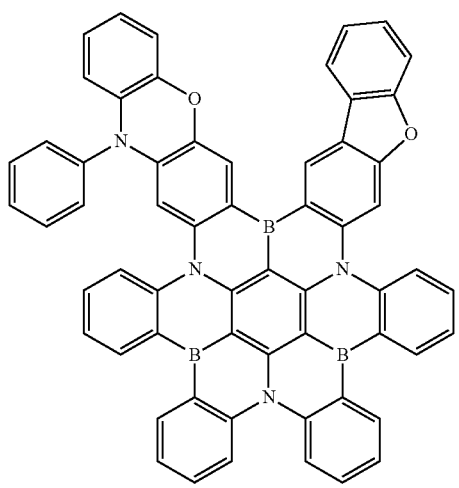
66
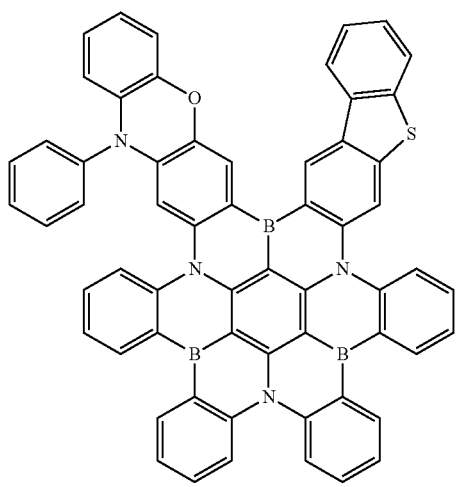
67
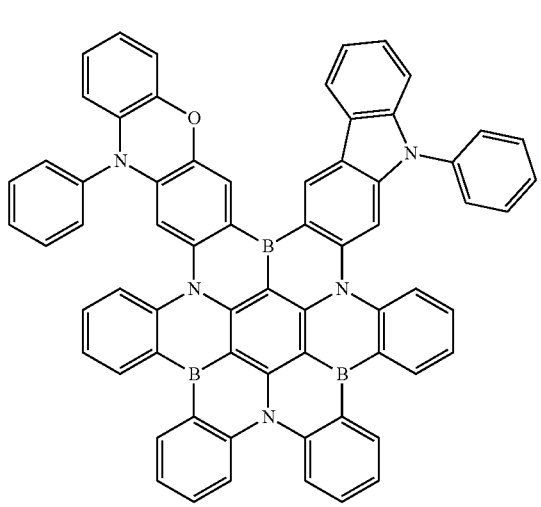

119
-continued
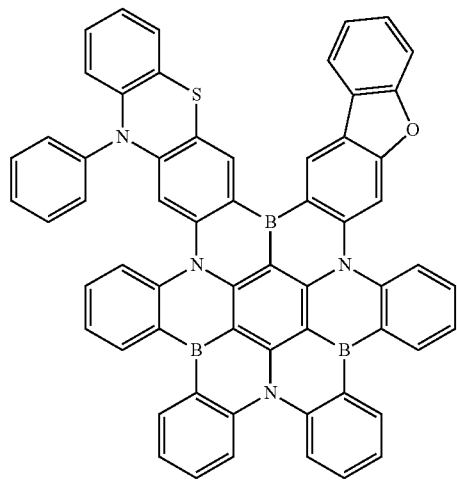
68
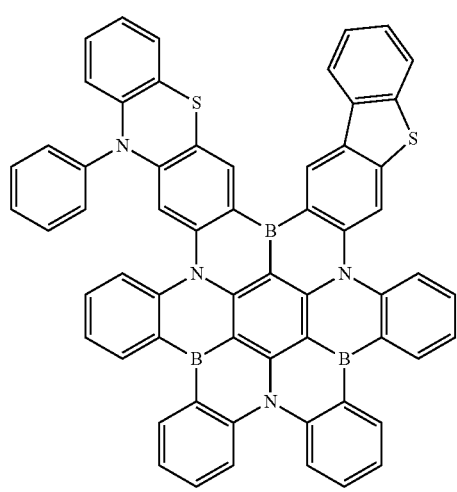
69
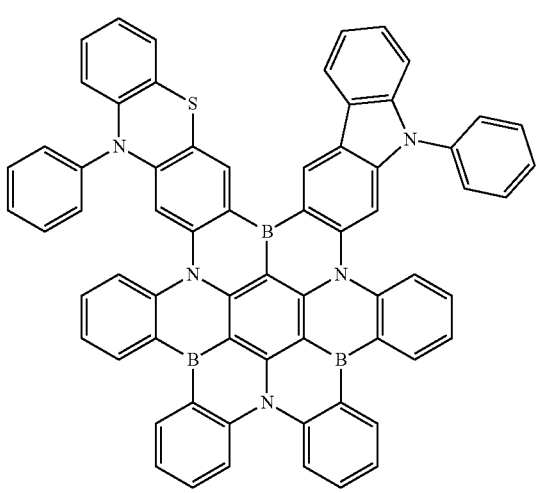
70
120
-continued
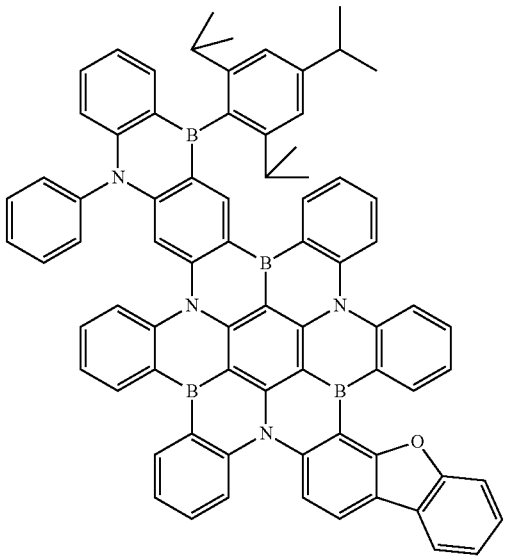
71
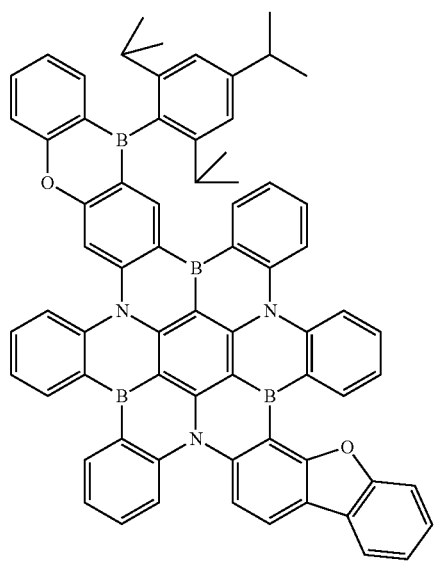
72

121
-continued
73
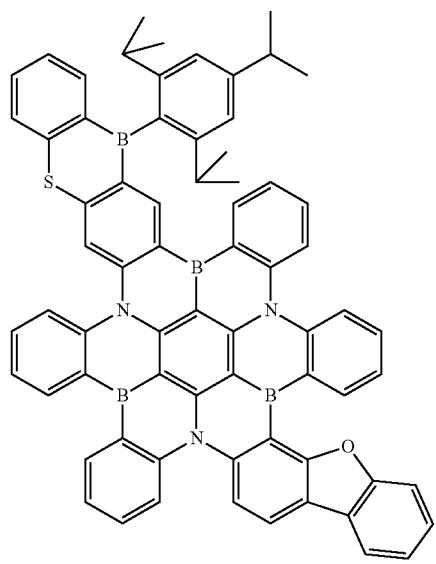
74
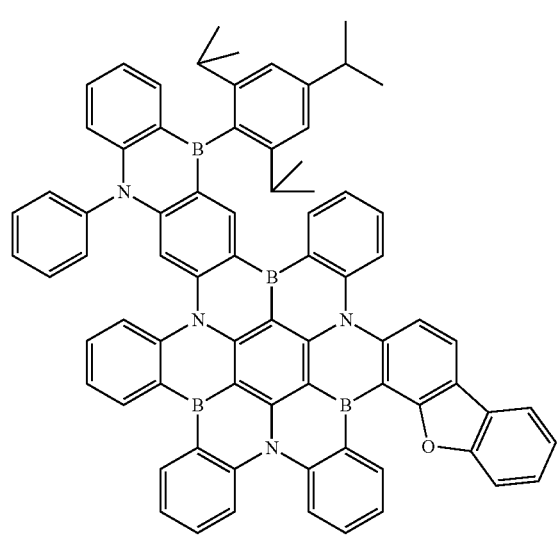
75
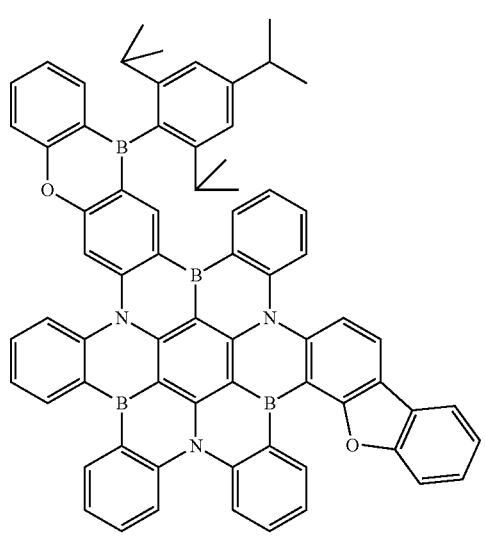
122
-continued
76
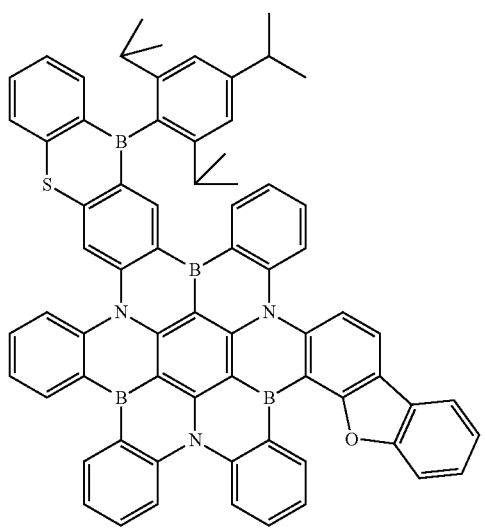
77
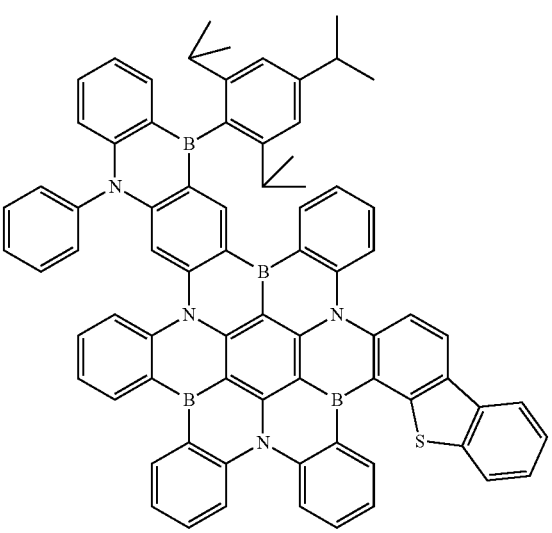
78
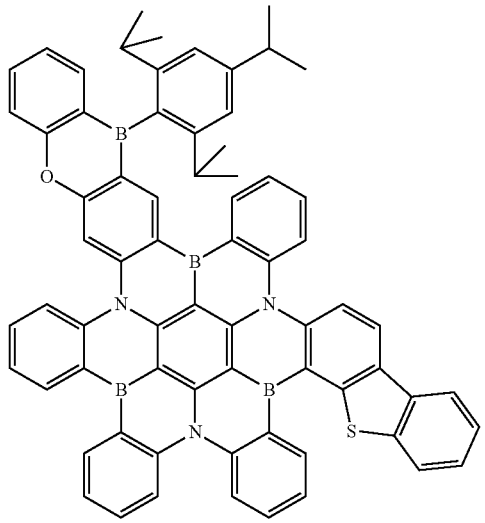

123
-continued
79
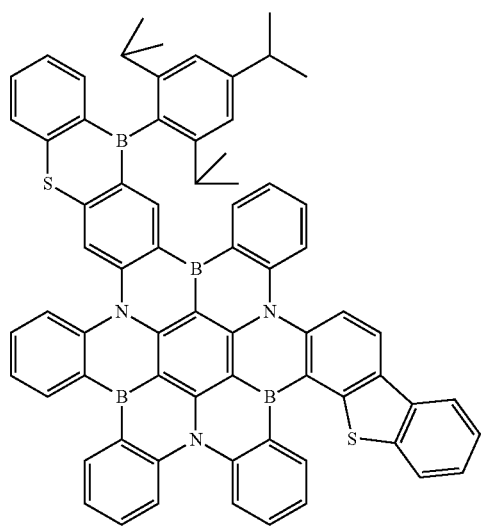
80
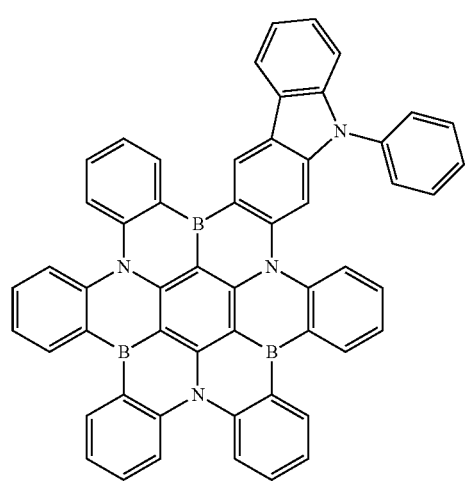
81
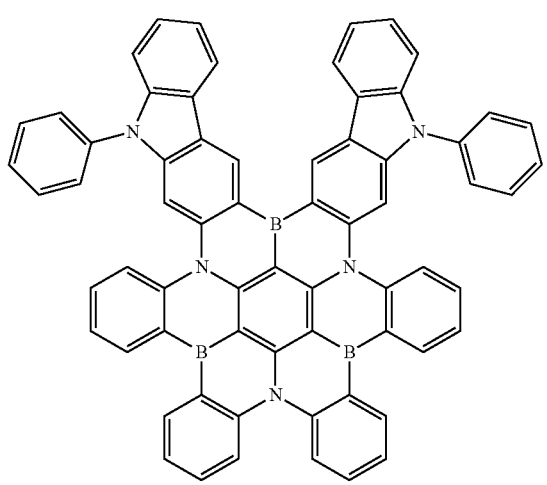
124
-continued
82
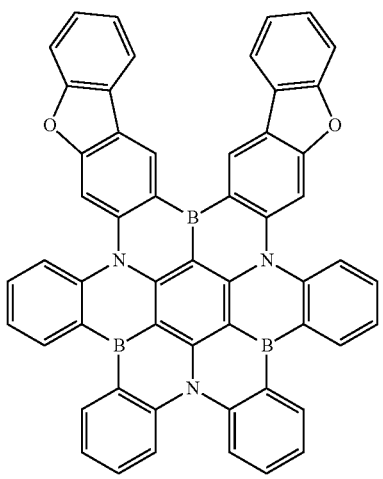
83
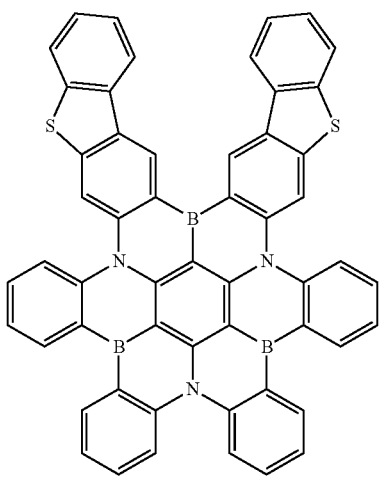
84
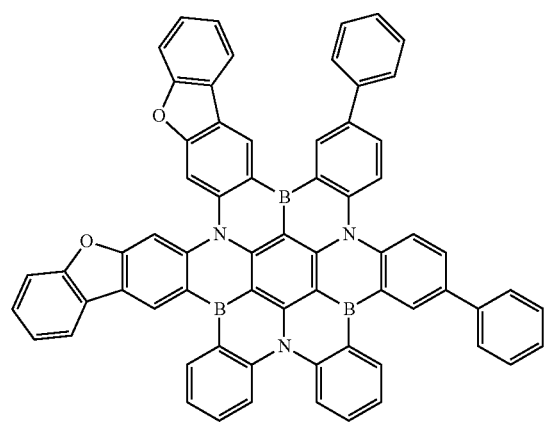

125
-continued
85
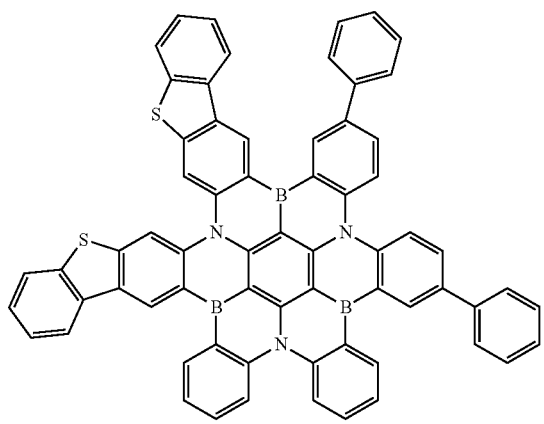
86
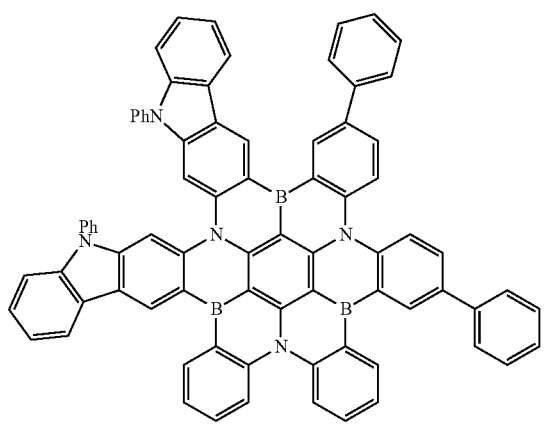
87
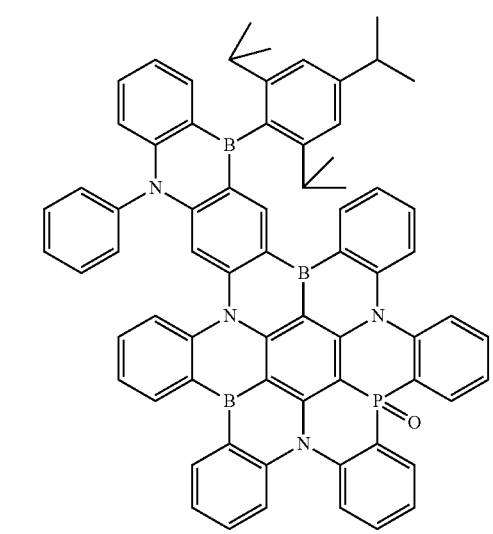
126
-continued
88
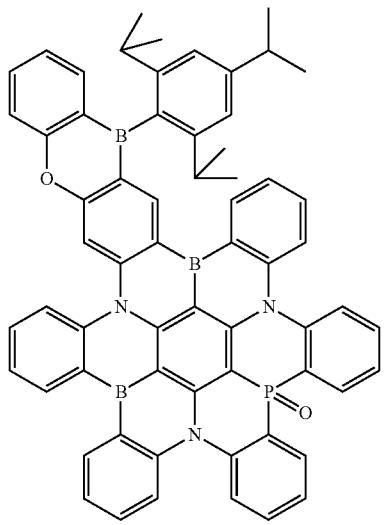
89
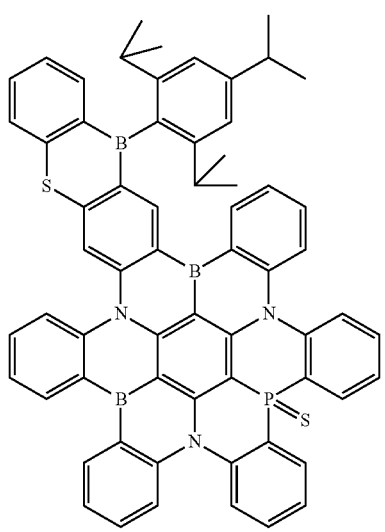
90
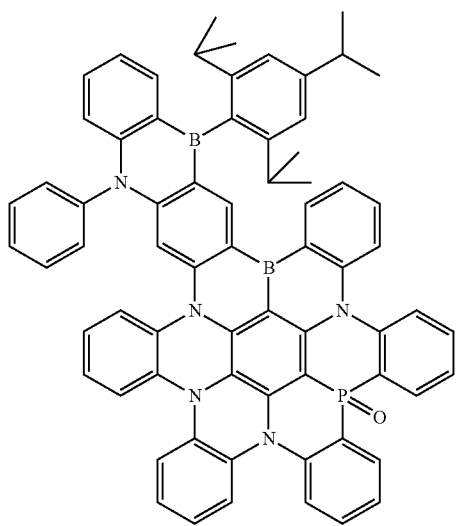

-continued
91
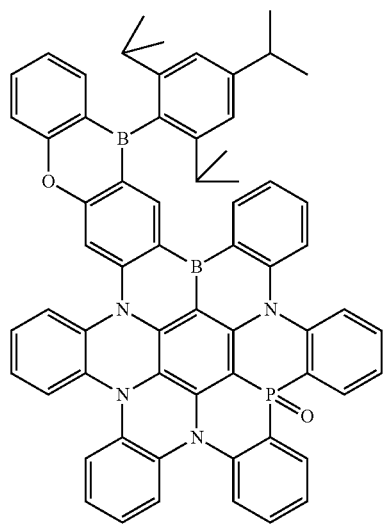
92
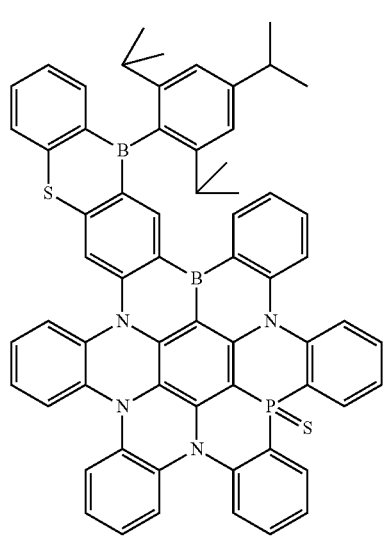
93
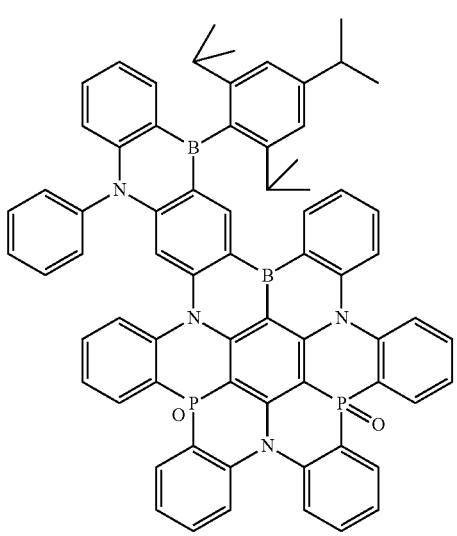
-continued
94
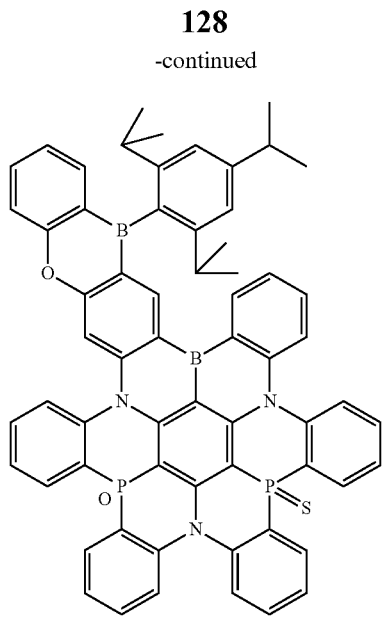
95
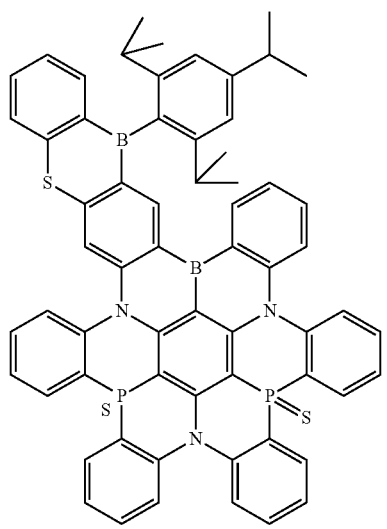
96
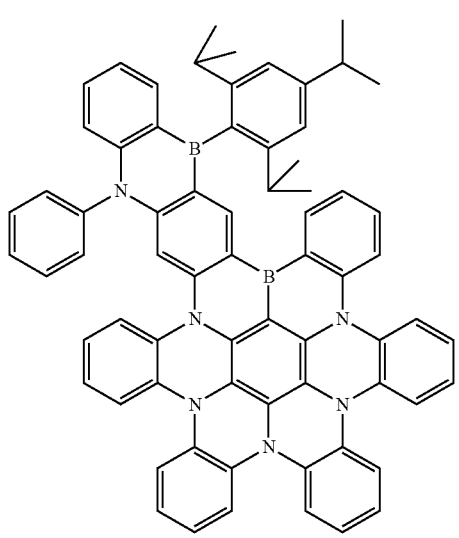

97
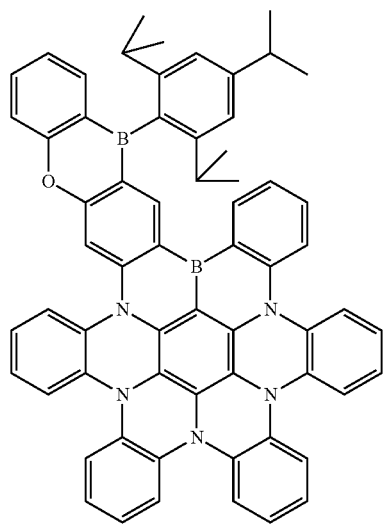
98
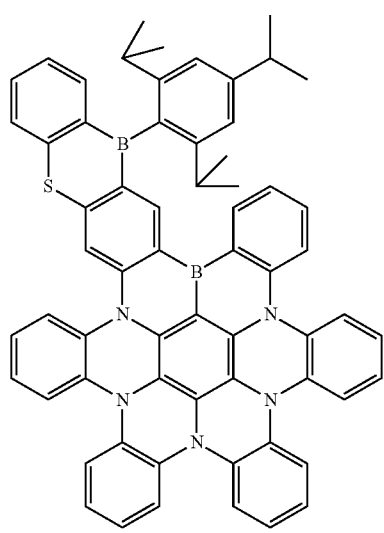
99
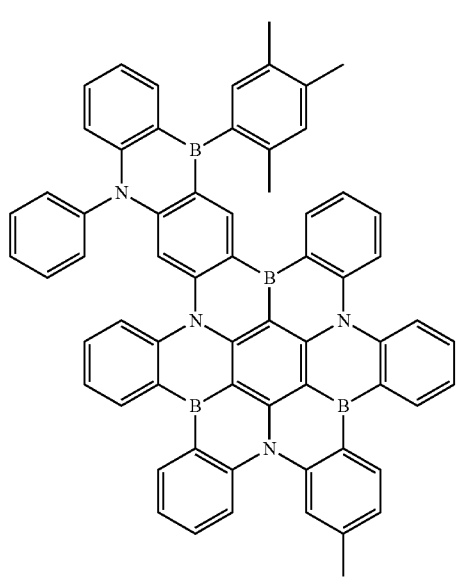
100
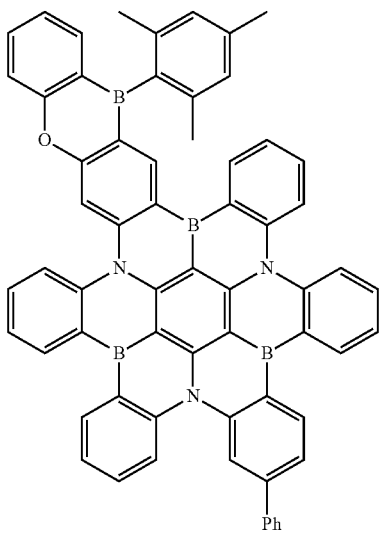
101
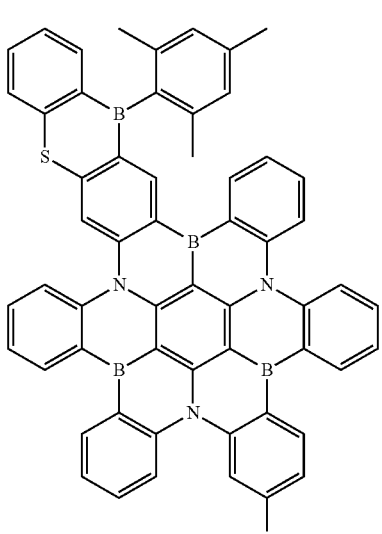
102
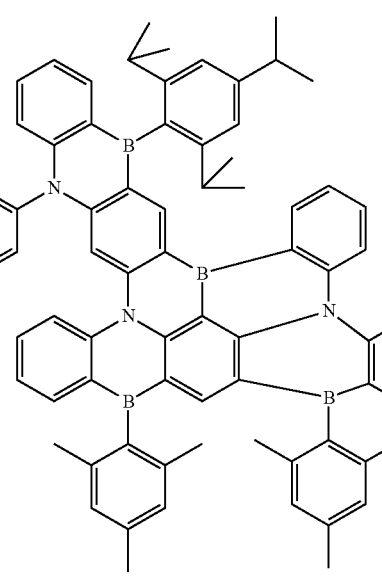

131
-continued
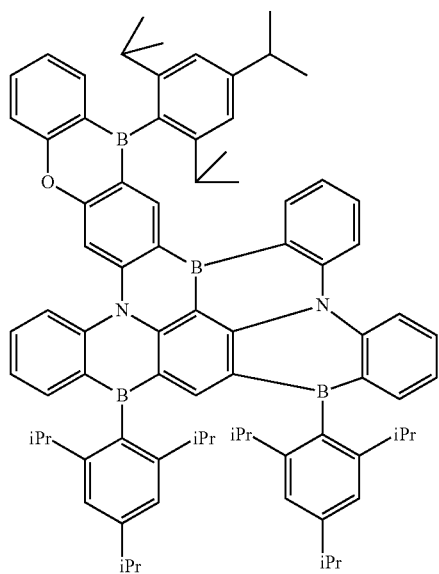
103
132
-continued
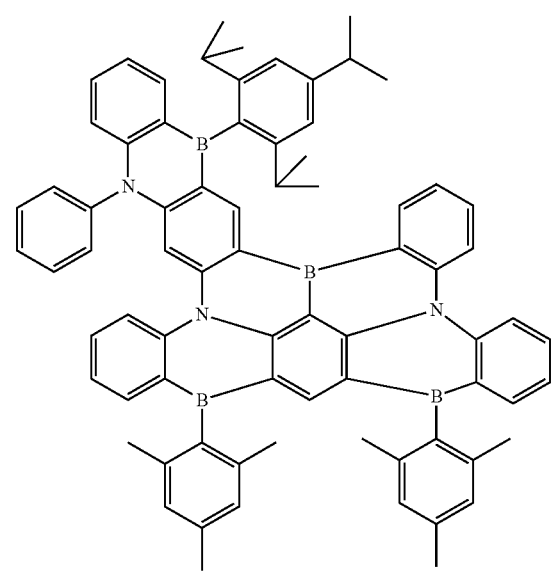
105
104
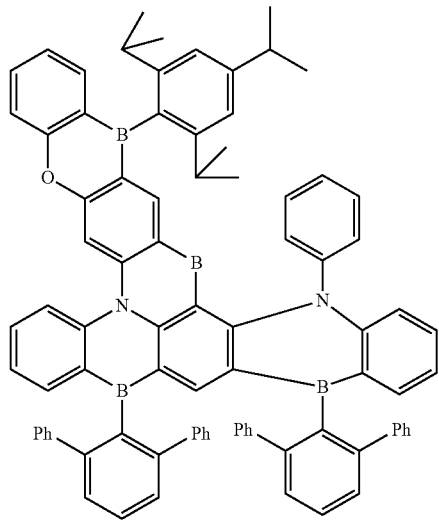
106
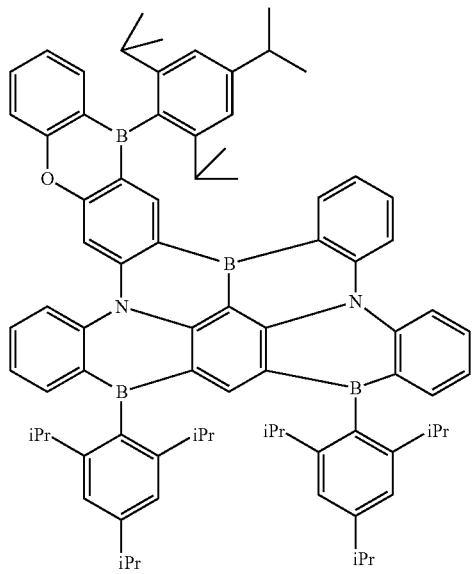

107
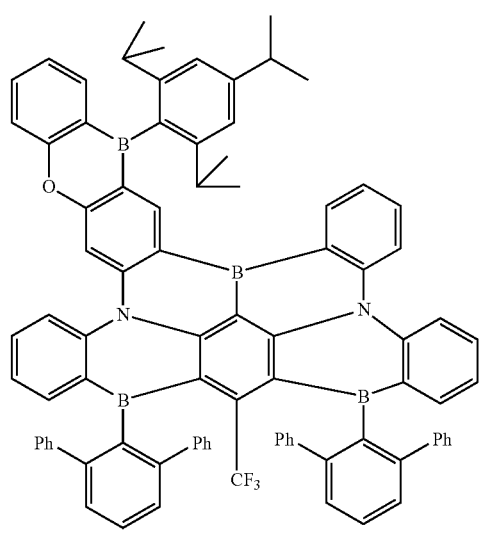
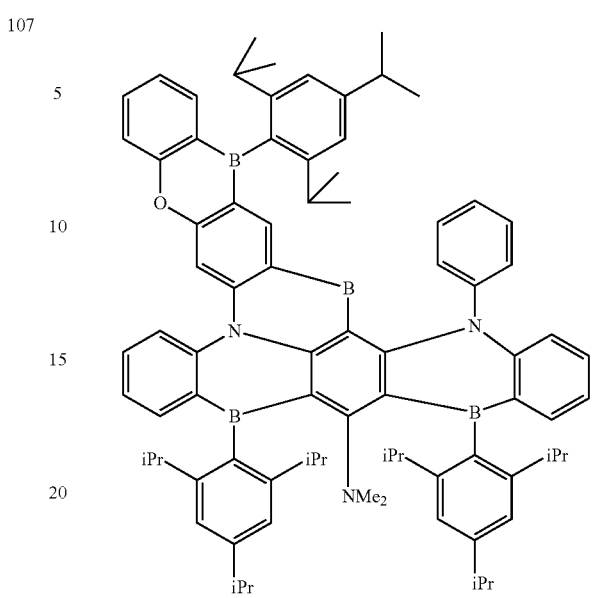
108
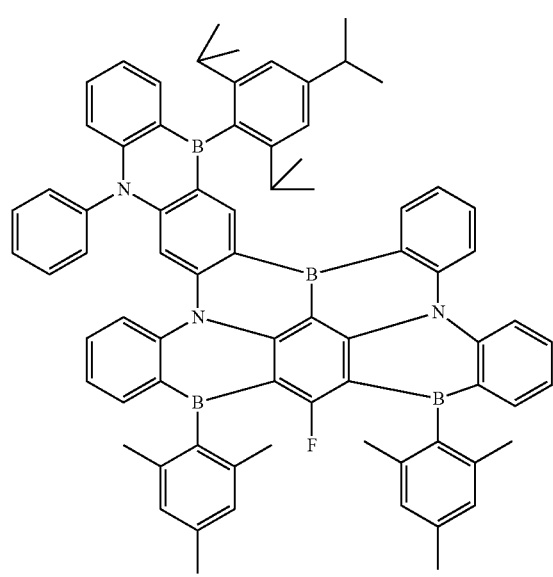

111
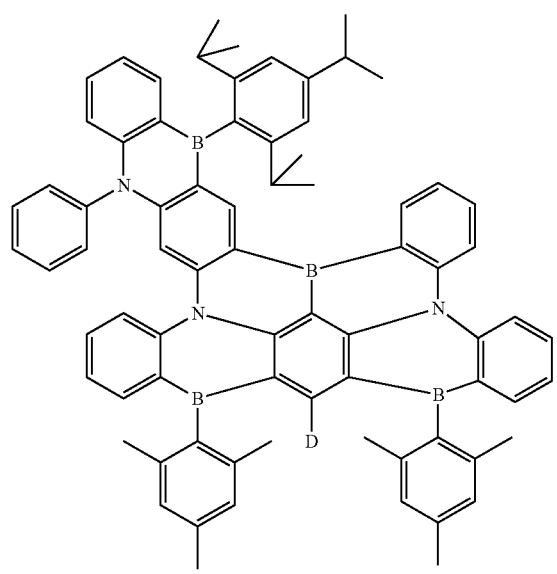
112
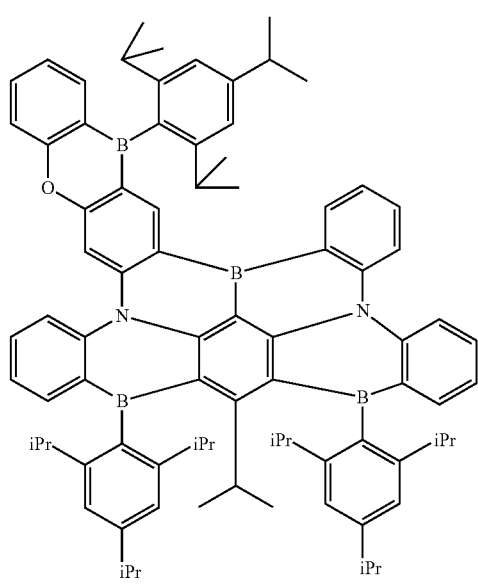
113
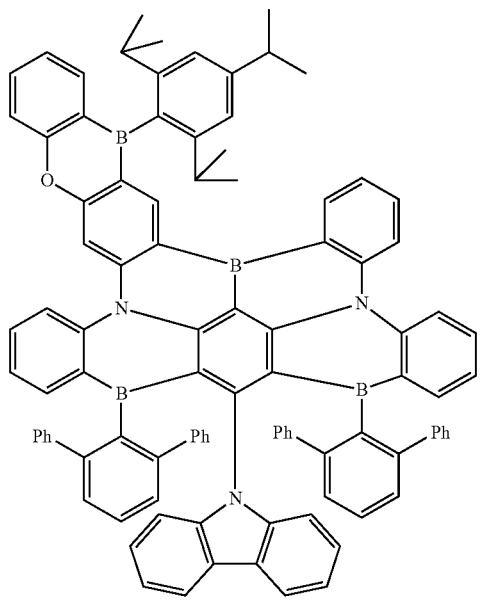
114
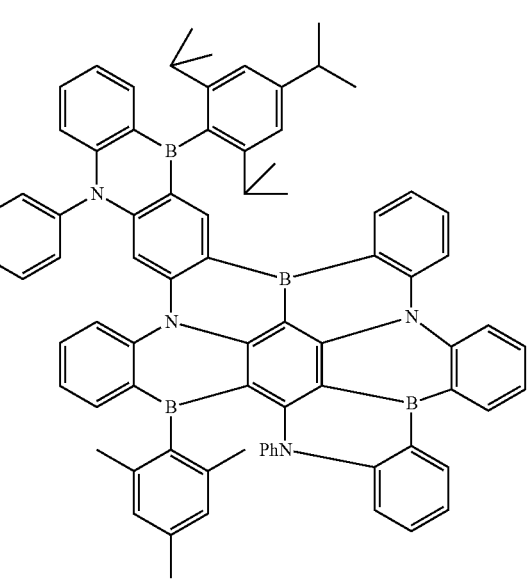

115
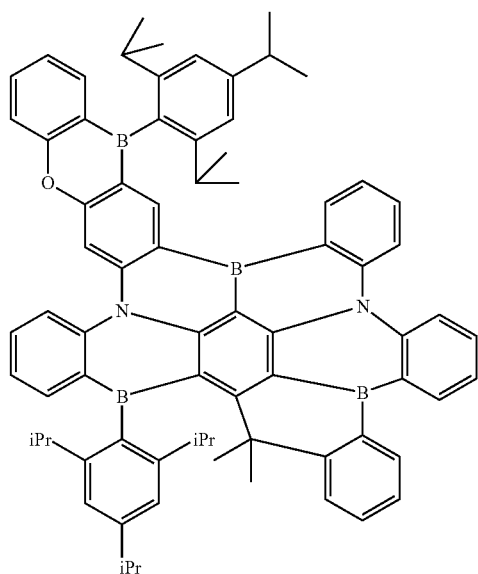
116
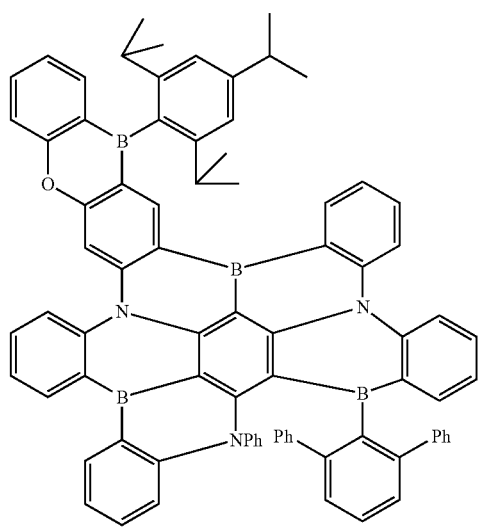
117
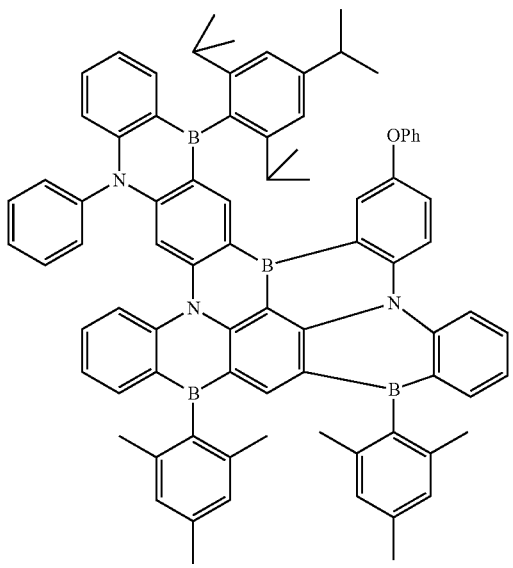
118
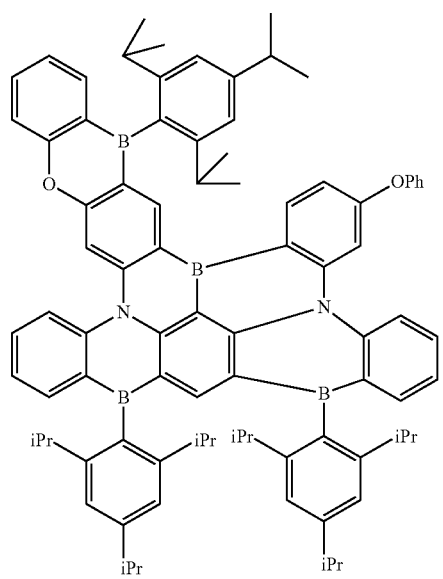
119
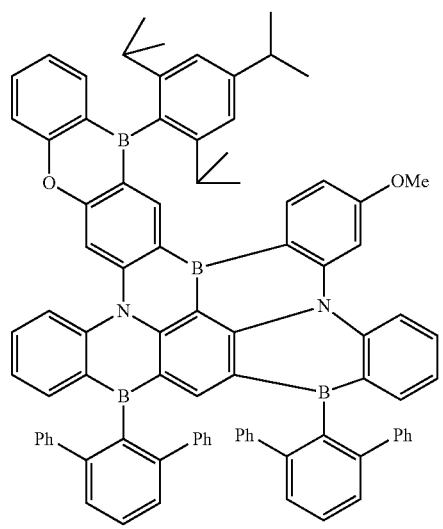

139
-continued
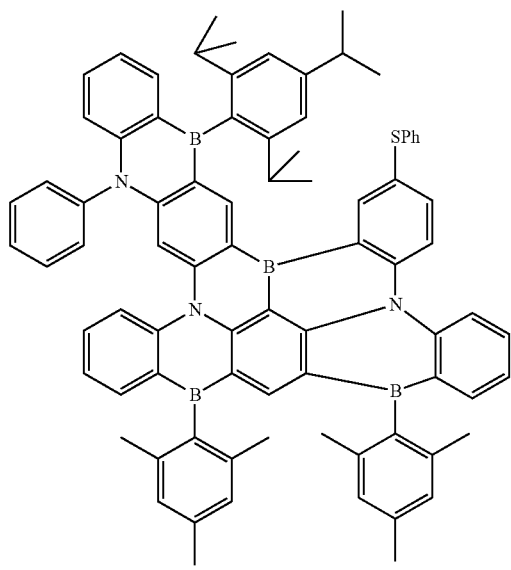
120
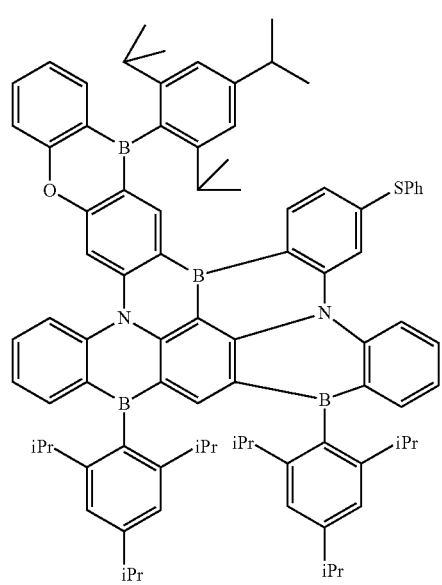
121
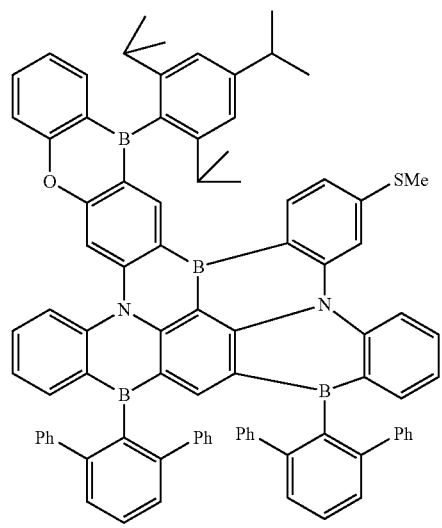
122
140
-continued
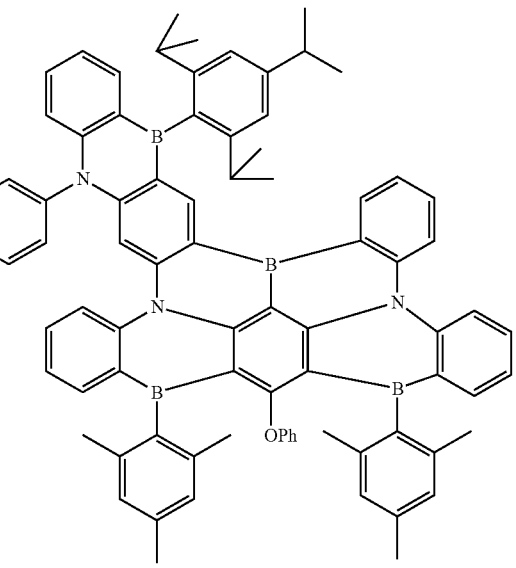

141
-continued

125

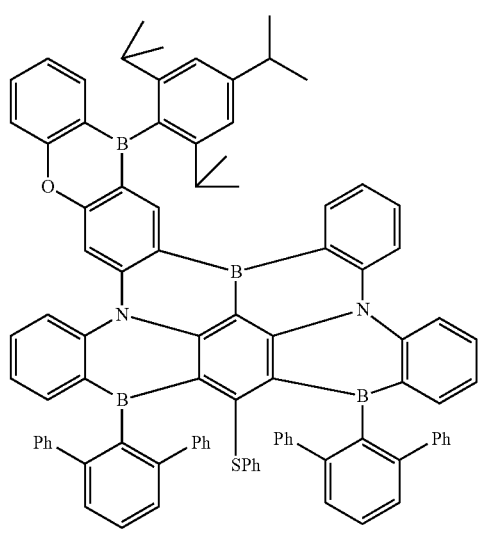

126

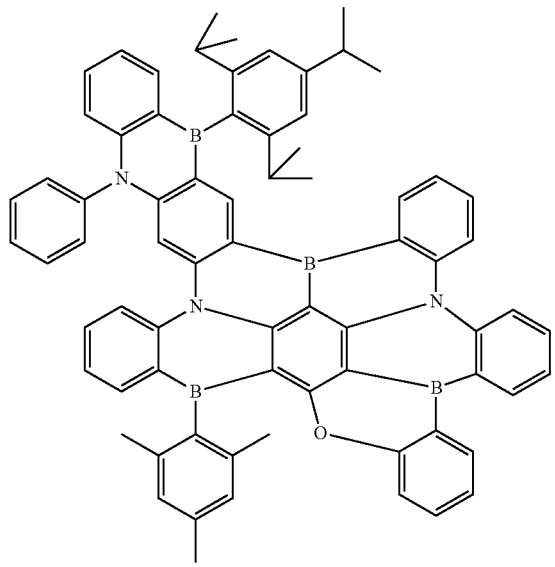

142
-continued

127

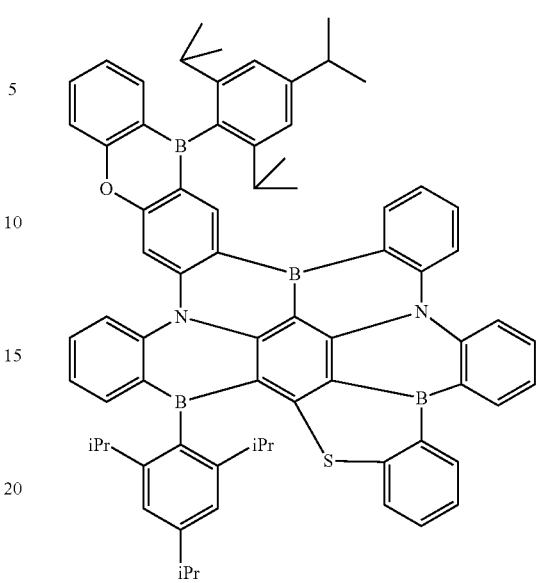

14. A polycyclic compound represented by the following Formula 1:

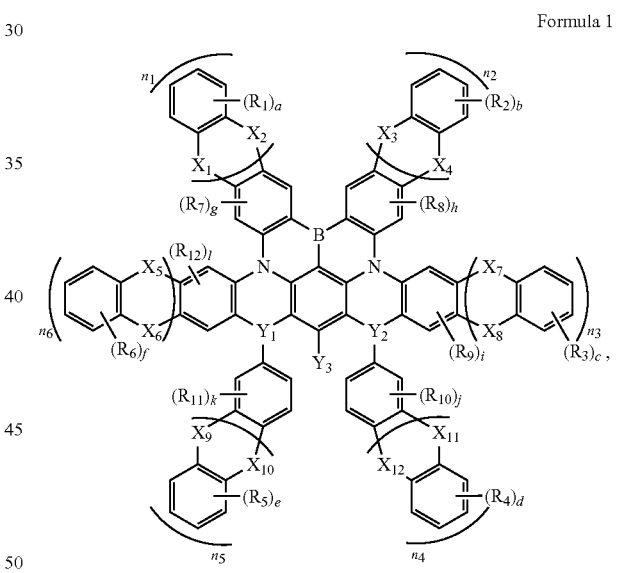

Formula 1 wherein in Formula 1,
$Y_1$ and $Y_2$ are each independently B, N, P=O or P=S,
$X_1$ to $X_{12}$ are each independently $BAr_1$, O, S, $NAr_2$ or a direct linkage,
$Ar_1$ and $Ar_2$ are each independently a substituted or unsubstituted aryl group of 6 to 30 carbon atoms for forming a ring, or a substituted or unsubstituted heteroaryl group of 2 to 30 carbon atoms for forming a ring,
$Y_3$ and $R_1$ to $R_{12}$ are each independent a hydrogen atom, a deuterium atom, a halogen atom, a substituted or unsubstituted amino group, a substituted or unsubstituted oxy group, a substituted or unsubstituted thio group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or are bonded to one or more adjacent groups to form one or more rings, "a" to "f" are each independently an integer of 0 to 4, "j" and "k" are each independently an integer of 0 to 3, "g" to "i" and "l" are each independently an integer of 0 to 2, and n1 to n6 are each independently 0 or 1, where at least one of n1 to n6 is 1.

15. The polycyclic compound of claim 14, wherein Formula 1 is represented by the following Formula 2:

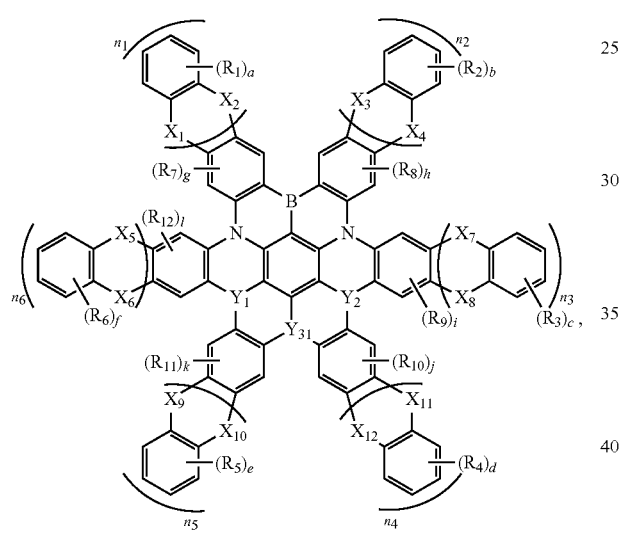

Formula 2 and wherein in Formula 2, $Y_{31}$ is CA or N,

A is a hydrogen atom, a deuterium atom, a halogen atom, a substituted or unsubstituted amino group, a substituted or unsubstituted oxy group, a substituted or unsubstituted thio group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, "j'" and "k'" are each independently an integer of 0 to 2, and $Y_1$, $Y_2$, $X_1$ to $X_{12}$, $R_1$ to $R_{12}$, "a" to "i", "l" and n1 to n6 are the same as defined in Formula 1.

16. The polycyclic compound of claim 14, wherein Formula 1 is represented by the following Formula 3:

Formula 3 and wherein in Formula 3, $Y_{32}$ is $CA_1A_2$ or $NA_3$, $A_1$ to $A_3$ are each independently a hydrogen atom, a deuterium atom, a halogen atom, a substituted or unsubstituted amino group, a substituted or unsubstituted oxy group, a substituted or unsubstituted thio group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, "j'" is an integer of 0 to 2, and $Y_1$, $Y_2$, $X_1$ to $X_{12}$, $R_1$ to $R_{12}$, "a" to "i", "k", "l" and n1 to n6 are the same as defined in Formula 1.

17. The polycyclic compound of claim 14, wherein Formula 1 is represented by the following Formula 4:

Formula 4

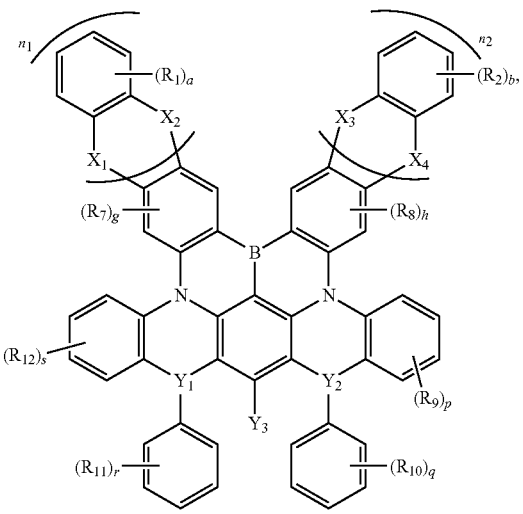

and wherein in Formula 4,

"q" and "r" are each independently an integer of 0 to 5,

"p" and "s" are each independently an integer of 0 to 4, and $Y_1$ to $Y_3$, $X_1$ to $X_4$, $R_1$, $R_2$, $R_7$ to $R_{12}$, "a", "b", "g", "h", n1 and n2 are the same as defined in Formula 1.

18. The polycyclic compound of claim 15, wherein Formula 2 is represented by the following Formula 5:

Formula 5

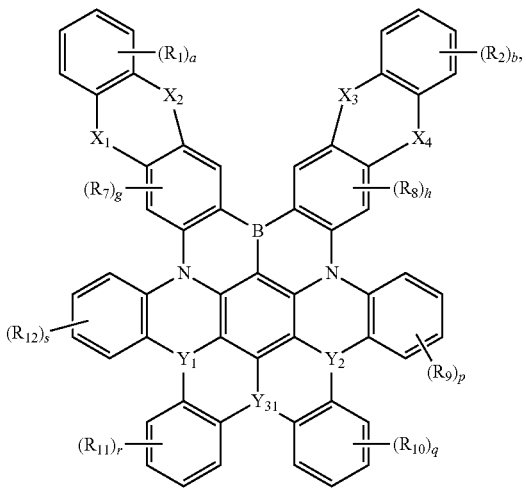

and wherein in Formula 5,

"p" to "s" are each independently an integer of 0 to 4, and $Y_1$, $Y_2$, $Y_{31}$, $X_1$ to $X_4$, $R_1$, $R_2$, $R_7$ to $R_{12}$, "a", "b", "g", and "h" are the same as defined in Formula 2.

19. The polycyclic compound of claim 15, wherein Formula 2 is represented by the following Formula 6:

Formula 6

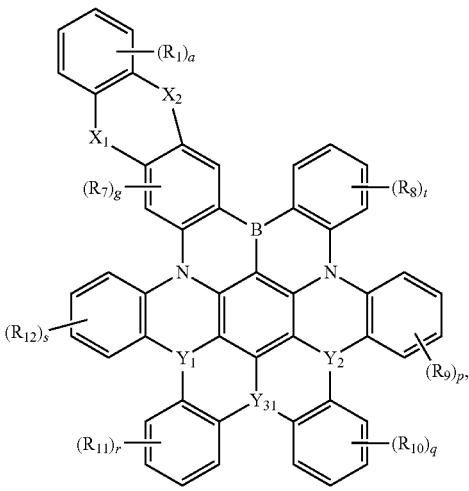

and wherein in Formula 6,

"p" to "s" are each independently an integer of 0 to 4, and $Y_1$, $Y_2$, $Y_{31}$, $X_1$, $X_2$, $R_1$, $R_7$ to $R_{12}$, "a", "g", and "h" are the same as defined in Formula 2.

20. The polycyclic compound of claim 14, wherein the polycyclic compound represented by Formula 1 is at least one among compounds represented in the following Compound Group 1:

Compound Group 1

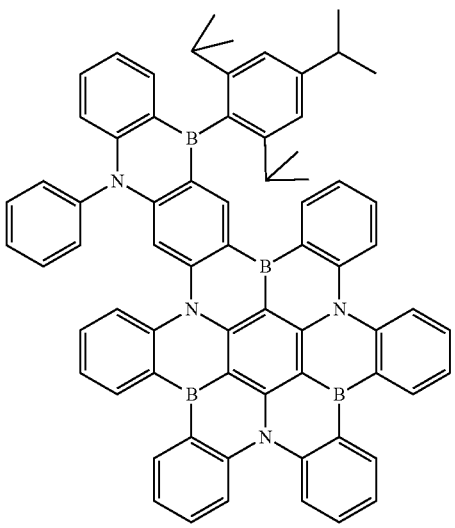

1

2
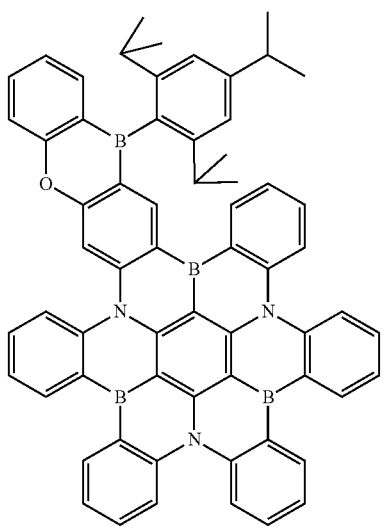
3
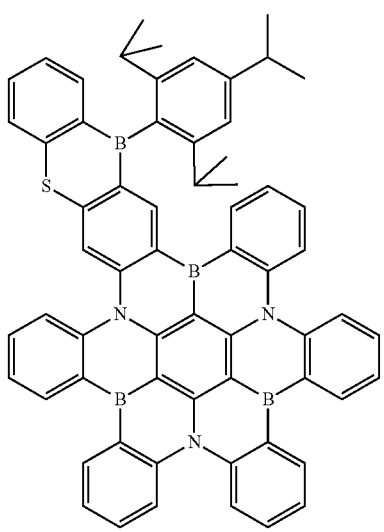
2-D
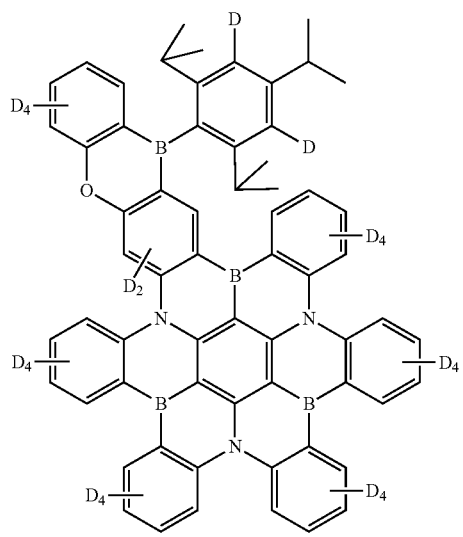
1-D
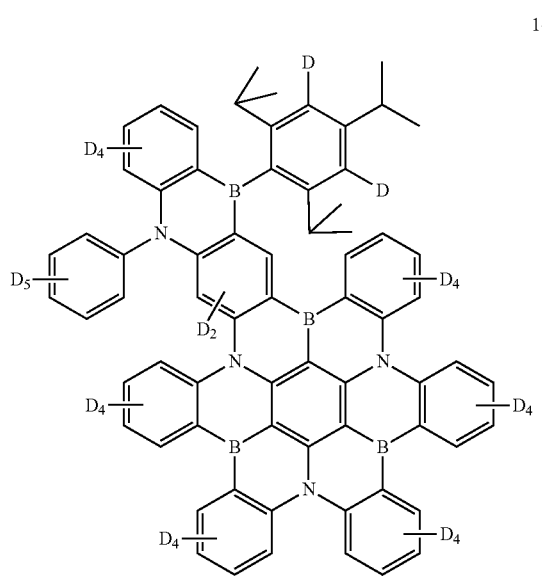
3-D
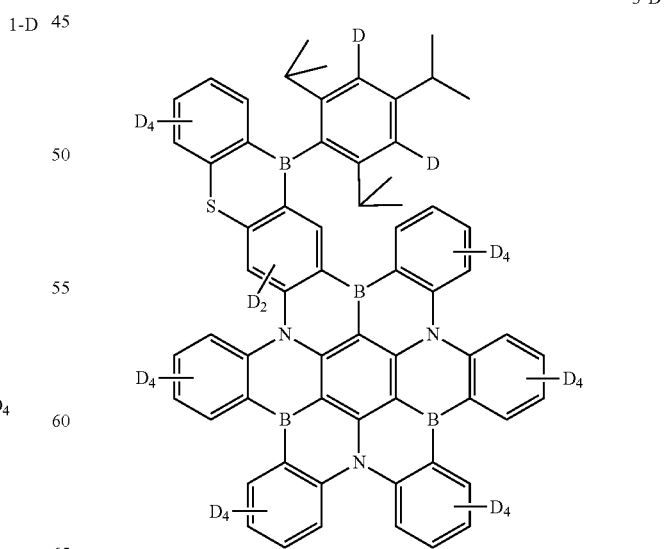

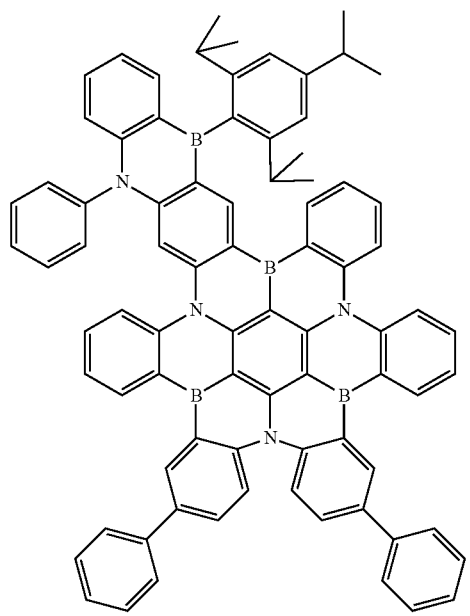
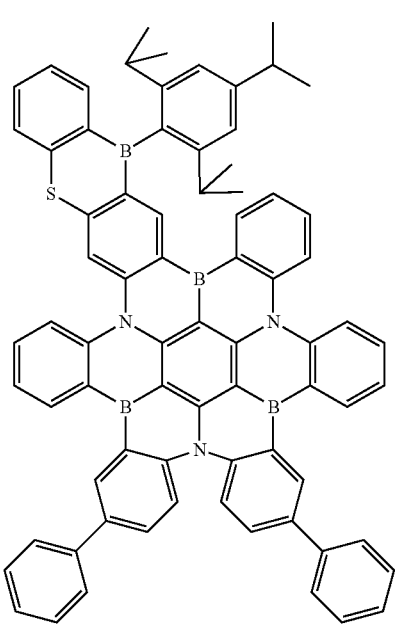
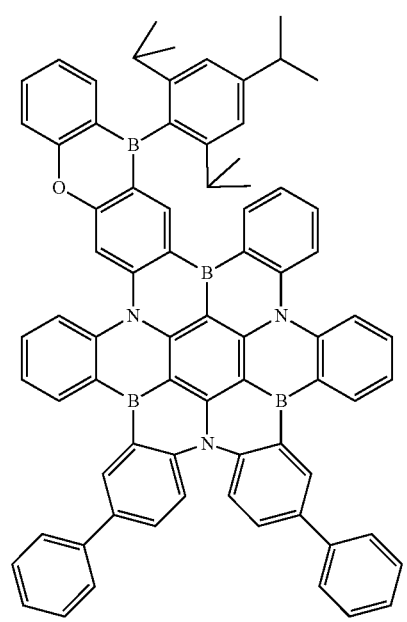
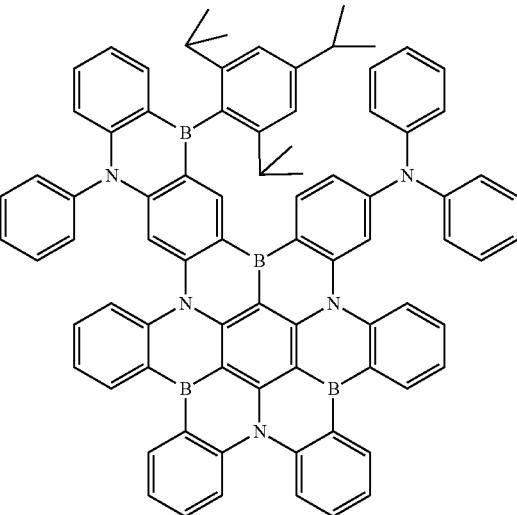

151
-continued
8
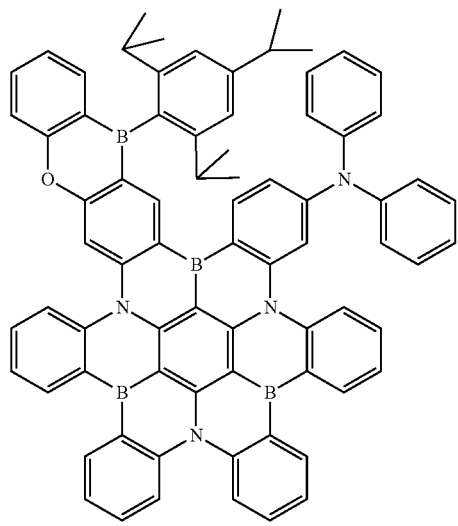
9
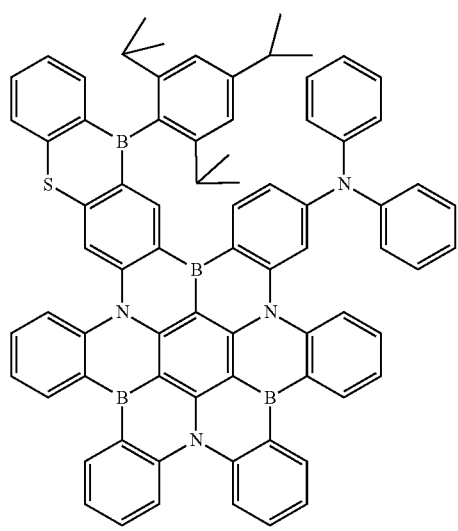
10
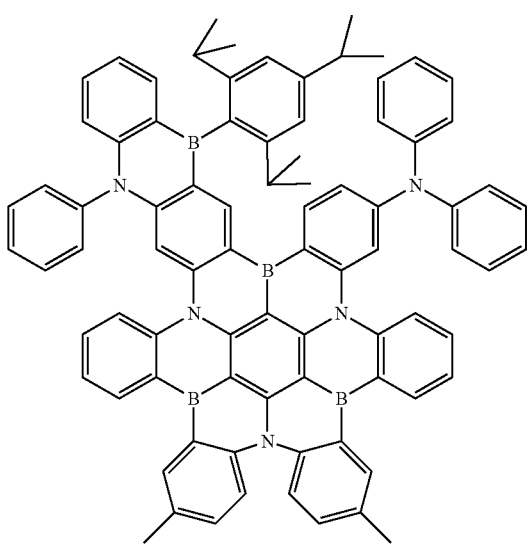
152
-continued
11
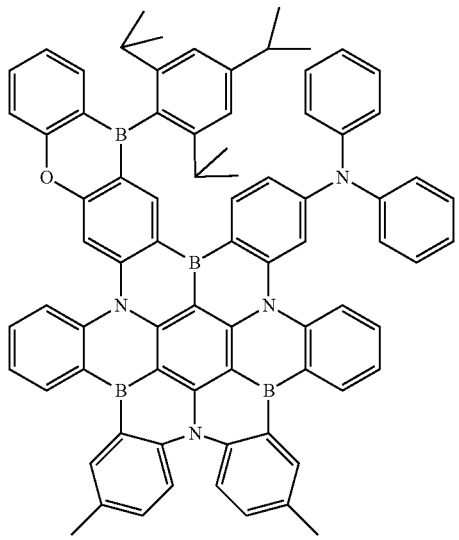
12
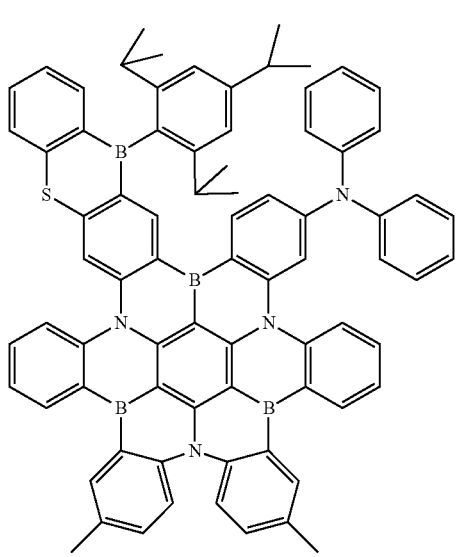
13
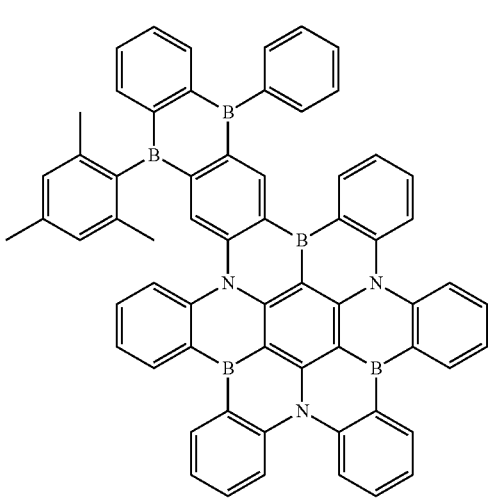

153
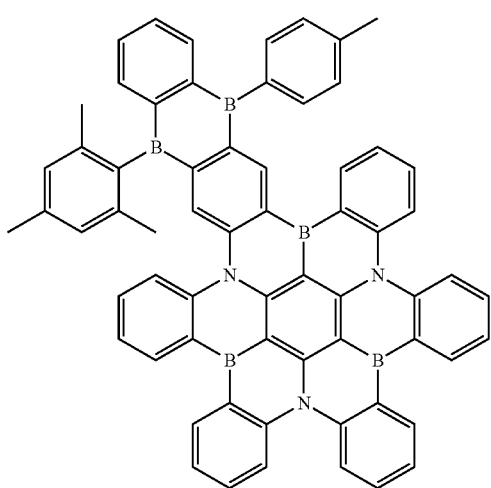
14
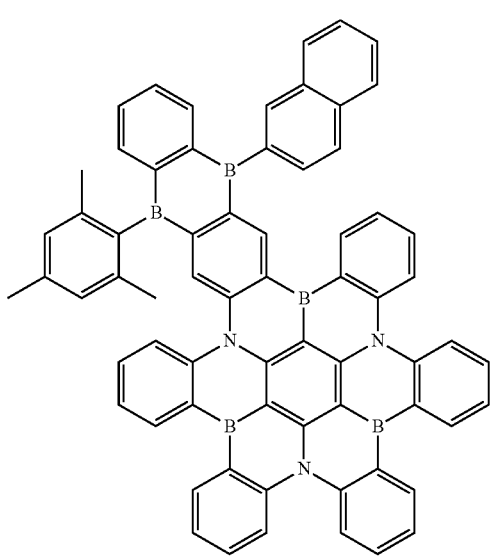
15
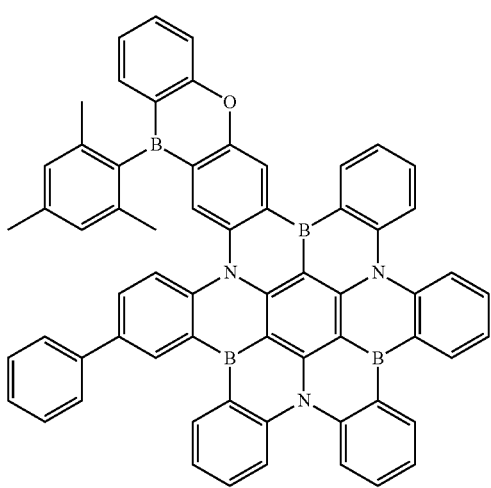
16
154
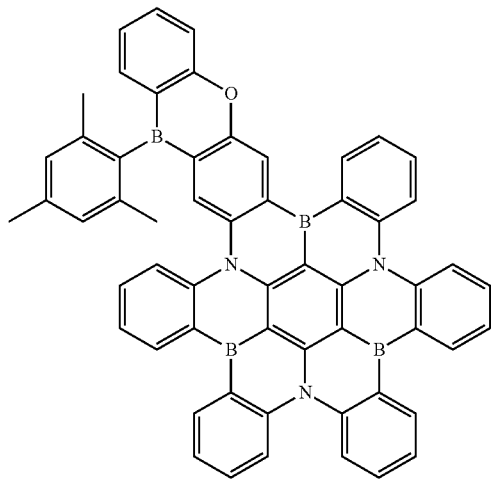
17
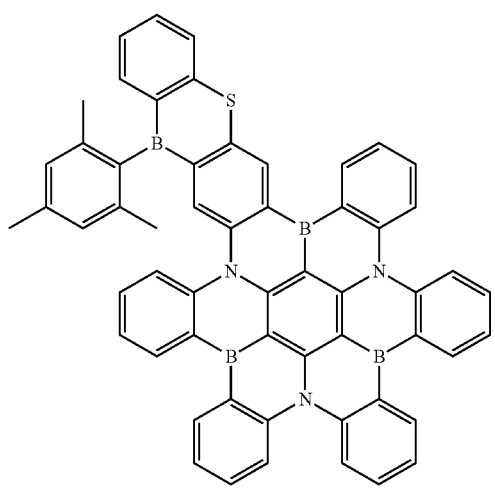
18
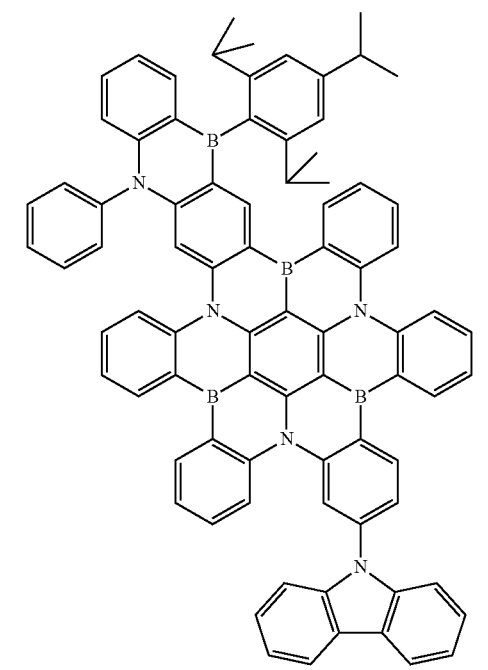
19

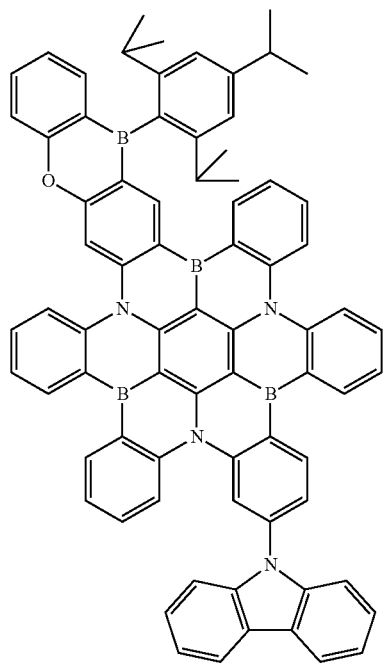
20
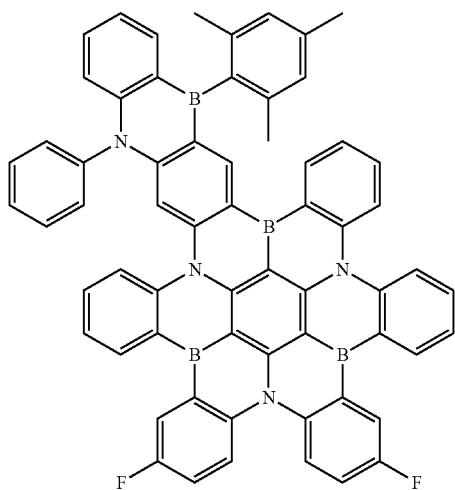
22
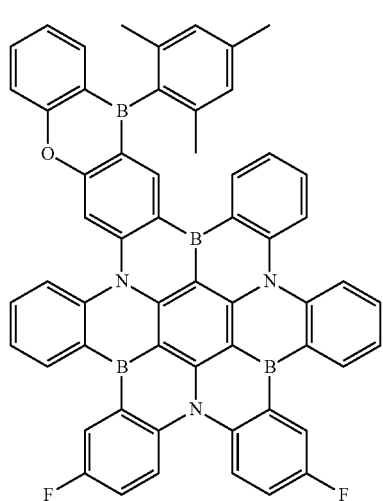
23
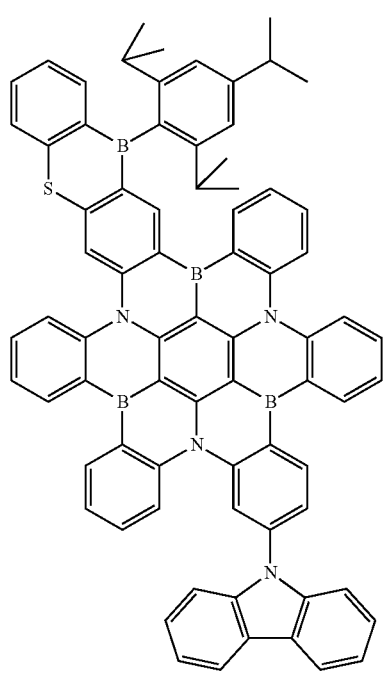
21
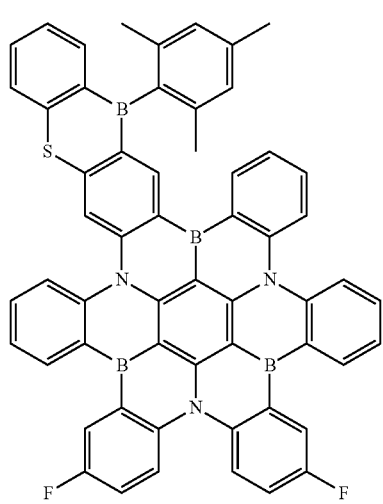
24

| 157 | 158 |
|---|---|
| 25 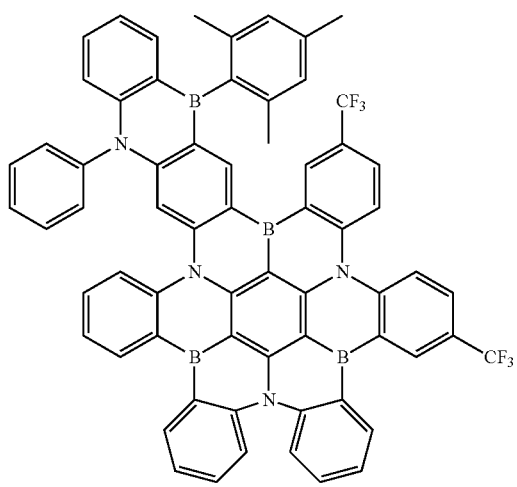 | 28 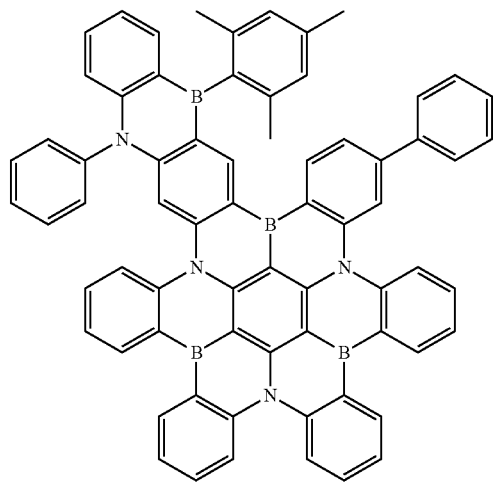 |
| 26 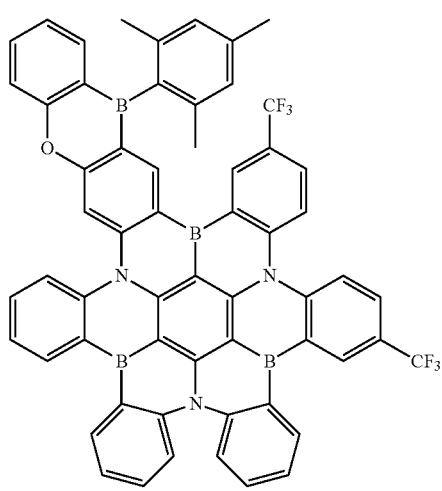 | 29 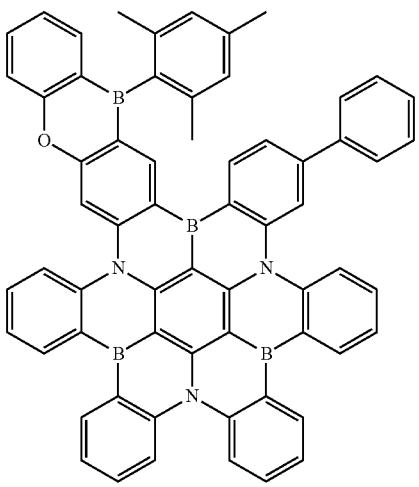 |
| 27 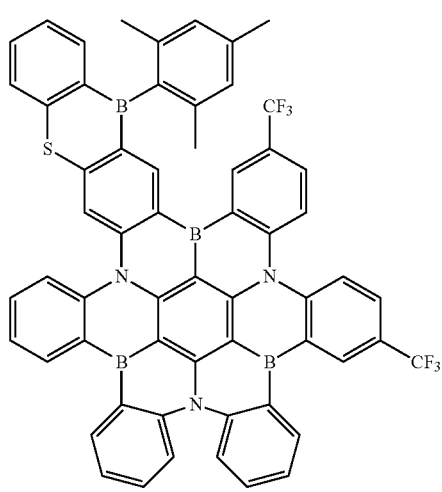 | 30 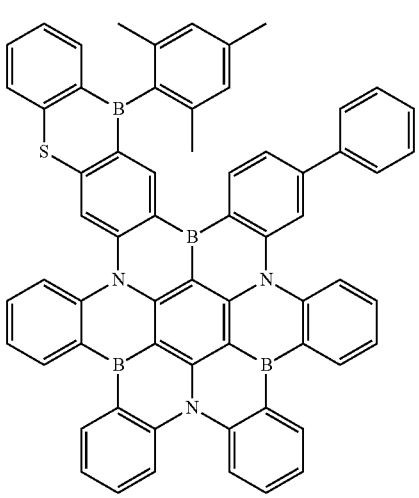 |

31
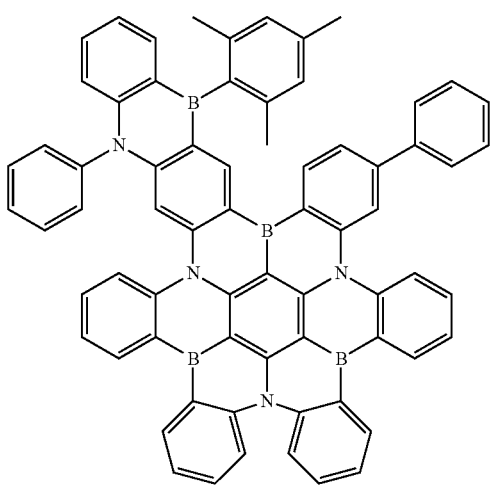
34
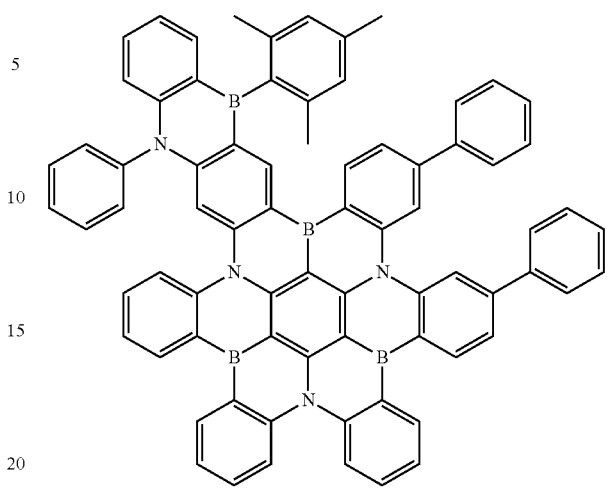
32
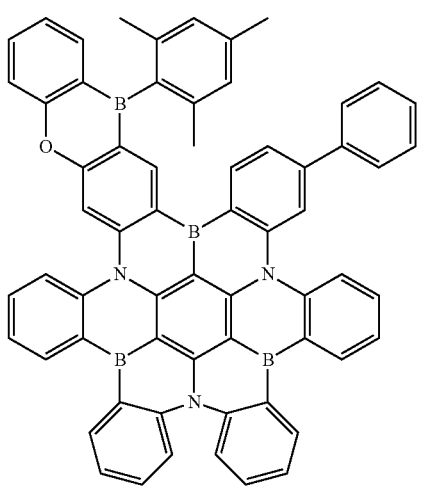
35
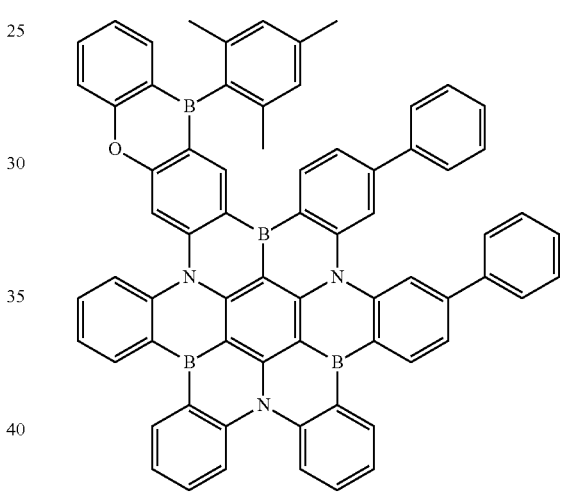
33
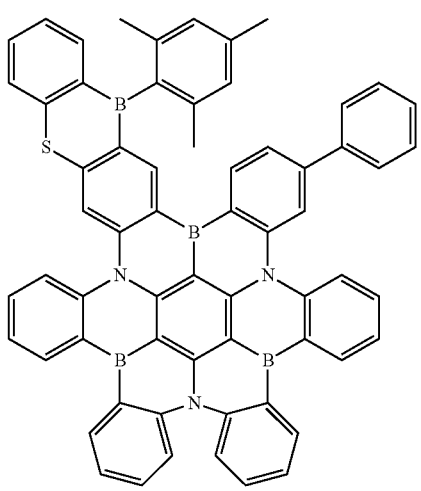
36
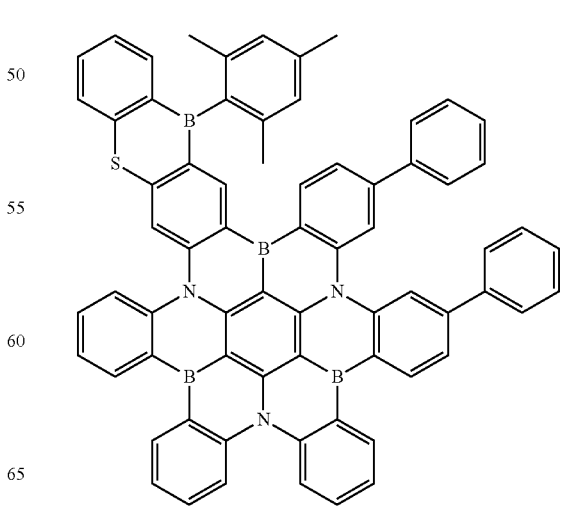

-continued
37
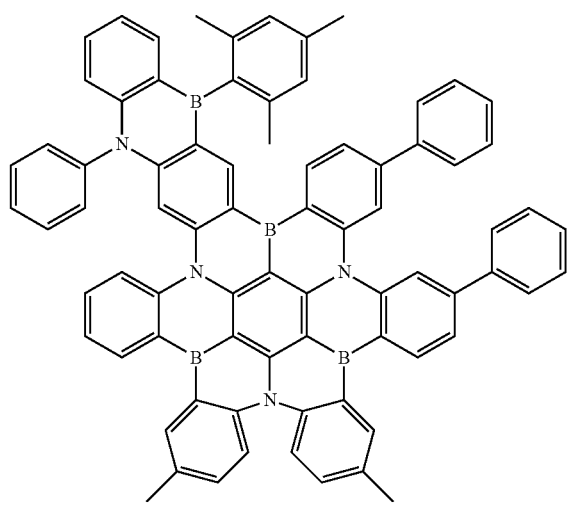
38
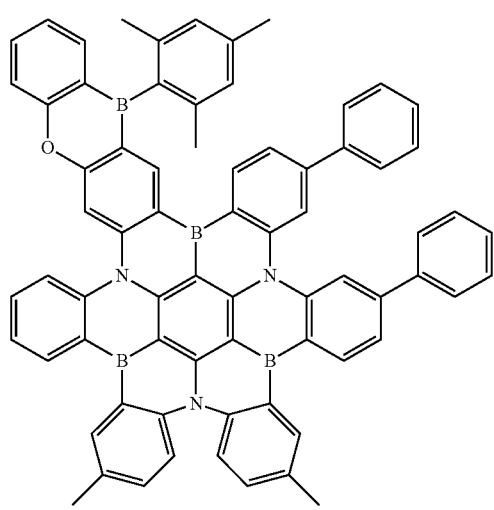
39
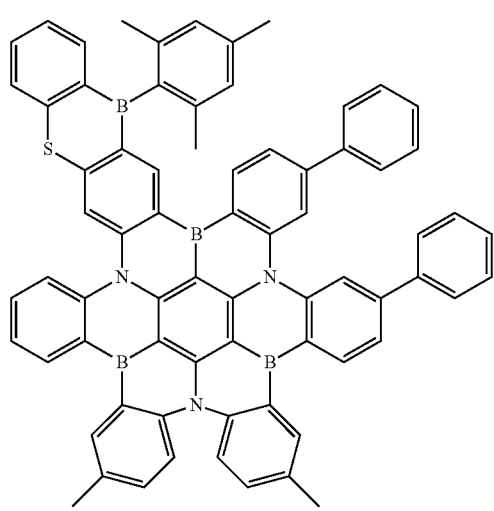
-continued
40
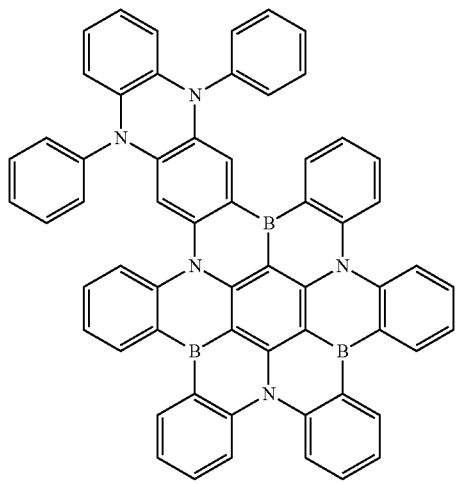
41
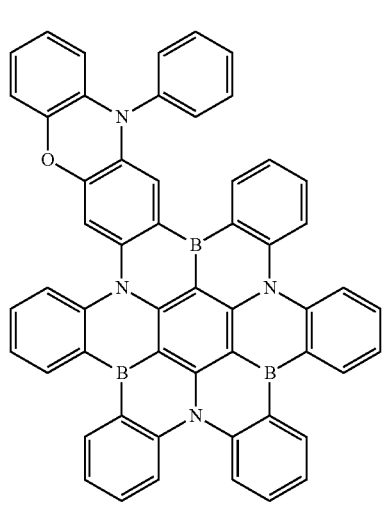
41-D
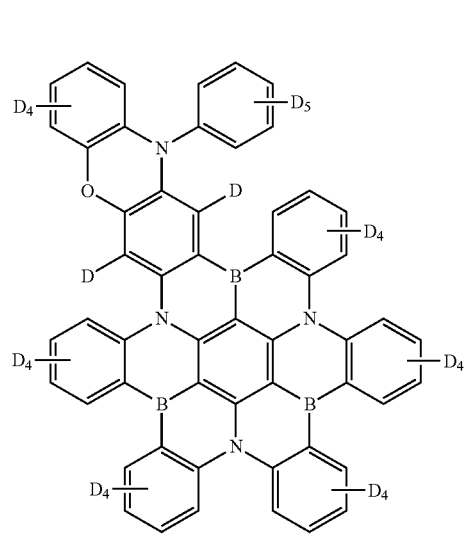

42
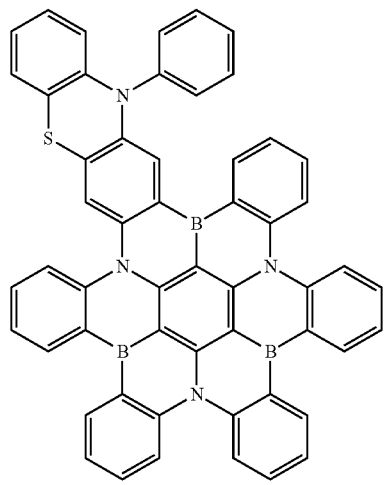
43
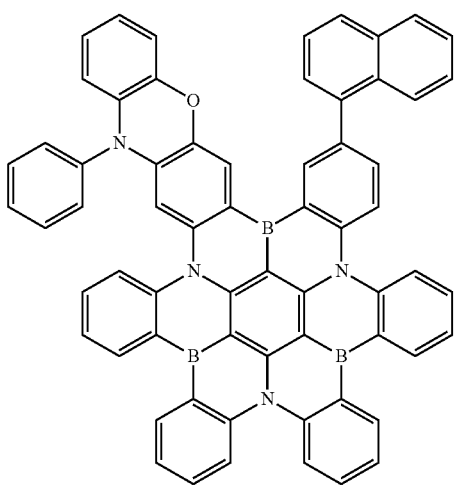
44
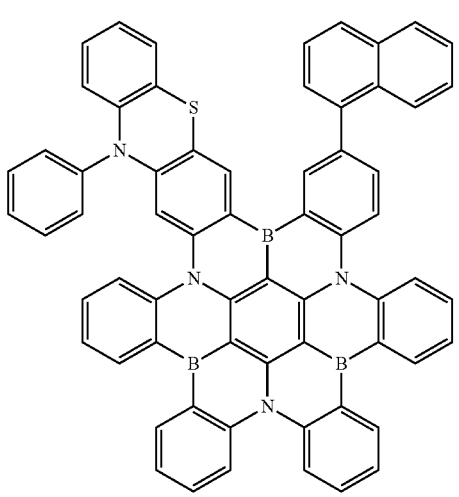
45
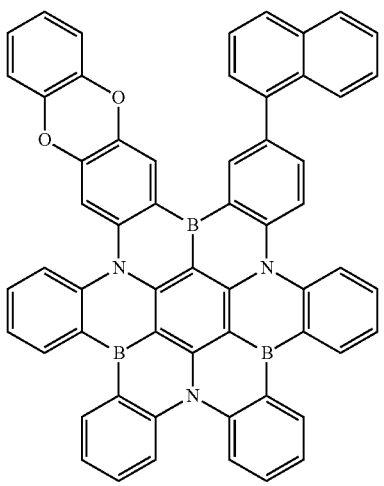
46
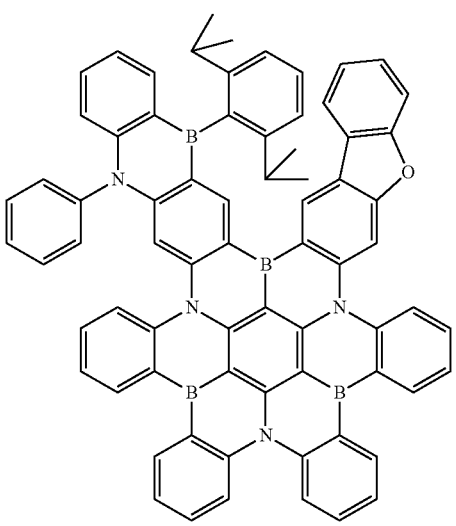
47
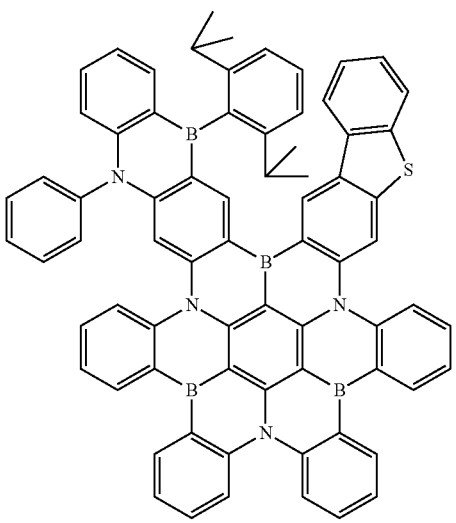

48
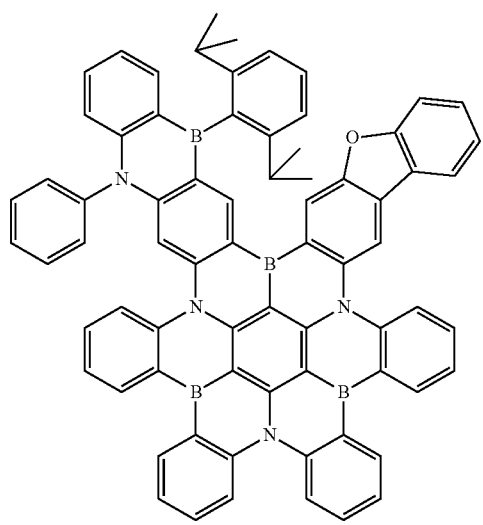
49
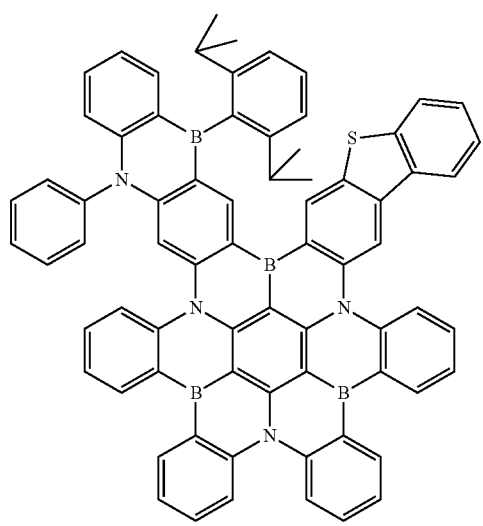
50
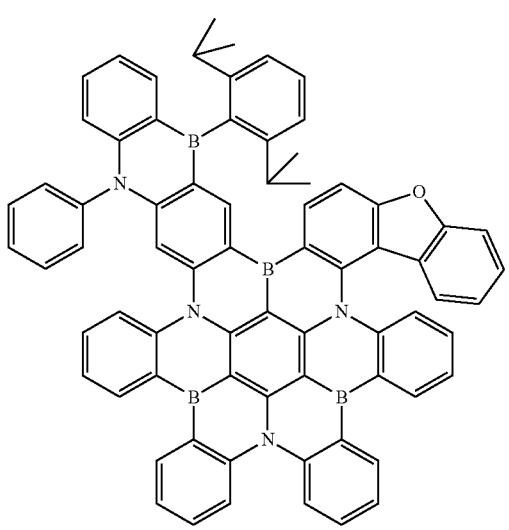
51
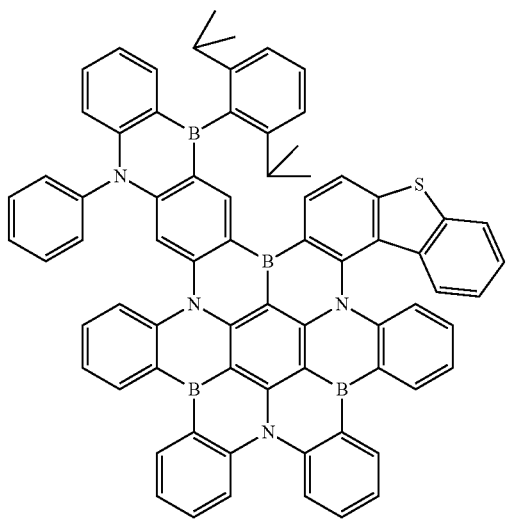
52
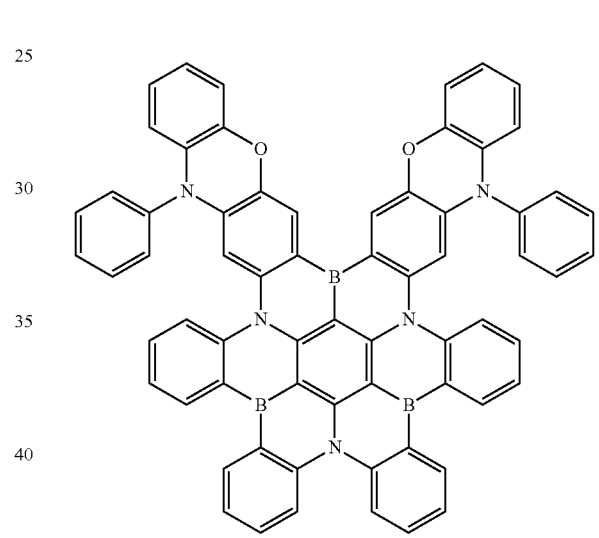
52-D
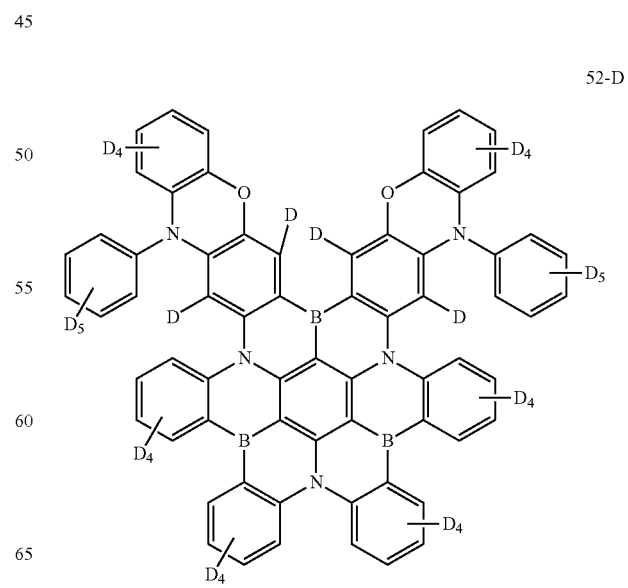

53
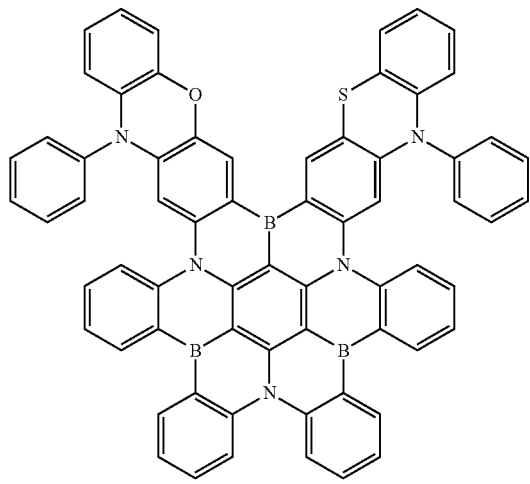
54
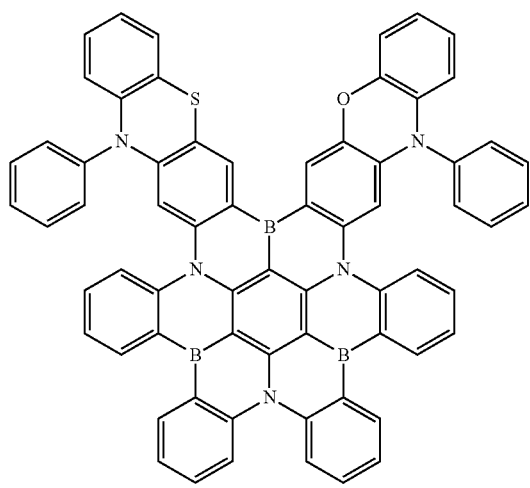
55
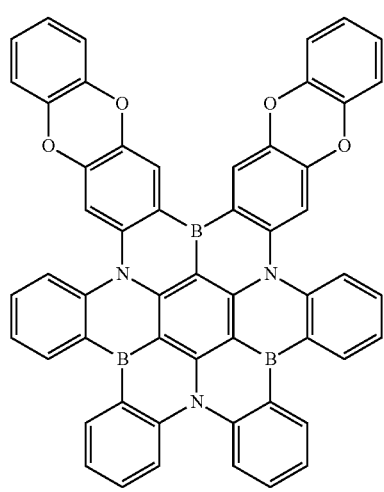
56
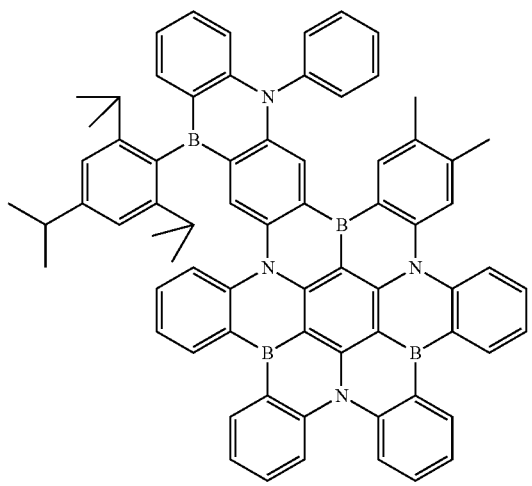
57
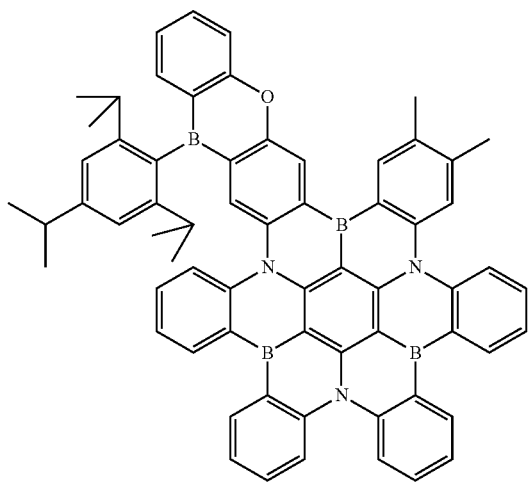
58
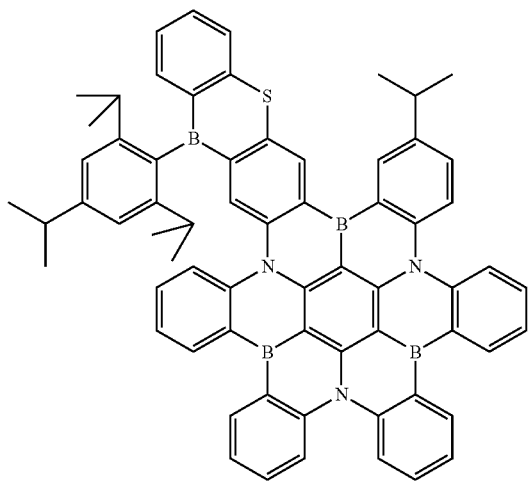

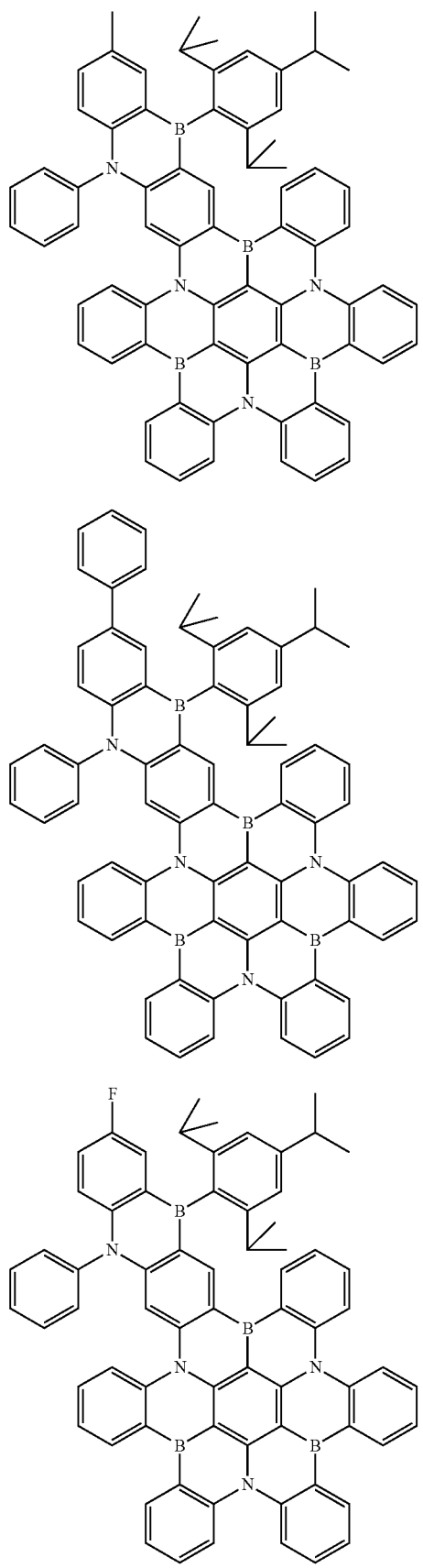
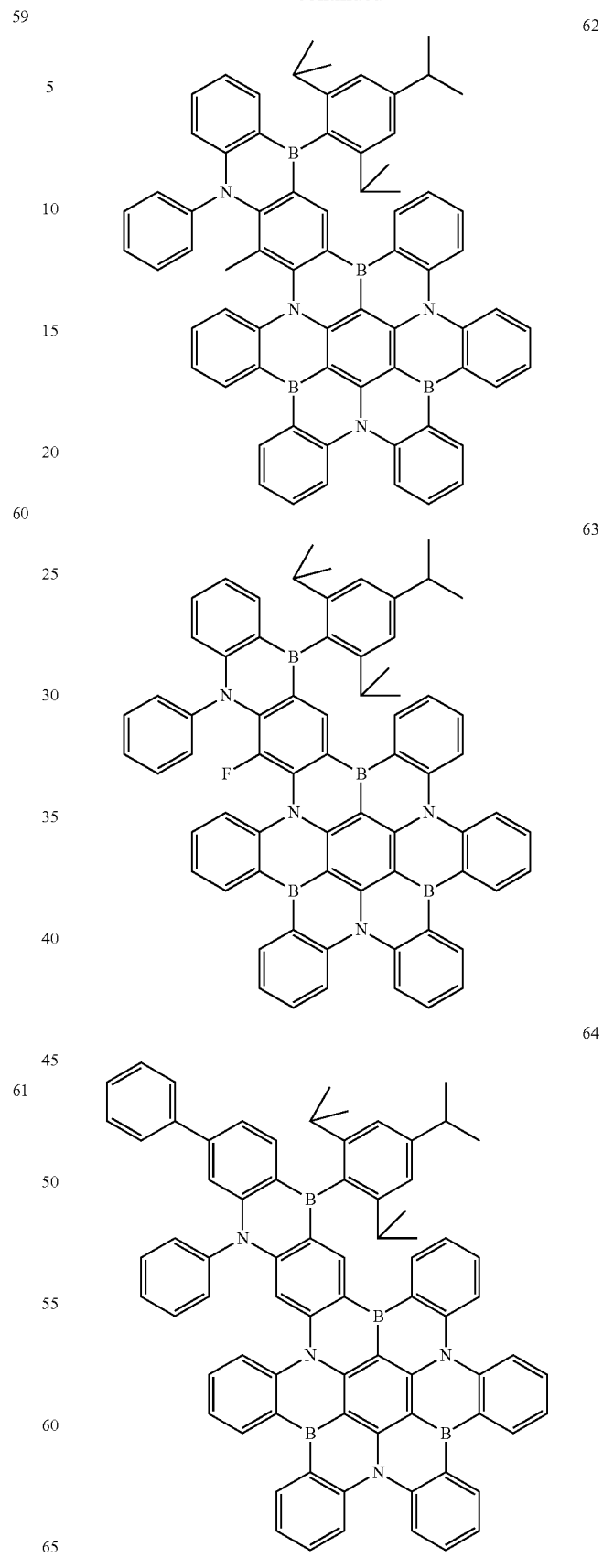

171
-continued
172
-continued
65
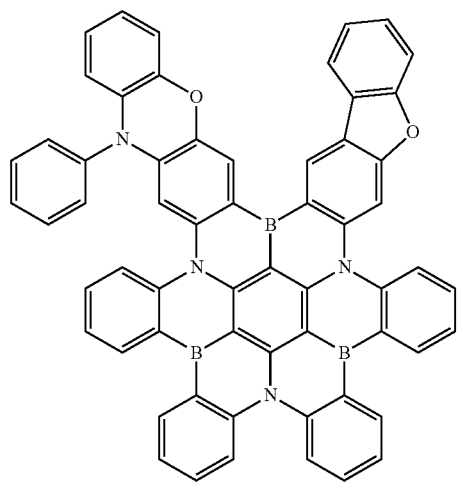
68
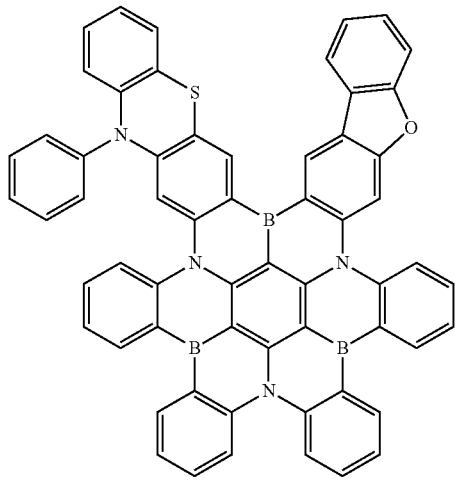
66
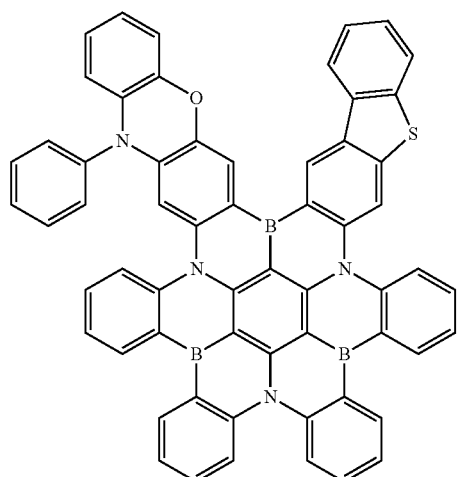
69
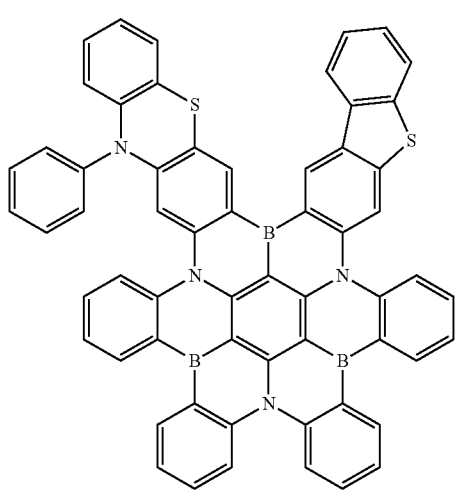
67
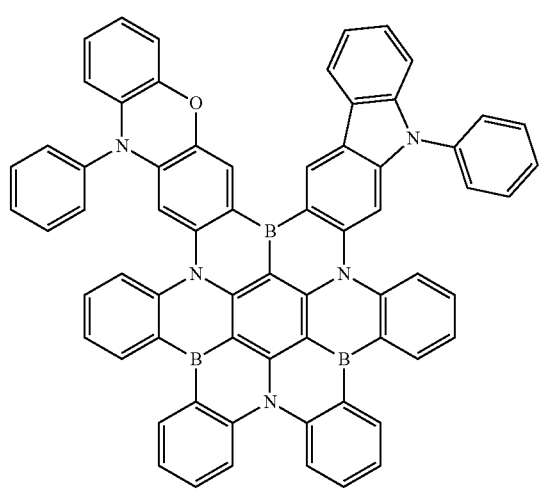
70
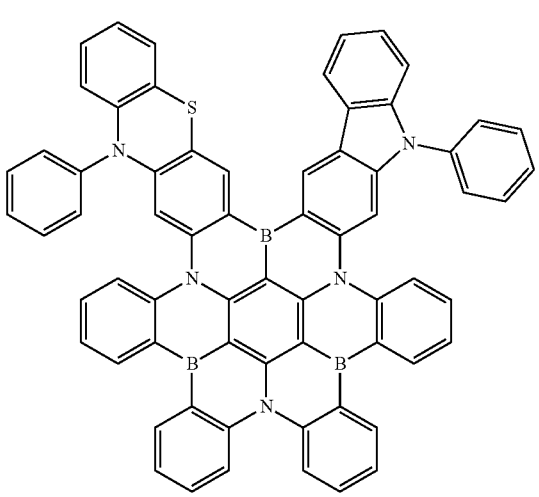

173
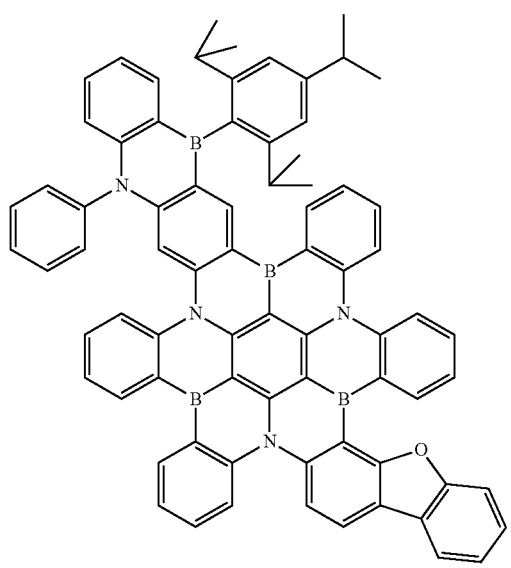
71
174
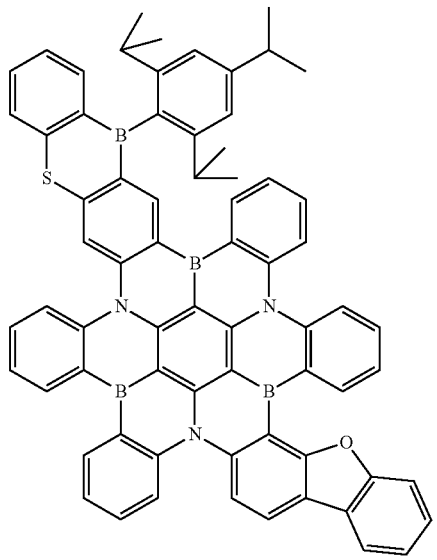
73
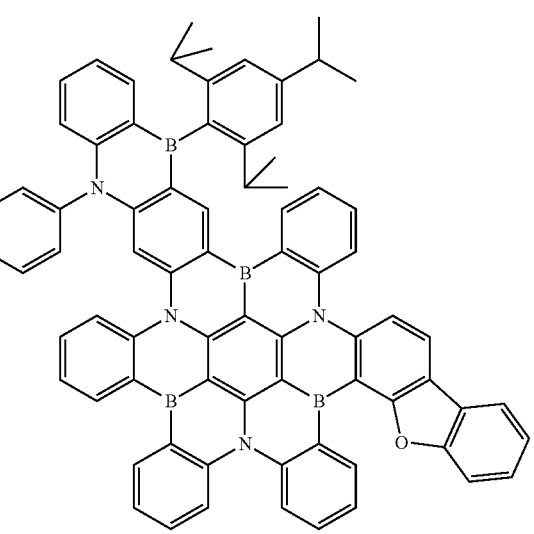
74
72
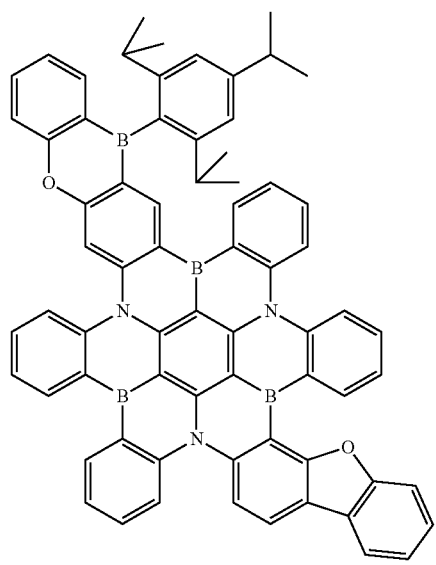
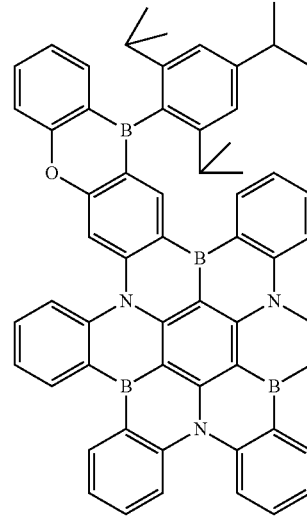
75

76
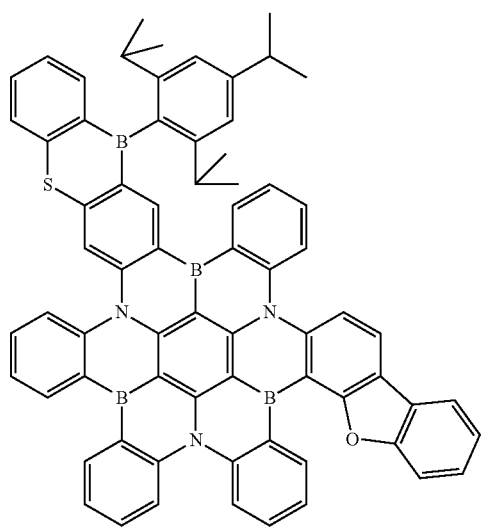
77
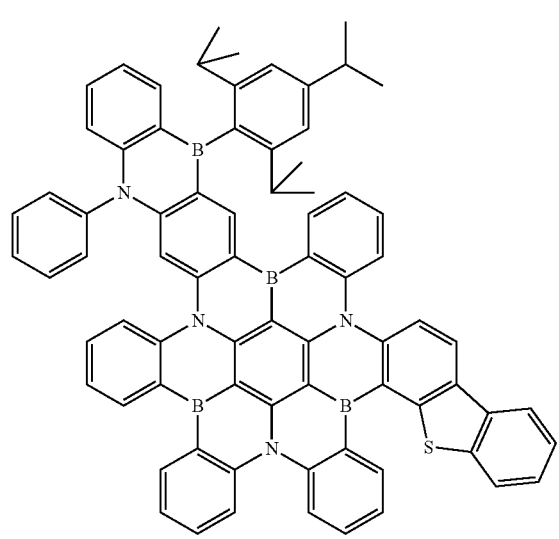
78
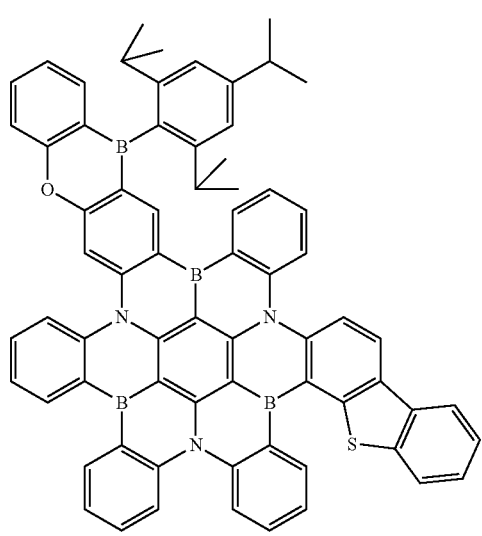
79
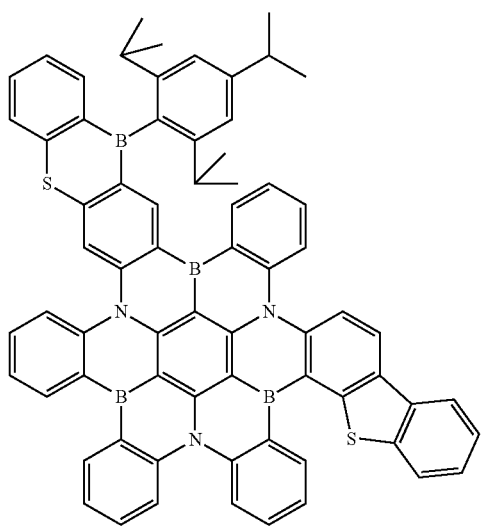
80
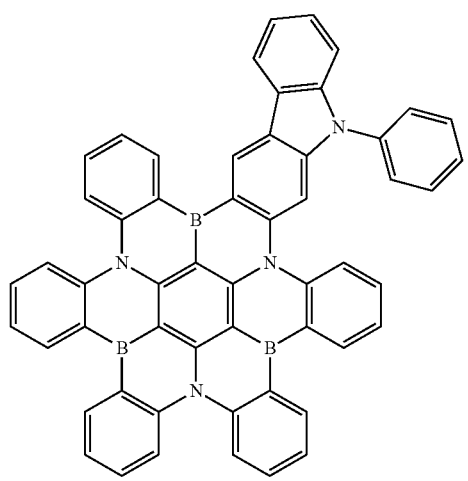
81
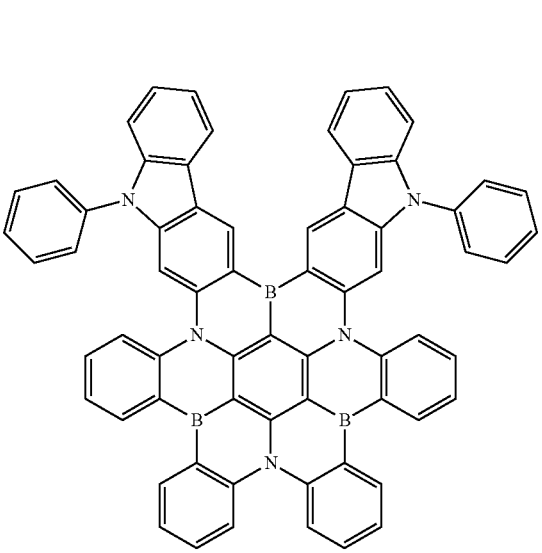

177
-continued
82
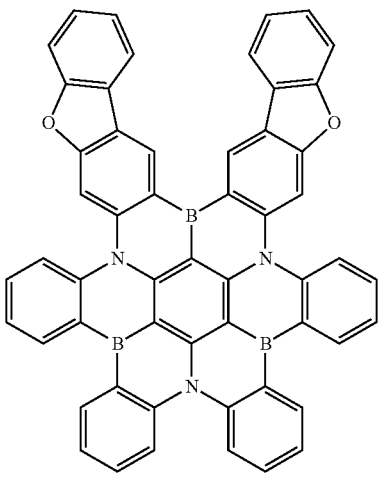
83
84
178
-continued
85
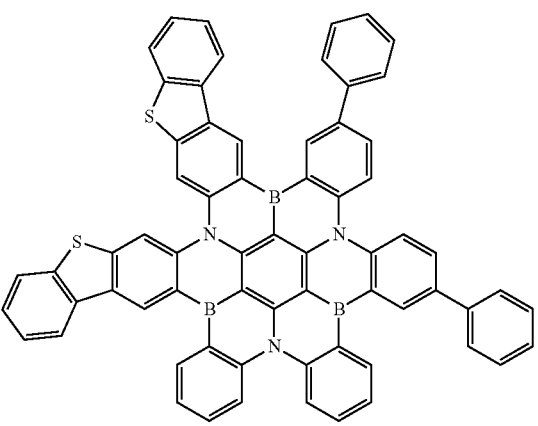
86
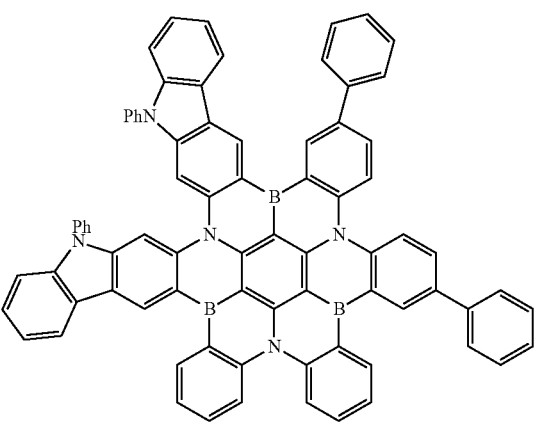
87
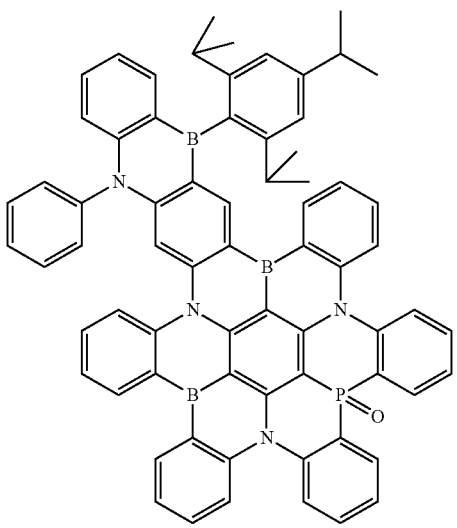

179
-continued
88
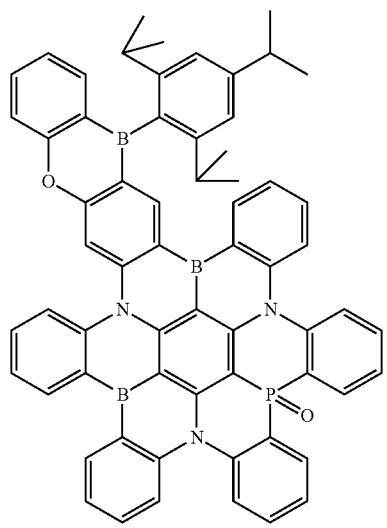
89
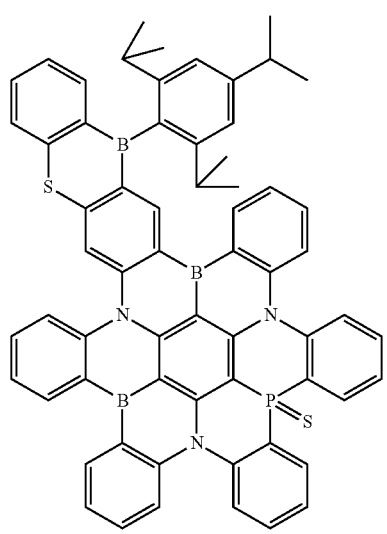
90
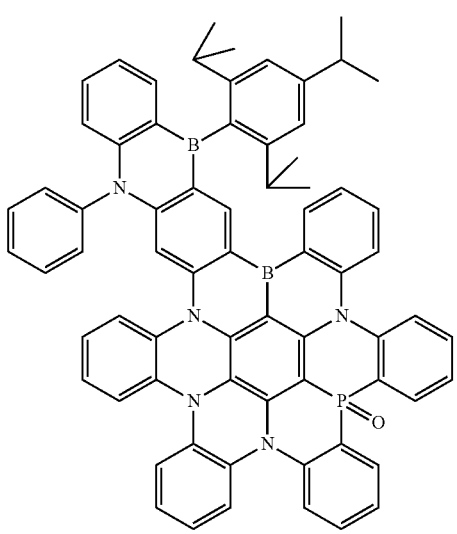
180
-continued
91
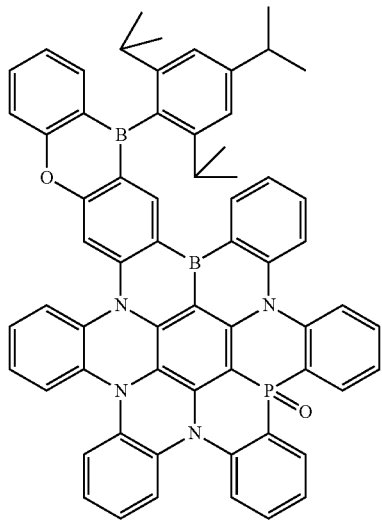
92
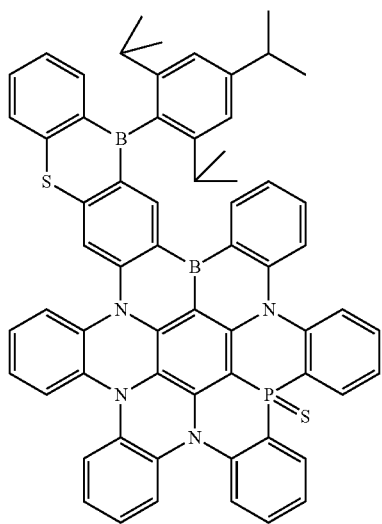
93
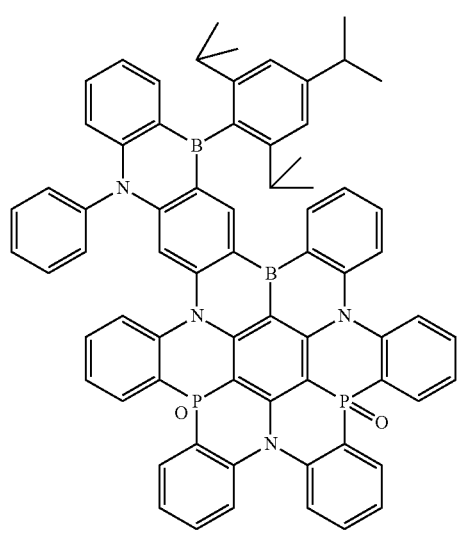

94
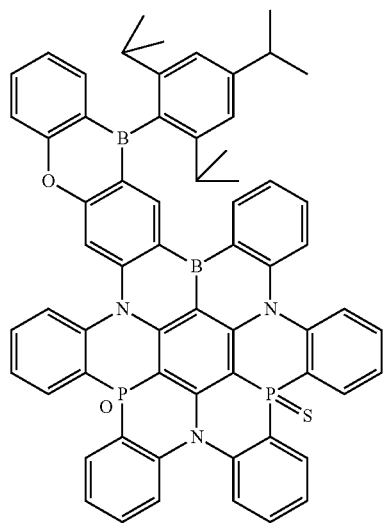
95
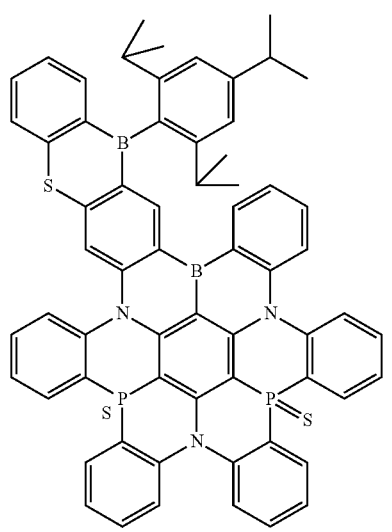
96
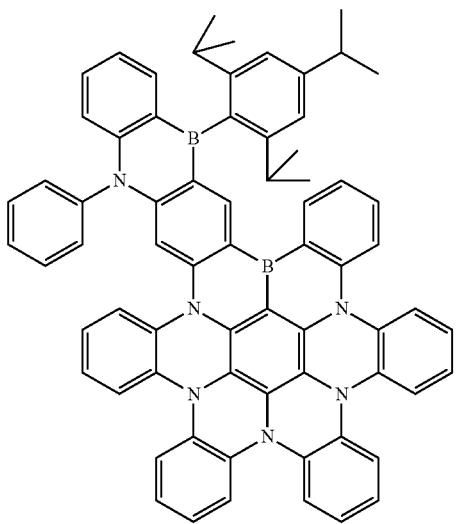
97
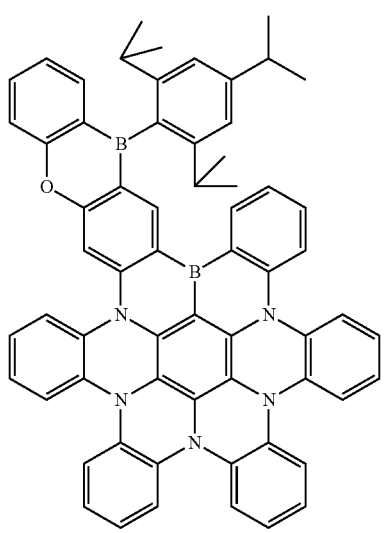
98
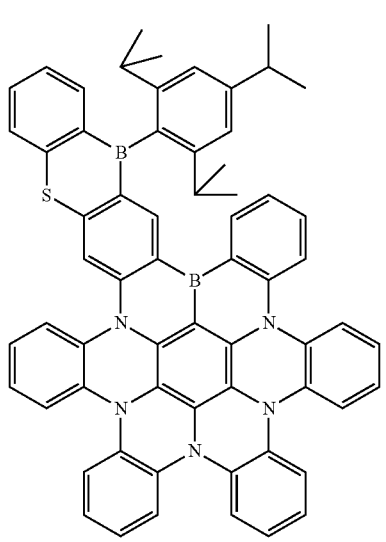
99
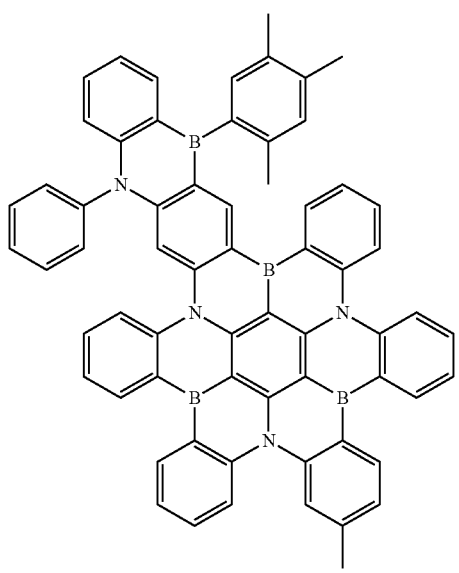

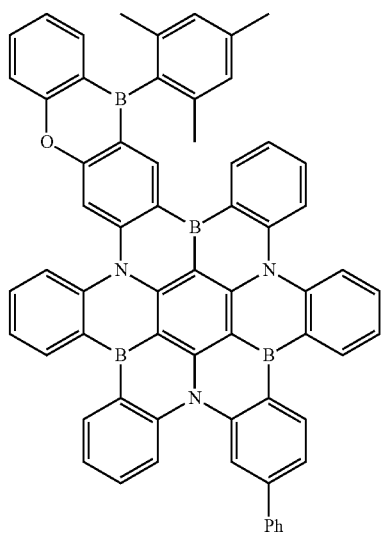
100
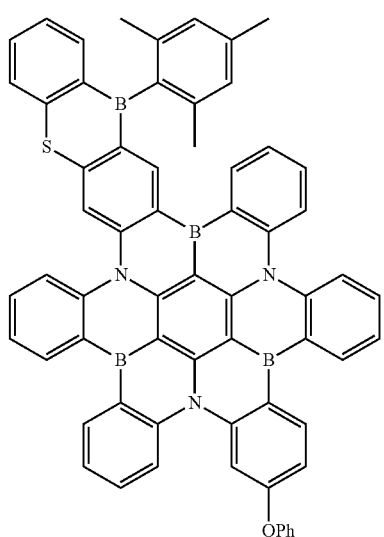
101
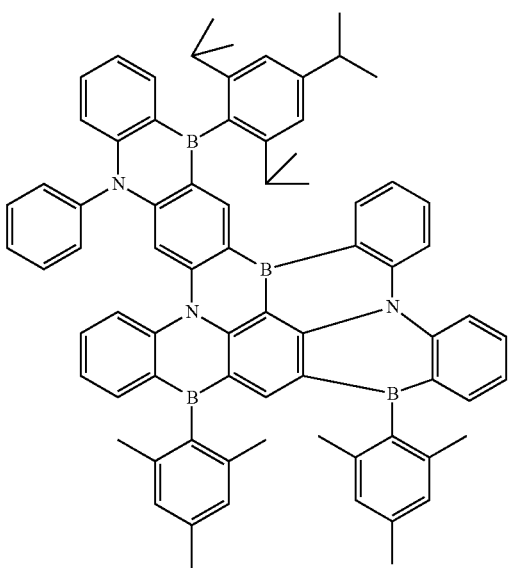
102
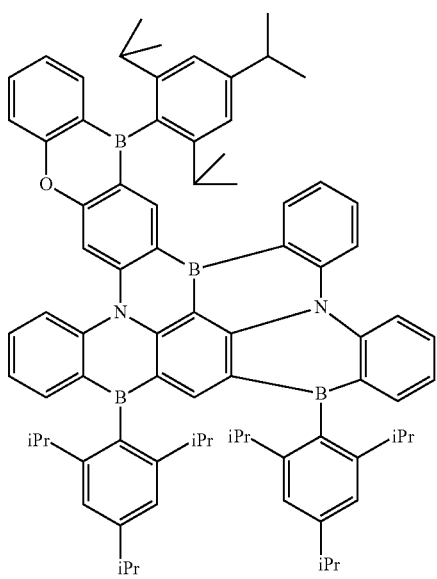
103
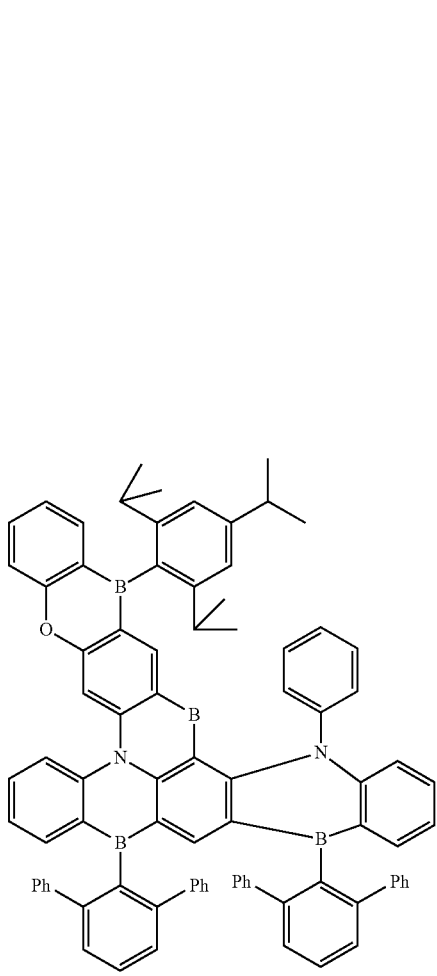
104

185
-continued
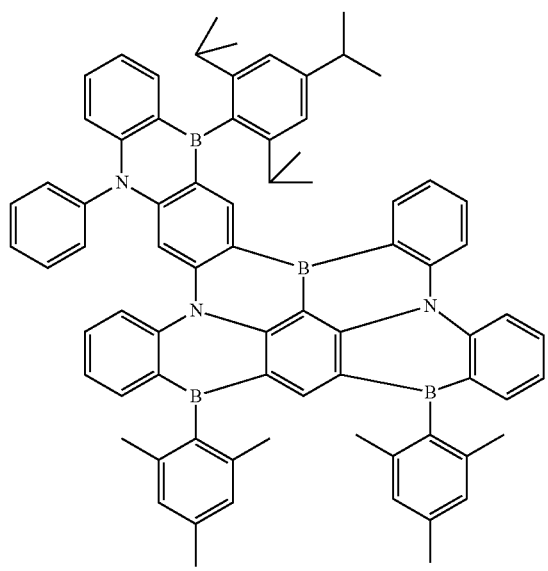
105
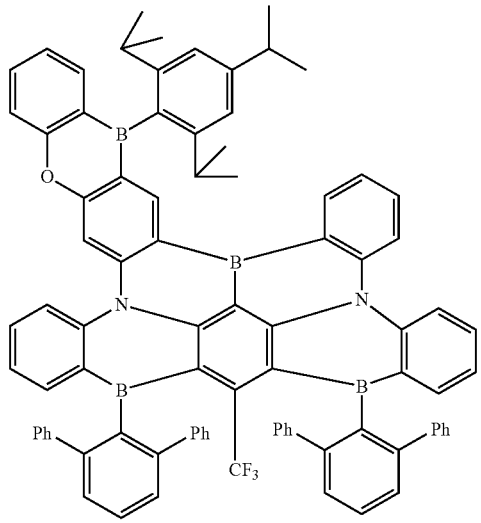
107
186
-continued
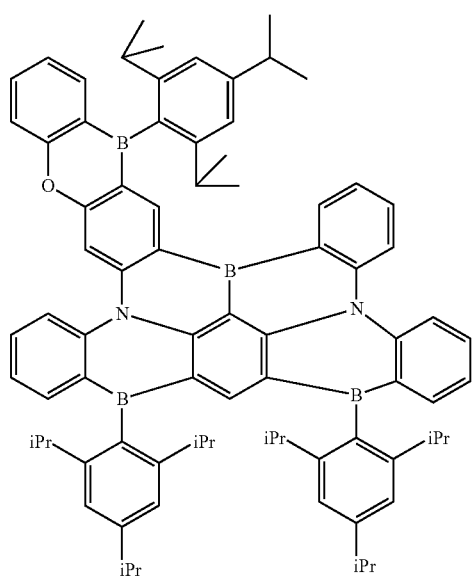
106
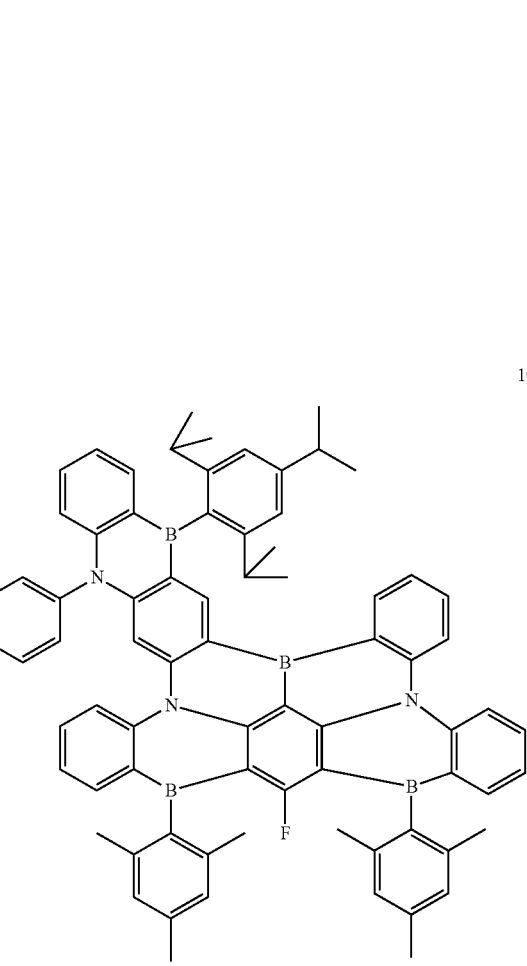
108

109
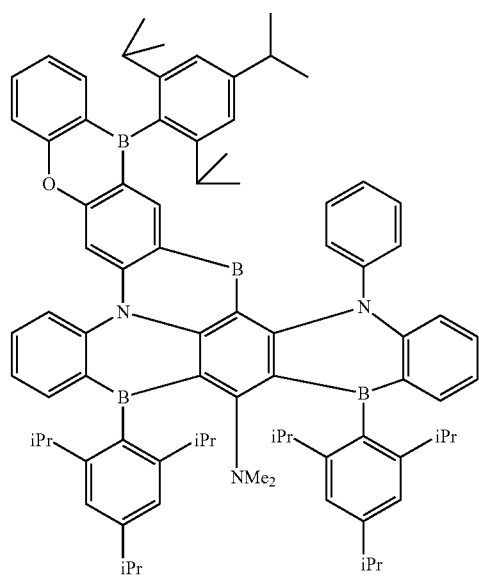
110
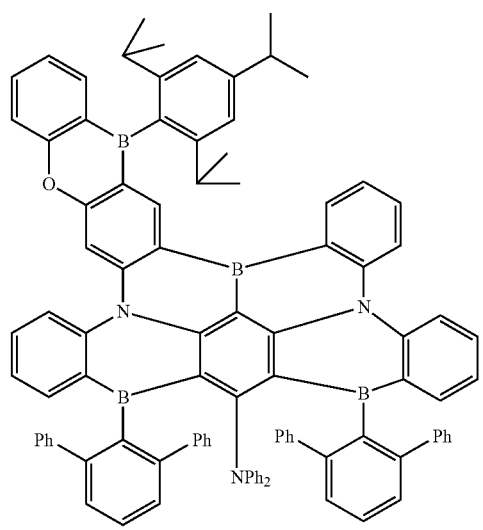
111
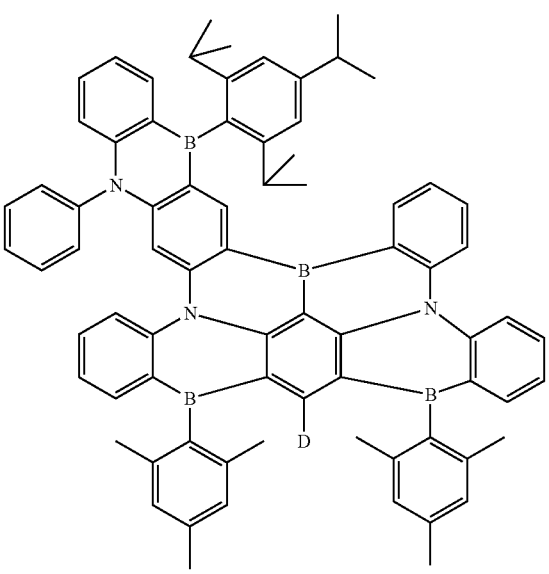
112
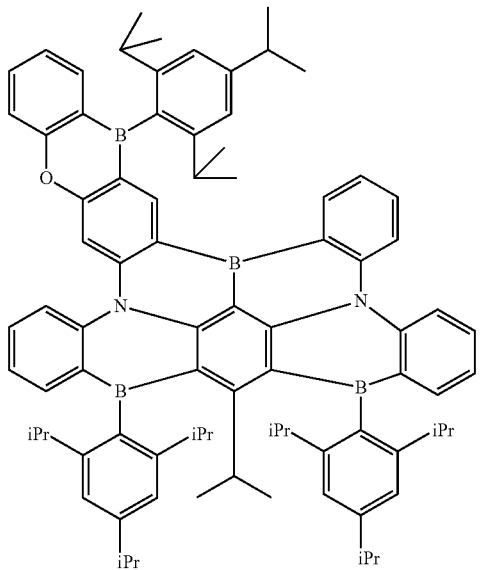

113
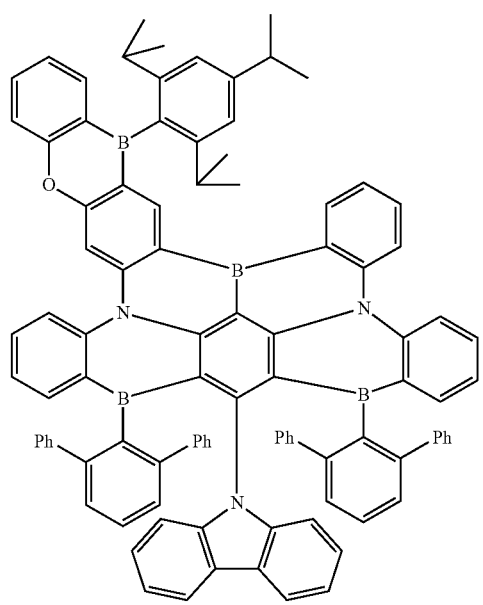
114
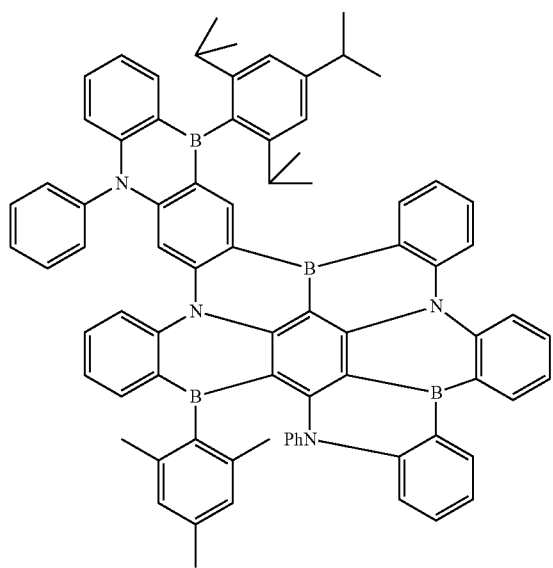
115
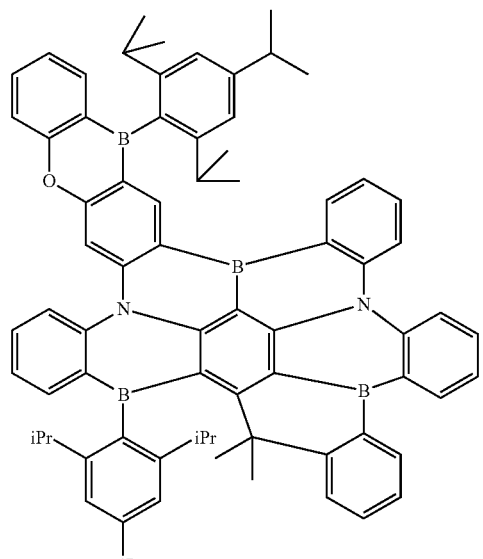
116
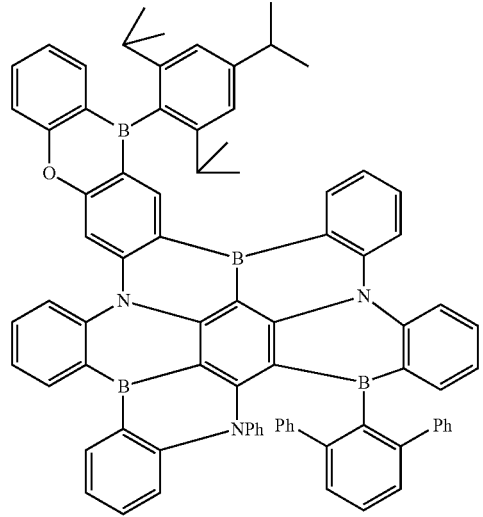

-continued
117
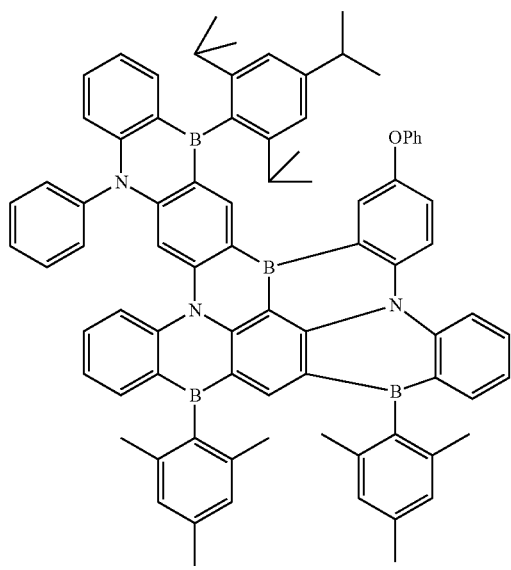
118
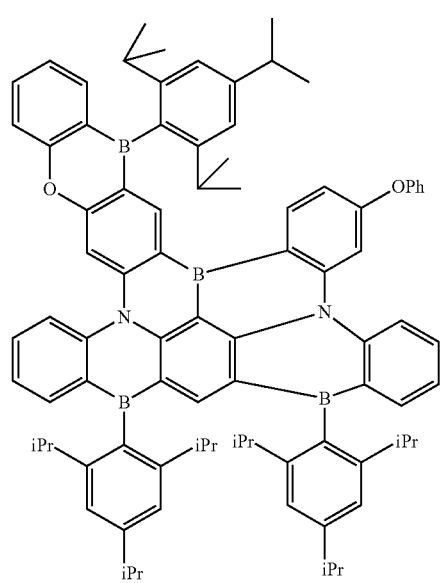
119
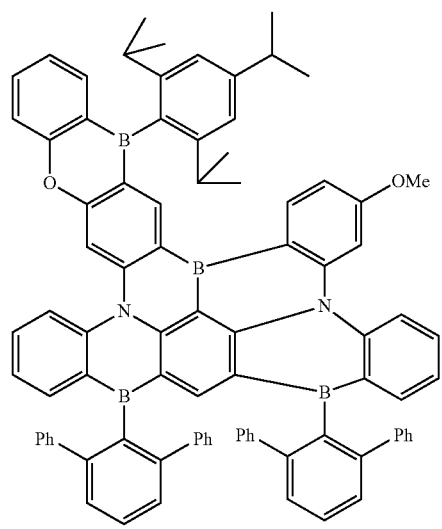
-continued
120
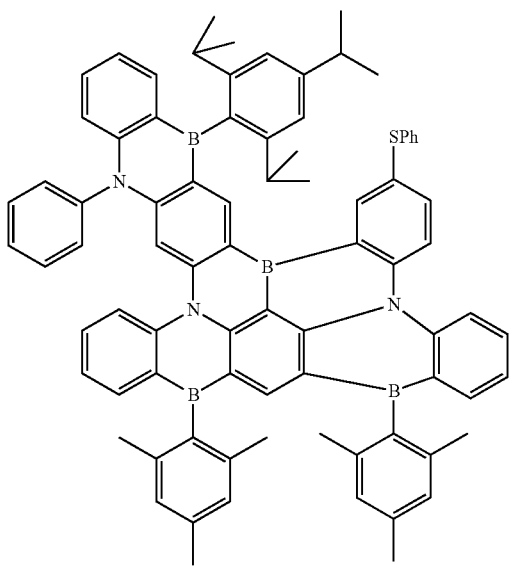
121
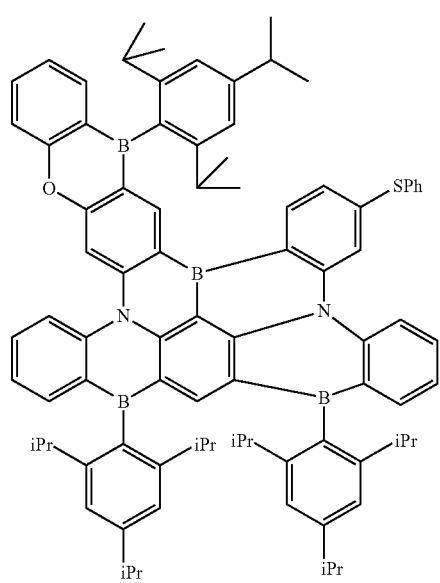
122
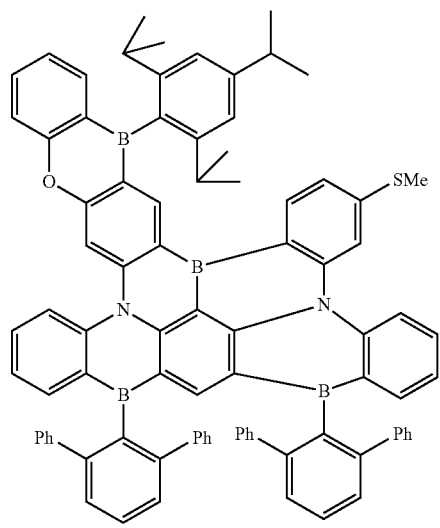

123
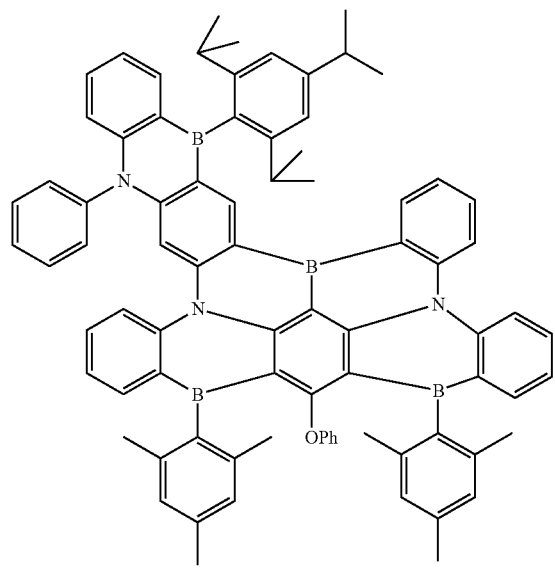
124
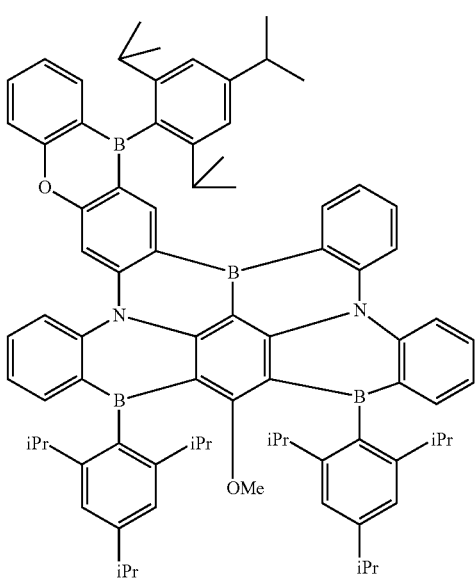
125
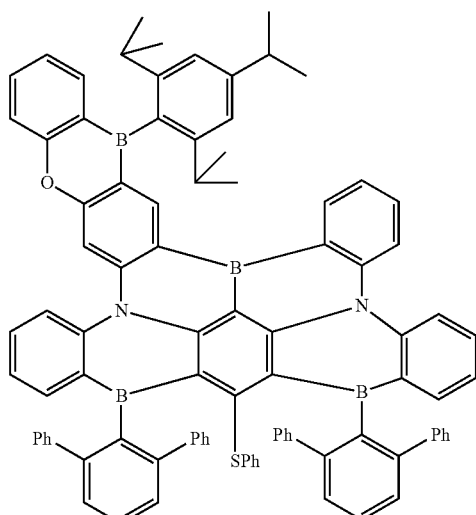
126
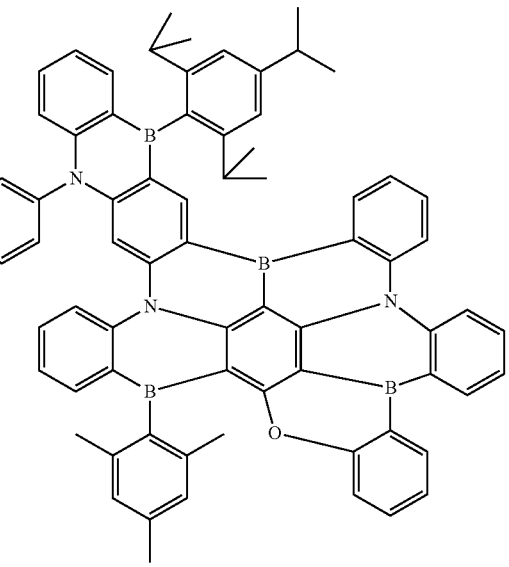

127
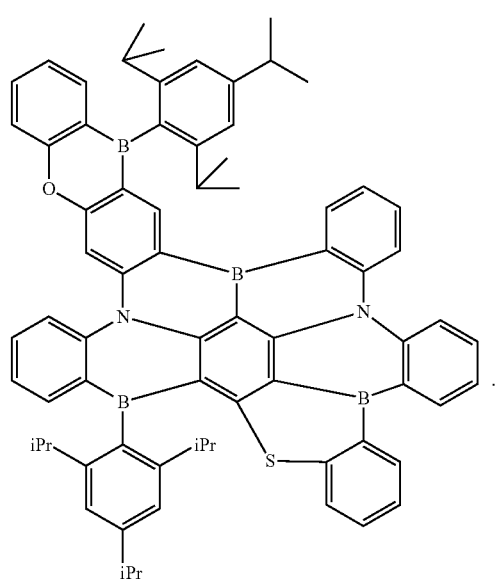

UNITED STATES PATENT AND TRADEMARK OFFICE
CERTIFICATE OF CORRECTION

PATENT NO. : 11,856,848 B2
APPLICATION NO. : 17/186737
DATED : December 26, 2023
INVENTOR(S) : Yuji Suzaki It is certified that error appears in the above-identified patent and that said Letters Patent is hereby corrected as shown below:

In the Claims

In Column 90, Line 27, in Claim 1, delete ""I"" and insert -- "l" --.

In Column 91, Line 36, in Claim 8, delete ""j"" and insert -- "j'" --.

In Column 99, Lines 49-66, in Claim 13, Compound 13, delete

" 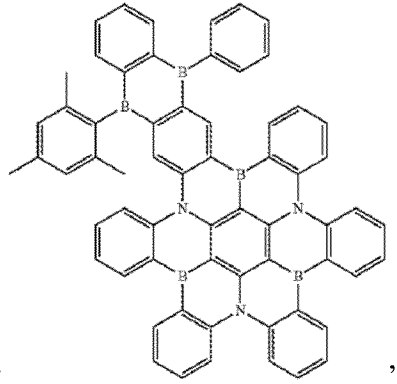 " and insert -- 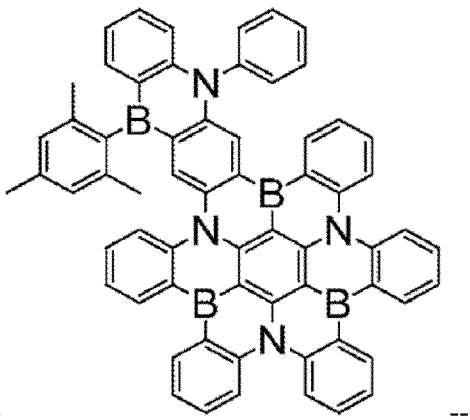 --.

Signed and Sealed this
Eighth Day of July, 2025

Coke Morgan Stewart
*Acting Director of the United States Patent and Trademark Office*

CERTIFICATE OF CORRECTION (continued)
U.S. Pat. No. 11,856,848 B2

Page 2 of 9

In Column 100, Lines 3-20, in Claim 13, Compound 14, delete

" 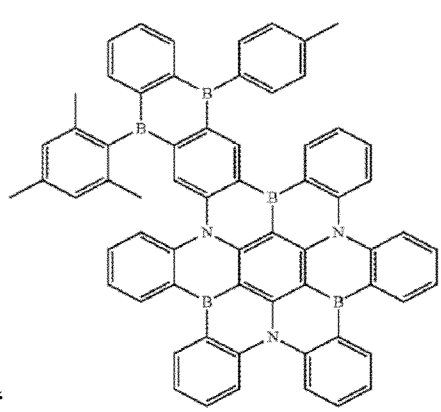 " and insert -- 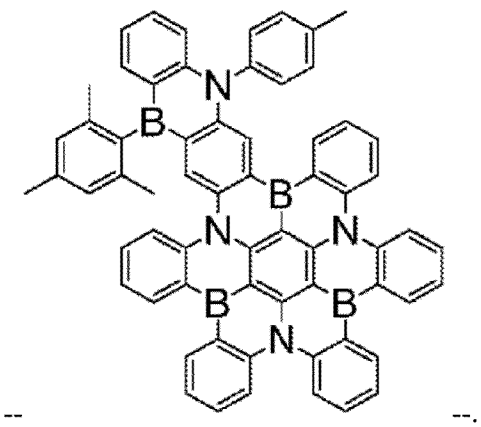 --.

In Column 100, Lines 25-45, in Claim 13, Compound 15, delete

" 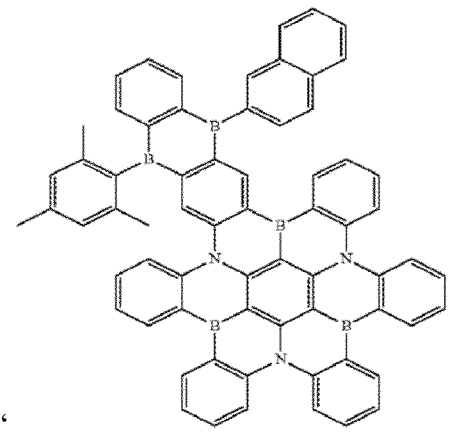 " and insert -- 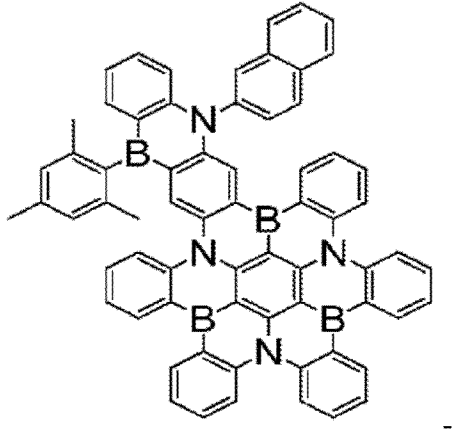 --.

In Column 108, Lines 3-22, in Claim 13, Compound 37, delete

" 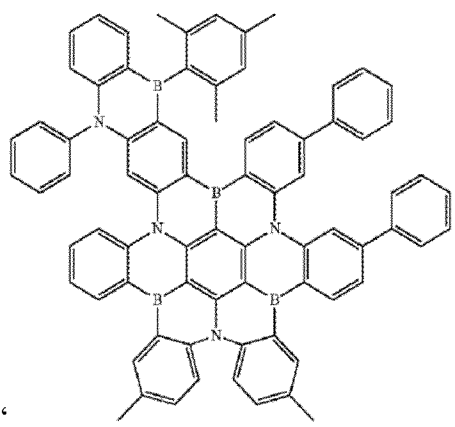 " and insert -- 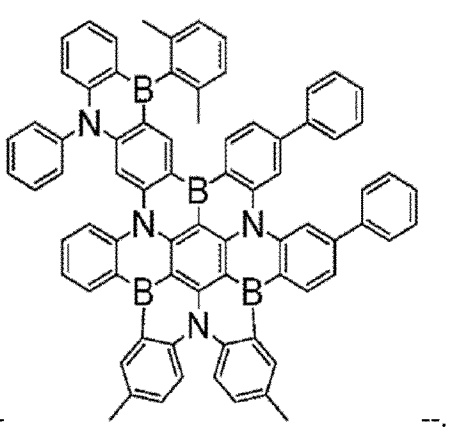 --.

CERTIFICATE OF CORRECTION (continued)
U.S. Pat. No. 11,856,848 B2

In Column 108, Lines 24-42, in Claim 13, Compound 38, delete

" 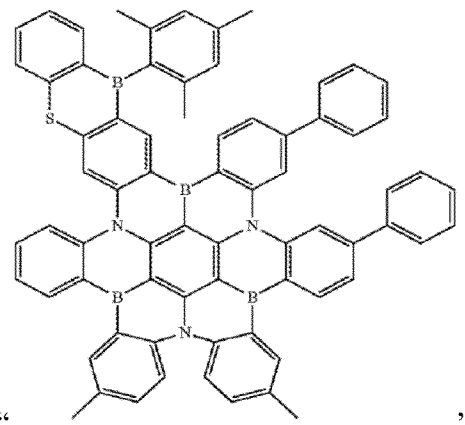 " and insert -- 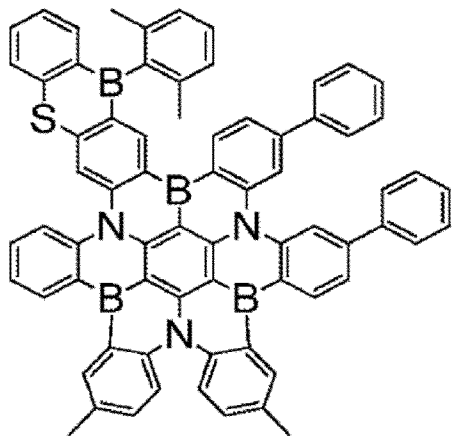 --.

In Column 108, Lines 48-66, in Claim 13, Compound 39, delete

" 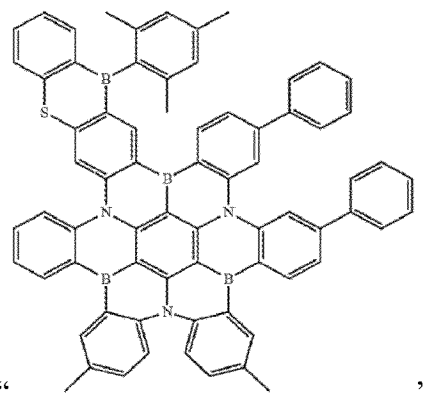 " and insert -- 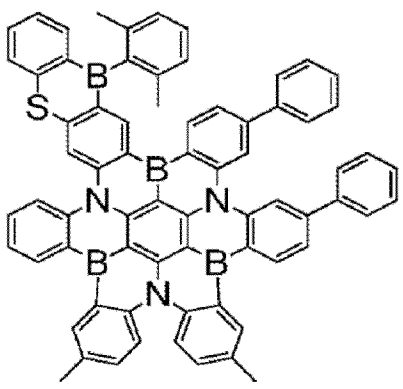 --.

In Column 114, Lines 3-21, in Claim 13, Compound 53, delete

" 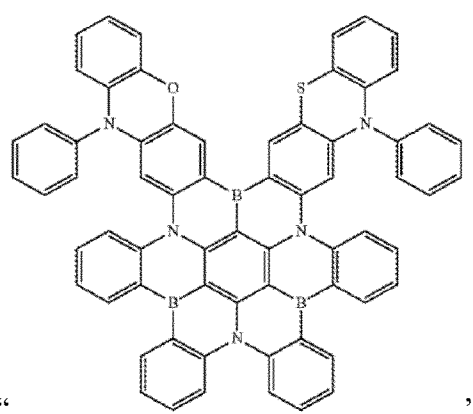 " and insert -- 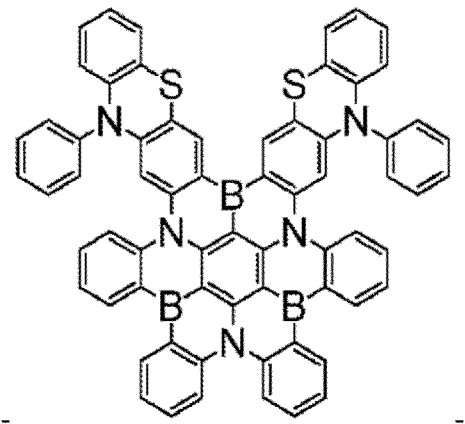 --.

In Column 114, Lines 25-43, in Claim 13, Compound 54, delete

CERTIFICATE OF CORRECTION (continued)
U.S. Pat. No. 11,856,848 B2

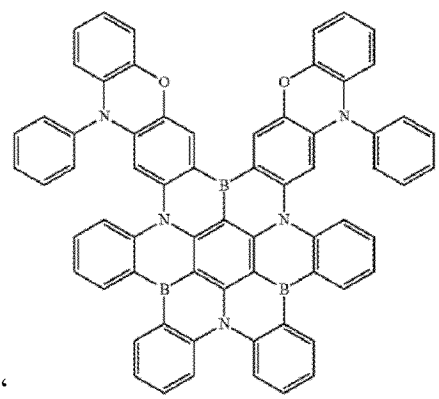 " and insert -- 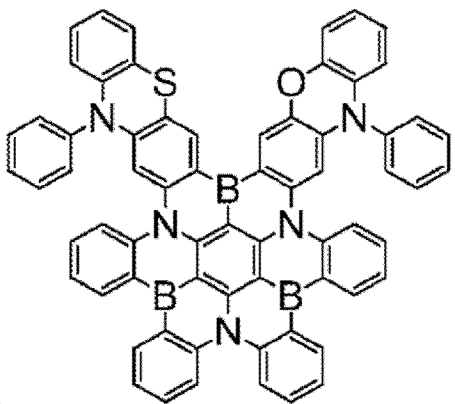 --.

In Column 129, Lines 45-66, in Claim 13, Compound 99, delete

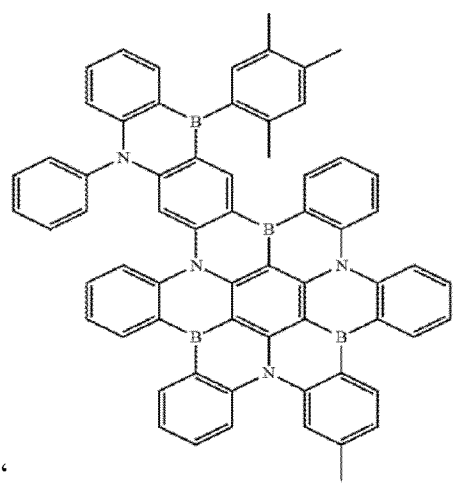 " and insert -- 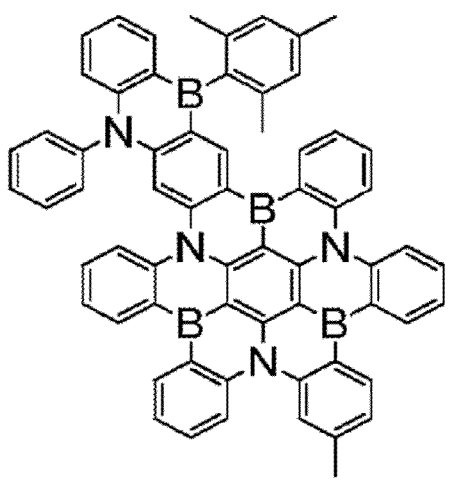 --.

In Column 131, Lines 45-65, in Claim 13, Compound 104, delete

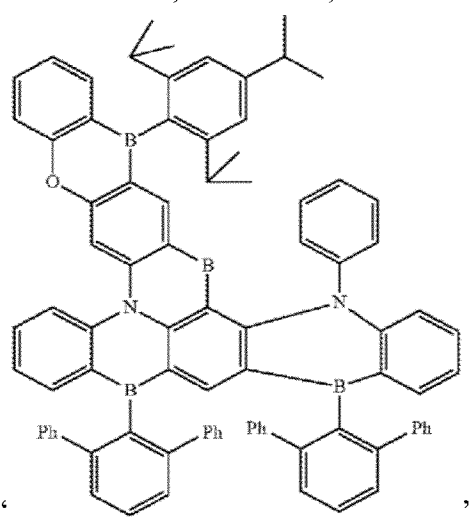 " and insert -- 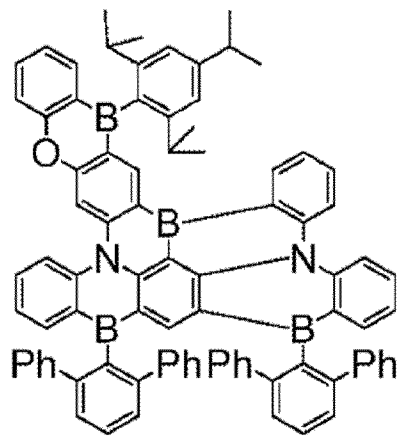 --.

In Column 132, Lines 3-24, in Claim 13, Compound 105, delete

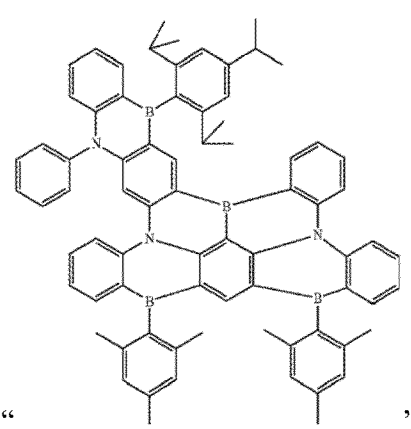 " and insert -- 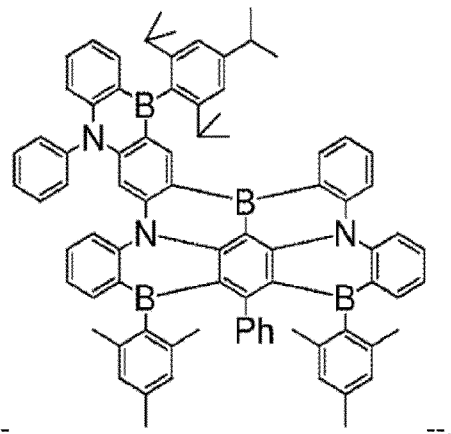 --.
In Column 132, Lines 45-66, in Claim 13, Compound 106, delete
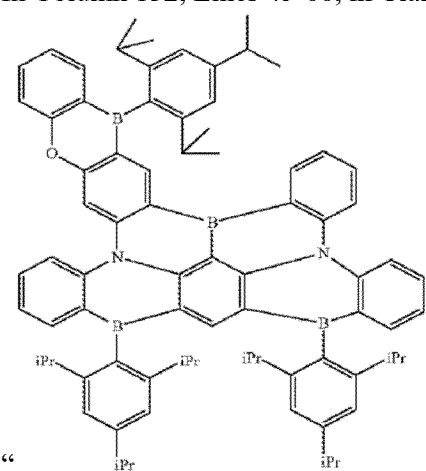 " and insert -- 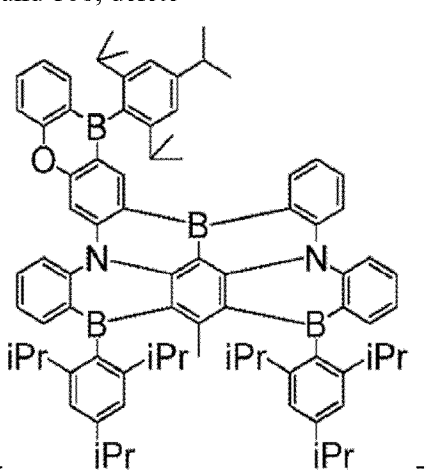 --.
In Column 134, Lines 3-24, in Claim 13, Compound 109, delete
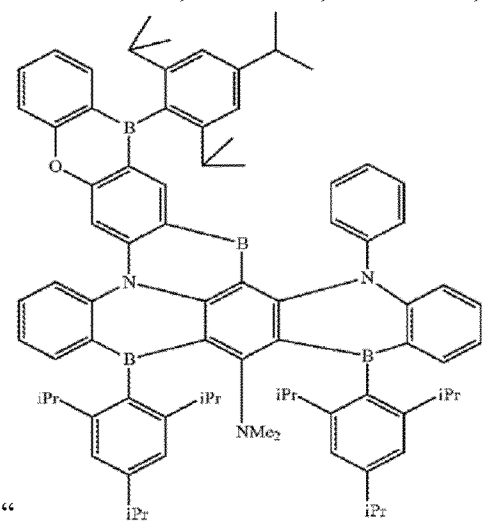 " and insert -- 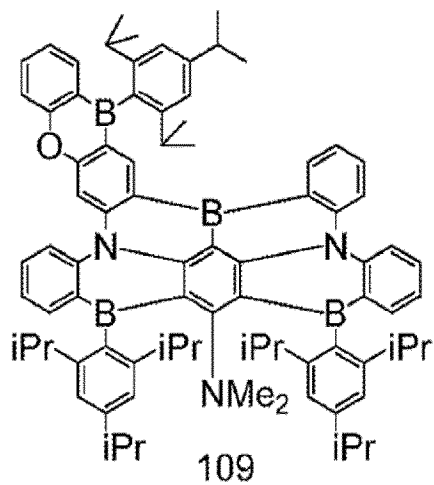 --.
In Column 143, Line 7, in Claim 14, delete ""I"" and insert -- "l" --.

CERTIFICATE OF CORRECTION (continued)
U.S. Pat. No. 11,856,848 B2

In Column 152, Lines 49-66, in Claim 20, Compound 13, delete

" 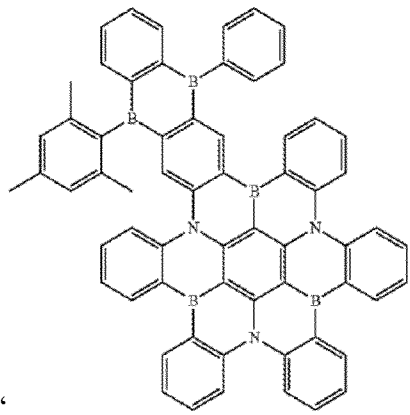 " and insert -- 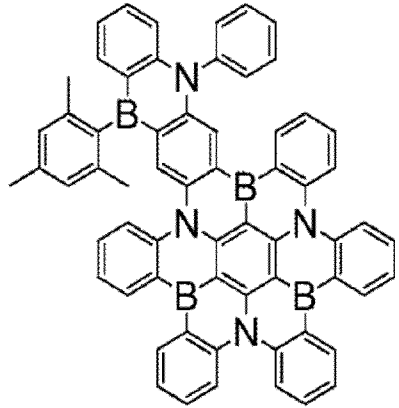 --.

In Column 153, Lines 2-20, in Claim 20, Compound 14, delete

" 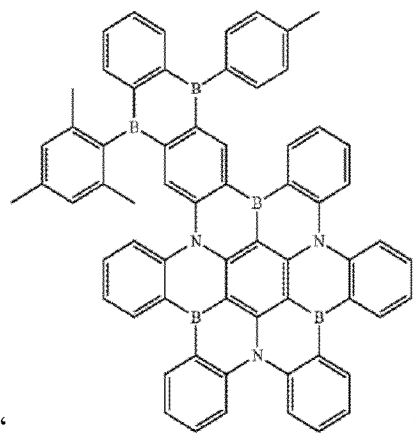 " and insert -- 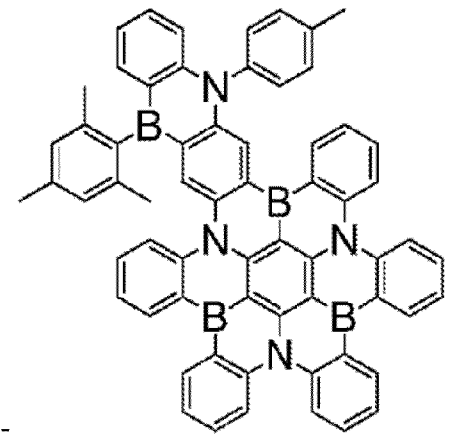 --.

In Column 153, Lines 25-45, in Claim 20, Compound 15, delete

" 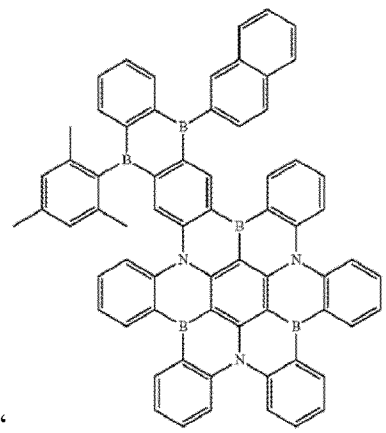 " and insert -- 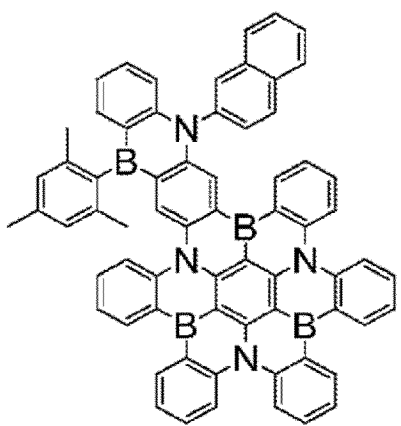 --.

In Column 161, Lines 3-22, in Claim 20, Compound 37, delete

CERTIFICATE OF CORRECTION (continued)
U.S. Pat. No. 11,856,848 B2

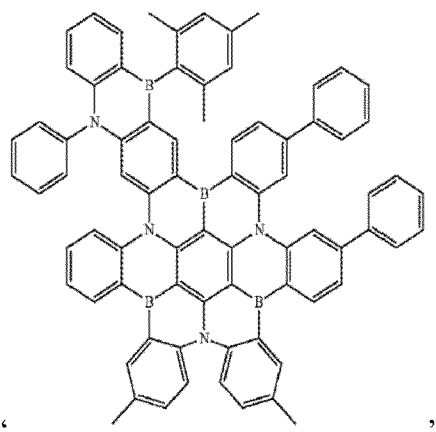 " and insert -- 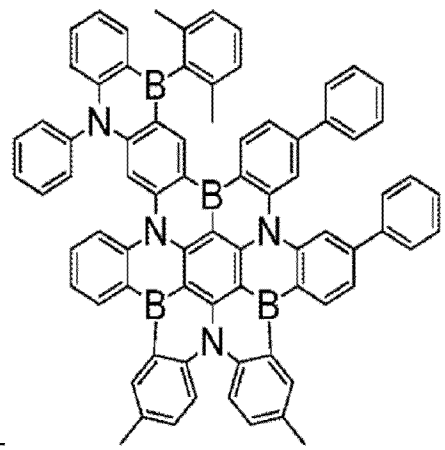 --.

In Column 161, Lines 24-43, in Claim 20, Compound 38, delete

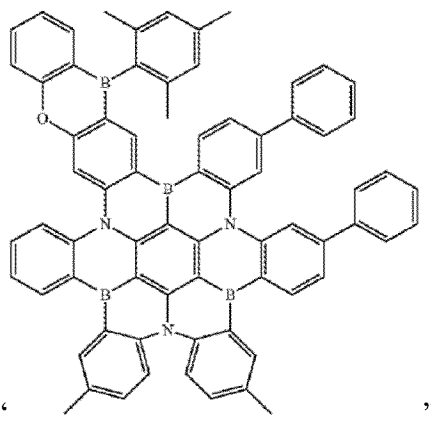 " and insert -- 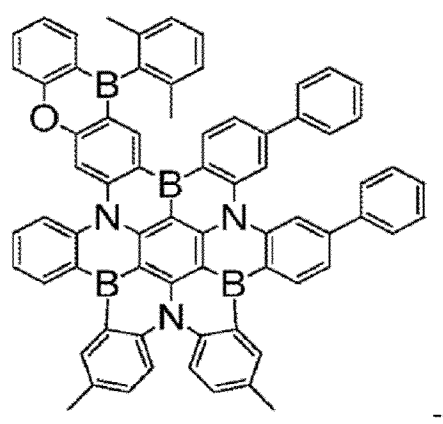 --.

In Column 161, Lines 48-65, in Claim 20, Compound 39, delete

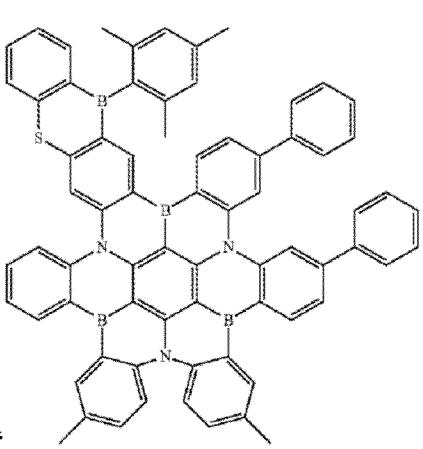 " and insert -- 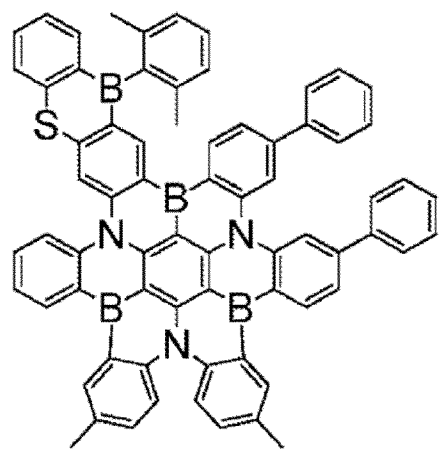 --.

In Column 167, Lines 3-21, in Claim 20, Compound 53, delete

CERTIFICATE OF CORRECTION (continued)
U.S. Pat. No. 11,856,848 B2

" 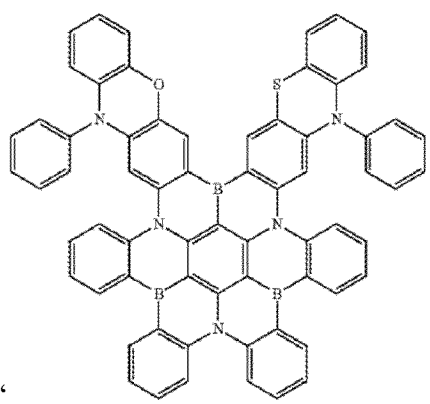 " and insert -- 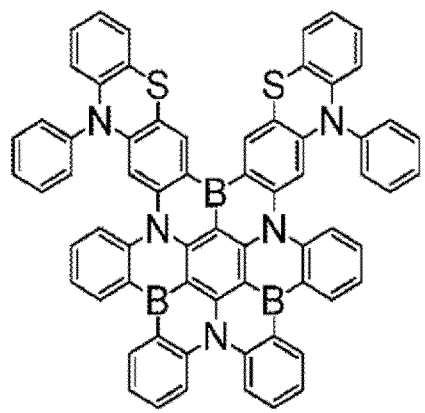 --.

In Column 182, Lines 44-65, in Claim 20, Compound 99, delete

" 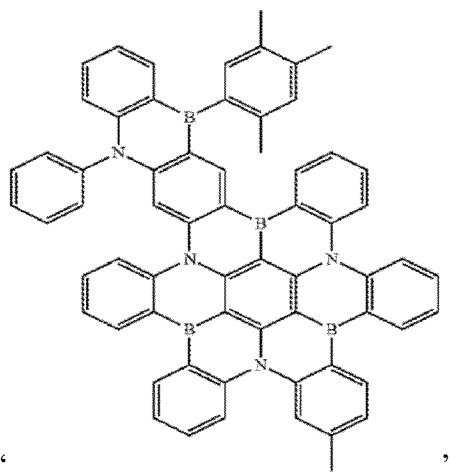 " and insert -- 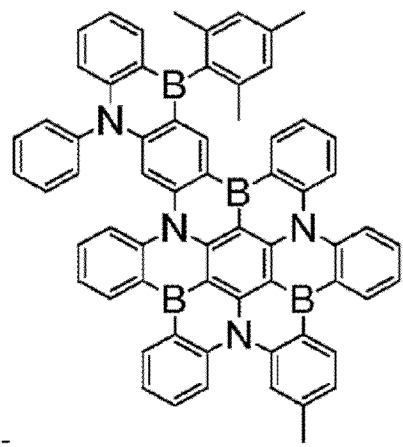 --.

In Column 184, Lines 46-66, in Claim 20, Compound 104, delete

" 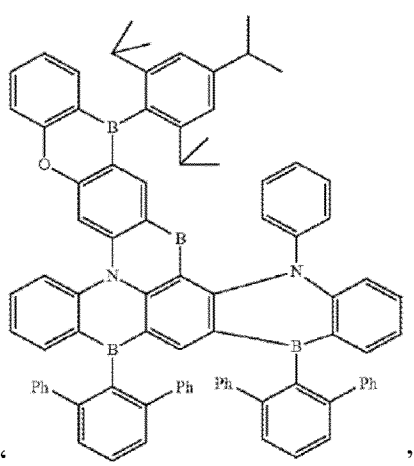 " and insert -- 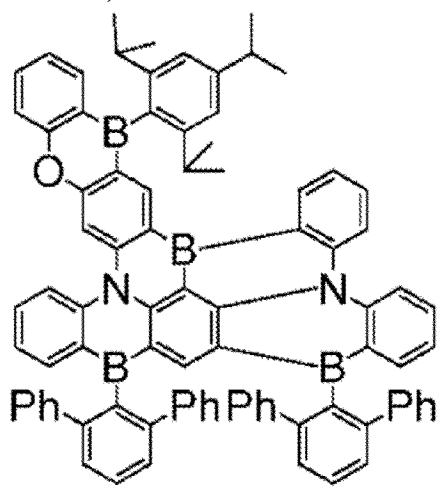 --.

In Column 185, Lines 3-24, in Claim 20, Compound 105, delete

CERTIFICATE OF CORRECTION (continued)
U.S. Pat. No. 11,856,848 B2

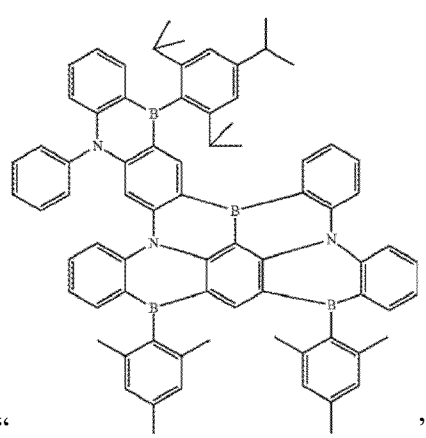 " and insert -- 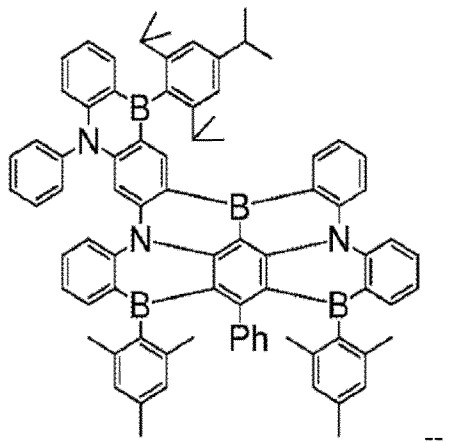 --.

In Column 185, Lines 45-66, in Claim 20, Compound 106, delete

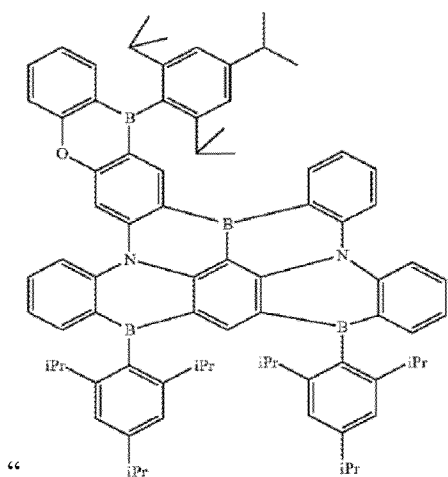 " and insert -- 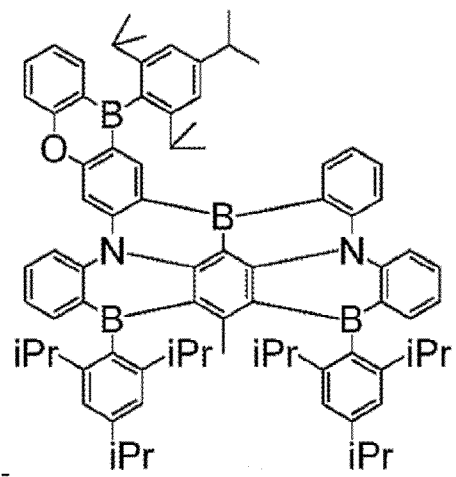 --.

In Column 187, Lines 3-24, in Claim 20, Compound 109, delete

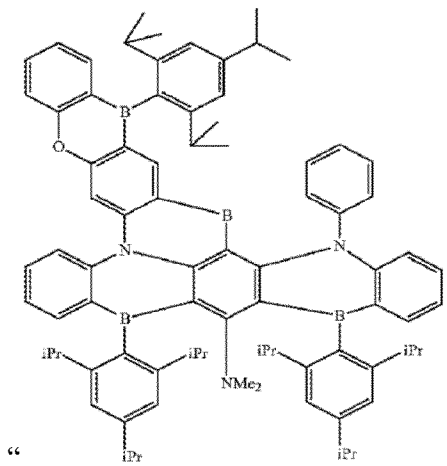 " and insert -- 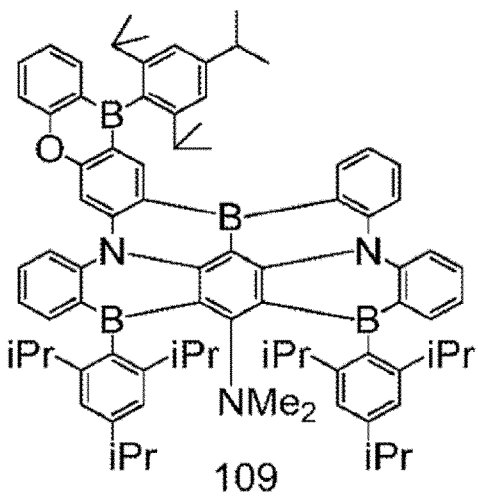 --.